US012754862B2

(12) United States Patent
Lee

(10) Patent No.: US 12,754,862 B2
(45) Date of Patent: Oct. 6, 2026

(54) INTEGRATED CIRCUIT PACKAGE AND METHOD OF MANUFACTURING THE SAME

(71) Applicant: SK hynix Inc., Icheon-si (KR)

(72) Inventor: Seong Ju Lee, San Jose, CA (US)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 19/390,261

(22) Filed: Nov. 14, 2025

(65) Prior Publication Data

US 2026/0072855 A1 Mar. 12, 2026

Related U.S. Application Data

(63) Continuation of application No. 19/334,932, filed on Sep. 21, 2025, which is a continuation-in-part of application No. 18/955,468, filed on Nov. 21, 2024.

(60) Provisional application No. 63/697,563, filed on Sep. 22, 2024, provisional application No. 63/566,570, filed on Mar. 18, 2024, provisional application No. 63/604,718, filed on Nov. 30, 2023.

(30) Foreign Application Priority Data

Jul. 4, 2024 (KR) ........................ 10-2024-0088306

(51) Int. Cl.
*G06F 13/16* (2006.01)
*H10B 80/00* (2023.01)
(Continued)

(52) U.S. Cl.
CPC ......... *G06F 13/1668* (2013.01); *H10B 80/00* (2023.02); *H10W 20/20* (2026.01);
(Continued)

(58) Field of Classification Search
CPC ... G06F 13/1668; H10B 80/00; H01L 23/481; H01L 23/5386; H01L 25/16;
(Continued)

(56) References Cited

U.S. PATENT DOCUMENTS

| | | |
|---|---|---|
| 5,404,559 A | 4/1995 | Bonella et al. |
| 6,742,098 B1 | 5/2004 | Halbert et al. |

(Continued)

FOREIGN PATENT DOCUMENTS

| | | |
|---|---|---|
| KR | 1020130042077 A | 4/2013 |
| KR | 1020200138911 A | 12/2020 |
| KR | 1020230133123 A | 9/2023 |

OTHER PUBLICATIONS

Non-Final Rejection for U.S. Appl. No. 18/955,468 from USPTO dated Aug. 17, 2026.

*Primary Examiner* — Victor A Mandala
*Assistant Examiner* — Colleen E Snow

(57) ABSTRACT

An integrated circuit package may include a base die, a host device, a first bonding interface, a stacked memory structure, and a second bonding interface. The base die may include a first surface and a second surface. The host device may be disposed on the first surface of the base die. The first bonding interface may be located between the first surface of the base die and the host device. The stacked memory structure may be disposed on the first surface of the base die. The second bonding interface may be located between the first surface of the base die and the stacked memory structure.

28 Claims, 50 Drawing Sheets

1000a

(51) Int. Cl.
*H10W 20/20* (2026.01)
*H10W 70/60* (2026.01)
*H10W 70/65* (2026.01)
*H10W 90/00* (2026.01)

(52) U.S. Cl.
CPC .......... *H10W 70/611* (2026.01); *H10W 70/65* (2026.01); *H10W 90/00* (2026.01)

(58) Field of Classification Search
CPC ..... H10W 90/00; H10W 70/65; H10W 20/20; H10W 70/611
See application file for complete search history.

(56) References Cited

U.S. PATENT DOCUMENTS

| | | | | |
|---|---|---|---|---|
| 6,898,659 | B2 | 5/2005 | Yoo et al. | |
| 7,552,267 | B2 | 6/2009 | Randell et al. | |
| 7,958,285 | B1 | 6/2011 | Chiu et al. | |
| 8,836,148 | B2 | 9/2014 | Gillingham | |
| 9,076,506 | B2 | 7/2015 | Tsai | |
| 9,224,722 | B2 | 12/2015 | Lim et al. | |
| 9,379,715 | B2 | 6/2016 | Jeong | |
| 9,437,586 | B2 | 9/2016 | Hong | |
| 10,090,236 | B2 | 10/2018 | Jayasena et al. | |
| 10,242,750 | B2 | 3/2019 | Linnen et al. | |
| 10,291,397 | B2 | 5/2019 | McElheny et al. | |
| 11,256,652 | B2 | 2/2022 | Usach Merino et al. | |
| 11,500,793 | B2 | 11/2022 | Sakaue et al. | |
| 12,164,446 | B2 | 12/2024 | Sakaue et al. | |
| 2013/0070507 | A1 | 3/2013 | Yoon | |
| 2014/0185389 | A1 | 7/2014 | Jeon et al. | |
| 2019/0268086 | A1* | 8/2019 | Wuu | H01L 25/0657 |
| 2020/0057717 | A1* | 2/2020 | Jayasena | G06F 12/0862 |
| 2021/0103533 | A1 | 4/2021 | Shiah | |
| 2022/0308995 | A1 | 9/2022 | Gomes et al. | |
| 2023/0107103 | A1 | 4/2023 | Youn et al. | |
| 2023/0259283 | A1 | 8/2023 | Kim et al. | |
| 2024/0014113 | A1 | 1/2024 | Baek | |
| 2025/0385209 | A1* | 12/2025 | Choi | H01L 25/0652 |

* cited by examiner

1000m

INTEGRATED CIRCUIT PACKAGE AND METHOD OF MANUFACTURING THE SAME

CROSS-REFERENCES TO RELATED APPLICATIONS

The present application is a continuation application of U.S. patent application Ser. No. 19/334,932, filed on Sep. 21, 2025, which is the continuation-in-part application of U.S. patent application Ser. No. 18/955,468, filed on Nov. 21, 2024, which claims benefit of priority of U.S. provisional patent application No. 63/604,718, filed on Nov. 30, 2023, U.S. provisional patent application No. 63/566,570, filed on Mar. 18, 2024, and, and Korean application number 10-2024-0088306, filed on Jul. 4, 2024. In addition, the U.S. patent application Ser. No. 19/334,932 further claims the benefit of priority to U.S. provisional application No. 63/697,758, filed on Sep. 23, 2024. The entire contents of each of the aforementioned applications are incorporated herein by reference in their entirety.

BACKGROUND

1. Technical Field

Various embodiments generally relate to integrated circuit technology, and more particularly, to a computing system architecture having efficient bus connections and an integrated circuit package including the same.

2. Related Art

In general, a computing system may have a structure in which a host device and a memory apparatus are electrically connected. The host device may include a processing core and a memory controller. The memory apparatus may include memory cell arrays. The host device may be electrically connected to the memory apparatus through a memory channel, in which the memory channel utilizes serial data transmission. The serial data transmission may minimize the number of data signal transmission lines included in the memory channel, and may reduce skew between data signals and clock signals. However, for serial data transmission, the host device may need a controller physical interface (e.g., a double data rate (DDR) PHY), and the memory apparatus may need a memory physical interface. For example, the controller physical interface and the memory physical interface both may include a Serializer-Deserializer (SerDes).

The controller physical interface may convert parallel data generated by the processor core and the memory controller to serial data, and may transmit the serial data to the memory apparatus through the memory channel. Further, the controller physical interface may convert serial data transmitted from the memory apparatus to parallel data, and provide the parallel data to the memory controller and the host device. The memory physical interface may convert parallel data output from the memory cell array to serial data and transmit the serial data to the host device through the memory channel. The memory physical interface may convert serial data transmitted from the host device through the memory channel to parallel data, and may provide the parallel data to the memory cell array. The above structure of a traditional computing system may have been the best signal transmission structure in an environment where the host device and the memory apparatus are each manufactured in a single chip or a single package. However, in an environment where advanced packaging technologies increase the number of signal transmission lines electrically connecting the host device and the memory apparatus, and where the host device and the memory apparatus are manufactured as chiplets, there is a need for computing system architectures that can more efficiently connect the host device and the memory apparatus.

SUMMARY

In an embodiment, an integrated circuit package may include a base die, a host device, a first bonding interface, a stacked memory structure, and a second bonding interface. The base die may include a first surface and a second surface. The host device may be disposed on the first surface of the base die. The first bonding interface may be located between the first surface of the base die and the host device. The stacked memory structure may be disposed on the first surface of the base die. The second bonding interface may be located between the first surface of the base die and the stacked memory structure.

In an embodiment, an integrated circuit package may include a package substrate, a base die structure, at least one host device, a plurality of stacked memory structures, at least one first bonding interface, and a plurality of second bonding interfaces. The base die structure may be mounted on the package substrate. The at least one host device may be disposed on the base die structure. The plurality of stacked memory structures may be disposed on the base die structure. The at least one first bonding interface may be located between the base die structure and the host device. The plurality of second bonding interfaces may be located between the base die structure and the plurality of stacked memory structures, respectively.

In an embodiment, a method of manufacturing an integrated circuit package is provided. At least one stacked memory structure may be hybrid bonded onto an upper surface of a base die. A host device may be hybrid bonded onto the upper surface of the base die.

In an embodiment, a method of manufacturing an integrated circuit package is provided. A base die structure comprising a plurality of base dies may be prepared. A plurality of stacked memory structures and a host device hybrid bonded onto an upper surface of the base die structure.

The base die structure may be mounted on a package substrate.

DETAILED DESCRIPTION

Figure 1:
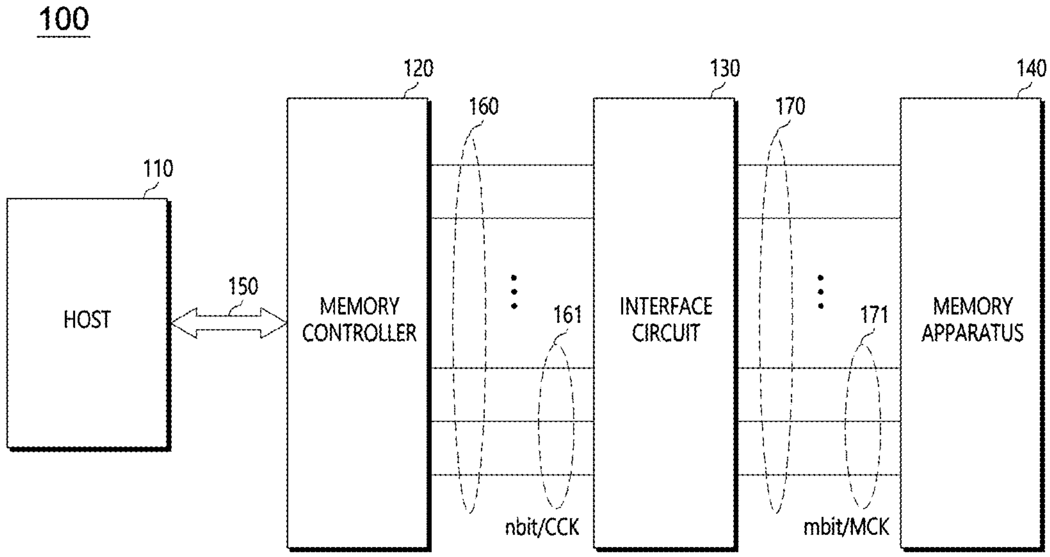
FIG. 1 is a diagram illustrating a configuration of a computing system according to an embodiment of the present disclosure.

FIG. 1 is a diagram illustrating a configuration of a computing system according to an embodiment of the present disclosure. Referring to FIG. 1, the computing system 100 may include a host 110, a memory controller 120, an interface circuit 130, and a memory apparatus 140. The host 110 may generate an access request to the memory apparatus 140 in response to input from a user (e.g., execution of application program or software). The access request may include a write request and a read request. The host 110 may include any computing architecture most suitable for executing applications required by the user. For example, the host 110 may include at least one of a central processing unit (CPU), a graphic processing unit (GPU), a multi-media processor (MMP), a digital signal processor (DSP), an application processor (AP), a data processing unit (DPU), a neural processing unit (NPU), a system-on-chip (SoC), or any combination of two or more of the foregoing. The host 110 may be electrically connected to the memory controller 120 through a first bus 150. The first bus 150 may be any set of signal transmission lines for electrically connecting the host 110 and the memory controller 120. For example, the first bus 150 may include at least one of Advanced extensible Interface (AXI) and Universal Chiplet Interconnect express (UCIe), Advanced Microcontroller Bus Architecture (AMBA), Ultra Path Interconnect (UPI), Infinite Fabric, and NVLINK.

The memory controller 120 may be electrically connected to the host 110 through the first bus 150. The memory controller 120 may facilitate data transmission between the host 110 and the memory apparatus 140. The memory controller 120 may receive write requests and read requests from the host 110 through the first bus 150, and may generate various control signals for accessing the memory apparatus 140 based on the requests. For example, the various control signals may include an address signal, a command signal, a write data signal, a read data signal, a clock signal, and the like. The memory controller 120 may be electrically connected to the interface circuit 130 through a second bus 160. The second bus 160 may include a first data bus 161. The first data bus 161 may transmit a write data signal from the memory controller 120 to the interface circuit 130 and may transmit a read data signal from the interface circuit 130 to the memory controller 120. The memory controller 120 and the interface circuit 130 may perform parallel data communication through the first data bus 161. In an embodiment, the memory controller 120 and the interface circuit 130 may perform partial parallel data communication, which is a combination of serial data communication and parallel data communication, through the first data bus 161. The remainder of the second bus 160, i.e., excluding the first data bus 161, may transmit the address signal, the command signal, and the clock signal, and the like, from the memory controller 120 to the interface circuit 130.

The interface circuit 130 may be electrically connected between the memory controller 120 and the memory apparatus 140. The interface circuit 130 may relay data transmission between the memory controller 120 and the memory apparatus 140, and signal transmission to and from the memory controller 120 and the memory apparatus 140. The interface circuit 130 may convert various signals received from the memory controller 120 to generate signals suitable for use by the memory apparatus 140 (e.g., serialize or de-serialize). The interface circuit 130 may convert signals received from the memory apparatus 140 to generate signals suitable for use by the memory controller 120 (e.g., serialize or de-serialize). The interface circuit 130 may be electrically connected to the memory controller 120 through the second bus 160. The interface circuit 130 may receive the address signal, the command signal, the clock signal, and the write data signal from the memory controller 120 and may transmit the read data signal to the memory controller 120, through the second bus 160. The interface circuit 130 may receive the write data signal from the memory controller 120 through the first data bus 161, and may transmit the read data signal to the memory controller 120 through the first data bus 161. The interface circuit 130 may be electrically connected to the memory apparatus 140 through a third bus 170. Through the third bus 170, the interface circuit 130 may provide the address signal, the command signal, the clock signal and memory data signal received from the memory controller 120 to the memory apparatus 140 and may receive the memory data signal from the memory apparatus 140. The third bus 170 may include a second data bus 171. The second data bus 171 may transmit the memory data signal from the interface circuit 130 to the memory apparatus 140, and may transmit the memory data signal from the memory apparatus 140 to the interface circuit 130. The third bus 170, other than the second data bus 171, may transmit the address signal, the command signal, and the clock signal, and the like, from the interface circuit 130 to the memory apparatus 140. The interface circuit 130 may generate the memory data signal based on the write data signal received from the memory controller 120, and may generate the read data signal based on the memory data signal received from the memory apparatus 140. The interface circuit 130 and the memory apparatus 140 may perform parallel data communication through the second data bus 171. The interface circuit 130 and the memory apparatus 140 may perform full parallel data communication through the second data bus 171.

The memory apparatus 140 may be electrically connected to the interface circuit 130 through the third bus 170. The memory apparatus 140 may receive the address signal, the command signal, the clock signal, and the memory data signal from the interface circuit 130 and may transmit the memory data signal to the interface circuit 130, through the third bus 170. The memory apparatus 140 may transmit the memory data signal to the interface circuit 130 through the second data bus 171, and may receive the memory data signal transmitted from the interface circuit 130 through the second data bus 171. The memory apparatus 140 may include a memory cell array, and a particular region of the memory cell array may be accessed based on the address signal. The memory apparatus 140 may perform a write operation and a read operation based on the command signal. The write operation may be an operation to store the memory data signal transmitted from the interface circuit 130 in an accessed region of the memory cell array based on the address signal. The read operation may be an operation of providing data stored in an accessed region of the memory cell array based on the address signal to the interface circuit 130 as the memory data signal.

The memory apparatus 140 may include at least one memory die. The memory apparatus 140 may include one memory die, or may include two or more memory dies disposed on one interposer and/or substrate. When the memory apparatus includes two or more memory dies, the two or more memory dies may independently form a plurality of channels, and the plurality of channels are independently electrically connected to the interface circuit 130. There may be a plurality of third buses 170 corresponding to the number of the channels. In an embodiment, the two or more memory dies may form one common channel, and may be electrically connected in common with the interface circuit 130. In an embodiment, the memory apparatus 140 may include a plurality of memory groups including two or more memory dies, and the plurality of memory groups may form a plurality of channels. The memory dies included in the plurality of memory groups may form a common channel. A plurality of third buses 170 may be provided corresponding to the number of channels.

In a conventional computing system, a memory controller and a memory apparatus are electrically connected through a high-speed serial bus, and the memory controller and the memory apparatus perform high-speed serial data communication. The high-speed serial bus has the advantage of being implemented at relatively low cost and reducing the number of signal transmission lines required. However, the high-speed serial bus has limitations in expanding the data bandwidth, and the integrity of the signals transmitted through the high-speed serial bus may be reduced as the frequency of the computing system increases. Moreover, in order to perform the serial data communication over the high-speed serial bus, the memory controller and the memory apparatus must be equipped with a serializer-deserializer (SerDes). Furthermore, in order to transmit data signals based on symbols, such as PAM (Pulse Amplitude Modulation), the memory controller and the memory apparatus must be equipped with a special purpose data encoder and a data decoder in addition to the SerDes. As the trend towards miniaturization of integrated circuits continues, the additional circuits required for serial data communication may impose a heavy burden on the host devices and memory apparatuses including memory controllers.

The physical constraints in the number of signal transmission lines can be mitigated through the use of substrates and/or interposers with multiple signal transmission lines and the development of advanced packaging technologies. For example, in the computing system 100, the memory controller 120 may be electrically connected through the interface circuit 130 to the memory apparatus 140 through a parallel bus, and may perform parallel data communication with the memory apparatus 140. When performing parallel data communication between the memory controller 120 and the memory apparatus 140, data bandwidth can be dramatically increased, and the memory apparatus 140 can more quickly provide the necessary data for the host 110 to perform computational operations. As artificial intelligence (AI) technology advances, the amount of data that the host 110 needs to process at one time continues to increase, so increasing the data bandwidth between the memory controller 120 and the memory apparatus 140 may be a key factor in optimizing the performance of the host 110. Furthermore, when the memory controller 120 and the memory apparatus 140 perform parallel data communication through the interface circuit 130, the memory controller 120 and the memory apparatus 140 might not need additional circuits such as SerDes, data encoders, data decoders, and the like. Therefore, the number and/or size of the computational circuits can improve the computational performance of the host 110. Further, the area of the memory dies can be reduced, or the data storage capacity of the memory dies can be increased by forming a larger number of memory cells using the same area.

In the integrated circuit package 100, a clock rate of the second bus 160 may be greater than or equal to a clock rate of the third bus 170. The clock rate may be a clock speed. The clock rate of the buses may refer to a clock frequency of the buses and/or a clock cycle of the buses. The clock frequency of the bus and/or the clock cycle of the bus may define a duration of the signal transmitted through the bus. The higher the clock frequency of the bus and the shorter the clock cycle of the bus, the shorter the duration of the signal transmitted through the bus. The lower the clock frequency of the bus and the longer the clock cycle, the longer the duration of the signal transmitted through the bus. The second bus 160 may operate based on a system clock signal CCK, and the third bus 170 may operate based on a memory clock signal MCK. The computing system 100 may set the ratio of the clock rate of the second bus 160 to the clock rate of the third bus 170 in various ways to ensure operational efficiency of the integrated circuit package 100. For example, the ratio of the clock rate of the second bus 160 to the clock rate of the third bus 170 may be selected as one of 1:1, 2:1, or 4:1. In an embodiment, the system clock signal CCK may have the same frequency as the memory clock signal MCK. In an embodiment, the system clock signal CCK may have a frequency twice as high as the memory clock signal MCK. In an embodiment, the system clock signal CCK may have a frequency four times higher than the memory clock signal MCK.

In the integrated circuit package 100, the first data bus 161 and the second data bus 171 may be parallel data buses that transmit parallel data. A width of the first data bus 161 may be less than or equal to a width of the second data bus 171. The width of the data buses may define the number of data signals and/or the number of bits of data that may be transmitted at one time through the data buses. In an embodiment, the width of the data bus may also define the number of signal transmission lines carrying the data signals. In an embodiment, the width of the second data bus 171 may be substantially the same as the width of the first data bus 161, and the number of data signals and bits transmitted at one time through the second data bus 171 may be substantially the same as the number of data signals and bits transmitted at one time through the first data bus 161. In an embodiment, a width of the second data bus 171 may be twice a width of the first data bus 161, and the number of data signals and bits transmitted at one time through the second data bus 171 may be twice the number of data signals and bits transmitted at one time through the first data bus 161. In an embodiment, a width of the second data bus 171 may be four times a width of the first data bus 161, and the number of data signals and bits transmitted at one time through the second data bus 171 may be four times the number of data signals and bits transmitted at one time through the first data bus 161. For example, the first data bus 161 may include n signal transmission lines, and n bits of data may be transmitted through the first data bus 161 at one time. Here, n may be a multiple of 2. The second data bus 171 may include m signal transmission lines, and m bits of data may be transmitted at a time through the second data bus 171. Here, m may be equal to n or may be a multiple of n. The clock rates of the second and third buses 160, 170 and the widths of the first and second data buses 161, 171 may be changed such that the second data bus 171 may have substantially the same data bandwidth as the first data bus 161.

In an embodiment, the host 110, the memory controller 120, and the interface circuit 130 may be integrated into a first device, and the memory apparatus 140 may be a second device. The first bus 150 and the second bus 160 may be internal buses, and the third bus 170 may be an external bus. The host 110, the memory controller 120, and the interface circuit 130 may be disposed on a first interposer and/or a first substrate, and the memory apparatus 140 may be disposed on a second interposer and/or a second substrate. In an embodiment, the host 110 and the memory controller 120 may be integrated into a first device, and the interface circuit 130 and the memory apparatus 140 may be integrated into a second device. The first and third buses 150, 170 may be internal buses, and the second bus 160 may be an external bus. The host 110 and the memory controller 120 may be disposed on a first interposer and/or a first substrate, and the interface circuit 130 and the memory apparatus 140 may be disposed on a second interposer and/or a second substrate. In an embodiment, the host 110 may be a first device, and the memory controller 120, the interface circuit 130, and the memory apparatus 140 may be integrated into a second device. The first bus 150 may be an external bus, and the second and third buses 160, 170 may be internal buses. The host 110 may be disposed on a first interposer and/or a first substrate, and the memory controller 120, the interface circuit 130, and the memory apparatus 140 may be disposed on a second interposer and/or a second substrate. In an embodiment, the host 110, the memory controller 120, the interface circuit 130, and the memory apparatus 140 may be integrated into a single device. The first to third buses 150, 160, 170 may be internal buses. The host 110, the memory controller 120, the interface circuit 130, and the memory apparatus 140 may be disposed on the same interposer and/or substrate. In an embodiment, some or all of the host 110, the memory controller 120, the interface circuit 130, and the memory apparatus 140 may be manufactured as chiplets.

Figure 2:
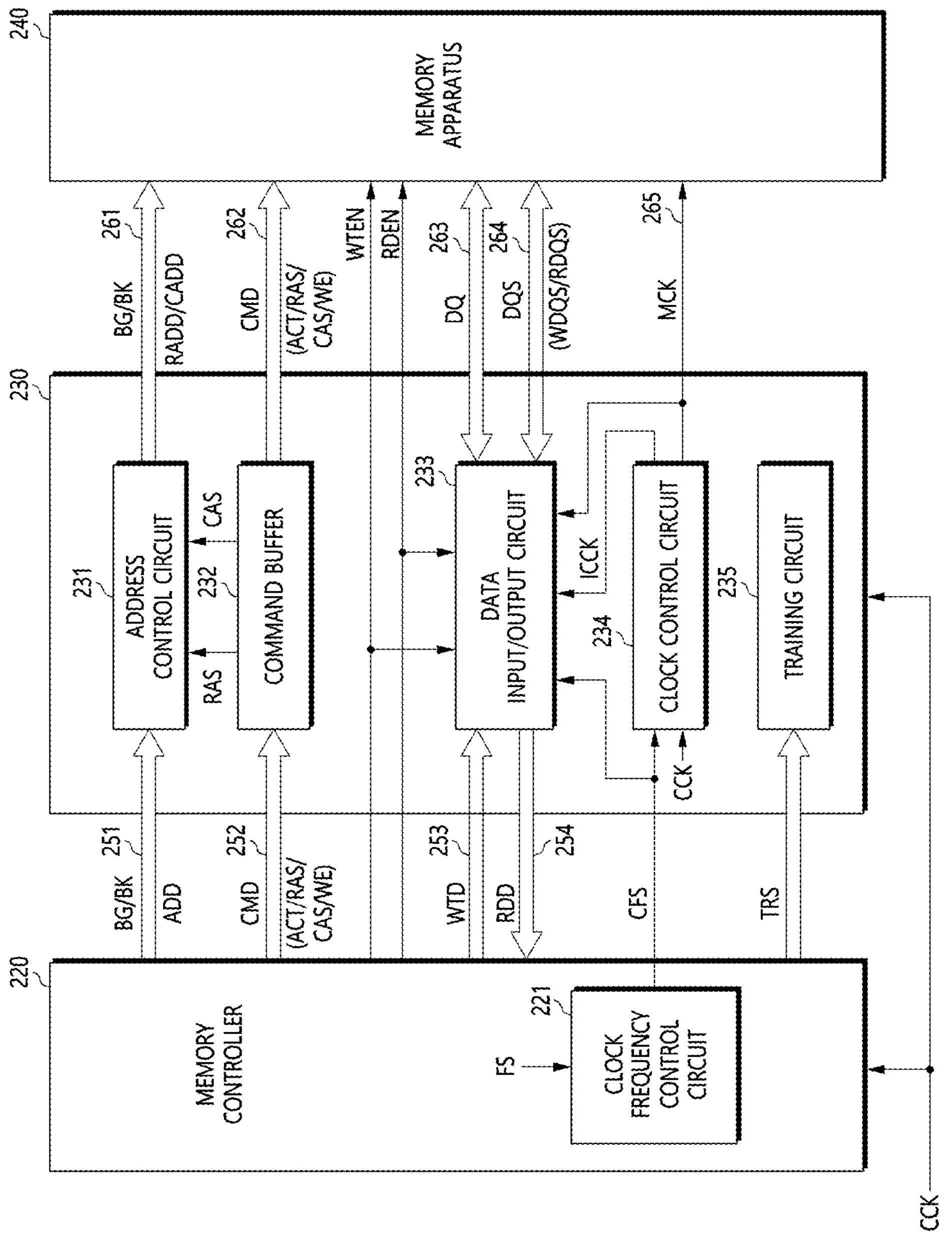
FIG. 2 is a diagram illustrating connection relationships among a memory controller, an interface circuit, and a memory apparatus shown in FIG. 1.

FIG. 2 is a diagram illustrating connection relationships among a memory controller 220, an interface circuit 230, and a memory apparatus 240 according to an embodiment of the present disclosure. The memory controller 220 may be applied as the memory controller 120 shown in FIG. 1, the interface circuit 230 may be applied as the interface circuit 130 shown in FIG. 1, and the memory apparatus 240 may be applied as the memory apparatus 140 shown in FIG. 1. Referring to FIG. 2, the memory controller 220 may generate or receive various control signals in response to an access request provided by the host 110 shown in FIG. 1. The various control signals may include an address signal ADD, a bank group signal BG, a bank address signal BK, a command signal CMD, a write data signal WTD, a read data signal RDD, and the like. The address signal ADD may be a signal used to access rows and columns of the memory cell array of the memory apparatus 240. The bank group signal BG may be an address signal used to access one of a plurality of memory bank groups included in the memory apparatus 240. The bank address signal BK may be an address signal used to access a memory bank of one of a plurality of memory banks constituting a memory bank group. The memory controller 220 may be electrically connected to the interface circuit 230 through an address bus 251. The address bus 251 may be a unidirectional bus from the memory controller 220 to the interface circuit 230. The address signal ADD, the bank group signal BG, and the bank address signal BK may be provided from the memory controller 220 to the interface circuit 230 through the address bus 251. The address bus 251 may include a plurality of signal transmission lines, and the address signal ADD, the bank group signal BG, and the bank address signal BK may be transmitted through separate signal transmission lines. The address bus 251 may be included in the portion of the second bus 160 that excludes the first data bus 161 as shown in FIG. 1.

The command signal CMD may include a plurality of signals. By way of non-limiting examples, the command signal CMD may include an active command signal ACT, a row access command signal RAS, a column access command signal CAS, and a write enable signal WE. The active command signal ACT may be a command signal that instructs the memory apparatus 240 to enter an active mode from a standby mode, or to enter the standby mode from the active mode. The memory apparatus 240 may perform write and read operations in the active mode, and the standby mode may be a low power mode of the memory apparatus 240. The row access command signal RAS may be a row address strobe signal, and may be a command signal that indicates access of a row of the memory apparatus 240. The column access command signal CAS may be a column address strobe signal, and may be a command signal indicating access of a column of the memory apparatus 240. The write enable signal WE may be a signal that determines whether an operation to be performed by the memory apparatus is a write operation or a read operation. For example, when the column access command signal CAS is enabled and the write enable signal WE has a first logic level, the write enable signal WE may be a command signal that instructs the memory apparatus 240 to perform a write operation. When the column access command signal CAS is enabled and the write enable signal WE has a second logic level, the write enable signal WE may be a command signal that instructs the memory apparatus 240 to perform a read operation. The memory controller 220 may be electrically connected to the interface circuit 230 through a command bus 252. The command bus 252 may be a unidirectional bus from the memory controller 220 to the interface circuit 230. The command signal CMD may be provided from the memory controller 220 to the interface circuit 230 through the command bus 252. The command bus 252 may include a plurality of signal transmission lines, and the active command signal ACT, the row access command signal RAS, the column access command signal CAS, and the write enable signal WE may be transmitted through separate signal transmission lines. The command bus 252 may be included in that part of the second bus 160 that might not be included in the first data bus 161 as shown in FIG. 1. Although not shown, the memory controller 220 may further generate control signals, such as a chip selection signal, a clock enable signal, and a reset signal, and may provide the control signals to the interface circuit 230 through other signal transmission lines.

The write data signal WTD may be a data signal provided to the memory apparatus 240 from the memory controller 220 when the memory controller 220 instructs the memory apparatus 240 to perform a write operation, and may be a data signal to be stored in the memory apparatus 240. The memory controller 220 may generate the write data signal WTD based on data transmitted with an access request from the host 110. The read data signal RDD may be a data signal provided to the memory controller 220 from the memory apparatus 240 when the memory controller 220 instructs the memory apparatus 240 to perform a read operation. The memory controller 220 may generate data that is transmitted to the host 110 based on the read data signal RDD. The memory controller 220 may be electrically connected to the interface circuit 230 through a write bus 253 and a read bus 254. The write bus 253 may be a unidirectional bus from the memory controller 220 to the interface circuit 230, and the read bus 254 may be a unidirectional bus from the interface circuit 230 to the memory controller 220. The write data signal WTD may be provided from the memory controller 220 to the interface circuit 230 through the write bus 253. The read data signal RDD may be provided from the interface circuit 230 to the memory controller 220 through the read bus 254. The write bus 253 and the read bus 254 may be included in the first data bus 161 shown in FIG. 1. A width of the write bus 253 and a width of the read bus 254 may be substantially the same, and a clock rate of the write bus 253 and a clock rate of the read bus 254 may be substantially the same. In an embodiment, the write bus 253 and the read bus 254 may be integrated into a single data bus, and the integrated data bus may be implemented as a bidirectional bus between the memory controller 220 and the interface circuit 230. The integrated data bus may have substantially the same width and clock rate as each of the write bus 253 and the read bus 254.

In an embodiment, the memory controller 220 may further provide a write selection signal WTEN and a read selection signal RDEN to the interface circuit 230 and the memory apparatus 240. The write selection signal WTEN may be a signal for enabling buffers in the interface circuit 230 and the memory apparatus 240 that transmit and receive signals related with the write operation when the memory controller 220 instructs the write operation to the memory apparatus 240. The read selection signal RDEN may be a signal for enabling buffers in the interface circuit 230 and the memory apparatus 240 that transmit and receive signals related to the read operation when the memory controller 220 instructs the read operation to the memory apparatus 240. In an embodiment, the memory controller 220 might not separately provide the write selection signal WTEN and the read selection signal RDEN to the interface circuit 230, and the interface circuit 230 may generate the write selection signal WTEN and the read selection signal RDEN based on the command signal CMD.

The interface circuit 230 may be electrically connected to the memory controller 220, and may receive the address signal ADD, the bank group signal BG, the bank address signal BK, the command signal CMD, the write data signal WTD from the memory controller 220, and may transmit the read data signal RDD to the memory controller 220. The interface circuit 230 may be electrically connected to the memory controller 220 through the address bus 251, the command bus 252, the write bus 253, and the read bus 254. The interface circuit 230 may receive the address signal ADD, the bank group signal BG, and the bank address signal BK from the memory controller 220 through the address bus 251. The interface circuit 230 may receive the active command signal ACT, the row access command signal RAS, the column access command signal CAS, and the write enable signal WE through the command bus 252. The interface circuit 230 may receive the write data signal WTD from the memory controller 220 through the write bus 253. The interface circuit 230 may transmit the read data signal RDD to the memory controller 220 through the read bus 254. The interface circuit 230 may be electrically connected to the memory apparatus 240 and may provide signals received from the memory controller 220 to the memory apparatus 240. The interface circuit 230 may buffer and convert signals received from the memory controller 220 to generate signals suitable for use in the memory apparatus 240 (e.g., serialize or de-serialize).

The interface circuit 230 may provide the bank group signal BG, the bank address signal BK, a row address signal RADD, a column address signal CADD, the command signal CMD, and a memory data signal DQ to the memory apparatus 240. The interface circuit 230 may buffer the bank group signal BG and the bank address signal BK received from the memory controller 220. The interface circuit 230 may generate the row address signal RADD and the column address signal CADD based on the address signal ADD and the command signal CMD received from the memory controller 220. The interface circuit 230 may be electrically connected with the memory apparatus 240 through an address bus 261, and may provide the bank group signal BG, the bank address signal BK, and the row address signal RADD and the column address signal CADD to the memory apparatus 240 through the address bus 261. The address bus 261 may be a unidirectional bus from the interface circuit 230 to the memory apparatus 240. The address bus 261 may include a plurality of signal transmission lines, and the bank group signal BG, the bank address signal BK, the row address signal RADD, and the column address signal CADD may be transmitted through separate signal transmission lines. The address bus 261 may be included as part of the third bus 170, but not part of the second data bus 171 shown in FIG. 1.

The interface circuit 230 may buffer the command signal CMD received from the memory controller 220. The interface circuit 230 may be electrically connected to the memory apparatus 240 through a command bus 262, and may provide the active command signal ACT, the row access command signal RAS, the column access command signal CAS, and the write enable signal WE to the memory apparatus 240 through the command bus 262. The command bus 262 may be a unidirectional bus from the interface circuit 230 to the memory apparatus 240. The command bus 262 may include a plurality of signal transmission lines, and the active command signal ACT, the row access command signal RAS, the column access command signal CAS, and the write enable signal WE may be transmitted through separate signal transmission lines. The command bus 262 may be included as part of the third bus 170 other than the second data bus 171 shown in FIG. 1.

The interface circuit 230 may generate the memory data signal DQ based on the write data signal WTD received from the memory controller 220, and may generate the read data signal RDD based on the memory data signal DQ received from the memory apparatus 240. The interface circuit 230 may be electrically connected to the memory apparatus 240 through a memory data bus 263, and may transmit the memory data signal DQ to the memory apparatus 240 or receive the memory data signal DQ transmitted from the memory apparatus 240 through the memory data bus 263. The memory data bus 263 may be a bidirectional bus between the interface circuit 230 and the memory apparatus 240. A width of the memory data bus 263 may be greater than or equal to a width of the write bus 253 or a width of the read bus 254, and a clock rate of the memory data bus 263 may be less than or equal to a clock rate of the write bus 253 or a clock rate of the read bus 254.

The interface circuit 230 may include an address control circuit 231, a command buffer 232, and a data input/output circuit 233. The address control circuit 231 may receive the bank group signal BG, the bank address signal BK, and the address signal ADD from the memory controller 220. The address control circuit 231 may buffer the bank group signal BG and the bank address signal BK, and may provide the buffered bank group signal BG and buffered bank address signal BK to the memory apparatus 240. The address control circuit 231 may generate the row address signal RADD and the column address signal CADD based on the address signal ADD and the command signal CMD. The address control circuit 231 may generate the row address signal RADD based on the address signal ADD and the row access command signal RAS, and may generate the column address signal CADD based on the address signal ADD and the column access command signal CAS. For example, the address control circuit 231 may generate the address signal ADD as the row address signal RADD when the row access command signal RAS is enabled. The address control circuit 231 may generate the address signal ADD as the column address signal CADD when the column access command signal CAS is enabled. The address control circuit 231 may transmit the row address signal RADD and the column address signal CADD to the memory apparatus 240 through the address bus 261.

The command buffer 232 may be electrically connected to the command bus 252 to receive the command signal CMD transmitted from the memory controller 220. The command buffer 232 may buffer the command signal CMD, and may transmit the buffered command signal CMD to the memory apparatus 240 through the command bus 262. The command buffer 232 may buffer the active command signal ACT, the row access command signal RAS, the column access command signal CAS, and the write enable signal WE, respectively, and may provide buffered active command signal ACT, buffered row access command signal RAS, buffered column access command signal CAS, and buffered write enable signal WE to the memory apparatus 240. The command buffer 232 may provide the buffered row access command signal RAS and the buffered column access command signal CAS to the address control circuit 231. The address control circuit 231 may generate the row address signal RADD and the column address signal CADD based on the address signal ADD and the row access command signal RAS and the column access command signal CAS received from the command buffer 232. In an embodiment, the command buffer 232 may be modified to generate the write selection signal WTEN and the read selection signal RDEN based on the write enable signal WE. The command buffer 232 may enable the write selection signal WTEN and disable the read selection signal RDEN when the column access command signal CAS is enabled and the write enable signal WE has a first logic level, i.e., when a write operation is performed. The command buffer 232 may enable the read selection signal RDEN and disable the write selection signal WTEN when the column access command signal CAS is enabled and the write enable signal WE has a second logic level, i.e., when a read operation is performed. The command buffer 232 may provide the write selection signal WTEN and the read selection signal RDEN to the data input/output circuit 233 and the memory apparatus 240.

The data input/output circuit 233 may be electrically connected to the memory controller 220 through the write bus 253 and the read bus 254, and may be electrically connected to the memory apparatus 240 through the memory data bus 263. The data input/output circuit 233 may receive the write data signal WTD from the memory controller 220 through the write bus 253, and may generate the memory data signal DQ based on the write data signal WTD. The data input/output circuit 233 may transmit the memory data signal DQ to the memory apparatus 240 through the memory data bus 263. The data input/output circuit 233 may receive the memory data signal DQ from the memory apparatus 240 through the memory data bus 263, and may generate the read data signal RDD based on the memory data signal DQ. The data input/output circuit 233 may transmit the read data signal RDD to the memory controller 220 through the read bus 254. The data input/output circuit 233 may selectively and electrically connect the memory data bus 263 with one of the write bus 253 and the read bus 254 based on the write enable signal WE of the command signal CMD (i.e., based on whether the signal indicates the write operation or the read operation). The data input/output circuit 233 may receive the write selection signal WTEN and the read selection signal RDEN transmitted from the memory controller 220. In an embodiment, the data input/output circuit 233 may receive the write selection signal WTEN and the read selection signal RDEN from the command buffer 232. The data input/output circuit 233 may electrically connect the write bus 253 with the memory data bus 263 based on the write selection signal WTEN, and may electrically connect the read bus 254 with the memory data bus 263 based on the read selection signal RDEN. The data input/output circuit 233 may buffer the write data signal WTD, and may output the buffered write data signal WTD as the memory data signal DQ when the write selection signal WTEN is enabled. The data input/output circuit 233 may receive the memory data signal DQ, buffer the memory data signal DQ, and output the buffered memory data signal DQ as the read data signal RDD, when the read selection signal RDEN is enabled. In an embodiment, the data input/output circuit 233 may convert the data rate of the write data signal WTD to generate the memory data signal DQ. For example, the data input/output circuit 233 may decrease the data rate of the write data signal WTD to generate the memory data signal DQ. The data input/output circuit 233 may convert the data rate of the memory data signal DQ to generate the read data signal RDD. For example, the data input/output circuit 233 may increase the data rate of the memory data signal DQ to generate the read data signal RDD. The data input/output circuit 233 may generate a data strobe signal DQS, transmit the data strobe signal DQS to the memory apparatus 240, and transmit the memory data signal DQ to the memory apparatus 240 in synchronization with the data strobe signal DQS. The data input/output circuit 233 may receive the data strobe signal DQS transmitted from the memory apparatus 240, and may receive the memory data signal DQ transmitted from the memory apparatus 240 in synchronization with the data strobe signal DQS. The data strobe signal DQS transmitted by the data input/output circuit 233 to the memory apparatus 240 may be a write data strobe signal WDQS. The data strobe signal DQS received by the data input/output circuit 233 from the memory apparatus 240 may be a read data strobe signal RDQS. The data input/output circuit 233 may transmit the write data strobe signal WDQS to the memory apparatus 240 through a strobe bus 264, and may receive the read data strobe signal RDQS transmitted from the memory apparatus 240 through the strobe bus 264. The data input/output circuit 233 may generate the write data strobe signal WDQS based on a memory clock signal MCK, which will be described later.

The memory controller 220 and the interface circuit 230 may receive a system clock signal CCK, and may operate in synchronization with the system clock signal CCK. The host 110 illustrated in FIG. 1 may generate the system clock signal CCK, and may provide the system clock signal CCK to the memory controller 220 and the interface circuit 230. In an embodiment, the memory controller 220 may generate the system clock signal CCK, and the memory controller 220 may provide the system clock signal CCK to the interface circuit 230. The memory controller 220 may provide the write data signal WTD to the interface circuit 230 in synchronization with the system clock signal CCK, and may receive the read data signal RDD in synchronization with the system clock signal CCK. The memory controller 220 may further include a clock frequency control circuit 221. The clock frequency control circuit 221 may set and/or change the operating speed of the interface circuit 230 and the memory apparatus 240. The clock frequency control circuit 221 may receive a frequency control signal FS from the host 110. The clock frequency control circuit 221 may generate a clock frequency setting signal CFS based on the frequency control signal FS. The clock frequency setting signal CFS may include information for setting the clock rate of the buses electrically connecting the memory controller 220 and the interface circuit 230 and the buses electrically connecting the interface circuit 230 and the memory apparatus 240.

The interface circuit 230 may further include a clock control circuit 234. The clock control circuit 234 may generate an interface clock signal ICCK and a memory clock signal MCK based on the system clock signal CCK and the clock frequency setting signal CFS. The clock control circuit 234 may generate the interface clock signal ICCK by buffering the system clock signal CCK, and the interface clock signal ICCK may have substantially the same frequency as the system clock signal CCK. The clock control circuit 234 may selectively delay the system clock signal CCK to generate the interface clock signal ICCK in consideration of delays occurring within the interface circuit 230. The clock control circuit 234 may change the frequency of the memory clock signal MCK based on the clock frequency setting signal CFS. For example, the memory clock signal MCK generated by the clock control circuit 234 based on the clock frequency setting signal CFS may have substantially the same frequency as the interface clock signal ICCK, or may have a frequency that is two or four times lower. The clock control circuit 234 may change the frequency of the memory clock signal MCK to set the ratio of clock rates of the write bus 253 and the read bus 254 to the memory data bus 263. The interface circuit 230 may be electrically connected to the memory apparatus 240 through a memory clock bus 265, and the clock control circuit 234 may transmit the memory clock signal MCK to the memory apparatus 240 through the memory clock bus 265. The clock control circuit 234 may provide the memory clock signal MCK and a complementary signal together, and may provide the memory clock signal MCK and the complementary signal as a differential clock signal to the memory apparatus 240.

The data input/output circuit 233 may further receive the clock frequency setting signal CFS, the interface clock signal ICCK, and the memory clock signal MCK. The data input/output circuit 233 may perform a data conversion operation based on the clock frequency setting signal CFS. When it is determined that the frequencies of the interface clock signal ICCK and the memory clock signal MCK are substantially the same according to the clock frequency setting signal CFS, the data input/output circuit 233 may buffer the write data signal WTD to generate the memory data signal DQ, and may buffer the memory data signal DQ to generate the read data signal RDD. When it is determined that the interface clock signal ICCK has a higher frequency than the memory clock signal MCK according to the clock frequency setting signal CFS, the data input/output circuit 233 may perform deserialization and serialization operations, and may perform operations similar to SerDes. The data input/output circuit 233 may deserialize the write data signal WTD to generate the memory data signal DQ, and may serialize the memory data signal DQ to generate the read data signal RDD. For example, the data input/output circuit 233 may latch the write data signal WTD based on the interface clock signal ICCK and transmit the latched write data signal WTD to the memory apparatus 240 as the memory data signal DQ in synchronization with the write data strobe signal WDQS. The data input/output circuit 233 may latch the memory data signal DQ based on the read data strobe signal RDQS, and transmit the latched memory data signal DQ in synchronization with the interface clock signal ICCK to the memory controller 220 as the read data signal RDD.

The interface circuit 230 may further include a training circuit 235. The memory controller 220 may provide a training signal TRS to the interface circuit 230 when a computing system is initialized or upon request of the host 110. The training circuit 235 enables training operations to be performed on internal circuits provided in the interface circuit 230 based on the training signal TRS. The internal circuits in which the training operation is performed will be described in more detail below.

Figure 3:
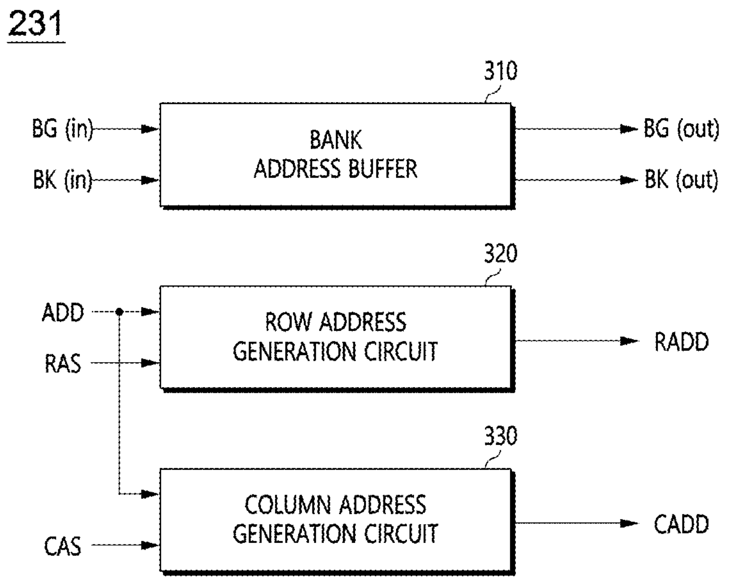
FIG. 3 is a block diagram illustrating a configuration of an address control circuit shown in FIG. 2.

FIG. 3 is a block diagram illustrating a configuration of the address control circuit 231 shown in FIG. 2. Referring to FIGS. 2 and 3, the address control circuit 231 may include a bank address buffer 310, a row address generation circuit 320, and a column address generation circuit 330. The bank address buffer 310 may buffer the bank group signal BG and the bank address signal BK received from the memory controller 220 to generate the bank group signal BG and the bank address signal BK transmitted to the memory apparatus 240. In FIG. 3, the bank group signal and the bank address signal input to the bank address buffer 310 from the memory controller 220 are denoted as BG (in) and BK (in), respectively, and the bank group signal and the bank address signal output from the bank address buffer 310 to the memory apparatus 240 are denoted as BG (out) and BK (out), respectively. The bank address buffer 310 may perform a general buffering operation without changing the characteristics of the bank group signal BG and the bank address signal BK.

The row address generation circuit 320 may receive the address signal ADD from the memory controller 220 and may receive the row access command signal RAS from the command buffer 232. The row address generation circuit 320 may output the address signal ADD as the row address signal RADD when the row access command signal RAS is enabled. The row address generation circuit 320 might not output the address signal ADD as the row address signal RADD when the row access command signal RAS is disabled. The row address generation circuit 320 may transmit the row address signal RADD to the memory apparatus 240.

The column address generation circuit 330 may receive the address signal ADD from the memory controller 220 and may receive the column access command signal CAS from the command buffer 232. The column address generation circuit 330 may output the address signal ADD as the column address signal CADD when the column access command signal CAS is enabled. When the column access command signal CAS is disabled, the column address generation circuit 330 may not output the address signal ADD as the column address signal CADD. The column address generation circuit 330 may transmit the column address signal CADD to the memory apparatus 240.

Figure 4:
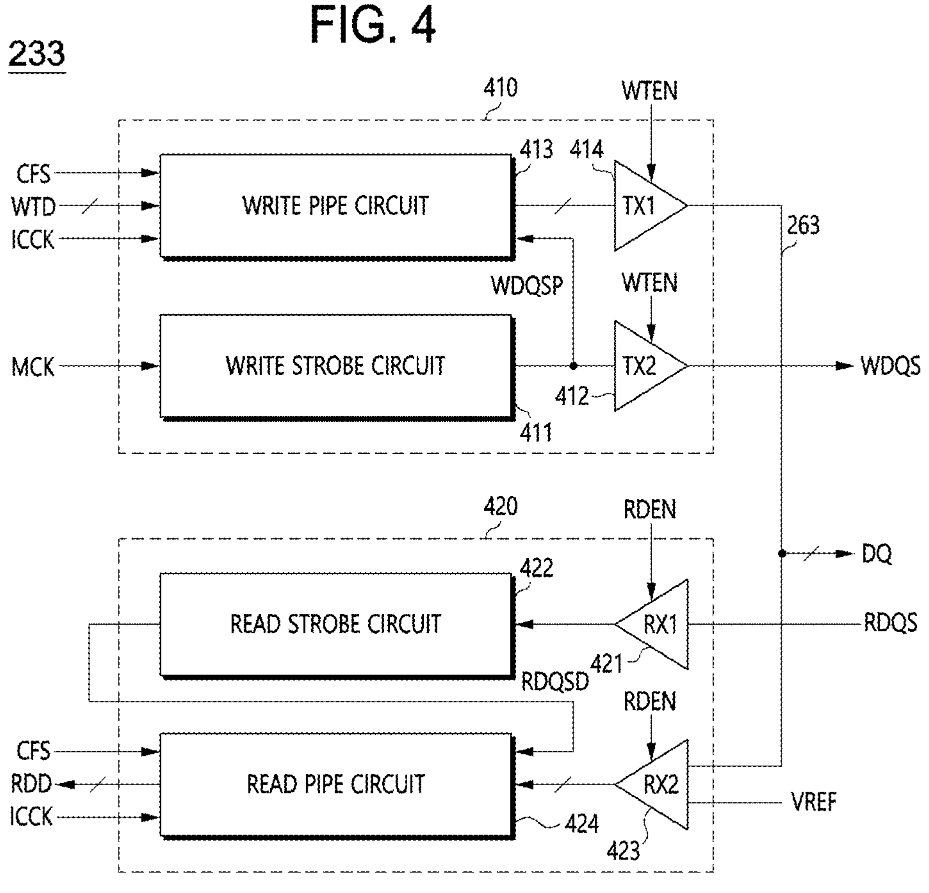
FIG. 4 is a block diagram illustrating a configuration of a data input/output circuit shown in FIG. 2.

FIG. 4 is a diagram illustrating a configuration of the data input/output circuit 233 shown in FIG. 2. Referring to FIGS. 2 and 4, the data input/output circuit 233 may include a write control circuit 410 and a read control circuit 420. The write control circuit 410 may receive the write selection signal WTEN, the write data signal WTD, and the interface clock signal ICCK, and may generate the memory data signal DQ and the write data strobe signal WDQS. The write control circuit 410 may be selectively activated based on the write selection signal WTEN. The write control circuit 410 may generate the write data strobe signal WDQS based on the interface clock signal ICCK. The write control circuit 410 may latch the write data signal WTD based on the interface clock signal ICCK, and may output the latched write data signal WTD as the memory data signal DQ based on the write data strobe signal WDQS.

The write control circuit 410 may include a write strobe circuit 411, a strobe transmitter 412, TX2, a write pipe circuit 413, and a data transmitter 414, TX1. The write strobe circuit 411 may receive the memory clock signal MCK and generate a pre-write data strobe signal WDQSP based on the memory clock signal MCK. The write strobe circuit 411 may buffer or divide the memory clock signal MCK to generate the pre-write data strobe signal WDQSP. In an embodiment, the write strobe circuit 411 may buffer the memory clock signal MCK to generate the pre-write data strobe signal WDQSP including a differential clock signal having a phase difference of 180 degrees. In an embodiment, the write strobe circuit 411 may divide the memory clock signal MCK to generate the pre-write data strobe signal WDQSP including multi-phase clock signals having a phase difference of 90 degrees. The write strobe circuit 411 may selectively delay the interface clock signal ICCK so that the memory data signal DQ and the pre-write data strobe signal WDQSP can be synchronized, and then generate the pre-write data strobe signal WDQSP based on a delayed interface clock signal ICCK. The strobe transmitter 412 may be electrically connected to the write strobe circuit 411 to receive the pre-write data strobe signal WDQSP. The strobe transmitter 412 may receive the write selection signal WTEN and may be activated when the write selection signal WTEN is enabled. The strobe transmitter 412 may transmit the write strobe signal WDQS to the memory apparatus 240 based on the pre-write data strobe signal WDQSP. The write strobe signal WDQS may be substantially the same signal as the pre-write data strobe signal WDQSP.

The write pipe circuit 413 may receive the write data signal WTD, the interface clock signal ICCK, and the pre-write data strobe signal WDQSP. The write pipe circuit 413 may sequentially store the write data signal WTD in synchronization with the interface clock signal ICCK. The write pipe circuit 413 may output the sequentially stored write data signal WTD as the memory data signal DQ in synchronization with the pre-write data strobe signal WDQSP. The write pipe circuit 413 may be implemented with a deserializer that converts a ratio of the duration of the write data signal WTD and the memory data signal DQ to 1:1, 1:2, or 1:4 depending on a frequency ratio of the interface clock signal ICCK to the pre-write data strobe signal WDQSP and/or the write data strobe signal WDQS. The write pipe circuit 413 may further receive the clock frequency setting signal CFS. Based on the clock frequency setting signal CFS, the write pipe circuit 413 may determine a frequency ratio of the interface clock signal ICCK and the write data strobe signal WDQS, and may change the ratio of the duration of the write data signal WTD and the memory data signal DQ. The data transmitter 414 may be electrically connected with the write pipe circuit 413 to receive an output signal of the write pipe circuit 413. The data transmitter 414 may receive the write selection signal WTEN and may be activated when the write selection signal WTEN is enabled. The data transmitter 414 may drive the memory data bus 263 based on the output signal of the write pipe circuit 413 to transmit the memory data signal DQ to the memory apparatus 240.

The read control circuit 420 may receive the read selection signal RDEN, the memory data signal DQ, the interface clock signal ICCK, and the read data strobe signal RDQS, and may generate the read data signal RDD. The read control circuit 420 may be selectively activated based on the read selection signal RDEN. The read control circuit 420 may latch the memory data signal DQ based on the read data strobe signal RDQS, and may output a latched memory data signal DQ as the read data signal RDD based on the interface clock signal ICCK.

The read control circuit 420 may include a strobe receiver 421, RX1, a read strobe circuit 422, a data receiver 423, RX2, and a read pipe circuit 424. The strobe receiver 421 may receive the read selection signal RDEN and the read data strobe signal RDQS. The strobe receiver 421 may be activated when the read selection signal RDEN is enabled. The strobe receiver 421 may receive the read data strobe signal RDQS from the memory apparatus 240. The read data strobe signal RDQS may include a differential clock signal having a phase difference of 180 degrees, or may include multi-phase clock signals having a phase difference of 90 degrees. The read strobe circuit 422 may be electrically connected to the strobe receiver 421 to receive an output signal of the strobe receiver 421, and may buffer the output signal of the strobe receiver 421. The read strobe circuit 422 may selectively delay the output signal of the strobe receiver 421 to match a delay time of the memory data signal DQ with a delay time of the read data strobe signal RDQS. The read strobe circuit 422 may generate a delayed read data strobe signal RDQSD from the output signal of the strobe receiver 421. The delayed read data strobe signal RDQSD may have substantially the same frequency characteristics as the read strobe signal RDQS.

The data receiver 423 may receive the read selection signal RDEN and the memory data signal DQ. The data receiver 423 may be selectively activated based on the read selection signal RDEN. The data receiver 423 may use a reference voltage VREF to receive the memory data signal DQ. The reference voltage VREF may have an appropriate voltage level based on a range of voltage level in which the memory data signal DQ swings. For example, when the memory data signal DQ is an NRZ signal, the reference voltage VREF may have a voltage level corresponding to a middle of the voltage level range in which the memory data signal DQ swings. The read pipe circuit 424 may receive the memory data signal DQ, the delayed read data strobe signal RDQSD, and the interface clock signal ICCK. The read pipe circuit 424 may sequentially store the memory data signal DQ in synchronization with the delayed read data strobe signal RDQSD. The read pipe circuit 424 may output the sequentially stored memory data signal DQ as the read data signal RDD in synchronization with the interface clock signal ICCK. The read pipe circuit 424 may be implemented with a serializer that converts the ratio of the duration of the memory data signal DQ and the read data signal RDD to 1:1, 2:1, or 4:1 depending on a frequency ratio of the delayed read data strobe signal RDQSD and/or the read data strobe signal RDQS to the interface clock signal ICCK. The read pipe circuit 424 may further receive the clock frequency setting signal CFS. The read pipe circuit 424 may determine a frequency ratio of the interface clock signal ICCK and the read strobe signal RDQS based on the clock frequency setting signal CFS, and may change the ratio of the duration of the memory data signal DQ and the read data signal RDD.

Figure 5:
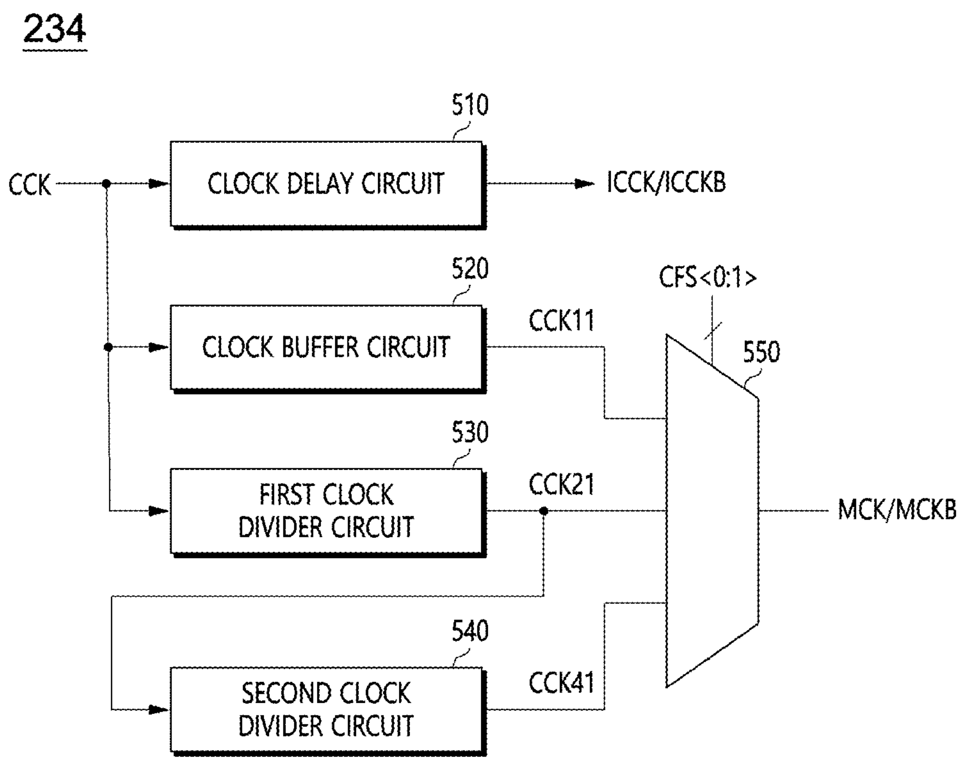
FIG. 5 is a block diagram illustrating a configuration of a clock control circuit shown in FIG. 2.

FIG. 5 is a diagram illustrating a configuration of the clock control circuit 234 shown in FIG. 2. Referring to FIG. 5, the clock control circuit 234 may include a clock delay circuit 510, a clock buffer circuit 520, a first clock divider circuit 530, a second clock divider circuit 540, and a clock selection circuit 550. The clock delay circuit 510 may receive the system clock signal CCK and may buffer the system clock signal CCK. The system clock signal CCK may be selectively delayed to generate an interface clock signal pair ICCK, ICCKB. The clock delay circuit 510 may generate the interface clock signal pair ICCK, ICCKB without substantially delaying the system clock signal CCK (except for a delay caused by a buffering operation). The clock delay circuit 510 may delay the system clock signal CCK by an arbitrary delay time (in addition to the delay time caused by the buffering operation) to generate the interface clock signal pair ICCK, ICCKB having a lagging phase relative to the system clock signal CCK. The clock delay circuit 510 may include digital and/or analog variable delay lines, and the delay time of the clock delay circuit 510 may be changed based on any digital and/or analog control signal.

The clock buffer circuit 520 may receive the system clock signal CCK, and may buffer the system clock signal CCK to generate a first clock signal pair CCK11. The first clock signal pair CCK11 may have substantially the same frequency as the system clock signal CCK. The first clock divider circuit 530 may receive the system clock signal CCK, and may divide a frequency of the system clock signal CCK by two to generate a second clock signal pair CCK21. The frequency of the second clock signal pair CCK21 may be ½ of the system clock signal CCK. The second clock divider circuit 540 may divide the frequency of the second clock signal pair CCK21 by two to generate a third clock signal pair CCK41. The frequency of the third clock signal pair CCK41 may be ½ of the frequency of the second clock signal pair CCK21, and may be ¼ of the frequency of the system clock signal CCK.

The clock selection circuit 550 may receive the first clock signal pair CCK11, the second clock signal pair CCK21, the third clock signal pair CCK41, and the clock frequency setting signal CFS. The clock selection circuit 550 may output one of the first to third clock signal pairs CCK11, CCK21, CCK41 as a memory clock signal pair MCK, MCKB based on the clock frequency setting signal CFS. The clock frequency setting signal CFS may be a digital signal having at least two bits. The clock selection circuit 550 may output the first clock signal pair CCK11 as the memory clock signal pair MCK, MCKB when the clock frequency setting signal CFS has a first logic value. The clock selection circuit 550 may output the second clock signal pair CCK21 as the memory clock signal pair MCK, MCKB when the clock frequency setting signal CFS has a second logic value. The clock selection circuit 550 may output the third clock signal pair CCK41 as the memory clock signal pair MCK, MCKB when the clock frequency setting signal CFS has a third logic value. The clock selection circuit 550 may be implemented with a 3 to 1 multiplexer using the clock frequency setting signal CFS as a control signal. Referring again to FIG. 2, the training circuit 235 may perform a training operation on the components shown in FIGS. 3 to 5 based on the training signal TRS. For example, based on the training signal TRS, the training circuit 235 may adjust the driving strength and/or delay time of the bank address buffer 310, the data transmitter 414, the write strobe circuit 411, and the strobe transmitter 412, the strobe receiver 421, the read strobe circuit 422, the data receiver 423, the clock delay circuit 510, the clock buffer circuit 520, etc.

Figure 6:
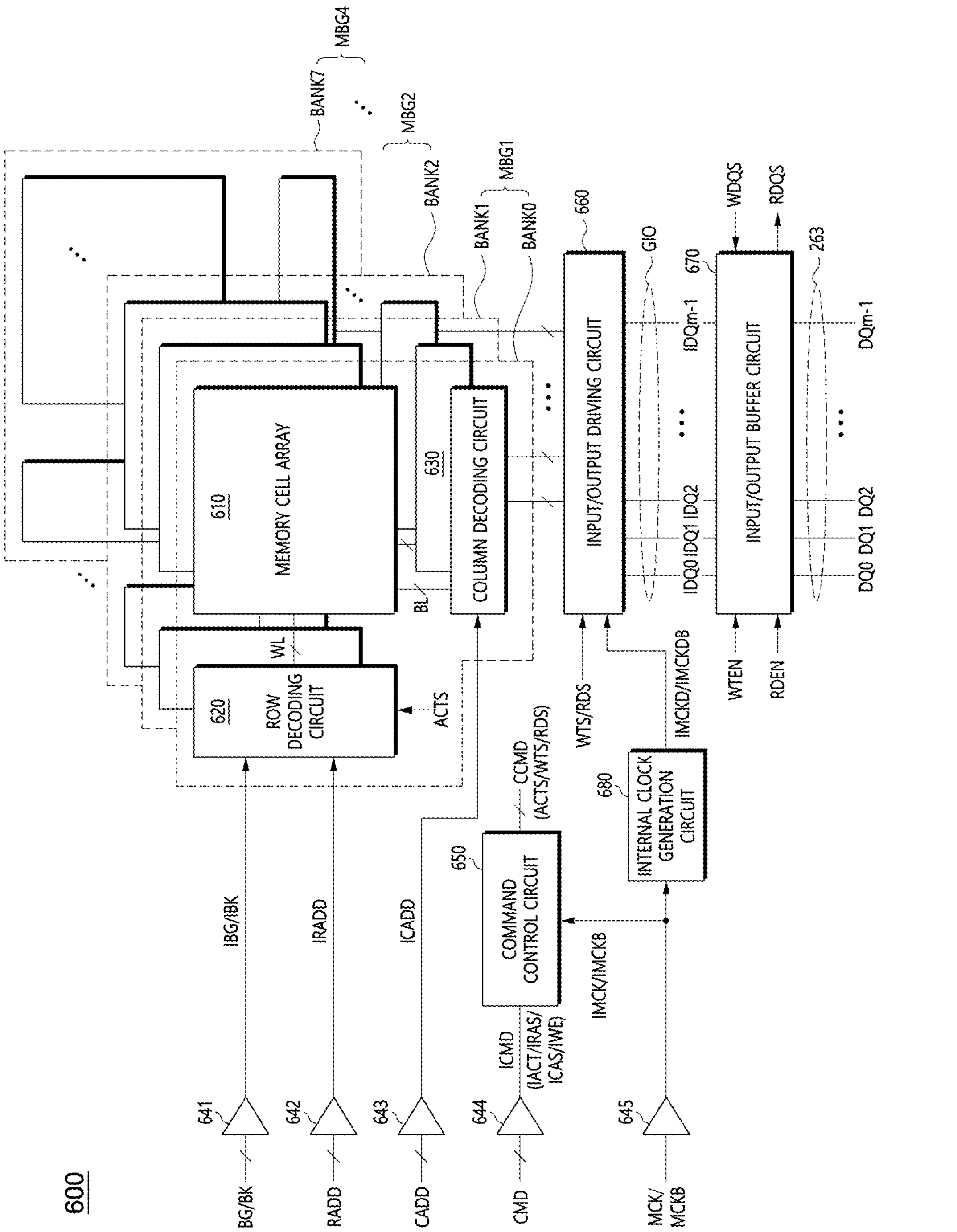
FIG. 6 is a diagram illustrating a configuration of a memory die according to an embodiment of the present disclosure.

FIG. 6 is a diagram illustrating a configuration of a memory die 600 according to an embodiment of the present disclosure. The memory apparatus 240 shown in FIG. 2 may include the memory die 600. When the memory apparatus 240 includes a plurality of memory dies, the plurality of memory dies may each have substantially the same configuration as the memory die 600. Referring to FIGS. 2 and 6, the memory die 600 may receive the bank group signal BG, the bank address signal BK, the row address signal RADD, the column address signal CADD, the command signal CMD, the memory clock signal pair MCK, MCKB, and the memory data signal DQ from the interface circuit 230. The memory die 600 may include a plurality of memory bank groups MBG1 to MBG4, a first address receiver 641, a second address receiver 642, a third address receiver 643, a command receiver 644, a clock receiver 645, a command control circuit 650, an input/output driving circuit 660, and an input/output buffer circuit 670. The memory die 600 may include a first to fourth memory bank groups MBG1 to MBG4. While FIG. 6 illustrates that the number of memory bank groups included by the memory die 600 is four, the number of memory bank groups included by the memory die 600 may be two, eight or more. Each of the first to fourth memory bank groups may include a plurality of memory banks BANK0, BANK1, BANK2, . . . , BANK7. For example, the first to fourth memory bank groups MBG1 to MBG4 may each include two memory banks. The first memory bank group MBG1 may include a first memory bank BANK0 and a second memory bank BANK1, the second memory bank group MBG1 may include a third memory bank BANK3 and a fourth memory bank, the third memory bank group may include a fifth memory bank and a sixth memory bank, and the fourth memory bank group MBG4 may include a seventh memory bank and an eighth memory bank BANK7. In FIG. 6, each memory bank group includes two memory banks, but the number of memory banks included in each memory bank group may be four or more. Each of the first to eighth memory banks BANK0, BANK2, BANK3, . . . , BANK7 may include a memory cell array 610, a row decoding circuit 620, and a column decoding circuit 630. The memory cell array 610, the row decoding circuit 620, and the column decoding circuit 630 may be provided as many in number as the number of the memory banks. A plurality of row lines WL may be disposed in a row direction of each memory cell array, a plurality of column lines BL may be disposed in a column direction of each memory cell array, and a plurality of memory cells may be electrically connected at points where the plurality of row lines and the plurality of column lines intersect.

Each of the row decoding circuits 620 may receive an internal bank group signal IBG, an internal bank address signal IBK, an internal row address signal IRADD, and an active signal ACTS. Each of the row decoding circuits 620 may select and/or enable a row line of the memory cell array 610 provided in the first to eighth memory bank when the active signal ACTS is enabled. Each of the row decoding circuits 620 may decode the internal bank group signal IBG to select and/or access at least one memory bank group of the plurality of memory bank groups MBG1 to MBG4. Each of the row decoding circuits 620 may decode the internal bank address signal IBK to select and/or access at least one memory bank of a plurality of memory banks of a selected memory bank group. Each of the row decoding circuits 620 may select and/or enable at least one of a plurality of row lines disposed in each of the memory cell arrays 610 based on the internal row address signal IRADD. Each of the column decoding circuits 630 may receive an internal column address signal ICADD. Each of the column decoding circuits 630 may decode the internal column address signal ICADD to select and/or access at least one of a plurality of column lines disposed in each of the memory cell arrays 610.

The first address receiver 641 may receive the bank group signal BG and the bank address signal BK transmitted from the interface circuit 230 through the address bus 261. The first address receiver 641 may receive the bank group signal BG and the bank address signal BK to generate an internal bank group signal IBG and an internal bank address signal IBK. The first address receiver 641 may generate the internal bank group signal IBG and the internal bank address signal IBK having substantially the same characteristics as the bank group signal BG and the bank address signal BK, without changing the characteristics of the bank group signal IBG and the bank address signal IBK. The first address receiver 641 may provide the internal bank group signal IBG and the internal bank address signal IBK to the respective row decoding circuits 620. The second address receiver 642 may receive the row address signal RADD transmitted from the interface circuit 230 through the address bus 261. The second address receiver 642 may receive the row address signal RADD to generate an internal row address signal IRADD. The second address receiver 642 may generate the internal row address signal IRADD having substantially the same characteristics as the row address signal RADD without changing the characteristics of the row address signal RADD. The second address receiver 642 may provide the internal row address signal IRADD to the respective row decoding circuits 620. The third address receiver 643 may receive the column address signal CADD transmitted from the interface circuit 230 through the address bus 261. The third address receiver 643 may receive the column address signal CADD to generate an internal column address signal ICADD. The third address receiver 643 may generate the internal column address signal ICADD having substantially the same characteristics as the column address signal CADD without changing the characteristics of the column address signal CADD. The third address receiver 643 may provide the internal column address signal ICADD to the respective column decoding circuits 630. The command receiver 644 may receive the command signal CMD transmitted from the interface circuit 230 through the command bus 262. The command receiver 644 may receive the command signal CMD to generate an internal command signal ICMD. The internal command signal ICMD may include an internal active command signal IACT, an internal row access command signal IRAS, an internal column access command signal ICAS, and an internal write enable signal IWE. The command receiver 644 may provide the internal command signal ICMD to the command control circuit 650. The clock receiver 645 may receive the memory clock signal pair MCK, MCKB transmitted from the interface circuit 230 through the memory clock bus 265. The clock receiver 645 may receive the memory clock signal pair MCK, MCKB to generate an internal clock signal pair IMCK, IMCKB.

The command control circuit 650 may receive the internal command signal ICMD and the internal memory clock signal pair IMCK, IMCKB. The command control circuit 650 may latch the internal command signal ICMD in synchronization with the internal memory clock signal pair IMCK, IMCKB. The command control circuit 650 may generate a conversion command signal CCMD based on the internal command signal ICMD. The command control circuit 650 may combine logic levels of at least one of the internal command signal ICMD to generate the conversion command signal CCMD. The conversion command signal CCMD may include at least an active signal ACTS, a write signal WTS, and a read signal RDS. The active signal ACTS may be a signal that instructs an active operation of the memory die 600, and the active operation may be an operation that selects and/or enables a row line of the memory cell array 610. The write signal WTS may be a signal that instructs a write operation of the memory die 600, and the write operation may be an operation of the memory die 600 storing the memory data signal DQ received through the memory data bus 263 into the memory cell array 610. The read signal RDS may be a signal that instructs a read operation of the memory die 600, and the read operation may be an operation of the memory die 600 outputting data stored in the memory cell array 610 as the memory data signal DQ through the memory data bus 263. The command control circuit 650 may delay the internal command signal ICMD by a time corresponding to a latency to generate the conversion command signal CCMD. The latency may refer to a delay time from when the memory die 600 receives the command signal CMD until the memory die 600 actually performs an operation directed by the command signal CMD. For example, the latency may include a CAS latency, a write latency, a read latency, or the like. The latency may be defined as an integer of one or more, and the latency of the command control circuit 650 according to the latency may be set to an integer multiple of a clock cycle of the memory clock signal pair MCK, MCKB. The command control circuit 650 may provide the conversion command signal CCMD to internal circuits of the memory die 600. The command control circuit 650 may provide the active signal ACTS to the respective row decoding circuits 620. The command control circuit 650 may provide the write signal WTS and the read signal RDS to the input/output driving circuit 660.

The input/output driving circuit 660 may be electrically connected to a plurality of column lines of the respective memory cell array 610 through each of the column decoding circuit 630. The input/output driving circuit 660 may receive the write signal WTS and the read signal RDS. Based on the write signal WTS, the input/output driving circuit 660 may provide internal data signals IDQ0, IDQ1, IDQ2, . . . , IDQm−1 (wherein m is an integer of 4 or more) transmitted through a global data line GIO to each of the memory cell array 610 through each of the column decoding circuit 630, and the internal data signals IDQ0, IDQ1, IDQ2, . . . , IDQm−1 may be stored in memory cells electrically connected with column lines accessed by the each of the column decoding circuit 630. The input/output driving circuit 660 may include a write driver circuit for providing the internal data signals IDQ0, IDQ1, IDQ2, . . . , IDQm−1 to the respective memory cell array 610 based on the write signal WTS. The input/output driving circuit 660 may receive data signal output from each of the memory cell array 610 based on the read signal RDS. The input/output driving circuit 660 may generate the internal data signals IDQ0, IDQ1, IDQ2, . . . , IDQm−1 by receiving output data signals output from the respective memory cell arrays 610 through the respective column decoding circuit 630. The input/output driving circuit 660 may output the internal data signals IDQ0, IDQ1, IDQ2, . . . , IDQm−1 through the global data line GIO. The input/output driving circuit 660 may include a read driver circuit for providing data signals output from the respective memory cell arrays 610 to the global data line GIO based on the read signal RDS. The input/output driving circuit 660 may operate based on the internal memory clock signal pair IMCK, IMCKB. The memory die 600 may further include an internal clock generation circuit 680. The internal clock generation circuit 680 may receive the internal memory clock signal pair IMCK, IMCKB, and may delay the internal memory clock signal pair IMCK, IMCKB to generate a delayed memory clock signal pair IMCKD, IMCKDB. The internal clock generation circuit 680 may provide the delayed memory clock signal pair IMCKD, IMCKDB to the input/output driving circuit 660, and the input/output driving circuit 660 may receive the internal data signals IDQ0, IDQ1, IDQ2, . . . , IDQm−1 in synchronization with the delayed memory clock signal pair IMCKD, IMCKDB, and may output the internal data signals IDQ0, IDQ1, IDQ2, . . . , IDQm−1 in synchronization with the delayed memory clock signal pair IMCKD, IMCKDB.

The input/output buffer circuit 670 may be electrically connected with the interface circuit 230 through the memory data bus 263, and may be electrically connected with the input/output driving circuit 660 through the global data line GIO. During the write operation, the input/output buffer circuit 670 may generate the internal data signals IDQ0, IDQ1, IDQ2, . . . , IDQm−1 based on memory data signals DQ0, DQ1, DQ2, . . . , DQm−1 transmitted from the interface circuit 230 through the memory data bus 263, and output the internal data signals IDQ0, IDQ1, IDQ2, . . . , IDQm−1 to the global data line GIO. During the read operation, the input/output buffer circuit 670 receives the internal data signals IDQ0, IDQ1, IDQ2, . . . , IDQm−1 transmitted from the input/output driving circuit 660 through the global data line GIO, generate the memory data signals DQ0, DQ1, DQ2, . . . , DQm−1 based on the internal data signals IDQ0, IDQ1, DQ2, . . . , DQm−1, and transmit the memory data signals DQ0, DQ1, DQ2, . . . , DQm−1 to the interface circuit 230 through the memory data bus 263. The input/output buffer circuit 670 may buffer the memory data signals DQ0, DQ1, DQ2, . . . , DQm−1 during the write operation to generate the internal data signals IDQ0, IDQ1, IDQ2, . . . , IDQm−1, and buffer the internal data signals IDQ0, IDQ1, IDQ2, . . . , IDQm−1 during the read operation to generate the memory data signals DQ0, DQ1, DQ2, . . . , DQm−1. The internal data signals IDQ0, IDQ1, IDQ2, . . . , IDQm−1 and the memory data signals DQ0, DQ1, DQ2, . . . , DQm−1 may be data signals of substantially the same type or of the same characteristics, and the type or characteristics of the internal data signals IDQ0, IDQ1, IDQ2, . . . , IDQm−1 and the memory data signals DQ0, DQ1, DQ2, . . . , DQm−1 might not be changed by the input/output buffer circuit 670.

For example, the internal data signals IDQ0, IDQ1, IDQ2, . . . , IDQm−1 and the memory data signals DQ0, DQ1, DQ2, . . . , DQm−1 may be parallel data signals having the same number of bits. The number of signal transmission lines included in the global data line GIO may be substantially the same as the number of signal transmission lines included in the memory data bus 263. A width of the data signal stored in each of the memory cell array 610 through a single write operation may be substantially the same as a width of the internal data signals IDQ0, IDQ1, IDQ2, . . . , IDQm−1 and a width of the memory data signals DQ0, DQ1, DQ2, . . . , DQm−1. A width of the data signal output from each of the memory cell array 610 in a single read operation may be substantially the same as a width of the internal data signals IDQ0, IDQ1, IDQ2, . . . , IDQm−1 and a width of the memory data signals DQ0, DQ1, DQ2, . . . , DQm−1. A width of the data signal may mean the number and/or the number of bits of the data signal. The input/output buffer circuit 670 may receive the write data strobe signal WDQS and generate the read data strobe signal RDQS. During the write operation, the input/output buffer circuit 670 may receive the write data strobe signal WDQS from the interface circuit 230 shown in FIG. 2, and may receive the memory data signals DQ0, DQ1, DQ2, . . . , DQm−1 transmitted from the interface circuit 230 in synchronization with the write data strobe signal WDQS. During the read operation, the input/output buffer circuit 670 may generate the read data strobe signal RDQS based on the write data strobe signal WDQS. The input/output buffer circuit 670 may output the memory data signals DQ0, DQ1, DQ2, . . . , DQm−1 to the interface circuit 230 in synchronization with the read data strobe signal RDQS. The input/output buffer circuit 670 may output the read data strobe signal RDQS along with the memory data signals DQ0, DQ1, DQ2, . . . , DQm−1 to the interface circuit 230. The input/output buffer circuit 670 may further receive the write selection signal WTEN and the read selection signal RDEN. The input/output buffer circuit 670 may activate a write path of the input/output buffer circuit 670 based on the write selection signal WTEN and may activate a read path of the input/output buffer circuit 670 based on the read selection signal RDEN. For example, the input/output buffer circuit 670 may include a transmitter for outputting the memory data signals DQ0, DQ1, DQ2, . . . , DQm−1 to the interface circuit 230 and a receiver for receiving the memory data signals DQ0, DQ1, DQ2, . . . , DQm−1 transmitted from the interface circuit 230. The transmitter of the input/output buffer circuit 670 may be activated based on the write selection signal WTEN. The receiver of the input/output buffer circuit 670 may be activated based on the read selection signal RDEN.

Because the memory die 600 receives the row address signal RADD and the column address signal CADD from the interface circuit 230, the memory die 600 might not have circuits for converting the address signal ADD to the row address signal RADD and the column address signal CADD according to the command signal CMD and for latching the converted address signals. For example, the input/output buffer circuit 670 might not include a SerDes to serialize the internal data signals IDQ0, IDQ1, IDQ2, . . . , IDQm−1 or to deserialize the memory data signals DQ0, DQ1, DQ2, . . . , DQm−1. With a large number of removable circuits, the memory die 600 may have a larger data storage capacity compared to a conventional memory die, and the memory die 600 may be smaller than a conventional memory die while maintaining the same data storage capacity. Furthermore, when the input/output buffer circuit 670 does not perform serialization and deserialization operations on data signals, timing delay of the command control circuit 650, that is, latencies of the memory die 600 and a memory apparatus including the memory die 600, may be very short compared to a conventional memory die and memory apparatus. Thus, the memory die 600 can perform a write operation and a read operation on more data signals in a shorter time period compared with a conventional device.

Figure 7:
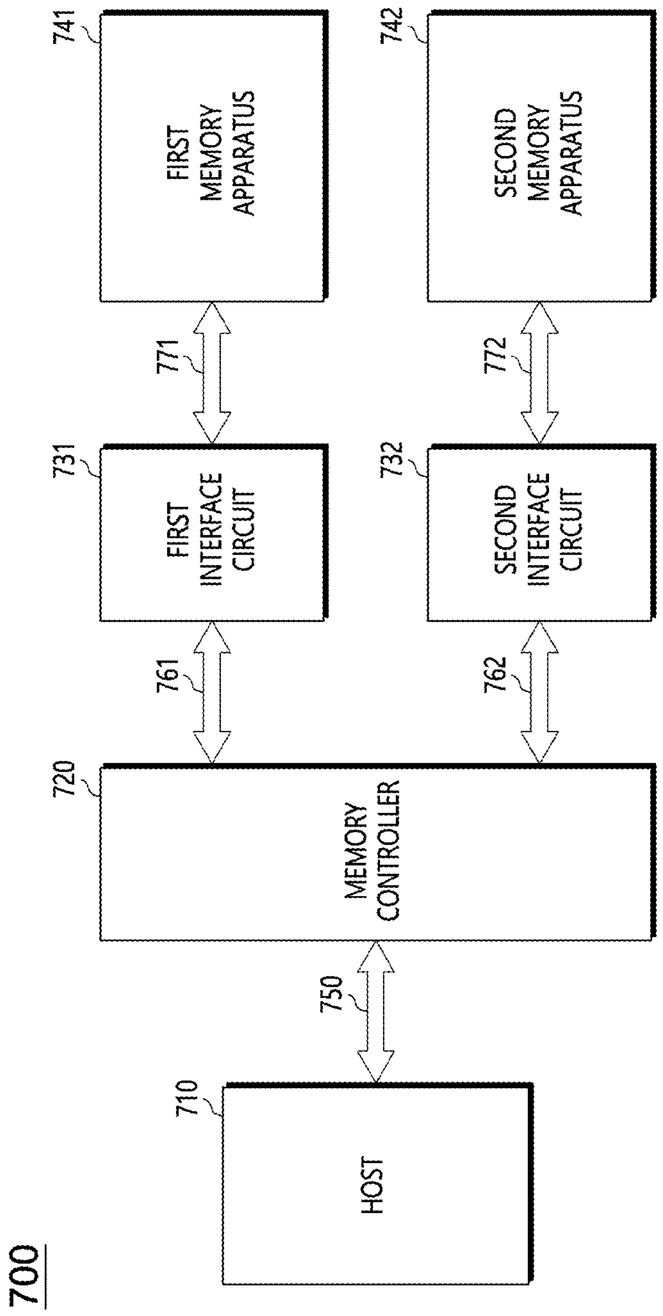
FIG. 7 is a diagram illustrating a configuration of a computing system according to an embodiment of the present disclosure.

FIG. 7 is a diagram illustrating a configuration of a computing system 700 according to an embodiment of the present disclosure. Referring to FIG. 7, the computing system 700 may include a host 710, a memory controller 720, a first interface circuit 731, a second interface circuit 732, a first memory apparatus 741, and a second memory apparatus 742. The host 710 may be electrically connected to the memory controller 720 through a host bus 750. The memory controller 720 may be electrically connected to the first interface circuit 731 through a first controller bus 761, and may be electrically connected to the second interface circuit 732 through a second controller bus 762. The first interface circuit 731 may be electrically connected to the first memory apparatus 741 through a first memory bus 771. The second interface circuit 732 may be electrically connected to the second memory apparatus 742 through a second memory bus 772. The host 710 may have substantially the same configuration as the host 110 illustrated in FIG. 1 and may perform substantially the same functions. The memory controller 720 may have substantially the same configuration and perform substantially the same functions as the memory controller 120 shown in FIG. 1. However, the memory controller 720 may be electrically connected to first and second controller buses 761, 762 to enable data communication with a plurality of memory apparatuses. The host 710 may access any one of the first and second memory apparatuses 741, 742 or may access both the first and second memory apparatuses 741, 742 simultaneously through the memory controller 720 and the first and second controller buses 761, 762. The host 710 may independently generate an access request for the first memory apparatus 741 and an access request for the second memory apparatus 742 to access the first and second memory apparatuses 741, 742 separately or simultaneously. The memory controller 720 may independently generate a control signal for accessing the first memory apparatus 741 and a control signal for accessing the second memory apparatus 742 to access the first and second memory apparatuses 741, 742 separately or simultaneously.

The host bus 750 may have substantially the same type and characteristics as the first bus 150 illustrated in FIG. 1. The first controller bus 761 may have substantially the same type and characteristics as the second bus 160 shown in FIG. 1. The first memory bus 771 may have substantially the same type and characteristics as the third bus 170 shown in FIG. 1. In an embodiment, a width of the data bus included in the first controller bus 761 may be less than or equal to a width of the data bus included in the first memory bus 771. The first interface circuit 731 may have substantially the same configuration and perform substantially the same functions as the interface circuits 130, 230 illustrated in FIGS. 1 and 2. The first memory apparatus 741 may have substantially the same configuration and perform substantially the same functions as the memory apparatuses 140, 240 shown in FIGS. 1 and 2.

The second controller bus 762 may have substantially the same type and characteristics as the first controller bus 761. The second memory bus 772 may have substantially the same type and characteristics as the first memory bus 771. In an embodiment, a width of the data bus included in the second controller bus 762 may be less than or equal to a width of the data bus included in the second memory bus 772. The second interface circuit 732 may have substantially the same configuration as the first interface circuit 731 and may perform substantially the same functions. The second memory apparatus 742 may have substantially the same configuration as the first memory apparatus 741 and may perform substantially the same functions.

In an embodiment, the second memory bus 772 may have a different type and characteristics than the first memory bus 771. For example, the second memory bus 772 may include a serial data bus. A width of the data bus included in the second memory bus 772 may be less than a width of the data bus included in the second controller bus 762. A clock rate of the second memory bus 772 may be higher than a clock rate of the second controller bus 762. In this case, the second interface circuit 732 may have a different configuration than the first interface circuit 731 and perform different functions, and the second memory apparatus 742 may have a different configuration than the first memory apparatus 741 and perform different functions. For example, the first interface circuit 731 and the first memory apparatus 741 may perform parallel data communication, while the second interface circuit 732 and the second memory apparatus 742 may perform serial data communication. The first interface circuit 731 and the first memory apparatus 741 do not need to perform data conversion, and therefore might not be equipped with a SerDes. The second interface circuit 732 and the second memory apparatus 742 need to perform data conversion for serial data communication, and therefore may include a SerDes.

In an embodiment, the host 710, the memory controller 720, the first interface circuit 731 and the second interface circuit 732 may be integrated into a first device, and the first memory apparatus 741 and the second memory apparatus 742 may be integrated into a second device. Alternatively, the first memory apparatus 741 may constitute the second device and the second memory apparatus 742 may constitute a third device. The host 710, the memory controller 720, the first interface circuit 731, and the second interface circuit 732 may be disposed on a first interposer and/or a first substrate. The first and second memory apparatuses 741, 742 may be disposed on a second interposer and/or a second substrate. The host bus 750, the first and second controller buses 761, 762 may be internal buses, and the first and second memory buses 771, 772 may be external buses. In an embodiment, the first memory apparatus 741 may be disposed on a second interposer and/or a second substrate, and the second memory apparatus 742 may be disposed on a third interposer and/or a third substrate.

In an embodiment, the host 710 and the memory controller 720 may be integrated into a first device, and the first and second interface circuits 731, 732 and the first and second memory apparatuses 741, 742 may be integrated into a second device. Alternatively, the first interface circuit 731 and the first memory apparatus 741 may be integrated into a second device, and the second interface circuit 732 and the second memory apparatus 742 may be integrated into a third device. The host 710 and the memory controller 720 may be disposed on a first interposer and/or a first substrate. The first interface circuit 731, the second interface circuit 732, the first memory apparatus 741, and the second memory apparatus 742 may be disposed on a second interposer and/or a second substrate. The host bus 750, the first memory bus 771 and the second memory bus 772 may be internal buses, and the first and second controller buses 761, 762 may be external buses. In an embodiment, the first interface circuit 731 and the first memory apparatus 741 may be disposed on a second interposer and/or a second substrate, and the second interface circuit 732 and the second memory apparatus 742 may be disposed on a third interposer and/or a third substrate.

In an embodiment, the host 710 may constitute a first device, and the memory controller 720, the first and second interface circuits 731, 732, and the first and second memory apparatuses 741, 742 may be integrated into a second device. The host 710 may be disposed on a first interposer and/or a first substrate. The memory controller 720, the first interface circuit 731, the second interface circuit 732, the first memory apparatus 741, and the second memory apparatus 742 may be disposed on a second interposer and/or a second substrate. The host bus 750 may be an external bus, the first and second controller buses 761, 762, and the first and second memory buses 771, 772 may be internal buses. In an embodiment, the host 710, the memory controller 720, the first and second interface circuits 731, 732, and the first and second memory apparatuses 741, 742 may be disposed on a single interposer and/or a single substrate. The host bus 750, the first and second controller buses 761, 762, and the first and second memory buses 771, 772 may all be internal buses. In an embodiment, some or all of the host 710, the memory controller 720, the first and second interface circuits 731, 732, and the first and second memory apparatuses 741, 742 may be manufactured as chiplets.

Figure 8:
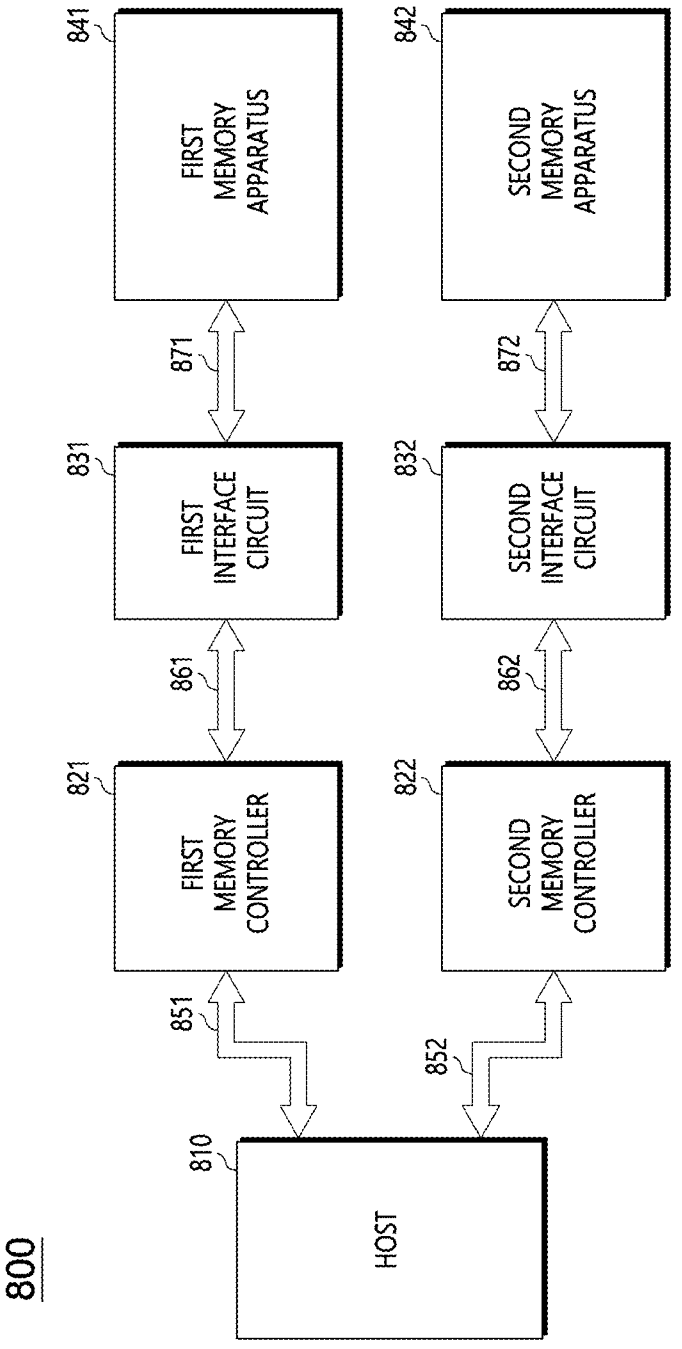
FIG. 8 is a diagram illustrating a configuration of a computing system according to an embodiment of the present disclosure.

FIG. 8 is a diagram illustrating a configuration of a computing system 800 according to an embodiment of the present disclosure. Referring to FIG. 8, the computing system 800 may include a host 810, a first memory controller 821, a second memory controller 822, a first interface circuit 831, a second interface circuit 832, a first memory apparatus 841, and a second memory apparatus 842. The first memory controller 821 may be electrically connected to the host 810 through a first host bus 851. The second memory controller 822 may be electrically connected to the host 810 through a second host bus 852. The first interface circuit 831 may be electrically connected to the first memory controller 821 through a first controller bus 861. The second interface circuit 832 may be electrically connected to the second memory controller 822 through a second controller bus 862. The first memory apparatus 841 may be electrically connected to the first interface circuit 831 through a first memory bus 871. The second memory apparatus 842 may be electrically connected to the second interface circuit 832 through a second memory bus 872. The host 810 may be independently electrically connected with the first and second memory controllers 821, 822 for independent access to the first and second memory apparatuses 841, 842. The host 810 may independently generate a first access request to the first memory apparatus 841 and a second access request to the second memory apparatus 842. In an embodiment, the host 810 may include a plurality of processor cores to independently generate the first and second access requests. The host 810 may provide the first access request to the first memory controller 821 through the first host bus 851, and may provide the second access request to the second memory controller 822 through the second host bus 852.

The first host bus 851 and the second host bus 852 may each have substantially the same type and characteristics as the first bus 150 illustrated in FIG. 1. The first controller bus 861 and the second controller bus 862 may each have substantially the same type and characteristics as the second bus 160 shown in FIG. 1. The first memory bus 871 may have substantially the same type and characteristics as the third bus 170 shown in FIG. 1. In an embodiment, a width of the data bus included in the first controller bus 861 may be less than or equal to a width of the data bus included in the first memory bus 871. The first interface circuit 831 may have substantially the same configuration and perform substantially the same functions as the interface circuits 130, 230 illustrated in FIGS. 1 and 2. The first memory apparatus 841 may have substantially the same configuration and perform substantially the same functions as the memory apparatuses 140, 240 shown in FIGS. 1 and 2.

The second controller bus 862 may have substantially the same type and characteristics as the first controller bus 861. The second memory bus 872 may have substantially the same type and characteristics as the first memory bus 871. In an embodiment, a width of the data bus included in the second controller bus 862 may be less than or equal to a width of the data bus included in the second memory bus 872. The second interface circuit 832 may have substantially the same configuration as the first interface circuit 831 and may perform substantially the same functions. The second memory apparatus 842 may have substantially the same configuration as the first memory apparatus 841 and may perform substantially the same functions. In an embodiment, the second memory bus 872 may have a different type and characteristics than the first memory bus 871. For example, the second memory bus 872 may include a serial data bus. A width of the data bus included in the second memory bus 872 may be less than a width of the data bus included in the second controller bus 862. A clock rate of the second memory bus 872 may be higher than a clock rate of the second controller bus 862. In this case, the second interface circuit 832 may have a different configuration than the first interface circuit 831 and perform different functions, and the second memory apparatus 842 may have a different configuration than the first memory apparatus 841 and perform different functions. For example, the first interface circuit 831 and the first memory apparatus 841 may perform parallel data communication, while the second interface circuit 832 and the second memory apparatus 842 may perform serial data communication. The first interface circuit 831 and the first memory apparatus 841 do not need to perform data conversion, and therefore might not be equipped with a SerDes. The second interface circuit 832 and the second memory apparatus 842 need to perform data conversion for serial data communication, and therefore may include a SerDes.

In an embodiment, the host 810, the first memory controller 821, the second memory controller 822, the first interface circuit 831, and the second interface circuit 832 may be integrated into a first device. The first and second memory apparatuses 841, 842 may be integrated into a second device. Alternatively, the first memory apparatus 841 may constitute a second device, and the second memory apparatus 842 may constitute a third device. The host 810, the first and second memory controllers 821, 822, and the first and second interface circuits 831, 832 may be disposed on a first interposer and/or a first substrate. The first and second memory apparatuses 841, 842 may be disposed on a second interposer and/or a second substrate. The first and second host buses 851, 852, the first and second controller buses 861, 862 may be internal buses, and the first and second memory buses 871, 872 may be external buses. In an embodiment, the first memory apparatus 841 may be disposed on a second interposer and/or a second substrate, and the second memory apparatus 842 may be disposed on a third interposer and/or a third substrate.

In an embodiment, the host 810, the first and second memory controllers 821, 822 may be integrated into a first device. The first and second interface circuits 831, 832, the first and second memory apparatuses 841, 842 may be integrated into a second device. Alternatively, the first interface circuit 831 and the first memory apparatus 841 may be integrated into a second device, and the second interface circuit 832 and the second memory apparatus 842 may be integrated into a third device. The host 810, the first and second memory controllers 821, 822 may be disposed on a first interposer and/or a first substrate. The first and second interface circuits 831, 832, the first and second memory apparatuses 841, 842 may be disposed on a second interposer and/or a second substrate. The first and second host buses 851, 852, the first and second memory buses 871, 872 may be internal buses, and the first and second controller buses 861, 862 may be external buses. In an embodiment, the first interface circuit 831 and the first memory apparatus 841 may be disposed on a second interposer and/or a second substrate, and the second interface circuit 832 and the second memory apparatus 842 may be disposed on a third interposer and/or a third substrate.

In an embodiment, the host 810 may constitute a first device, and the first and second memory controllers 821, 822, the first and second interface circuits 831, 832, and the first and second memory apparatuses 841, 842 may be integrated into a second device. Alternatively, the first memory controller 821, the first interface circuit 831 and the first memory apparatus 841 may be integrated into a second device, and the second memory controller 822, the second interface circuit 832 and the second memory apparatus 842 may be integrated into a third device. The host 810 may be disposed on a first interposer and/or a first substrate. The first and second memory controllers 821, 822, the first and second interface circuits 831, 832, and the first and second memory apparatuses 841, 842 may be disposed on a second interposer and/or a second substrate. The first and second host buses 851, 852 may be external buses, and the first and second controller buses 861, 862 and the first and second memory buses 871, 872 may be internal buses. In an embodiment, the first memory controller 821, the first interface circuit 831 and the first memory apparatus 841 may be disposed on a second interposer and/or a second substrate, and the second memory controller 822, the second interface circuit 832 and the second memory apparatus 842 may be disposed on a third interposer and/or a third substrate.

In an embodiment, the host 810, the first and second memory controllers 821, 822, the first and second interface circuits 831, 832, and the first and second memory apparatuses 841, 842 may be disposed on a single interposer and/or a single substrate. The first and second host buses 851, 852, the first and second controller buses 861, 862, and the first and second memory buses 871, 872 may all be internal buses. In an embodiment, some or all of the host 810, the first and second memory controllers 821, 822, the first and second interface circuits 831, 832, and the first and second memory apparatuses 841, 842 may be manufactured as chiplets.

Figure 9A:
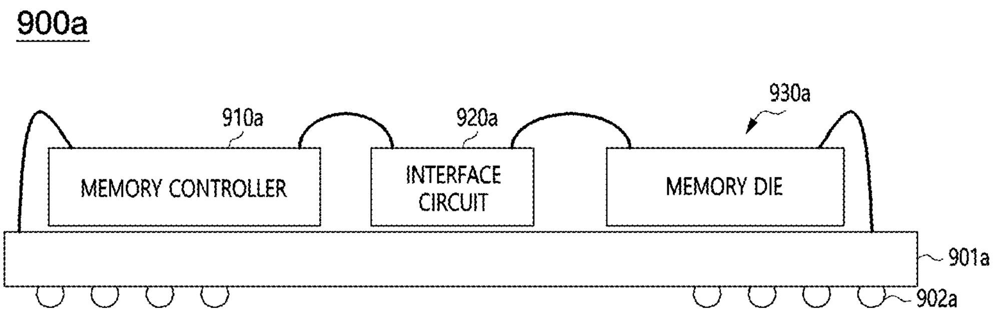
FIG. 9A is a diagram illustrating a configuration and connection relationship of an integrated circuit package according to an embodiment of the present disclosure.

FIG. 9A is a diagram illustrating a configuration and connection relationship of an integrated circuit package 900*a* according to an embodiment of the present disclosure. Referring to FIG. 9A, the integrated circuit package may include a substrate 901*a*, a memory controller 910*a*, an interface circuit 920*a*, and a memory apparatus 930*a*. The memory controller 910*a*, the interface circuit 920*a*, and the memory apparatus 930*a* may be manufactured as separate dies and/or chiplets. Some or all of the memory controller 910*a*, the interface circuit 920*a*, and the memory apparatus 930*a* may be manufactured using process technologies with different characteristics. The memory controller 910*a*, the interface circuit 920*a*, and the memory apparatus 930*a* may be disposed on the substrate 901*a*. The memory controller 910*a* may be disposed in a first region on the substrate 901*a*. The interface circuit 920*a* may be disposed in a second region on the substrate 901*a*. The memory apparatus 930*a* may be disposed in a third region on the substrate 901*a*. The first and third regions might not overlap, and the second region may be between the first and third regions. The memory apparatus 930*a* is illustrated to include a single memory die. For example, the memory controller 910*a*, the interface circuit 920*a*, and the memory apparatus 930*a* may be attached to the substrate 901*a* using an adhesive. The substrate 901*a* may include any substrate having pads capable of wire bonding, and may be one of, for example, a package substrate, an organic substrate, and a module substrate. The substrate 901*a* may include external terminals 902*a* underneath the substrate that are used to electrically connect with external devices. The external terminals 902*a* may include solder balls or package balls.

The memory controller 910*a* may be electrically connected to the substrate 901*a* by wire bonding a pad formed on a first side (e.g., a left side in FIG. 9A) T of the memory controller 910*a* to a pad formed on the substrate 901*a*. The wire bonding between the memory controller 910*a* and the substrate 901*a* may be a first wire bonding. The memory controller 910*a* may be electrically connected to the interface circuit 920*a* by wire bonding a pad formed on a second side (e.g., a right side in FIG. 9A) of the memory controller 910*a* to a pad formed on a first side of the interface circuit 920*a*. The wire bonding between the memory controller 910*a* and the interface circuit 920*a* may be a second wire bonding. The interface circuit 920*a* may be electrically connected to the memory apparatus 930*a* by wire bonding a pad formed on a second side of the interface circuit 920*a* to a pad formed on a first side of the memory apparatus 930*a*. The wire bonding between the interface circuit 920*a* and the memory apparatus 930*a* may be a third wire bonding. The memory apparatus 930*a* may be electrically connected to the substrate 901*a* by wire bonding a pad formed on a second side of the memory apparatus 930*a* to a pad formed on the substrate 901*a*. The wire bonding between the memory apparatus 930*a* and the substrate 901*a* may be a fourth wire bonding. The substrate 901*a*, the memory controller 910*a*, the interface circuit 920*a*, and the memory apparatus 930*a* may be packaged in a single package. Because the memory controller 910*a*, the interface circuit 920*a*, and the memory apparatus 930*a* are electrically connected by wire bonding, a low-cost substrate can be used and the manufacturing cost of an integrated circuit package can be reduced. The first wire bonding between the memory controller 910*a* and the substrate 901*a* may correspond to some or all of the first bus 150 shown in FIG. 1. The second wire bonding between the memory controller 910*a* and the interface circuit 920*a* may correspond to the second bus 160 shown in FIG. 1. The third wire bonding between the interface circuit 920*a* and the memory apparatus 930*a* may correspond to the third bus 170 shown in FIG. 1. The fourth wire bonding between the memory apparatus 930*a* and the substrate 901*a* may correspond to a direct access path for the external device to access the memory apparatus 930*a*. A frequency of signal transmitted through the second wire bonding may be greater than or equal to a frequency of signal transmitted through the third wire bonding. A frequency of signal transmitted through a wire bonding may be related to a clock rate or a clock frequency. The signal may be transmitted at a first clock rate through the second wire bonding, and the signal may be transmitted at a second clock rate through the third wire bonding. The first clock rate may be greater than or equal to the second clock rate. The second wire bonding may include a first data bus, and the third wire bonding may include a second data bus. The number of data signals transmitted at one time through the first data bus may be less than or equal to the number of data signals transmitted at one time through the second data bus.

Figure 9B:
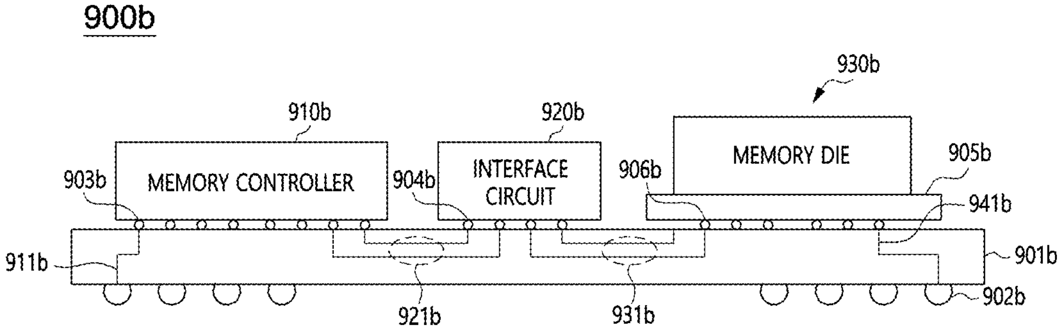
FIG. 9B is a diagram illustrating a configuration and connection relationship of an integrated circuit package according to an embodiment of the present disclosure.

FIG. 9B is a diagram illustrating a configuration and connection relationship of an integrated circuit package 900*b* according to an embodiment of the present disclosure. Referring to FIG. 9B, the integrated circuit package 900*b* may include a first substrate 901*b*, a memory controller 910*b*, an interface circuit 920*b*, and a memory apparatus 930*b*. The memory controller 910*b*, the interface circuit 920*b*, and the memory apparatus 930*b* may be disposed on the first substrate 901*b*. The first substrate 901*b* may include an interposer. The memory controller 910*b* may be disposed in a first region on the first substrate 901*b*. The interface circuit 920*b* may be disposed in a second region on the first substrate 901*b*. The memory apparatus 930*b* may be disposed in a third region on the first substrate 901*b*. The first and third regions might not overlap, and the second region may be between the first and third regions. The memory apparatus 930*b* is illustrated to include a single memory die. The integrated circuit package 900*b* may further include a second substrate 905*b*. The second substrate 905*b* may include a redistribution layer or interposer. The second substrate 905*b* may be provided to electrical connect the memory apparatus 930*b* and the first substrate 901*b*, and the second substrate 905*b* may be disposed on the first substrate 901*b*. The second substrate 905*b* may be disposed in the third region of the first substrate 901*b*. The second substrate 905*b* may include a plurality of signal paths for electrically connecting the memory apparatus 930*b* to the first substrate 901*b*. The memory apparatus 930*b* may be disposed on the second substrate 905*b*. When the second substrate 905*b* is an interposer, the memory apparatus 930*b* may be electrically connected to the second substrate 905*b* through microbumps. When the second substrate 905*b* is a redistribution layer, the memory apparatus 930*b* may be electrically connected to the second substrate 905*b* through microbumps, or may be electrically connected to the second substrate 905*b* without microbumps. In an embodiment, the memory apparatus 930*b* may be directly electrically connected to the first substrate 901*b* without the second substrate 905*b*. The first substrate 901*b* may include external terminals 902*b* underneath the first substrate 901*b* that are used to electrically connect with external devices. The external terminals 902*b* may include microbumps or bumps. In an embodiment, the integrated circuit package 900*b* may further include another substrate, and the first substrate 901*b* may be disposed on the another substrate. The another substrate may include another interposer or package substrate. When the another substrate is provided, the first substrate 901*b* may be electrically connected to the another substrate through microbumps or bumps and may be electrically connected to the external devices through the another substrate.

The first substrate 901*b* may include a plurality of signal paths 911*b*, 921*b*, 931*b*, 941*b* used to electrically connect components disposed on the first substrate 901*b*. The memory controller 910*b* may be electrically connected to the first substrate 901*b* through microbumps 903*b*. The interface circuit 920*b* may be electrically connected to the first substrate 901*b* through microbumps 904*b*. The memory apparatus 930*b* may be electrically connected with first substrate 901*b* through microbumps 906*b*. The memory controller 910*b* may be electrically connected to the signal path 911*b* of the first substrate 901*b* and the external terminals 902*b* through a microbump 903*b* at a first side of the memory controller 910*b*. Through the microbumps 903*b* at a second side of the memory controller 910*b*, the memory controller 910*b* may be electrically connected with microbumps 904*b* at a first side of the interface circuit 920*b* and the signal path 921*b* of the first substrate 901*b*. The interface circuit 920*b* may be electrically connected with microbumps 906*b* at a first side of the second substrate 905*b* through the microbumps 904*b* at a second side of the interface circuit 920*b* and the signal path 931*b* of the first substrate 901*b*. The memory apparatus 930*b* may be electrically connected with the external terminals 902*b* through a microbump 906*b* at a second side of the second substrate 905*b* and the signal path 941*b* of the first substrate 901*b*.

The first substrate 901*b*, the memory controller 910*b*, the interface circuit 920*b*, and the memory apparatus 930*b* may be packaged in a single package. Disposing the memory controller 910*b*, the interface circuit 920*b*, and the memory apparatus 930*b* on the first substrate 901*b* may facilitate integrated circuit package manufacturing and reduce integrated circuit package size because wire bonding is not required. The electrical connection between the memory controller 910*b* and the signal path 911*b* of the first substrate 901*b* may correspond to some or all of the first bus 150 shown in FIG. 1. The signal path 921*b* of the first substrate 901*b* electrically connecting the memory controller 910*b* and the interface circuit 920*b* may correspond to the second bus 160 shown in FIG. 1. The signal path 931*b* of the first substrate 901*b* electrically connecting the interface circuit 920*b* and the memory apparatus 930*b* may correspond to the third bus 170 shown in FIG. 1. The electrical connection between the memory apparatus 930*b* and the signal path 941*b* of the first substrate 901*b* may correspond to a direct access path to the memory apparatus 930*b*. A frequency of signal transmitted through the signal path 921*b* may be greater than or equal to a frequency of signal transmitted through the signal path 931*b*. The signal may be transmitted at a first clock rate through the signal path 921*b*, and the signal may be transmitted at a second clock rate through the signal path 931*b*. The first clock rate may be greater than or equal to the second clock rate. The signal path 921*b* may include a first data bus, and the signal path 931*b* may include a second data bus. The number of data signals transmitted at one time through the first data bus may be less than or equal to the number of data signals transmitted at one time through the second data bus.

Figure 9C:
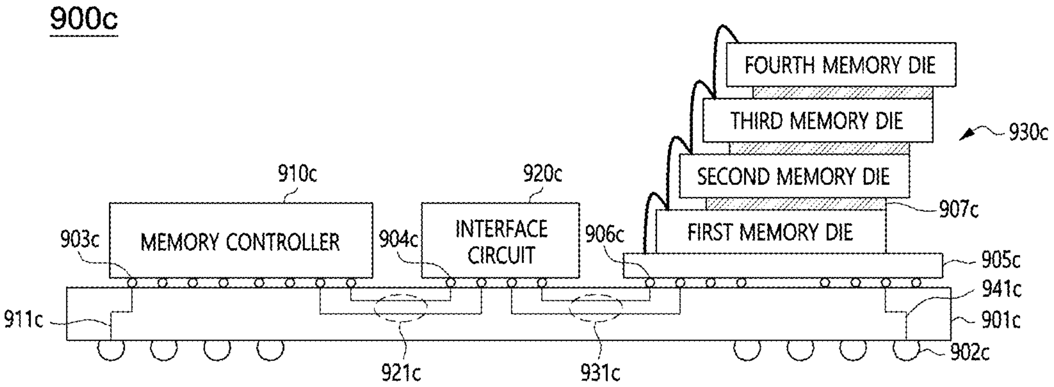
FIG. 9C is a diagram illustrating a configuration and connection relationship of an integrated circuit package according to an embodiment of the present disclosure.

FIG. 9C is a diagram illustrating a configuration and connection relationship of an integrated circuit package 900*c* according to an embodiment of the present disclosure. Referring to FIG. 9C, the integrated circuit package 900*c* may include a first substrate 901*c*, a memory controller 910*c*, an interface circuit 920*c*, and a memory apparatus 930*c*. The memory controller 910*c*, the interface circuit 920*c*, and the memory apparatus 930*c* may be disposed on the first substrate 901*c*. The first substrate 901*c* may include an interposer. The memory controller 910*c* may be disposed in a first region on the first substrate 901*c*. The interface circuit 920*c* may be disposed in a second region on the first substrate 901*c*. The memory apparatus 930*c* may be disposed in a third region on the first substrate 901*c*. The first and third regions might not overlap, and the second region may be between the first and third regions. The memory apparatus 930*c* may include one or more memory dies. The number of memory dies included by the memory apparatus 930*c* may be two, four, eight, or more. For example, the memory apparatus 930*c* may include first to fourth memory dies. The number of memory dies that the memory apparatus 930*c* includes may be two, or may be eight or more. The integrated circuit package 900*c* may further include a second substrate 905*c*. The second substrate 905*c* may include a redistribution layer or interposer. The second substrate 905*c* may be provided for electrically connecting the memory apparatus 930*c* and the first substrate 901*c*, and the second substrate 905*c* may be disposed on the first substrate 901*c*. The second substrate 905*c* may be disposed in the third region of the first substrate 901*c*. The second substrate 905*c* may include a plurality of signal paths for electrically connecting the memory apparatus 930*c* to the first substrate 901*c*. The first to fourth memory dies may be disposed on the second substrate 905*c*. The memory controller 910*c* may be electrically connected to the first substrate 901*c* through microbumps 903*c*. The interface circuit 920*c* may be electrically connected to the first substrate 901*c* through microbumps 904*c*. The second substrate 905*c* may be electrically connected with the first substrate 901*c* through microbumps 906*c*. The first substrate 901*c* may include external terminals 902*c* underneath the first substrate 901*c* that are used to electrically connect with external devices. The external terminals 902*c* may include microbumps or bumps. In an embodiment, the integrated circuit package 900*c* may further include another substrate, and the first substrate 901*c* may be disposed on the another substrate. The another substrate may include another interposer or package substrate. When the another substrate is provided, the first substrate 901*c* may be electrically connected to the another substrate through microbumps or bumps and may be electrically connected to the external devices through the another substrate.

The memory controller 910*c* may be electrically connected to a signal path 911*c* of the first substrate 901*c* and external terminals 902*c* through a microbump 903*c* at a first side of the memory controller 910*c*. Through the microbumps 903*c* at a second side of the memory controller 910*c*, the memory controller 910*c* may be electrically connected with the microbumps 904*c* at a first side of the interface circuit 920*c* and a signal path 921*c* of the first substrate 901*c*. The interface circuit 920*c* may be electrically connected with the microbumps 906*c* at a first side of the second substrate 905*c* through the microbumps 904*c* at a second side of the interface circuit 920*c* and a signal path 931*c* of the first substrate 901*c*. The second substrate 905*c* may be electrically connected to the external terminals 902*c* through the microbumps 906*c* at a second side of the second substrate 905*c* and a signal path 941*c* of the first substrate 901*c*. The first to fourth memory dies may be stacked sequentially on the second substrate 905*c*. A DAF (die attached film) 907*c* may be provided between the first memory die and the second memory die, between the second memory die and the third memory die, and between the third memory die and the fourth memory die, respectively, and the first to fourth memory dies may be adhered using the DAF 907*c*. The DAF 907*c* may increase the strength of the memory die to prevent the memory die from warping and allow space for wire bonding. The first to fourth memory dies may be stacked in a stepwise manner. The pads of the fourth memory die may be wire bonded to the pads of the third memory die, and the pads of the third memory die may be wire bonded to the pads of the second memory die. The pads of the second memory die may be wire bonded with the pads of the first memory die, and the pads of the first memory die may be wire bonded with the pads formed on the second substrate 905*c*. In an embodiment, the pads of the first memory die may be wire bonded to the pads formed on the second substrate 905*c*, and the pads of the second memory die may be wire bonded to the pads formed on the second substrate 905*c*. The pads of the third memory die may be wire bonded to the pads formed on the second substrate 905*c*, and the pads of the fourth memory die may be wire bonded to pads formed on the second substrate 905*c*. The pads of the first and fourth memory dies may be common wire bonded to the same pads on the second substrate 905*c*, and the first and fourth memory dies may form a common channel. In an embodiment, the pads of the first to fourth memory dies may be wire bonded to different pads of the second substrate 905*c*, and the first to fourth memory dies may form channels independent of each other.

The first substrate 901*c*, the memory controller 910*c*, the interface circuit 920*c*, and the memory apparatus 930*c* may be packaged in a single package. The signal path 911*c* between the memory controller 910*c* and the first substrate 901*c* may correspond to some or all of the first bus 150 shown in FIG. 1. The signal path 921*c* of the first substrate 901*c* electrically connecting the memory controller 910*c* and the interface circuit 920*c* may correspond to the second bus 160 shown in FIG. 1. The signal path 931*c* of the first substrate 901*c* electrically connecting the interface circuit 920*c* and the second substrate 905*c*, and the wire bondings electrically connecting the second substrate 905*c* and the first to fourth memory dies, may correspond to the third bus 170 shown in FIG. 1. The signal path 941*c* of the first substrate 901*c* may correspond to a direct access path to the memory apparatus 930*c*. A frequency of signal transmitted through the signal path 921*c* may be greater than or equal to a frequency of signal transmitted through the signal path 931*c*. The signal may be transmitted at a first clock rate through the signal path 921*c*, and the signal may be transmitted at a second clock rate through the signal path 931*c*. The first clock rate may be greater than or equal to the second clock rate. The signal path 921*c* may include a first data bus, and the signal path 931*c* may include a second data bus. The number of data signals transmitted at one time through the first data bus may be less than or equal to the number of data signals transmitted at one time through the second data bus.

Figure 9D:
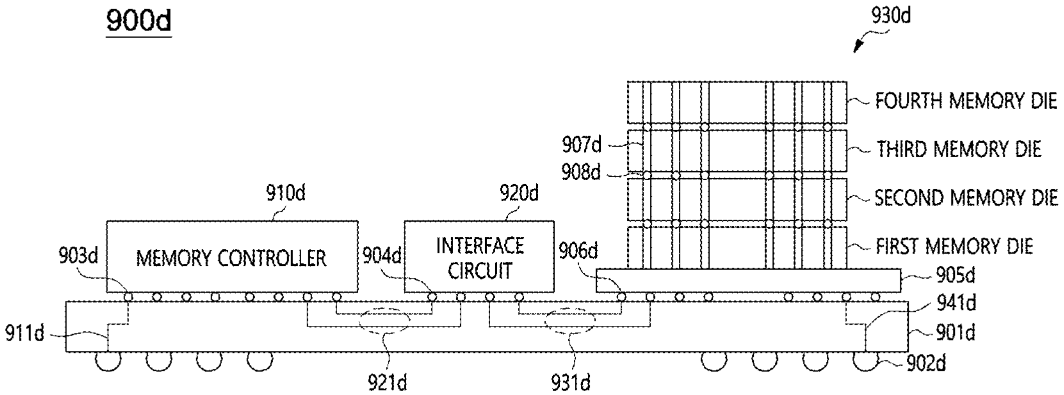
FIG. 9D is a diagram illustrating a configuration and connection relationship of an integrated circuit package according to an embodiment of the present disclosure.

FIG. 9D is a diagram illustrating a configuration and connection relationship of an integrated circuit package 900*d* according to an embodiment of the present disclosure. Referring to FIG. 9D, the integrated circuit package 900*d* may include a first substrate 901*d*, a memory controller 910*d*, an interface circuit 920*d*, and a memory apparatus 930*d*. The memory controller 910*d*, the interface circuit 920*d*, and the memory apparatus 930*d* may be disposed on the first substrate 901*d*. The first substrate 901*d* may include an interposer. The memory controller 910*d* may be disposed in a first region on the first substrate 901*d*. The interface circuit 920*d* may be disposed in a second region on the first substrate 901*d*. The memory apparatus 930*d* may be disposed in a third region on the first substrate 901*d*. The first and third regions might not overlap, and the second region may be between the first and third regions. The memory apparatus 930*d* may include one or more memory dies. The number of memory dies included by the memory apparatus 930*d* may be two, four, eight, or more. For example, the memory apparatus 930*d* may include first to fourth memory dies. The integrated circuit package 900*d* may further include a second substrate 905*d*. The second substrate 905*d* may include a redistribution layer or an interposer. The second substrate 905*d* may be provided for electrically connecting the memory apparatus 930*c* and the first substrate 901*d*, and the second substrate 905*d* may be disposed on the first substrate 901*d*. The second substrate 905*d* may be disposed in the third region of the first substrate 901*d*. The second substrate 905*d* may include a plurality of signal paths for electrically connecting the memory apparatus 930*d* to the first substrate 901*d*. The first to fourth memory dies may be stacked on the second substrate 905*d*. The first substrate 901*d* may include external terminals 902*d* underneath the first substrate 901*d* that are used to electrically connect with external devices. The external terminals 902*d* may include microbumps or bumps. In an embodiment, the integrated circuit package 900*d* may further include another substrate, and the first substrate 901*d* may be disposed on the another substrate. The another substrate may include another interposer or package substrate. When the another substrate is provided, the first substrate 901*d* may be electrically connected to the another substrate through microbumps or bumps and electrically connected to the external devices through the another substrate.

The memory controller 910*d* may be electrically connected to the first substrate 901*d* through microbumps 903*d*. The interface circuit 920*d* may be electrically connected with the first substrate 901*d* through microbumps 904*d*. The second substrate 905*d* may be electrically connected with the first substrate 901*d* through microbumps 906*d*. The memory controller 910*d* may be electrically connected with a signal path 911*d* and external terminals 902*d* of the first substrate 901*d* through a microbump 903*d* at a first side of the memory controller 910*d*. Through the microbumps 903*d* at a second side of the memory controller 910*d*, the memory controller 910*d* may be electrically connected with the microbumps 904*d* at a first side of the interface circuit 920*d* and a signal path 921*d* of the first substrate 901*d*. Through the microbumps 904*d* at a second side of the interface circuit 920*d*, the interface circuit 920*d* may be electrically connected with the microbumps 906*d* at a first side of the second substrate 905*d* and a signal path 931*d* of the first substrate 901*d*. Through microbumps 906*d* at the second side of the second substrate 905*d*, the second substrate 905*d* may be electrically connected to the external terminals 902*d* and a signal path 941*d* of the first substrate 901*d*. The first to fourth memory dies may be stacked sequentially on the second substrate 905*d*. The first to fourth memory dies may be vertically aligned and stacked. Through vias 907*d* may be formed in the first to fourth memory dies, and the first to fourth memory dies may be electrically connected to each other through the through vias 907*d* and microbumps 908*d*. When the first to fourth memory dies are electrically connected through the through vias 907*d*, the first to fourth memory dies need not be stacked in a stepwise manner as shown in FIG. 9C, but may be stacked in a vertically aligned manner. Accordingly, the area of the second substrate 905*d* and the integrated circuit package size may be reduced. The first to fourth memory dies may be electrically connected with a common signal path of the second substrate 905*d*, and the first to fourth memory dies may form a common channel. In an embodiment, the first to fourth memory dies may be electrically connected with different signal paths to the second substrate 905*d*, and the first to fourth memory dies may form channels independent of each other.

The first substrate 901*d*, the memory controller 910*d*, the interface circuit 920*d* and the memory apparatus 930*d* may be packaged in a single package. The signal path 911*d* between the memory controller 910*d* and the first substrate 901*d* may correspond to some or all of the first bus 150 shown in FIG. 1. The signal path 921*d* of the first substrate 901*d* electrically connecting the memory controller 910*d* and the interface circuit 920*d* may correspond to the second bus 160 shown in FIG. 1. The signal path 931*d* of the first substrate 901*d* electrically connecting the interface circuit 920*d*, and the second substrate 905*d*, and the microbumps 908*d* and through vias 907*d* electrically connecting the second substrate 905*d* and the first to fourth memory dies may correspond to the third bus 170 shown in FIG. 1. The signal path 941*d* of the first substrate 901*d* may correspond to a direct access path to the memory apparatus 930*d*. A frequency of signal transmitted through the signal path 921*d* may be greater than or equal to a frequency of signal transmitted through the signal path 931*d*. The signal may be transmitted at a first clock rate through the signal path 921*d*, and the signal may be transmitted at a second clock rate through the signal path 931*d*. The first clock rate may be greater than or equal to the second clock rate. The signal path 921*d* may include a first data bus, and the signal path 931*d* may include a second data bus. The number of data signals transmitted at one time through the first data bus may be less than or equal to the number of data signals transmitted at one time through the second data bus.

Figure 9E:
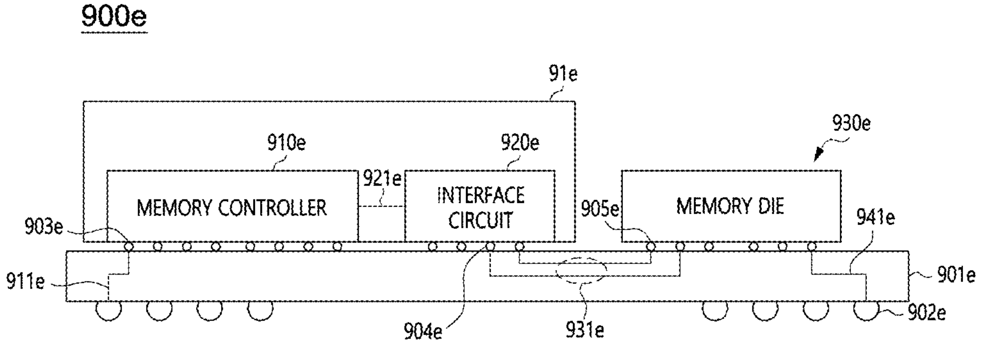
FIG. 9E is a diagram illustrating a configuration and connection relationship of an integrated circuit package according to an embodiment of the present disclosure.

FIG. 9E is a diagram illustrating a configuration and connection relationship of an integrated circuit package 900*e* according to an embodiment of the present disclosure. Referring to FIG. 9E, the integrated circuit package 900*e* may include a substrate 901*e*, a die 91*e*, and a memory apparatus 930*e*. The die 91*e* may include a memory controller 910*e* and an interface circuit 920*e*. The memory controller 910*e* and the interface circuit 920*e* may be internal circuits of the die 91*e*. The die 91*e* and the memory apparatus 930*e* may be manufactured as separate dies and/or chiplets. The die 91*e* and the memory apparatus 930*e* may be manufactured using process technologies with different characteristics or may be manufactured using process technologies with the same characteristics. The die 91*e* and the memory apparatus 930*e* may be disposed on the substrate 901*e*. The substrate 901*e* may include an interposer. The die 91*e* may be disposed in a first region on the substrate 901*e*, and the memory apparatus 930*e* may be disposed in a second region on the substrate 901*e*. The first and second regions might not overlap. The memory apparatus 930*e* is illustrated to include a single memory die. The substrate 901*e* may include external terminals 902*e* underneath the substrate 901*e* that are used to electrically connect with external devices. The external terminals 902*e* may include microbumps or bumps. In an embodiment, the integrated circuit package 900*e* may further include another substrate, and the substrate 901*e* may be disposed on this other substrate. This other substrate may include another interposer or package substrate. When another substrate is provided, the substrate 901*e* may be electrically connected to this other substrate through microbumps or bumps and electrically connected to the external devices through this other substrate.

The substrate 901*e* may include a plurality of signal paths 911*e*, 931*e*, 941*e* used to electrically connect components disposed on the substrate 901*e*. The memory controller 910*e* may be electrically connected to the signal path 911*e* and the external terminals 902*e* through a microbump 903*e* at a first side of the die 91*e*. The memory controller may be electrically connected to the interface circuit 920*e* through a signal transmission line 921*e* inside the die 91*e*. Hereinafter, the electrical connection means for electrically connecting the internal circuits formed inside one die may be referred to as signal transmission lines, and the electrical connection means formed on the interposer and/or substrate may be referred to as signal paths. The interface circuit 920*e* may be electrically connected with the signal path 931*e* through the microbumps 904*e* at a second side of the die 91*e*. The memory apparatus 930*e* may be electrically connected to the signal path 931*e* through the microbumps 905*e* at a first side of the memory apparatus 930*e*. The memory apparatus 930*b* may be electrically connected with the external terminals 902*e* through microbumps 905*e* at a second side of the memory apparatus 930*b* and the signal path 941*e*.

The substrate 901*e*, the die 91*e* and the memory apparatus 930*e* may be packaged in a single package. Disposing the die 91*e* and the memory apparatus 930*e* on the substrate 901*e* may facilitate integrated circuit package manufacturing and reduce integrated circuit package size because wire bonding is not required. The electrical connection of the memory controller 910*e* to the signal path 911*e* may correspond to some or all of the first bus 150 shown in FIG. 1. The signal transmission line 921*e* electrically connecting the memory controller 910*e* and the interface circuit 920*e* may correspond to the second bus 160 shown in FIG. 1. The signal path 931*e* electrically connecting the interface circuit 920*e* and the memory apparatus 930*e* may correspond to the third bus 170 shown in FIG. 1. The electrical connection between the memory apparatus 930*e* and the signal path 941*e* may correspond to a direct access path to the memory apparatus 930*e*. A frequency of signal transmitted through the signal transmission line 921*e* may be greater than or equal to a frequency of signal transmitted through the signal path 931*e*. The signal transmission line 921*e* may include a first data bus, and the signal path 931*e* may include a second data bus. The signal may be transmitted at a first clock rate through the signal transmission line 921*e*, and the signal may be transmitted at a second clock rate through the signal path 931*e*. The first clock rate may be greater than or equal to the second clock rate. The number of data signals transmitted at one time through the first data bus may be less than or equal to the number of data signals transmitted at one time through the second data bus.

Figure 10A:
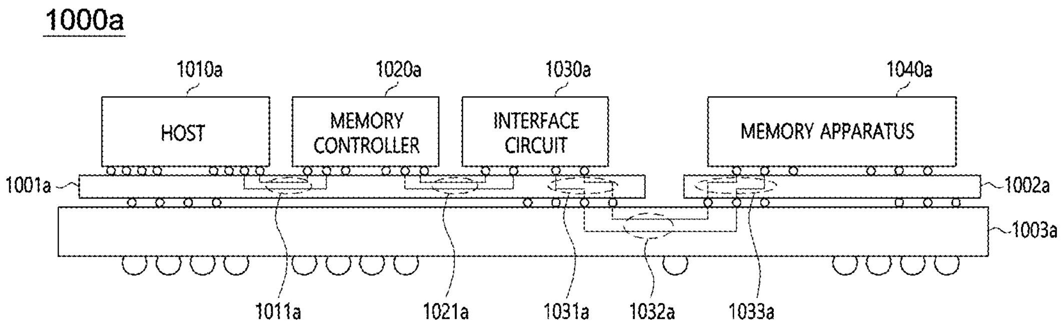
FIG. 10A is a diagram illustrating a configuration and connection relationship of an integrated circuit package according to an embodiment of the present disclosure.

FIG. 10A is a diagram illustrating a configuration and connection relationship of an integrated circuit package 1000*a* according to an embodiment of the present disclosure. Referring to FIG. 10A, the integrated circuit package 1000*a* may include a first substrate 1001*a*, a second substrate 1002*a*, a host 1010*a*, a memory controller 1020*a*, an interface circuit 1030*a*, and a memory apparatus 1040*a*. The memory apparatus 1040*a* may include any of the memory apparatuses 930*b* to 930*d* shown in FIGS. 9B to 9D. The host 1010*a*, the memory controller 1020*a*, the interface circuit 1030*a*, and the memory apparatus 1040*a* may be manufactured as separate dies and/or chiplets. Some or all of the host 1010*a*, the memory controller 1020*a*, the interface circuit 1030*a*, and the memory apparatus 1040*a* may be manufactured using process technologies with different characteristics. The host 1010*a*, the memory controller 1020*a*, and the interface circuit 1030*a* may be disposed on a first substrate 1001*a*. The first substrate 1001*a* may include a first interposer. The host 1010*a* may be disposed in a first region on the first substrate 1001*a*. The memory controller 1020*a* may be disposed in a second region on the first substrate 1001*a*. The interface circuit 1030*a* may be disposed in a third region on the first substrate 1001*a*. The first and third regions might not overlap each other, and the second region may be between the first and third regions. The host 1010*a* may be electrically connected to the first substrate 1001*a* through microbumps of the host 1010*a*. The memory controller 1020*a* may be electrically connected to the first substrate 1001*a* through microbumps of the memory controller 1020*a*. The interface circuit 1030*a* may be electrically connected to the first substrate 1001*a* through microbumps of the interface circuit 1030*a*. The memory apparatus 1040*a* may be disposed on a second substrate 1002*a*. The second substrate 1002*a* may include a second interposer. The memory apparatus 1040*a* may be electrically connected to the second substrate 1002*a* through microbumps of the memory apparatus 1040*a*. The first substrate 1001*a* and the second substrate 1002*a* may be disposed on a third substrate 1003*a*. The third substrate 1003*a* may include another interposer or package substrate. The first substrate 1001*a* may be disposed in a first region on the third substrate 1003*a*, and the second substrate 1002*a* may be disposed in a second region on the third substrate 1003*a*. The first and second regions might not overlap each other. The first and second substrates 1001*a*, 1002*a* may be electrically connected to the third substrate 1003*a* through microbumps or bumps in the first and second substrates 1001*a*, 1002*a*, respectively. The third substrate 1003*a* may be electrically connected to an external device through external terminals of the third substrate 1003*a*. The external terminals may include microbumps, bumps, solder balls, or package balls.

The host 1010*a* may be electrically connected to the memory controller 1020*a* through a signal path 1011*a* formed in the first substrate 1001*a*. The memory controller 1020*a* may be electrically connected to the interface circuit 1030*a* through a signal path 1021*a* of the first substrate 1001*a*. The interface circuit 1030*a* may be electrically connected with the memory apparatus 1040*a* through a signal path 1031*a* of the first substrate 1001*a*, a signal path 1032*a* formed in the third substrate 1003*a*, and a signal path 1033*a* of the second substrate 1002*a*. The signal path 1011*a* between the host 1010*a* and the memory controller 1020*a* may correspond to the first bus 150 shown in FIG. 1. The signal path 1021*a* between the memory controller 1020*a* and the interface circuit 1030*a* may correspond to the second bus 160 shown in FIG. 1. The signal paths 1031*a*, 1032*a*, 1033*a* between the interface circuit 1030*a* and the memory apparatus 1040*a* may correspond to the third bus 170 shown in FIG. 1. A frequency of signal transmitted through the signal path 1021*a* may be greater than or equal to a frequency of signal transmitted through the signal paths 1031*a*, 1032*a*, 1033*a*. The signal may be transmitted at a first clock rate through the signal path 1021*a*, and the signal may be transmitted at a second clock rate through the signal paths 1031*a*, 1032*a*, 1033*a*. The first clock rate may be greater than or equal to the second clock rate. The signal path 1021*a* may include a first data bus, and the signal paths 1031*a*, 1032*a*, 1033*a* may include a second data bus. The number of data signals transmitted at one time through the first data bus may be less than or equal to the number of data signals transmitted at one time through the second data bus. In an embodiment, the first substrate 1001*a*, the host 1010*a*, the memory controller 1020*a*, and the interface circuit 1030*a* on the first substrate 1001*a* may be packaged in a first package. The memory apparatus 1040*a* on the second substrate 1002*a* may be packaged in a second package. The first and second packages may be disposed on the third substrate 1003*a* and packaged in a third package, and the integrated circuit package 1000*a* may be manufactured in a PIP (package in package) structure.

Figure 10B:
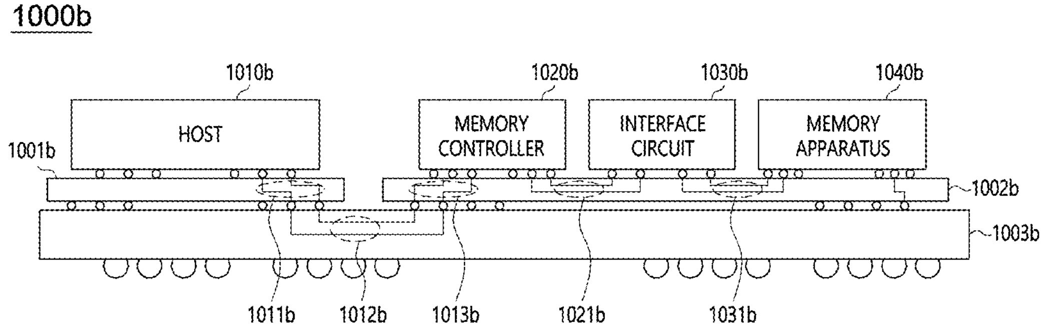
FIG. 10B is a diagram illustrating a configuration and connection relationship of an integrated circuit package according to an embodiment of the present disclosure.

FIG. 10B is a diagram illustrating a configuration and connection relationship of an integrated circuit package 1000*b* according to an embodiment of the present disclosure. Referring to FIG. 10B, the integrated circuit package 1000*b* may include a first substrate 1001*b*, a second substrate 1002*b*, a host 1010*b*, a memory controller 1020*b*, an interface circuit 1030*b*, and a memory apparatus 1040*b*. The memory apparatus 1040*b* may include any of the memory apparatuses 930*b* to 930*d* shown in FIGS. 9B to 9D. The host 1010*b* may be disposed on a first substrate 1001*b*. The first substrate 1001*b* may include a first interposer. The host 1010*b* may be electrically connected to the first substrate 1001*b* through microbumps of the host 1010*b*. The memory controller 1020*b*, the interface circuit 1030*b*, and the memory apparatus 1040*b* may be disposed on a second substrate 1002*b*. The second substrate 1002*b* may include a second interposer. The memory controller 1020*b* may be disposed in a first region on the second substrate 1002*b*. The interface circuit 1030*b* may be disposed in a second region on the second substrate 1002*b*. The memory apparatus 1040*b* may be disposed in a third region on the second substrate 1002*b*. The first and third regions might not overlap each other, and the second region may be between the first and third regions. The memory controller 1020*b* may be electrically connected to the second substrate 1002*b* through microbumps of the memory controller 1020*b*. The interface circuit 1030*b* may be electrically connected to the second substrate 1002*b* through microbumps of the interface circuit 1030*b*. The memory apparatus 1040*b* may be electrically connected to the second substrate 1002*b* through microbumps of the memory apparatus 1040*b*. The first substrate 1001*b* and the second substrate 1002*b* may be disposed on a third substrate 1003*b*. The third substrate 1003*b* may include another interposer or package substrate. The first substrate 1001*b* may be disposed in a first region on the third substrate 1003*b*, and the second substrate 1002*b* may be disposed in a second region on the third substrate 1003*b*. The first and second regions might not overlap each other. The first and second substrates 1001*b*, 1002*b* may be electrically connected to the third substrate 1003*b* through microbumps or bumps in the first and second substrates 1001*b*, 1002*b*, respectively. The third substrate 1003*b* may be electrically connected to an external device through external terminals of the third substrate 1003*b*. The external terminals may include microbumps, bumps, solder balls, or package balls.

The host 1010*b* may be electrically connected to the memory controller 1020*b* through a signal path 1011*b* formed in the first substrate 1001*b*, a signal path 1012*b* formed in the third substrate 1003*b*, and a signal path 1013*b* formed in the second substrate 1002*b*. The memory controller 1020*b* may be electrically connected to the interface circuit 1030*b* through a signal path 1021*b* of the second substrate 1002*b*. The interface circuit 1030*b* may be electrically connected to the memory apparatus 1040*b* through a signal path 1031*b* of the second substrate 1002*b*. The signal paths 1011*b*, 1012*b*, 1013*b* between the host 1010*b* and the memory controller 1020*b* may correspond to the first bus 150 shown in FIG. 1. The signal path 1021*b* between the memory controller 1020*b* and the interface circuit 1030*b* may correspond to the second bus 160 shown in FIG. 1. The signal path 1031*b* between the interface circuit 1030*b* and the memory apparatus 1040*b* may correspond to the third bus 170 shown in FIG. 1. A frequency of signal transmitted through the signal path 1021*b* may be greater than or equal to a frequency of signal transmitted through the signal path 1031*b*. The signal may be transmitted at a first clock rate through the signal path 1021*b*, and the signal may be transmitted at a second clock rate through the signal path 1031*b*. The first clock rate may be greater than or equal to the second clock rate. The signal path 1021*b* may include a first data bus, and the signal path 1031*b* may include a second data bus. The number of data signals transmitted at one time through the first data bus may be less than or equal to the number of data signals transmitted at one time through the second data bus. In an embodiment, the first substrate 1001*b* and the host 1010*b* may be packaged in a first package. The second substrate 1002*b*, the memory controller 1020*b*, the interface circuit 1030*b*, and the memory apparatus 1040*b* on the second substrate 1002*b* may be packaged in a second package. The first and second packages may be disposed on the third substrate 1003*b* and packaged in a third package, and the integrated circuit package 1000*b* may be manufactured in a PIP (package in package) structure.

Figure 10C:
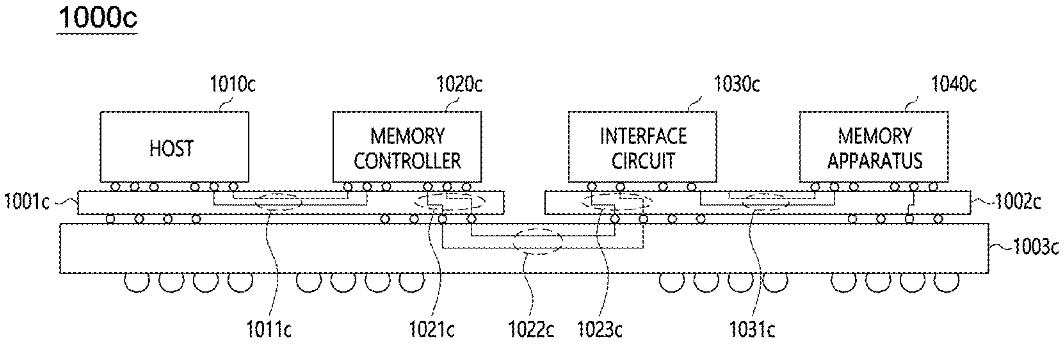
FIG. 10C is a diagram illustrating a configuration and connection relationship of an integrated circuit package according to an embodiment of the present disclosure.

FIG. 10C is a diagram illustrating a configuration and connection relationship of an integrated circuit package 1000*c* according to an embodiment of the present disclosure. Referring to FIG. 10C, the integrated circuit package 1000*c* may include a first substrate 1001*c*, a second substrate 1002*c*, a host 1010*c*, a memory controller 1020*c*, an interface circuit 1030*c*, and a memory apparatus 1040*c*. The memory apparatus 1040*c* may include any of the memory apparatuses 930*b* to 930*d* shown in FIGS. 9B to 9D. The host 1010*c* and the memory controller 1020*c* may be disposed on a first substrate 1001*c*. The first substrate 1001*c* may include a first interposer. The host 1010*c* may be disposed in a first region on the first substrate 1001*c*, and the memory controller 1020*c* may be disposed in a second region on the first substrate 1001*c*. The first and second regions might not overlap each other. The host 1010*c* may be electrically connected to the first substrate 1001*c* through microbumps of the host 1010*c*. The memory controller 1020*c* may be electrically connected to the first substrate 1001*c* through microbumps of the memory controller 1020*c*. The interface circuit 1030*c* and the memory apparatus 1040*c* may be disposed on a second substrate 1002*c*. The second substrate 1002*c* may include a second interposer. The interface circuit 1030*c* may be disposed in a first region on the second substrate 1002*c*, and the memory apparatus 1040*c* may be disposed in a second region on the second substrate 1002*c*. The first and second regions might not overlap. The interface circuit 1030*c* may be electrically connected to the second substrate 1002*c* through microbumps of the interface circuit 1030*c*. The memory apparatus 1040*c* may be electrically connected to the second substrate 1002*c* through microbumps of the memory apparatus 1040*c*. The first substrate 1001*c* and the second substrate 1002*c* may be disposed on a third substrate 1003*c*. The third substrate 1003*c* may include another interposer or package substrate. The first substrate 1001*c* may be disposed in a first region on the third substrate 1003*c*, and the second substrate 1002*c* may be disposed in a second region on the third substrate 1003*c*. The first and second regions might not overlap each other. The first and second substrates 1001*c*, 1002*c* may be electrically connected to the third substrate 1003*c* through microbumps or bumps in the first and second substrates 1001*c*, 1002*c*, respectively. The third substrate 1003*c* may be electrically connected to an external device through external terminals of the third substrate 1003*c*. The external terminals may include microbumps, bumps, solder balls, or package balls.

The host 1010*c* may be electrically connected to the memory controller 1020*c* through a signal path 1011*c* formed in the first substrate 1001*c*. The memory controller 1020*c* may be electrically connected to the interface circuit 1030*c* through a signal path 1021*c* of the first substrate 1001*c*, a signal path 1022*c* formed in the third substrate 1003*c*, and a signal path 1023*c* formed in the second substrate 1002*c*. The interface circuit 1030*c* may be electrically connected with the memory apparatus 1040*c* through a signal path 1031*c* formed in the second substrate 1002*c*. The signal path 1011*c* between the host 1010*c* and the memory controller 1020*c* may correspond to the first bus 150 shown in FIG. 1. The signal paths 1021*c*, 1022*c*, 1023*c* between the memory controller 1020*c* and the interface circuit 1030*c* may correspond to the second bus 160 shown in FIG. 1. The signal path 1031*c* between the interface circuit 1030*c* and the memory apparatus 1040*c* may correspond to the third bus 170 shown in FIG. 1. A frequency of signal transmitted through the signal paths 1021*c*, 1022*c*, 1023*c* may be greater than or equal to a frequency of signal transmitted through the signal path 1031*c*. The signal may be transmitted at a first clock rate through the signal paths 1021*c*, 1022*c*, 1023*c*, and the signal may be transmitted at a second clock rate through the signal path 1031*c*. The first clock rate may be greater than or equal to the second clock rate. The signal paths 1021*c*, 1022*c*, 1023*c* may include a first data bus, and the signal path 1031*c* may include a second data bus. The number of data signals transmitted at any one time through the first data bus may be less than or equal to the number of data signals transmitted at any one time through the second data bus. In an embodiment, the first substrate 1001*c*, the host 1010*c* and the memory controller 1020*c* may be packaged in a first package. The second substrate 1002*c*, the interface circuit 1030*c* and the memory apparatus 1040*c* may be packaged in a second package. The first and second packages may be disposed on the third substrate 1003*c* and packaged in a third package, and the integrated circuit package 1000*c* may be manufactured in a PIP (package in package) structure.

Figure 10D:
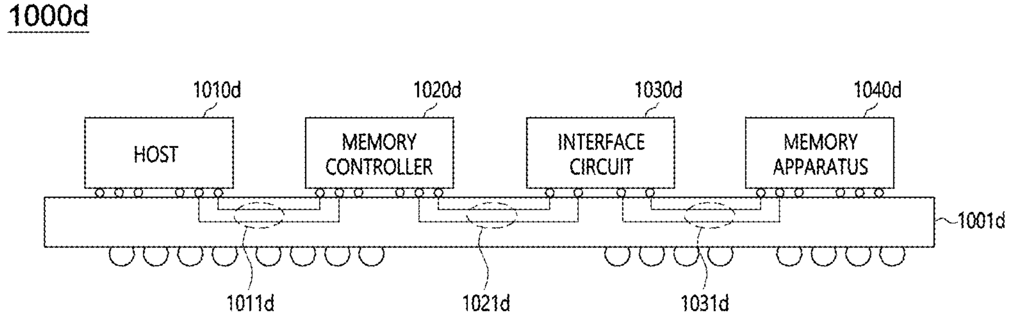
FIG. 10D is a diagram illustrating a configuration and connection relationship of an integrated circuit package according to an embodiment of the present disclosure.

FIG. 10D is a diagram illustrating a configuration and connection relationship of an integrated circuit package 1000*d* according to an embodiment of the present disclosure. Referring to FIG. 10D, the integrated circuit package 1000*d* may include a substrate 1001*d*, a host 1010*d*, a memory controller 1020*d*, an interface circuit 1030*d*, and a memory apparatus 1040*d*. The memory apparatus 1040*d* may include any of the memory apparatuses 930*b* to 930*d* shown in FIGS. 9B to 9D. The host 1010*d*, the memory controller 1020*d*, the interface circuit 1030*d*, and the memory apparatus 1040*d* may be disposed on the substrate 1001*d*. The substrate 1001*d* may be an interposer and/or glass substrate containing various signal paths. The host 1010*d* may be disposed in a first region on the substrate 1001*d*. The memory controller 1020*d* may be disposed in a second region on the substrate 1001*d*. The interface circuit 1030*d* may be disposed in a third region on the substrate 1001*d*. The memory apparatus 1040*d* may be disposed in a fourth region on the substrate 1001*d*. The first and fourth regions might not overlap each other. The second region may be between the first region and the third region, and the third region may be between the second region and the fourth region. The host 1010*d* may be electrically connected to the substrate 1001*d* through microbumps of the host 1010*d*. The memory controller 1020*d* may be electrically connected to the substrate 1001*d* through microbumps of the memory controller 1020*d*. The interface circuit 1030*d* may be electrically connected to the substrate 1001*d* through microbumps of the interface circuit 1030*d*. The memory apparatus 1040*d* may be electrically connected with the substrate 1001*d* through microbumps of the memory apparatus 1040*d*. The substrate 1001*d* may include external terminals underneath the substrate 1001*d* used to electrically connect with an external device. The external terminals may include micro-bumps, bumps, solder balls, or package balls. The host 1010*d*, the memory controller 1020*d*, the interface circuit 1030*d*, and the memory apparatus 1040*d* disposed on the substrate 1001*d* may be packaged in a single package.

The host 1010*d* may be electrically connected to the memory controller 1020*d* through a signal path 1011*d* formed in the substrate 1001*d*. The memory controller 1020*d* may be electrically connected with the interface circuit 1030*d* through a signal path 1021*d* formed in the substrate 1001*d*. The interface circuit 1030*d* may be electrically connected with the memory apparatus 1040*d* through a signal path 1031*d* formed in the substrate 1001*d*. The signal path 1011*d* between the host 1010*d* and the memory controller 1020*d* may correspond to the first bus 150 shown in FIG. 1. The signal path 1021*d* between the memory controller 1020*d* and the interface circuit 1030*d* may correspond to the second bus 160 shown in FIG. 1. The signal path 1031*d* between the interface circuit 1030*d* and the memory apparatus 1040*d* may correspond to the third bus 170 shown in FIG. 1. A frequency of signal transmitted through the signal path 1021*d* may be greater than or equal to a frequency of signal transmitted through the signal path 1031*d*. The signal may be transmitted at a first clock rate through the signal path 1021*d*, and the signal may be transmitted at a second clock rate through the signal path 1031*d*. The first clock rate may be greater than or equal to the second clock rate. The signal path 1021*d* may include a first data bus, and the signal path 1031*d* may include a second data bus. The number of data signals transmitted at one time through the first data bus may be less than or equal to the number of data signals transmitted at one time through the second data bus.

Figure 10E:
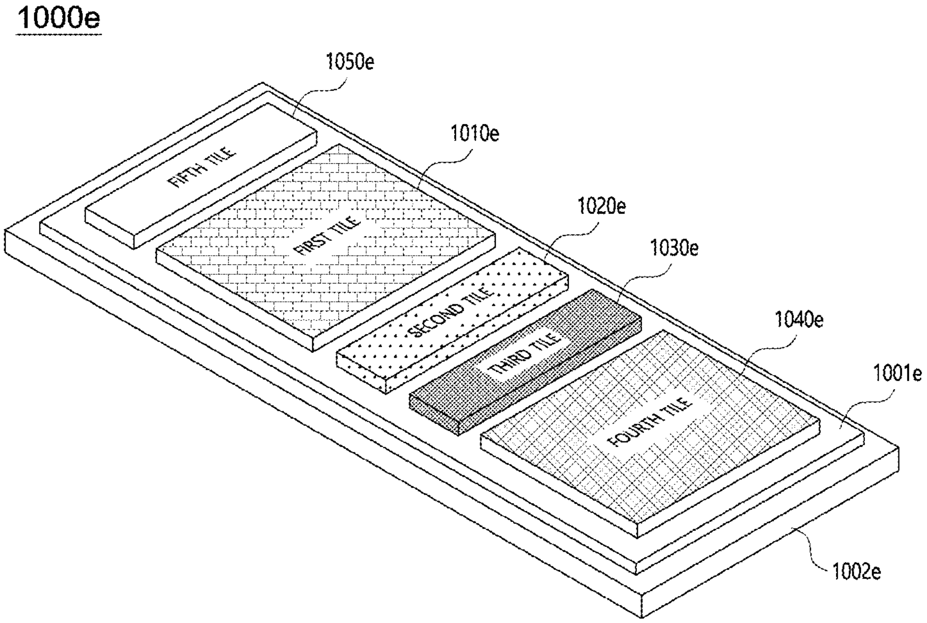
FIG. 10E is a diagram illustrating a configuration and connection relationship of an integrated circuit package according to an embodiment of the present disclosure.

FIG. 10E is a diagram illustrating a configuration and connection relationship of an integrated circuit package 1000*e* according to an embodiment of the present disclosure. Referring to FIG. 10E, the integrated circuit package 1000*e* may include a first tile 1010*e*, a second tile 1020*e*, a third tile 1030*e*, and a fourth tile 1040*e*. In FIG. 10E, a tile may refer to a die, structure, unit module, or chiplet of a single device. The first tile 1010*e* may correspond to the host 110 shown in FIG. 1. The second tile 1020*e* may correspond to the memory controller 120 shown in FIG. 1. The third tile 1030*e* may correspond to the interface circuit 130 shown in FIG. 1. The fourth tile 1040*e* may correspond to the memory apparatus 140 shown in FIG. 1. The first to fourth tiles 1010*e*, 1020*e*, 1030*e*, 1040*e* may be mounted on a base tile 1001*e*. The base tile 1001*e* may include a plurality of tile sockets or connectors to allow the first to fourth tiles 1010*e*, 1020*e*, 1030*e*, 1040*e* and additional tiles (i.e., a fifth tile 1050*e*) to be mounted on the base tile 1001*e*. The base tile 1001*e* may include signal paths for electrically connecting the plurality of tiles mounted to the base tile 1001*e*. Although not shown, a plurality of signal paths may be formed within the base tile 1001*e* for electrically connecting each of the first to fourth tiles 1010*e*, 1020*e*, 1030*e*, 1040*e*. The base tile 1001*e* may be disposed on a substrate 1002*e*. The substrate 1002*e* may include any one of an interposer, a package substrate, an organic substrate, and a redistribution layer. A signal path between the first tile 1010*e* and the second tile 1020*e* may correspond to the first bus 150 shown in FIG. 1. A signal path between the second tile 1020*e* and the third tile 1030*e* may correspond to the second bus 160 shown in FIG. 1. A signal path between the third tile 1030*e* and the fourth tile 1040*e* may correspond to the third bus 170 shown in FIG. 1. The integrated circuit package 1000*e* may further include the fifth tile 1050*e*. The fifth tile 1050*e* may be a logic tile performing the same or different functions as any one of the first to fourth tiles 1010*e*, 1020*e*, 1030*e*, 1040*e*. Some or all of the first to fifth tiles 1010*e*, 1020*e*, 1030*e*, 1040*e*, 1050*e* may be manufactured using different process technologies. In an embodiment, the first and second tiles 1010*e*, 1020*e* may be integrated into a single tile, and the integrated tile may be mounted to the base tile 1001*e* through a single socket or connector. In an embodiment, the second and third tiles 1020*e*, 1030*e* may be integrated into a single tile, and the integrated tile may be mounted to the base tile 1001*e* through a single socket or connector.

Figure 10F:
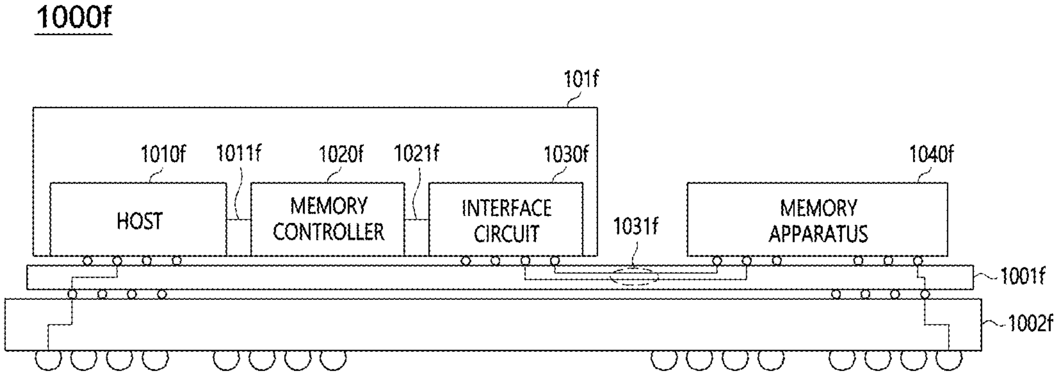
FIG. 10F is a diagram illustrating a configuration and connection relationship of an integrated circuit package according to an embodiment of the present disclosure.

FIG. 10F is a diagram illustrating a configuration and connection relationship of an integrated circuit package 1000*f* according to an embodiment of the present disclosure. Referring to FIG. 10F, the integrated circuit package 1000*f* may include a first substrate 1001*f*, a host die 101*f* and a memory apparatus 1040*f*. The memory apparatus 1040*f* may include any of the memory apparatuses 930*b* to 930*d* shown in FIGS. 9B to 9D. The host die 101*f* may include a host 1010*f*, a memory controller 1020*f*, and an interface circuit 1030*f*. The host 1010*f*, the memory controller 1020*f*, and the interface circuit 1030*f* may be internal circuits of the host die 101*f*. The host die 101*f* and the memory apparatus 1040*f* may be manufactured as separate dies and/or chiplets. The host die 101*f* and the memory apparatus 1040*f* may be manufactured using process technologies with different characteristics or may be manufactured using process technologies with the same characteristics. The host die 101*f* and the memory apparatus 1040*f* may be disposed on the first substrate 1001*f*. The first substrate 1001*f* may include an interposer. The host die 101*f* may be disposed in a first region on the first substrate 1001*f*, and the memory apparatus 1040*f* may be disposed in a second region on the first substrate 1001*f*. The first and second regions might not overlap each other.

The host die 101*f* may be electrically connected to the first substrate 1001*f* through microbumps of the host die 101*f*. The memory apparatus 1040*f* may be electrically connected with the first substrate 1001*f* through microbumps of the memory apparatus 1040*f*. The integrated circuit package 1000*f* may further include a second substrate 1002*f*. The first substrate 1001*f* may be disposed on the second substrate 1002*f*. The second substrate may include another interposer or package substrate. The first substrate 1001*f* may be electrically connected to the second substrate 1002*f* through microbumps or bumps of the first substrate 1001*f*. The second substrate 1002*f* may be electrically connected to an external device through external terminals of the second substrate 1002*f*. The external terminals may include microbumps, bumps, solder balls, or package balls.

The host 1010*f* may be electrically connected to the memory controller 1020*f* through a signal transmission line 1011*f* inside the host die 101*f*. The memory controller 1020*f* may be electrically connected with the interface circuit 1030*f* through a signal transmission line 1021*f* inside the host die 101*f*. The interface circuit 1030*f* may be electrically connected to the memory apparatus 1040*f* through microbumps of the host die 101*f* and a signal path 1031*f* formed in the first substrate 1001*f*. The memory apparatus 1040*f* may be electrically connected to the signal path 1031*f* through microbumps of the memory apparatus 1040*f*. In an embodiment, the host 1010*f* may be directly electrically connected to an external device through a signal path formed in the first substrate 1001*f* and a signal path formed in the second substrate 1002*f* and external terminals of the second substrate 1002*f*. The memory apparatus 1040*f* may be directly electrically connected to an external device through a signal path formed in the first substrate 1001*f*, a signal path formed in the second substrate 1002*f*, and external terminals of the second substrate 1002*f*. The signal transmission line 1011*f* electrically connecting the host 1010*f* and the memory controller 1020*f* may correspond to the first bus 150 shown in FIG. 1. The signal transmission line 1021*f* electrically connecting the memory controller 1020*f* and the interface circuit 1030*f* may correspond to the second bus 160 shown in FIG. 1. The signal path 1031*f* between the interface circuit 1030*f* and the memory apparatus 1040*f* may correspond to the third bus 170 shown in FIG. 1. A frequency of signal transmitted through the signal transmission line 1021*f* may be greater than or equal to a frequency of signal transmitted through the signal path 1031*f*. The signal may be transmitted at a first clock rate through the signal transmission line 1021*f*, and the signal may be transmitted at a second clock rate through the signal path 1031*f*. The first clock rate may be greater than or equal to the second clock rate. The signal transmission line 1021*f* may include a first data bus, and the signal path 1031*f* may include a second data bus. The number of data signals transmitted at one time through the first data bus may be less than or equal to the number of data signals transmitted at one time through the second data bus. The first substrate 1001*f*, the second substrate 1002*f*, host die 101*f* and the memory apparatus 1040*f* may be packaged in a single package.

Figure 10G:
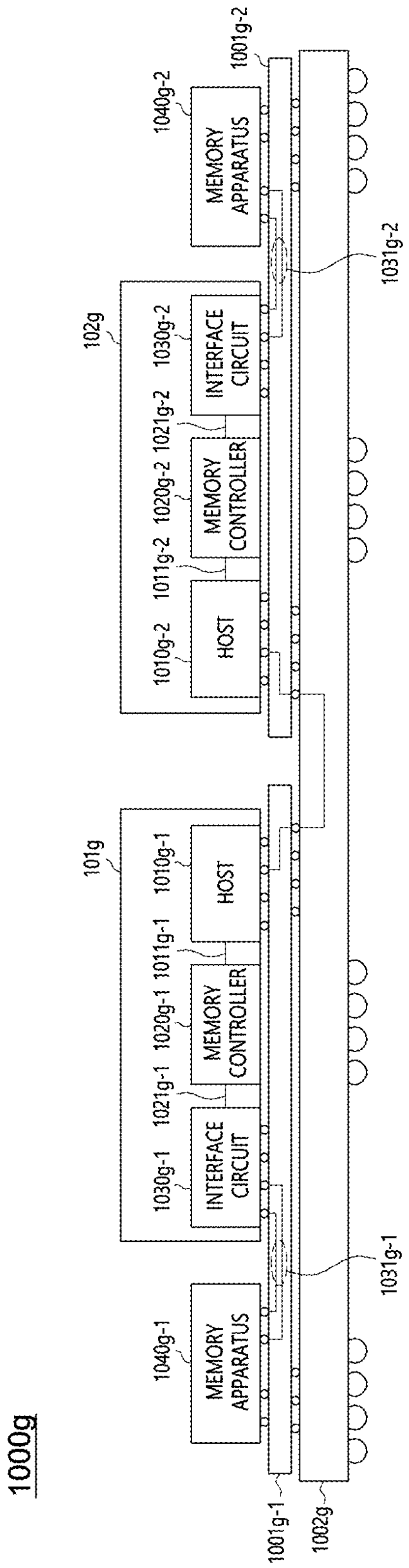
FIG. 10G is a diagram illustrating a configuration and connection relationship of an integrated circuit package according to an embodiment of the present disclosure.

FIG. 10G is a diagram illustrating a configuration and connection relationship of an integrated circuit package 1000*g* according to an embodiment of the present disclosure. Referring to FIG. 10G, the integrated circuit package 1000*g* may include a first substrate 1001*g*-1, a second substrate 1001*g*-2, a first host die 101*g*, a second host die 102*g*, a first memory apparatus 1040*g*-1, and a second memory apparatus 1040*g*-2. The first and second memory apparatuses 1040*g*-1, 1040*g*-2 may each include any one of the memory apparatuses 930*b* to 930*d* shown in FIGS. 9B to 9D. The first host die 101*g* may include a host 1010*g*-1, a memory controller 1020*g*-1, and an interface circuit 1030*g*-1. The host 1010*g*-1, the memory controller 1020*g*-1, and the interface circuit 1030*g*-1 may be internal circuits of the first host die 101*g*. The first host die 101*g* and the first memory apparatus 1040*g*-1 may be disposed on the first substrate 1001*g*-1. The first substrate 1001*g*-1 may include a first interposer. The first host die 101*g* may be disposed in a first region on the first substrate 1001*g*-1, and the first memory apparatus 1040*g*-1 may be disposed in a second region on the first substrate 1001*g*-1. The first and second regions might not overlap. The first host die 101*g* may be electrically connected to the first substrate 1001*g*-1 through microbumps of the first host die 101*g*. The first memory apparatus 1040*g*-1 may be electrically connected to the first substrate 1001*g*-1 through microbumps of the first memory apparatus 1040*g*-1. The integrated circuit package 1000*g* may further include a third substrate 1002*g*. The first substrate 1001*g*-1 may be disposed on the third substrate 1002*g*. The third substrate 1002*g* may include another interposer or package substrate. The first substrate 1001*g*-1 may be electrically connected to the third substrate 1002*g* through microbumps or bumps of the first substrate 1001*g*-1. The third substrate 1002*g* may be electrically connected to an external device through external terminals of the third substrate 1002*g*. The external terminals may include microbumps, bumps, solder balls, or package balls.

The host 1010*g*-1 may be electrically connected to the memory controller 1020*g*-1 through a signal transmission line 1011*g*-1 inside the first host die 101*g*. The memory controller 1020*g*-1 may be electrically connected with the interface circuit 1030*g*-1 through a signal transmission line 1021*g*-1 inside the first host die 101*g*. The interface circuit 1030*g*-1 may be electrically connected with the first memory apparatus 1040*g*-1 through microbumps of the first host die 101*g* and a signal path 1031*g*-1 formed in the first substrate 1001*g*-1. The first memory apparatus 1040*g*-1 may be electrically connected to the signal path 1031*g*-1 through microbumps of the first memory apparatus 1040*g*-1. The signal transmission line 1011*g*-1 electrically connecting the host 1010*g*-1 and the memory controller 1020*g*-1 may correspond to the first bus 150 shown in FIG. 1. The signal transmission line 1021*g*-1 electrically connecting the memory controller 1020*g*-1 and the interface circuit 1030*g*-1 may correspond to the second bus 160 shown in FIG. 1. The signal path 1031*g*-1 between the interface circuit 1030*g*-1 and the first memory apparatus 1040*g*-1 may correspond to the third bus 170 shown in FIG. 1. A frequency of signal transmitted through the signal transmission line 1021*g*-1 may be greater than or equal to a frequency of signal transmitted through the signal path 1031*g*-1. The signal may be transmitted at a first clock rate through the signal transmission line 1021*g*-1, and the signal may be transmitted at a second clock rate through the signal path 1031*g*-1. The first clock rate may be greater than or equal to the second clock rate. The signal transmission line 1021*g*-1 may include a first data bus, and the signal path 1031*g*-1 may include a second data bus. The number of data signals transmitted at one time through the first data bus may be less than or equal to the number of data signals transmitted at one time through the second data bus. The first substrate 1001*g*-1, the first host die 101*g* and the first memory apparatus 1040*g*-1 may be packaged in a first package.

The second host die 102*g* may include a host 1010*g*-2, a memory controller 1020*g*-2, and an interface circuit 1030*g*-2. The host 1010*g*-2, the memory controller 1020*g*-2, and the interface circuit 1030*g*-2 may be internal circuits of the second host die 102*g*. The second host die 102*g* and the second memory apparatus 1040*g*-2 may be disposed on a second substrate 1001*g*-2. The second substrate 1001*g*-2 may include a second interposer. The second host die 102*g* may be disposed in a first region on the second substrate 1001*g*-2, and the second memory apparatus 1040*g*-2 may be disposed in a second region on the second substrate 1001*g*-2. The first and second regions might not overlap. The second host die 102*g* may be electrically connected to the second substrate 1001*g*-2 through microbumps of the second host die 102*g*. The second memory apparatus 1040*g*-2 may be electrically connected to the second substrate 1001*g*-2 through microbumps of the second memory apparatus 1040*g*-2. The second substrate 1001*g*-2 may be disposed on the third substrate 1002*g*. The second substrate 1001*g*-2 may be disposed on the third substrate 1002*g* in a region different from the region where the first substrate 1001*g*-1 is disposed. The second substrate 1001*g*-2 may be electrically connected to the third substrate 1002*g* through microbumps or bumps of the second substrate 1001*g*-2.

The host 1010*g*-2 may be electrically connected to the memory controller 1020*g*-2 through a signal transmission line 1011*g*-2 inside the second host die 102*g*. The memory controller 1020*g*-2 may be electrically connected with the interface circuit 1030*g*-2 through a signal transmission line 1021*g*-2 inside the second host die 102*g*. The interface circuit 1030*g*-2 may be electrically connected with the second memory apparatus 1040*g*-2 through microbumps of the second host die 102*g* and a signal path 1031*g*-2 formed in the second substrate 1001*g*-2. The second memory apparatus 1040*g*-2 may be electrically connected to the signal path 1031*g*-2 through microbumps of the second memory apparatus 1040*g*-2. The signal transmission line 1011*g*-2 electrically connecting the host 1010*g*-2 and the memory controller 1020*g*-2 may correspond to the first bus 150 shown in FIG. 1. The signal transmission line 1021*g*-2 electrically connecting the memory controller 1020*g*-2 and the interface circuit 1030*g*-2 may correspond to the second bus 160 shown in FIG. 1. The signal path 1031*g*-2 between the interface circuit 1030*g*-2 and the second memory apparatus 1040*g*-2 may correspond to the third bus 170 shown in FIG. 1. A frequency of signal transmitted through the signal transmission line 1021*g*-2 may be greater than or equal to a frequency of signal transmitted through the signal path 1031*g*-2. The signal may be transmitted at a third clock rate through the signal path 1021*g*-2, and the signal may be transmitted at a fourth clock rate through the signal path 1031*g*-2. The third clock rate may be greater than or equal to the fourth clock rate. The third clock rate may be equal to or different from the first clock rate. The fourth clock rate may be equal to or different from the fourth clock rate. The signal transmission line 1021*g*-2 may include a third data bus, and the signal path 1031*g*-2 may include a fourth data bus. The number of data signals transmitted at one time through the third data bus may be less than or equal to the number of data signals transmitted at one time through the fourth data bus. In an embodiment, the first substrate 1001*g*-1, the first host die 101*g*, and the first memory apparatus 1040*g*-1 may be packaged in a first package. The second substrate 1001*g*-2, the second host die 102*g* and the second memory apparatus 1040*g*-2 may be packaged in a second package. The first and second packages may be disposed on the third substrate 1002*g* and packaged in a third package, and the integrated circuit package 1000*g* may be manufactured in a PIP (package in package) structure. The host 1010*g*-1 may be electrically connected with the host 1010*g*-2 through the microbumps of the first host die 101*g*, the signal path formed in the first substrate 1001*g*-1, the microbumps of the first substrate 1001*g*-1, the signal path of the third substrate 1002*g*, the microbumps of the second substrate 1001*g*-2, the signal path of the second substrate 1001*g*-2, and the microbumps of the second host die 102*g*.

Figure 10H:
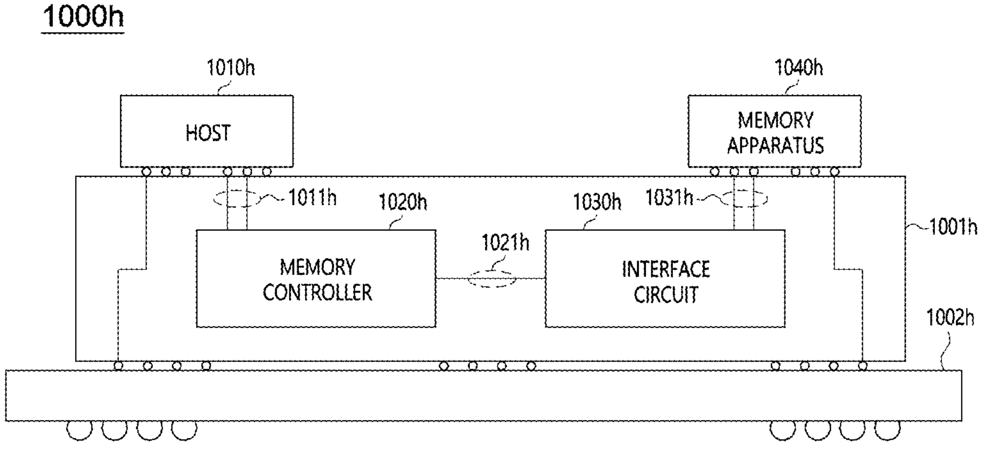
FIG. 10H is a diagram illustrating a configuration and connection relationship of an integrated circuit package according to an embodiment of the present disclosure.

FIG. 10H is a diagram illustrating a configuration and connection relationship of an integrated circuit package 1000*h* according to an embodiment of the present disclosure. Referring to FIG. 10H, the integrated circuit package 1000*h* may include a first substrate 1001*h*, a host 1010*h*, a memory controller 1020*h*, an interface circuit 1030*h*, and a memory apparatus 1040*h*. The memory apparatus 1040*h* may include any one of the memory apparatuses 930*b* to 930*d* shown in FIGS. 9B to 9D. The host 1010*h* and the memory apparatus 1040*h* may be disposed on the first substrate 1001*h*. The host 1010*h* may be disposed in a first region on the first substrate 1001*h*, and the memory apparatus 1040*h* may be disposed in a second region on the first substrate 1001*h*. The first and second regions might not overlap each other. The first substrate 1001*h* may be an active interposer that includes various signal paths as well as circuits to perform various functions. The host 1010*h* may be electrically connected to the first substrate 1001*h* through microbumps of the host 1010*h*. The memory apparatus 1040*h* may be electrically connected to the first substrate 1001*h* through microbumps of the memory apparatus 1040*h*. The integrated circuit package 1000*h* may further include a second substrate 1002*h*. The first substrate 1001*h* may be disposed on the second substrate 1002*h*. The second substrate 1002*h* may include an interposer or package substrate. The first substrate 1001*h* may be electrically connected to the second substrate 1002*h* through microbumps or bumps of the first substrate 1001*h*. The second substrate 1002*h* may be electrically connected to external devices through external terminals of the second substrate 1002*h*. The external terminals may include microbumps, bumps, solder balls, or package balls. The memory controller 1020*h* and the interface circuit 1030*h* may be formed within the first substrate 1001*h*. The memory controller 1020*h* and the interface circuit 1030*h* may be manufactured with the first substrate 1001*h* as internal circuits of the first substrate 1001*h*. The memory controller 1020*h* and the interface circuit 1030*h* may be electrically connected to the host 1010*h* and the memory apparatus 1040*h* through a plurality of signal paths formed within the first substrate 1001*h*. The second substrate 1002*h*, the first substrate 1001*h*, and the host 1010*h* and the memory apparatus 1040*h* disposed on the first substrate 1001*h*, may be packaged in a single package. In an embodiment, the first region of the first substrate 1001*h* where the host 1010*h* is disposed may be closer to the region where the memory controller 1020*h* is disposed than the region where the interface circuit 1030*h* is disposed within the first substrate 1001*h*. The second region of the first substrate 1001*h* where the memory apparatus 1040*h* is disposed may be closer to the region where the interface circuit 1030*h* is disposed than to the region where the memory controller 1020*h* is disposed within the first substrate 1001*h*.

The memory controller 1020*h* may be electrically connected to the host 1010*h* through a signal path 1011*h* and microbumps of the host 1010*h*. The memory controller 1020*h* may be electrically connected to the interface circuit 1030*h* through a signal path 1021*h*. The interface circuit 1030*h* may be electrically connected to the memory apparatus 1040*h* through a signal path 1031*h* and microbumps of the memory apparatus 1040*h*. The signal path 1011*h* between the host 1010*h* and the memory controller 1020*h* may correspond to the first bus 150 illustrated in FIG. 1. The signal path 1021*h* between the memory controller 1020*h* and the interface circuit 1030*h* may correspond to the second bus 160 shown in FIG. 1. The signal path 1031*h* between the interface circuit 1030*h* and the memory apparatus 1040*h* may correspond to the third bus 170 shown in FIG. 1. A frequency of signal transmitted through the signal path 1021*h* may be greater than or equal to a frequency of signal transmitted through the signal path 1031*h*. The signal may be transmitted at a first clock rate through the signal path 1021*h*, and the signal may be transmitted at a second clock rate through the signal path 1031*h*. The first clock rate may be greater than or equal to the second clock rate. The signal path 1021*h* may include a first data bus, and the signal path 1031*h* may include a second data bus. The number of data signals transmitted at one time through the first data bus may be less than or equal to the number of data signals transmitted at one time through the second data bus. In an embodiment, the first substrate 1001*h* may include some or all of the cache utilized by the host 1010*h*. If some or all of the cache utilized by the host 1010*h* is formed in the first substrate 1001*h*, then the host 1010*h* may include processing cores capable of performing more computational functions without increasing the size of the host 1010*h*. In an embodiment, a low-speed input/output circuit that allows the host 1010*h* to communicate directly with external devices may be further provided, and the low-speed input/output circuit may be formed in the first substrate 1001*h*. In an embodiment, a test circuit that allows the external devices to directly access the memory apparatus 1040*h* to test the memory apparatus 1040*h* may be further provided, and the test circuit may be formed in the first substrate 1001*h*.

Figure 10I:
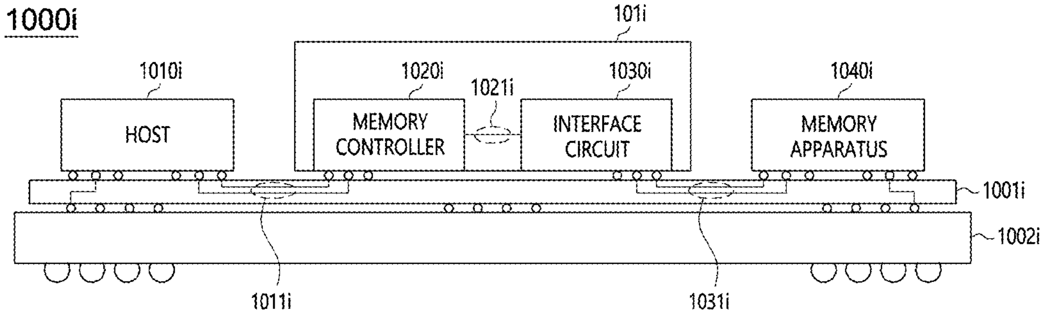
FIG. 10I is a diagram illustrating a configuration and connection relationship of an integrated circuit package according to an embodiment of the present disclosure.

FIG. 10I is a diagram illustrating a configuration and connection relationship of an integrated circuit package 1000*i* according to an embodiment of the present disclosure. Referring to FIG. 10I, the integrated circuit package 1000*i* may include a first substrate 1001*i*, a host 1010*i*, a controller die 101*i*, and a memory apparatus 1040*i*. The memory apparatus 1040*i* may include any one of the memory apparatuses 930*b* to 930*d* shown in FIGS. 9B to 9D. The controller die 101*i* may include a memory controller 1020*i* and an interface circuit 1030*i*. The controller die 101*i* may be manufactured as a separate die or chiplet from the host 1010*i*. The memory controller 1020*i* and the interface circuit 1030*i* may be internal circuits of the controller die 101*i*. The host 1010*i*, the controller die 101*i*, and the memory apparatus 1040*i* may be disposed on the first substrate 1001*i*. The first substrate 1001*i* may include an interposer. The host 1010*i* may be disposed in a first region on the first substrate 1001*i*. The controller die 101*i* may be disposed in a second region on the first substrate 1001*i*. The memory apparatus 1040*i* may be disposed in a third region on the first substrate 1001*i*. The first and third regions might not overlap each other. The host 1010*i* may be electrically connected to the first substrate 1001*i* through microbumps of the host 1010*i*. The controller die 101*i* may be electrically connected to the first substrate 1001*i* through microbumps of the controller die 101*i*. The memory apparatus 1040*i* may be electrically connected with the first substrate 1001*i* through microbumps of the memory apparatus 1040*i*. The integrated circuit package 1000*i* may further include a second substrate 1002*i*. The first substrate 1001*i* may be disposed on the second substrate 1002*i*. The second substrate 1002*i* may include an interposer or package substrate. The first substrate 1001*i* may be electrically connected to the second substrate 1002*i* through microbumps or bumps of the first substrate 1001*i*. The second substrate 1002*i* may be electrically connected to an external device through external terminals of the second substrate 1002*i*. The external terminals may include microbumps, bumps, solder balls, or package balls. The memory controller 1020*i* may be electrically connected to the first substrate 1001*i* through microbumps at a first side of the controller die 101*i*. The interface circuit 1030*i* may be electrically connected to the first substrate 1001*i* through microbumps at a second side of the controller die 101*i*. The second substrate 1002*i*, the first substrate 1001*i*, the host 1010*i*, the controller die 101*i*, and the memory apparatus 1040*i* may be packaged in a single package.

The host 1010*i* may be electrically connected to the memory controller 1020*i* through a signal path 1011*i* formed in the first substrate 1001*i*. The memory controller 1020*i* and the interface circuit 1030*i* may be electrically connected through a signal path 1021*i* inside the controller die 101*i*. The interface circuit 1030*i* may be electrically connected to the memory apparatus 1040*i* through a signal path 1031*i* formed in the first substrate 1001*i*. The signal path 1011*i* between the host 1010*i* and the memory controller 1020*i* may correspond to the first bus 150 shown in FIG. 1. The signal path 1021*i* electrically connecting the memory controller 1020*i* and the interface circuit 1030*i* may correspond to the second bus 160 shown in FIG. 1. The signal path 1031*i* between the interface circuit 1030*i* and the memory apparatus 1040*i* may correspond to the third bus 170 shown in FIG. 1. A frequency of signal transmitted through the signal path 1021*i* may be greater than or equal to a frequency of signal transmitted through the signal path 1031*i*. The signal may be transmitted at a first clock rate through the signal path 1021*i*, and the signal may be transmitted at a second clock rate through the signal path 1031*i*. The first clock rate may be greater than or equal to the second clock rate. The signal path 1021*i* may include a first data bus, and the signal path 1031*i* may include a second data bus. The number of data signals transmitted at one time through the first data bus may be less than or equal to the number of data signals transmitted at one time through the second data bus.

Figure 10J:
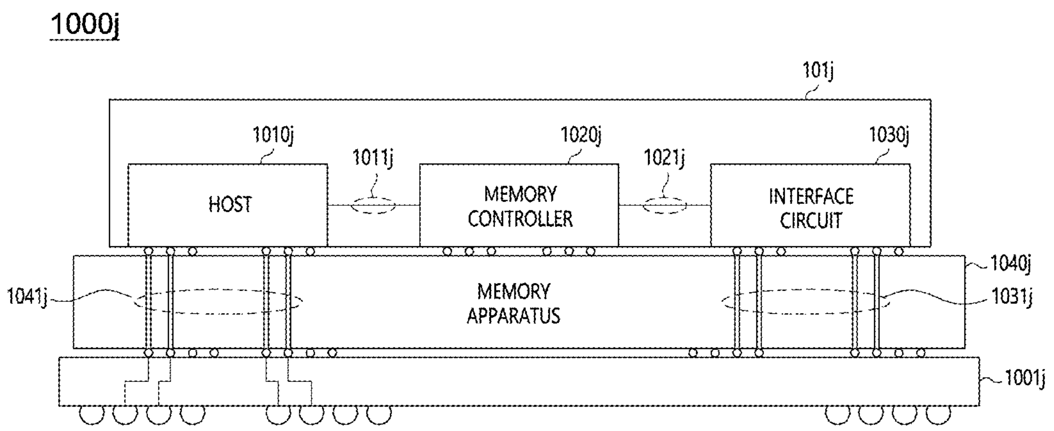
FIG. 10J is a diagram illustrating a configuration and connection relationship of an integrated circuit package according to an embodiment of the present disclosure.

FIG. 10J is a diagram illustrating a configuration and connection relationship of an integrated circuit package 1000*j* according to an embodiment of the present disclosure. Referring to FIG. 10J, the integrated circuit package 1000*j* may include a substrate 1001*j*, a host die 101*j* and a memory apparatus 1040*j*. The memory apparatus 1040*j* may include any one of the memory apparatuses 940*b*, 940*d* shown in FIGS. 9B and 9D. Through vias may be formed in the memory apparatus 1040*j*. The host die 101*j* may include a host 1010*j*, a memory controller 1020*j*, and an interface circuit 1030*j*. The host 1010*j*, the memory controller 1020*j*, and the interface circuit 1030*j* may be internal circuits of the host die 101*j*. The host die 101*j* and the memory apparatus 1040*j* may be disposed on the substrate 1001*j*. The memory apparatus 1040*j* may be disposed on the substrate 1001*j*, and the host die 101*j* may be disposed on the memory apparatus 1040*j*. The host die 101*j* may be electrically connected to the memory apparatus 1040*j* through microbumps of the host die 101*j*. The host die 101*j* may be electrically connected with the substrate 1001*j* and the memory apparatus 1040*j* through vias formed in the memory apparatus 1040*j*. The memory apparatus 1040*j* may be electrically connected to the substrate 1001*j* through microbumps of the memory apparatus 1040*j*. The substrate 1001*j* may include at least one of an interposer, a redistribution layer, and a glass substrate. In an embodiment, the integrated circuit package 1000*j* may further include another substrate, and the substrate 1001*j* may be disposed on the another substrate. The substrate 1001*j* may be electrically connected to an external device through the another substrate. The another substrate may include another interposer or package substrate.

The host 1010*j* may be electrically connected to the memory controller 1020*j* through a signal transmission line 1011*j* inside the host die 101*j*. The host 1010*j* may be electrically connected to a signal path formed in the substrate 1001*j* through microbumps of the host die 101*j*, through vias 1041*j* formed in the memory apparatus 1040*j*, and microbumps of the memory apparatus 1040*j*. The signal path may be electrically connected to the another substrate or an external device through microbumps, bumps, solder balls, or package balls on the substrate 1001*j*. The memory controller 1020*j* may be electrically connected to the interface circuit 1030*j* through a signal transmission line 1021*j* inside the host die 101*j*. The interface circuit 1030*j* may be electrically connected with the memory apparatus 1040*j* through microbumps of the host die 101*j* and through vias 1031*j* formed in the memory apparatus 1040*j*. The signal transmission line 1011*j* electrically connecting the host 1010*j* and the memory controller 1020*j* may correspond to the first bus 150 shown in FIG. 1. The signal transmission line 1021*j* electrically connecting the memory controller 1020*j* and the interface circuit 1030*j* may correspond to the second bus 160 shown in FIG. 1. The microbumps and through vias 1031*j* electrically connecting the interface circuit 1030*j* and the memory apparatus 1040*j* may correspond to the third bus 170 shown in FIG. 1. The substrate 1001*j*, the host die 101*j* and the memory apparatus 1040*j* may be packaged in a single package. A frequency of signal transmitted through the signal transmission line 1021*j* may be greater than or equal to a frequency of signal transmitted through the through via 1031*j*. The signal may be transmitted at a first clock rate through the signal transmission line 1021*j*, and the signal may be transmitted at a second clock rate through the through via 1031*j*. The first clock rate may be greater than or equal to the second clock rate. The signal transmission line 1021*j* may include a first data bus, and the through via 1031*j* may include a second data bus. The number of data signals transmitted at one time through the first data bus may be less than or equal to the number of data signals transmitted at one time through the second data bus.

Figure 10K:
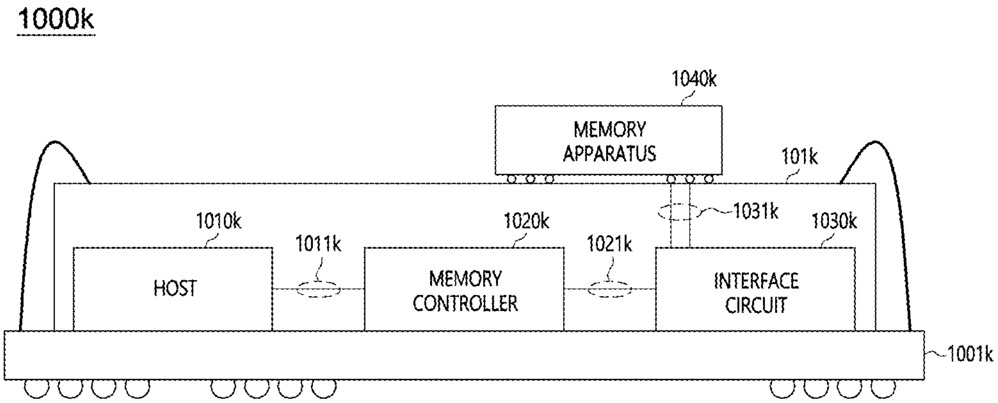
FIG. 10K is a diagram illustrating a configuration and connection relationship of an integrated circuit package according to an embodiment of the present disclosure.

FIG. 10K is a diagram illustrating a configuration and connection relationship of an integrated circuit package 1000*k* according to an embodiment of the present disclosure. Referring to FIG. 10K, the integrated circuit package 1000*k* may include a substrate 1001*k*, a host die 101*k* and a memory apparatus 1040*k*. The memory apparatus 1040*k* may include any one of the memory apparatuses 930*b* to 930*d* illustrated in FIGS. 9B to 9D. The host die 101*k* may include a host 1010*k*, a memory controller 1020*k*, and an interface circuit 1030*k*. The host 1010*k*, the memory controller 1020*k*, and the interface circuit 1030*k* may be internal circuits of the host die 101*k*. The host die 101*k* and the memory apparatus 1040*k* may be disposed on the substrate 1001*k*. The substrate 1001*k* may include a package substrate. The host die 101*k* may be disposed on the substrate 1001*k*, and the memory apparatus 1040*k* may be disposed on the host die 101*k*. The memory apparatus 1040*k* may be electrically connected to the host die 101*k* through microbumps of the memory apparatus 1040*k*. The host die 101*k* may be electrically connected to the substrate 1001*k* through wire bondings. In an embodiment, the substrate 1001*k* may be replaced by an interposer, and the host die 101*k* may include microbumps. The host die 101*k* may be electrically connected to the interposer through the microbumps instead of the wire bonding, or may be electrically connected to the redistribution layer through microbumps or without microbumps. The substrate 1001*k* may be electrically connected to an external device through external terminals (e.g., solder balls or package balls).

The host 1010*k* may be electrically connected to the memory controller 1020*k* through a signal transmission line 1011*k* inside the host die 101*k*. The host 1010*k* may be electrically connected to the external devices through wire bonding between the host die 101*k* and the substrate 1001*k*. The memory controller 1020*k* may be electrically connected with the interface circuit 1030*k* through a signal transmission line 1021*k* inside the host die 101*k*. The interface circuit 1030*k* may be electrically connected with the memory apparatus 1040*k* through a signal transmission line 1031*k* inside the host die 101*k* and microbumps of the memory apparatus 1040*k*. The signal transmission line 1011*k* electrically connecting the host 1010*k* and the memory controller 1020*k* may correspond to the first bus 150 shown in FIG. 1. The signal transmission line 1021*k* electrically connecting the memory controller 1020*k* and the interface circuit 1030*k* may correspond to the second bus 160 shown in FIG. 1. The signal transmission line 1031*k* electrically connecting the interface circuit 1030*k* and the memory apparatus 1040*k* and the microbumps may correspond to the third bus 170 shown in FIG. 1. A frequency of signal transmitted through the signal transmission line 1021*k* may be greater than or equal to a frequency of signal transmitted through the signal transmission line 1031*k*. The signal may be transmitted at a first clock rate through the signal transmission line 1021*k*, and the signal may be transmitted at a second clock rate through the signal transmission line 1031*k*. The first clock rate may be greater than or equal to the second clock rate. The signal transmission line 1021*k* may include a first data bus, and the signal transmission line 1031*k* may include a second data bus. The number of data signals transmitted at one time through the first data bus may be less than or equal to the number of data signals transmitted at one time through the second data bus. The substrate 1001*k*, the host die 101*k* and the memory apparatus 1040*k* may be packaged in a single package.

Figure 10L:
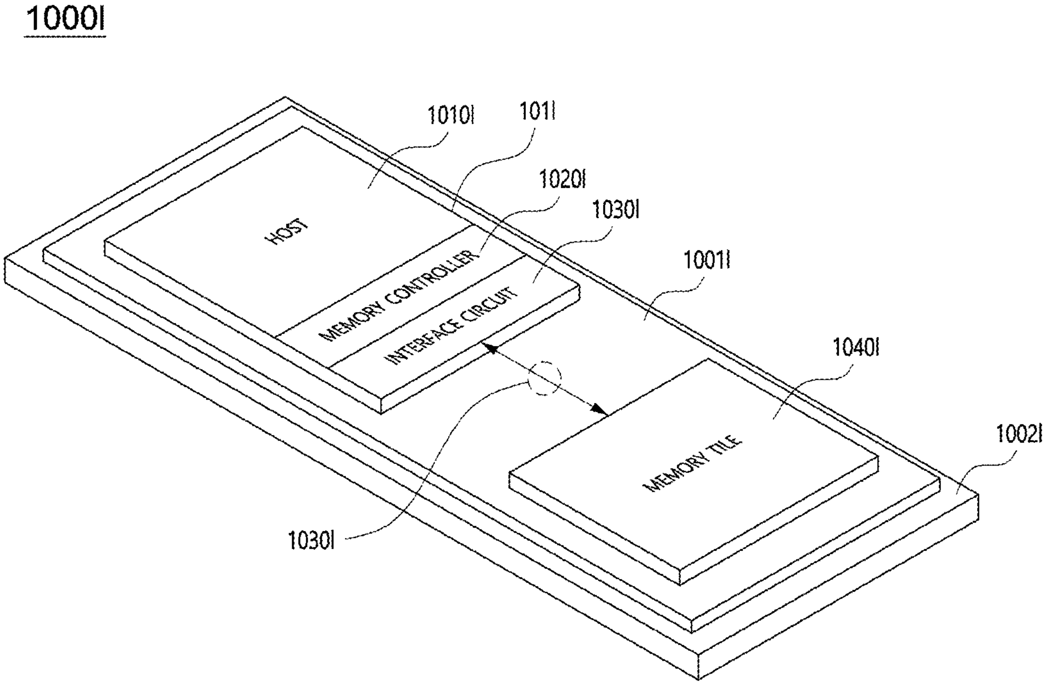
FIG. 10L is a diagram illustrating a configuration and connection relationship of an integrated circuit package according to an embodiment of the present disclosure.

FIG. 10L is a diagram illustrating a configuration and connection relationship of an integrated circuit package 1000*l* according to an embodiment of the present disclosure. Referring to FIG. 10L, the integrated circuit package 1000*l* may include a host tile 101*l* and a memory tile 1040*l*. In FIG. 10L, a tile may refer to a die, structure, unit module, or chiplet of a single device. The host tile 101*l* may include a host 1010*l*, a memory controller 1020*l*, and an interface circuit 1030*l*. The memory tile 1040*l* may include at least one memory die, and may include any one of the memory apparatuses 930*a* to 930*d* shown in FIGS. 9A to 9D. The host tile 101*l* and the memory tile 1040*l* may be disposed on and electrically connected to a base tile 1001*l*. The base tile 1001*l* may include signal paths for electrically connecting a plurality of tiles mounted on the base tile 1001*l*. The base tile 1001*l* may be disposed on a substrate 1002*l*. The substrate 1002*l* may include any one of an interposer, a package substrate, an organic substrate, and a redistribution layer. The host 1010*l* and the memory controller 1020*l* may be electrically connected through a signal transmission line inside the host tile 101*l*, and the memory controller 1020*l* and the interface circuit 1030*l* may be electrically connected through a signal transmission line inside the host tile 101*l*. The interface circuit 1030*l* may be electrically connected to the memory tile 1040*l* through a signal path 1031*l* formed inside the base tile 1001*l*. The signal transmission line electrically connecting the host 1010*l* and the memory controller 1020*l* may correspond to the first bus 150 shown in FIG. 1. The signal transmission line electrically connecting the memory controller 1020*l* to the interface circuit 1030*l* may correspond to the second bus 160 shown in FIG. 1. The signal path 1031*l* formed inside the base tile 1001*l* and electrically connecting the interface circuit 1030*l* and the memory tile 1040*l* may correspond to the third bus 170 shown in FIG. 1. Some or all of the host tile 101*l* and the memory tile 1040*l* may be manufactured using process technologies of different characteristics. The host tile 101*l*, the memory tile 1040*l*, the base tile 1001*l*, and the substrate 1002*l* may be packaged in one package to form a single semiconductor apparatus.

Figure 10M:
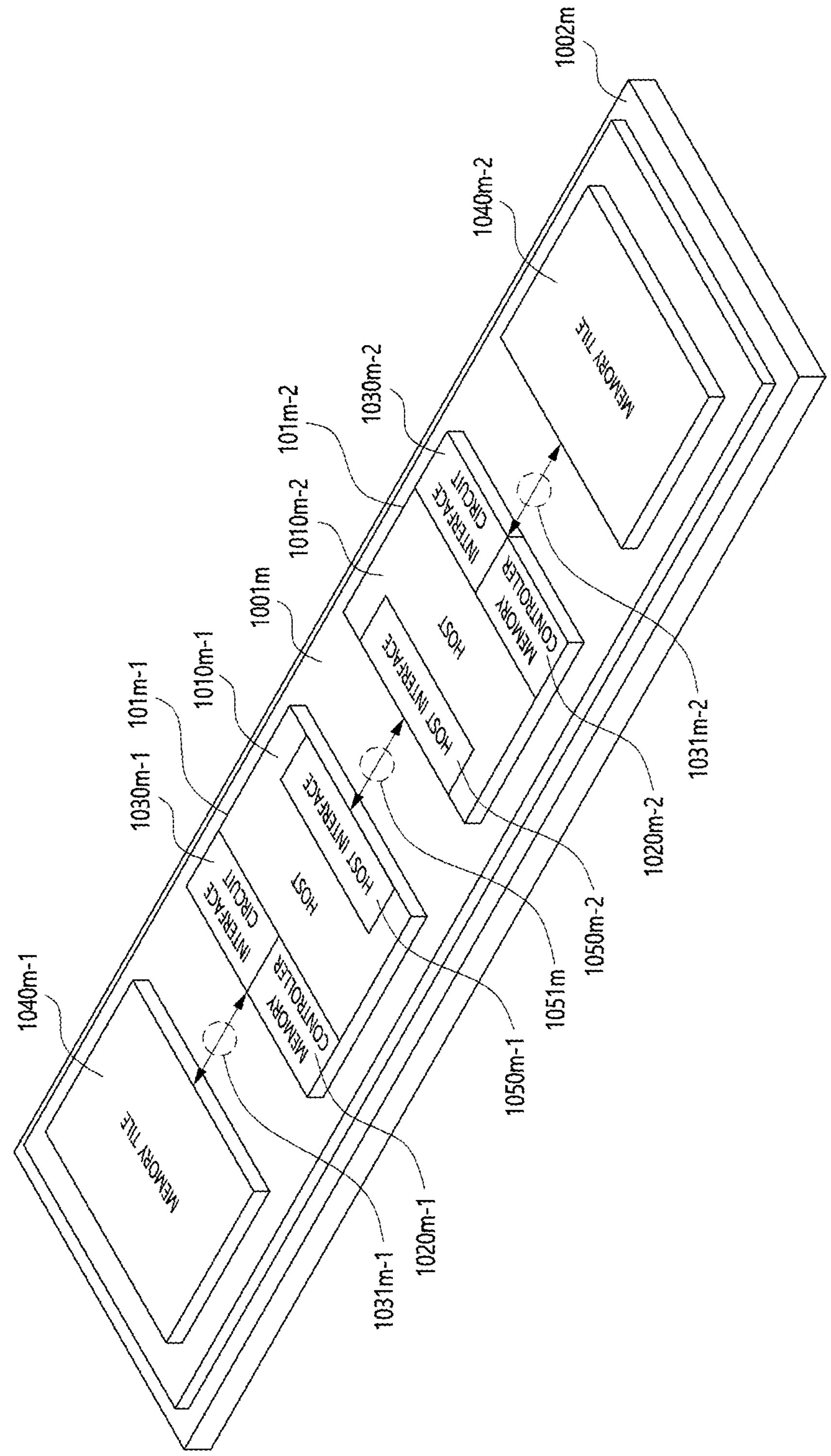
FIG. 10M is a diagram illustrating a configuration and connection relationship of an integrated circuit package according to an embodiment of the present disclosure.

FIG. 10M is a diagram illustrating a configuration and connection relationship of an integrated circuit package 1000*m* according to an embodiment of the present disclosure. Referring to FIG. 10M, the integrated circuit package 1000*m* may include a plurality of host tiles and a plurality of memory tiles. The integrated circuit package 1000*m* may include a first host tile 101*m*-1, a second host tile 101*m*-2, a first memory tile 1040*m*-1, and a second memory tile 1040*m*-2. The first host tile 101*m*-1 may include a first host 1010*m*-1, a first memory controller 1020*m*-1, and a first interface circuit 1030*m*-1. The second host tile 101*m*-2 may include a second host 1010*m*-2, a second memory controller 1020*m*-2, and a second interface circuit 1030*m*-2. The first memory tile 1040*m*-1 may include at least one memory die, and may include any one of the memory apparatuses 930*b* to 930*d* shown in FIGS. 9B to 9D. The second memory tile 1040*m*-2 may include at least one memory die, and may include any one of the memory apparatuses 930*a* to 930*d* shown in FIGS. 9A to 9D. The second memory tile 1040*m*-2 may have substantially the same structure as the first memory tile 1040*m*-1, or may have a different structure than the first memory tile 1040*m*-1. In an embodiment, the first host tile 101*m*-1 may further include a first host interface 1050*m*-1 and the second host tile 101*m*-2 may further include a second host interface 1050*m*-2. The first and second host tiles 101*m*-1, 101*m*-2 may be electrically connected through the first and second host interfaces 1050*m*-1, 1050*m*-2.

The first host tile 101*m*-1, the second host tile 101*m*-2, the first memory tile 1040*m*-1, and the second memory tile 1040*m*-2 may be disposed on and electrically connected to a base tile 1001*m*. The base tile 1001*m* may include signal paths for electrically connecting a plurality of tiles mounted on the base tile 1001*m*. Although not shown, a plurality of signal paths may be formed within the base tile 1001*m* for electrically connecting the first host tile 101*m*-1 and the second host tile 101*m*-2, the first host tile 101*m*-1 and the first memory tile 1040*m*-1, and the second host tile 101*m*-2 and the second memory tile 1040*m*-2. The base tile 1001*m* may be disposed on a substrate 1002*m*. The substrate 1002*m* may include any one of an interposer, a package substrate, an organic substrate, and a redistribution layer. The first host 1010*m*-1 and the first memory controller 1020*m*-1 may be electrically connected through a signal transmission line inside the first host tile 101*m*-1, and the first memory controller 1020*m*-1 and the first interface circuit 1030*m*-1 may be electrically connected through a signal transmission line inside the first host tile 101*m*-1. The first interface circuit 1030*m*-1 may be electrically connected to the first memory tile 1040*m*-1 through a signal path 1031*m*-1 formed in the base tile 1001*m*. The second host 1010*m*-2 and the second memory controller 1020*m*-2 may be electrically connected through a signal transmission line inside the second host tile 101*m*-2, and the second memory controller 1020*m*-2 and the second interface circuit 1030*m*-2 may be electrically connected through a signal transmission line inside the second host tile 101*m*-2. The second interface circuit 1030*m*-2 may be electrically connected to the second memory tile 1040*m*-2 through a signal path 1031*m*-2 formed in the base tile 1001*m*. The first host tile 101*m*-1 may be electrically connected to the second host tile 101*m*-2 through a signal path 1051*m* formed in the base tile 1001*m*. The signal path 1051*m* may electrically connect between the first and second host interfaces 1050*m*-1 and 1050*m*-2. The signal transmission lines electrically connecting the first and second hosts 1010*m*-1, 1010*m*-2 and the signal transmission lines electrically connecting the first and second memory controllers 1020*m*-1, 1020*m*-2, may correspond respectively to the first bus 150 shown in FIG. 1. The signal transmission lines electrically connecting the first and second memory controllers 1020*m*-1 and 1020*m*-2 and the signal transmission lines electrically connecting the first and second interface circuits 1030*m*-1 and 1030*m*-2, may correspond respectively to the second bus 160 shown in FIG. 1. The signal paths formed in the base tile 1001*m* and electrically connecting the first and second interface circuits 1030*m*-1 and 1030*m*-2 and the signal transmission lines electrically connecting the first and second memory tiles 1040*m*-1 and 1040*m*-2 may correspond respectively to the third bus 170 shown in FIG. 1. The first host tile 101*m*-1, the second host tile 101*m*-2, the first memory tile 1040*m*-1, the second memory tile 1040*m*-2, the base tile 1001*m*, and the substrate 1002*m* may be packaged in a single package to form a single semiconductor apparatus.

Figure 10N:
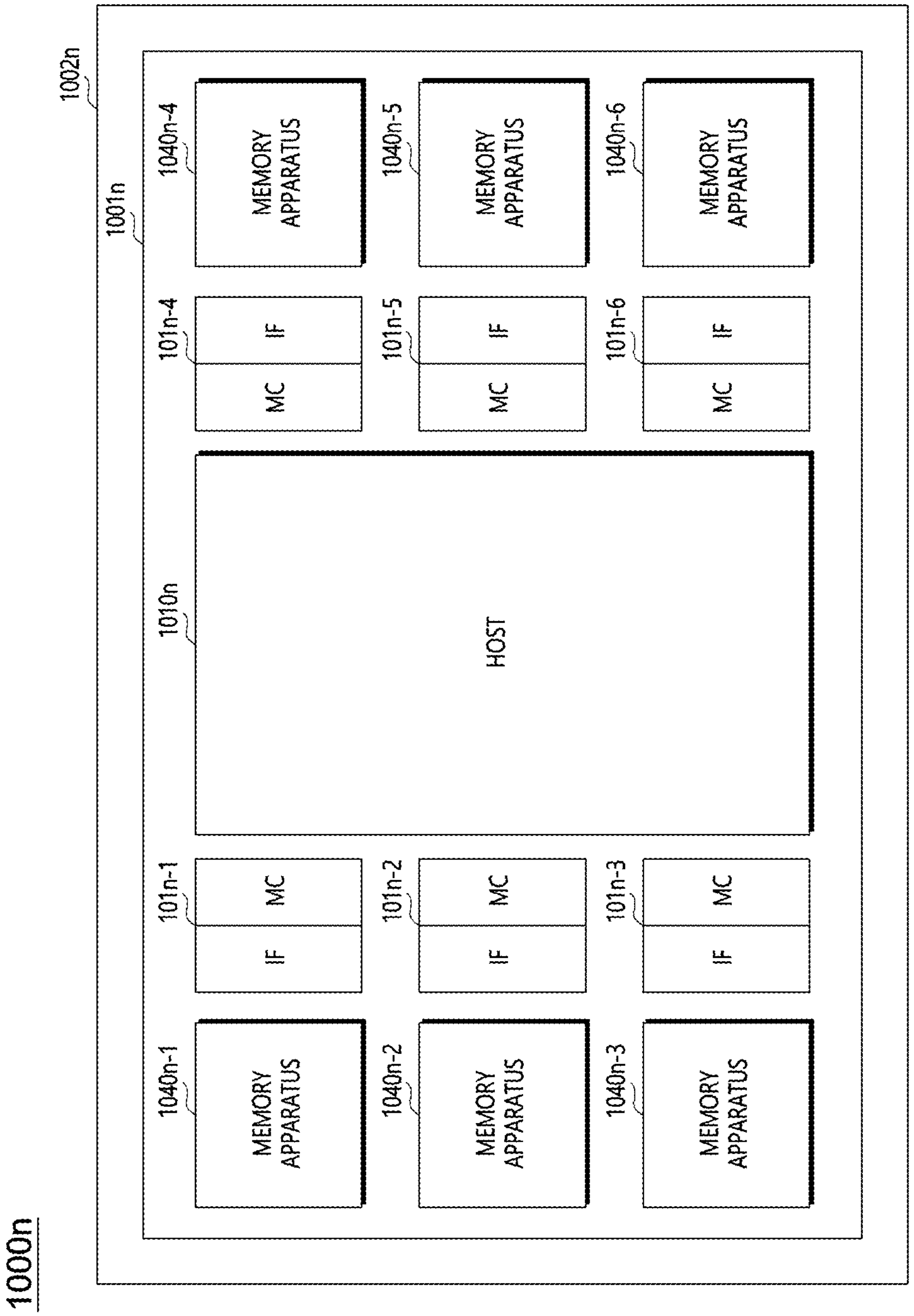
FIG. 10N is a diagram illustrating a configuration and connection relationship of an integrated circuit package according to an embodiment of the present disclosure.

FIG. 10N is a diagram illustrating a configuration and connection relationship of an integrated circuit package 1000*n* according to an embodiment of the present disclosure. Referring to FIG. 10N, the integrated circuit package 1000*n* may include at least one host, a plurality of controller dies, and a plurality of memory apparatuses. In FIG. 10N, the integrated circuit package 1000*n* is shown to include six controller dies and six memory apparatuses, but this exemplary illustration is not intended to limit the number of controller dies and memory apparatuses that the integrated circuit package 1000*n* includes. The integrated circuit package 1000*n* may include two, four, or eight or more controller dies, and may include two, four, or eight or more memory apparatuses electrically connected with each of the controller dies. In an embodiment, the number of memory apparatuses electrically connected with one controller die may be two or more. The integrated circuit package 1000*n* may include a host 1010*n*, a first controller die 101*n*-1, a second controller die 101*n*-2, a third controller die 101*n*-3, a fourth controller die 101*n*-4, and a fifth controller die 101*n*-5, a sixth controller die 101*n*-6, a first memory apparatus 1040*n*-1, a second memory apparatus 1040*n*-2, a third memory apparatus 1040*n*-3, a fourth memory apparatus 1040*n*-4, a fifth memory apparatus 1040_n_-5, and a sixth memory apparatus 1040_n_-6. The host 1010_n_ may be manufactured in a single die or tile, and may include a plurality of processor cores. The host 1010_n_ may be manufactured as a core complex die, which includes at least two processor cores. Each of the first to six controller dies 101_n_-1, 101_n_-2, 101_n_-3, 101_n_-4, 101_n_-5, 101_n_-6 may be manufactured in a single die or tile. Each of the first to six controller dies 101_n_-1, 101_n_-2, 101_n_-3, 101_n_-4, 101_n_-5, 101_n_-6 may include a memory controller MC and an interface circuit IF. The memory controllers MC and the interface circuits IF of the first to sixth controller dies 101_n_-1, 101_n_-2, 101_n_-3, 101_n_-4, 101_n_-5, 101_n_-6 may be respectively electrically connected through signal transmission paths inside the first to sixth controller dies 101_n_-1, 101_n_-2, 101_n_-3, 101_n_-4, 101_n_-5, 101_n_-6, respectively. The first to six memory apparatuses 1040_n_-1, 1040_n_-2, 1040_n_-3, 1040_n_-4, 1040_n_-5, 1040_n_-6 may each include at least one memory die. Each of the first to six memory apparatuses 1040_n_-1, 1040_n_-2, 1040_n_-3, 1040_n_-4, 1040_n_-5, 1040_n_-6 may include at least one of the memory apparatuses 940_a_ to 940_d_ illustrated in FIGS. 9A to 9D. All of the first to six memory apparatuses 1040_n_-1, 1040_n_-2, 1040_n_-3, 1040_n_-4, 1040_n_-5, 1040_n_-6 may have the same structure, or some or all of the first to six memory apparatuses 1040_n_-1, 1040_n_-2, 1040_n_-3, 1040_n_-4, 1040_n_-5, 1040_n_-6 may have different structures.

The host 1010_n_, the first to six controller dies 101_n_-1, 101_n_-2, 101_n_-3, 101_n_-4, 101_n_-5, 101_n_-6, and the first to six memory apparatuses 1040_n_-1, 1040_n_-2, 1040_n_-3, 1040_n_-4, 1040_n_-5, 1040_n_-6 may be disposed on a first substrate 1001_n_. The first substrate 1001_n_ may include an interposer. The first substrate 1001_n_ may include signal paths for electrically connecting the host 1010_n_ and the first to six controller dies 101_n_-1, 101_n_-2, 101_n_-3, 101_n_-4, 101_n_-5, 101_n_-6, respectively, and signal paths for electrically connecting the first to six controller dies 101_n_-1, 101_n_-2, 101_n_-3, 101_n_-4, 101_n_-5, 101_n_-6 and the first to sixth memory apparatuses 1040_n_-1, 1040_n_-2, 1040_n_-3, 1040_n_-4, 1040_n_-5, 1040_n_-6, respectively. In an embodiment, the first substrate 1001_n_ may be replaced by a base tile, and the host 1010_n_, the first to six controller dies 101_n_-1, 101_n_-2, 101_n_-3, 101_n_-4, 101_n_-5, 101_n_-6, and the first to six memory apparatuses 1040_n_-1, 1040_n_-2, 1040_n_-3, 1040_n_-4, 1040_n_-5, 1040_n_-6 may each be manufactured as a separate and independent tile that is electrically connected with the base tile. The integrated circuit package 1000_n_ may further include a second substrate 1002_n_, and the first substrate 1001_n_ may be disposed on the second substrate 1002_n_. The second substrate 1002_n_ may include an interposer or package substrate. The host 1010_n_ and a memory controller MC of the first controller die 101_n_-1 may be electrically connected through a signal path formed in the first substrate 1001_n_. An interface circuit IF of the first controller die 101_n_-1 and the first memory apparatus 1040_n_-1 may be electrically connected through a signal path formed in the first substrate 1001_n_. The host 1010_n_ and a memory controller MC of the second controller die 101_n_-2 may be electrically connected through a signal path formed in the first substrate 1001_n_. An interface circuit IF of the second controller die 101_n_-2 and the second memory apparatus 1040_n_-2 may be electrically connected through a signal path formed in the first substrate 1001_n_. The host 1010_n_ and a memory controller MC of the third controller die 101_n_-3 may be electrically connected through a signal path formed in the first substrate 1001_n_. An interface circuit IF of the third controller die 101_n_-3 and the third memory apparatus 1040_n_-3 may be electrically connected through a signal path formed in the first substrate 1001_n_. The host 1010_n_ and a memory controller MC of the fourth controller die 101_n_-4 may be electrically connected through a signal path formed in the first substrate 1001_n_. An interface circuit IF of the fourth controller die 101_n_-4 and the fourth memory apparatus 1040_n_-4 may be electrically connected through a signal path formed in the first substrate 1001_n_. The host 1010_n_ and a memory controller MC of the fifth controller die 101_n_-5 may be electrically connected through a signal path formed in the first substrate 1001_n_. An interface circuit IF of the fifth controller die 101_n_-5 and the fifth memory apparatus 1040_n_-5 may be electrically connected through a signal path formed in the first substrate 1001_n_. The host 1010_n_ and a memory controller MC of the sixth controller die 101_n_-6 may be electrically connected through a signal path formed in the first substrate 1001_n_. An interface circuit IF of the sixth controller die 101_n_-6 and the sixth memory apparatus 1040_n_-6 may be electrically connected through a signal path formed in the first substrate 1001_n_. The signal paths electrically connecting the host 1010_n_ and the memory controllers MC of the first to six controller dies 101_n_-1, 101_n_-2, 101_n_-3, 101_n_-4, 101_n_-5, 101_n_-6, respectively, may each correspond to the first bus 150 shown in FIG. 1. The signal transmission lines electrically connecting the memory controllers MC of the first to sixth controller dies 101_n_-1, 101_n_-2, 101_n_-3, 101_n_-4, 101_n_-5, 101_n_-6 to the interface circuits IF, respectively, may each correspond to the second bus 160 shown in FIG. 1. The signal paths electrically connecting the interface circuits IF of the first to six controller dies 101_n_-1, 101_n_-2, 101_n_-3, 101_n_-4, 101_n_-5, 101_n_-6 and the first to six memory apparatuses 1040_n_-1, 1040_n_-2, 1040_n_-3, 1040_n_-4, 1040_n_-5, 1040_n_-6, respectively, may each correspond to the third bus 170 shown in FIG. 1. The host 1010_n_, the first to six controller dies 101_n_-1, 101_n_-2, 101_n_-3, 101_n_-4, 101_n_-5, 101_n_-6, the first to six memory apparatuses 1040_n_-1, 1040_n_-2, 1040_n_-3, 1040_n_-4, 1040_n_-5, 1040_n_-6, the first substrate 1001_n_, and the second substrate 1002_n_ may be packaged in one package to form a single semiconductor apparatus.

Figure 11:
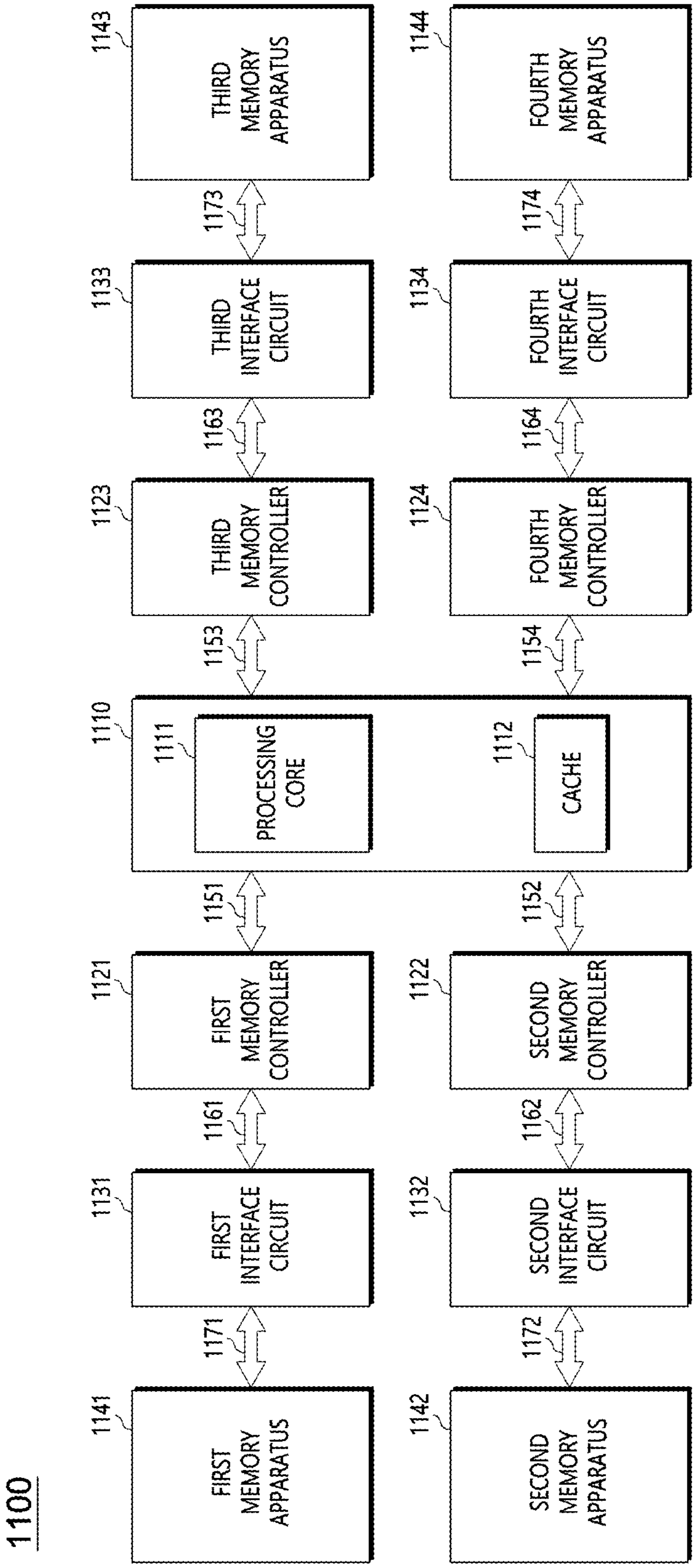
FIG. 11 is a diagram illustrating a configuration of a computing system according to an embodiment of the present disclosure.

FIG. 11 is a diagram illustrating a configuration of a computing system 1100 according to an embodiment of the present disclosure. Referring to FIG. 11, the computing system 1100 may be a computing logic hardware that includes at least one of a system on chip (SoC), a central processing unit (CPU), a graphic processing unit (GPU), a field programmable gate array (FPGA), a data processing unit (DPU), a vision processing unit (VPU), a neural processing unit (NPU), and an application specific integrated circuit (ASIC) as a computing architecture suitable for performing various applications executed by a user. The computing system 1100 may include a host 1110, a first memory controller 1121, a second memory controller 1122, a third memory controller 1123, a fourth memory controller 1124, a first interface circuit 1131, a second interface circuit 1132, a third interface circuit 1133, a fourth interface circuit 1134, a first memory apparatus 1141, a second memory apparatus 1142, a third memory apparatus 1143, and a fourth memory apparatus 1144. The host 1110 may generate access requests to access the first to fourth memory apparatuses 1141, 1142, 1143, 1144 to perform data communications. The host 1110 may selectively access at least one of the first to fourth memory apparatuses 1141, 1142, 1143, 1144, and may access at least two of the first to fourth memory apparatuses 1141, 1142, 1143, 1144 simultaneously. The host 1110 may include a processing core 1111 and a cache 1112. The processing core 1111 may generate a plurality of access requests to access each of the first to fourth memory apparatuses 1141, 1142, 1143, 1144 to perform computational operations required for execution of the applications. The processing core 1111 may include at least one core. The processing core 1111 may include one core, and the one core may generate a plurality of access requests to access the first to fourth memory apparatuses 1141, 1142, 1143, 1144 one by one or simultaneously. The processing core 1111 may include two or more cores, and the two or more cores may independently generate a plurality of access requests for accessing one or more of the first to fourth memory apparatuses 1141, 1142, 1143, 1144. The cache 1112 may be configured as a computer memory buffer to mitigate the difference in operating speed between the host 1110 and the first to fourth memory apparatuses 1141, 1142, 1143, 1144. The cache 1112 may improve the operating speed and/or performance of the host 1110 because the processing core 1111 does not need to access the first to fourth memory apparatuses 1141, 1142, 1143, 1144 if the data or computation results required by the processing core 1111 are stored in the cache 1112.

The host 1110 may be electrically connected to the first memory controller 1121 through a first host bus 1151. The host 1110 may transmit an access request and data to the first memory controller 1121 through the first host bus 1151 to access the first memory apparatus 1141, and may receive data from the first memory controller 1121. The host 1110 may be electrically connected to the second memory controller 1122 through a second host bus 1152. The host 1110 may transmit an access request and data to the second memory controller 1122 through the second host bus 1152 to access the second memory apparatus 1142, and may receive data from the second memory controller 1122. The host 1110 may be electrically connected to the third memory controller 1123 through a third host bus 1153. The host 1110 may transmit an access request and data to the third memory controller 1123 through the third host bus 1153 to access the third memory apparatus 1143, and may receive data from the third memory controller 1123. The host 1110 may be electrically connected to the fourth memory controller 1124 through a fourth host bus 1154. The host 1110 may transmit an access request and data to the fourth memory controller 1124 through the fourth host bus 1154 to access the fourth memory apparatus 1144, and may receive data from the fourth memory controller 1124. The first bus 150 illustrated in FIG. 1 may be applied as each of the first to fourth host buses 1151, 1152, 1153, 1154, and each of the first to fourth host buses 1151, 1152, 1153, 1154 may have substantially the same characteristics as the first bus 150.

The first memory controller 1121 may be electrically connected to the first interface circuit 1131 through a first controller bus 1161. The first memory controller 1121 may generate a command signal, an address signal, and a write data signal based on the access request and data received from the host 1110. The first memory controller 1121 may transmit the command signal, the address signal, and the write data signal to the first interface circuit 1131 through the first controller bus 1161, and may receive a read data signal from the first interface circuit 1131. The first memory controller 1121 may generate data that is transmitted to the host 1110 through the first host bus 1151 based on the read data signal. The second memory controller 1122 may be electrically connected to the second interface circuit 1132 through a second controller bus 1162. The second memory controller 1122 may generate a command signal, an address signal, and a write data signal based on the access request and data received from the host 1110. The second memory controller 1122 may transmit the command signal, the address signal, and the write data signal to the second interface circuit 1132 through the second controller bus 1162, and may receive a read data signal from the second interface circuit 1132. The second memory controller 1122 may generate data based on the read data signal that is transmitted to the host 1110 through the second host bus 1152. The third memory controller 1123 may be electrically connected to the third interface circuit 1133 through a third controller bus 1163. The third memory controller 1123 may generate a command signal, an address signal, and a write data signal based on the access request and data received from the host 1110. The third memory controller 1123 may transmit the command signal, the address signal, and the write data signal to the third interface circuit 1133 through the third controller bus 1163, and may receive a read data signal from the third interface circuit 1133. The third memory controller 1123 may generate data that is transmitted to the host 1110 through the third host bus 1153 based on the read data signal. The fourth memory controller 1124 may be electrically connected to the fourth interface circuit 1134 through a fourth controller bus 1164. The fourth memory controller 1124 may generate a command signal, an address signal, and a write data signal based on the access request and data received from the host 1110. The fourth memory controller 1124 may transmit the command signal, the address signal, and the write data signal to the fourth interface circuit 1134 through the fourth controller bus 1164, and may receive a read data signal from the fourth interface circuit 1134. The fourth memory controller 1124 may generate data that is transmitted to the host 1110 through the fourth host bus 1154 based on the read data signal. The second bus 160 illustrated in FIG. 1 may be applied as each of the first to fourth controller buses 1161, 1162, 1163, 1164, and each of the first to fourth controller buses 1161, 1162, 1163, 1164 may have substantially the same characteristics as the second bus 160.

The first interface circuit 1131 may be electrically connected to the first memory apparatus 1141 through a first memory bus 1171. The first interface circuit 1131 may generate a row address signal, a column address signal, a command signal, and a memory data signal based on the command signal, the address signal, and the write data signal received from the first memory controller 1121 through the first controller bus 1161. The first interface circuit 1131 may transmit the row address signal, the column address signal, the command signal, and the memory data signal to the first memory apparatus 1141 through the first memory bus 1171. The first interface circuit 1131 may receive the memory data signal transmitted from the first memory apparatus 1141 through the first memory bus 1171, and may generate a read data signal based on the memory data signal. The first interface circuit 1131 may transmit the read data signal to the first memory controller 1121 through the first controller bus 1161. The second interface circuit 1132 may be electrically connected to the second memory apparatus 1142 through a second memory bus 1172. The second interface circuit 1132 may generate a row address signal, a column address signal, a command signal, and a memory data signal based on the command signal, the address signal, and the write data signal received from the second memory controller 1122 through the second controller bus 1162. The second interface circuit 1132 may transmit the row address signal, the column address signal, the command signal, and the memory data signal to the second memory apparatus 1142 through the second memory bus 1172. The second interface circuit 1132 may receive the memory data signal transmitted from the second memory apparatus 1142 through the second memory bus 1172, and may generate a read data signal based on the memory data signal. The second interface circuit 1132 may transmit the read data signal to the second memory controller 122 through the second controller bus 1162. The third interface circuit 1133 may be electrically connected to the third memory apparatus 1143 through a third memory bus 1173. The third interface circuit 1133 may generate a row address signal, a column address signal, a command signal, and a memory data signal based on the command signal, the address signal, and the write data signal received from the third memory controller 1123 through the third controller bus 1163. The third interface circuit 1133 may transmit the row address signal, the column address signal, the command signal, and the memory data signal to the third memory apparatus 1143 through the third memory bus 1173. The third interface circuit 1133 may receive the memory data signal transmitted from the third memory apparatus 1143 through the third memory bus 1173, and may generate a read data signal based on the memory data signal. The third interface circuit 1133 may transmit the read data signal to the third memory controller 1123 through the third controller bus 1163. The fourth interface circuit 1134 may be electrically connected to the fourth memory apparatus 1144 through a fourth memory bus 1174. The fourth interface circuit 1134 may generate a row address signal, a column address signal, a command signal, and a memory data signal based on the command signal, the address signal, and the write data signal received from the fourth memory controller 1124 through the fourth controller bus 1164. The fourth interface circuit 1134 may transmit the row address signal, the column address signal, the command signal, and the memory data signal to the fourth memory apparatus 1144 through the fourth memory bus 1174. The fourth interface circuit 1134 may receive the memory data signal transmitted from the fourth memory apparatus 1144 through the fourth memory bus 1174, and may generate a read data signal based on the memory data signal. The fourth interface circuit 1134 may transmit the read data signal to the fourth memory controller 1124 through the fourth controller bus 1164. The third bus 170 illustrated in FIG. 1 may be applied as each of the first to fourth memory buses 1171, 1172, 1173, 1174, and each of the first to fourth memory buses 1171, 1172, 1173, 1174 may have substantially the same characteristics as the third bus 170.

Each of the first to fourth memory apparatuses 1141, 1142, 1143, 1144 may include at least one memory die. When the first to fourth memory apparatuses 1141, 1142, 1143, 1144 each include two or more memory dies, the first to fourth memory apparatuses 1141, 1142, 1143, 1144 may each have a stacked chip structure. The two or more memory dies may be electrically connected to each other through wire bonding or through vias.

In an embodiment, the host 1110, the first to fourth memory controllers 1121, 1122, 1123, 1124, and the first to fourth interface circuits 1131, 1132, 1133, 1134 may be integrated into a first device, and the first to fourth memory apparatuses 1141, 1142, 1143, 1144 may constitute second to fifth devices, respectively. In an embodiment, the host 1110 and the first to fourth memory controllers 1121, 1122, 1123, 1124 may be integrated into a first device, the first interface circuit 1131 and the first memory apparatus 1141 may be integrated into a second device. The second interface circuit 1132 and the second memory apparatus 1142 may be integrated into a third device, the third interface circuit 1133 and the third memory apparatus 1143 may be integrated into a fourth device, and the fourth interface circuit 1134 and the fourth memory apparatus 1144 may be integrated into a fifth device. In an embodiment, the host 1110 may constitute a first device, and the first memory controller 1121, the first interface circuit 1131, and the first memory apparatus 1141 may be integrated into a second device. The second memory controller 1122, the second interface circuit 1132, and the second memory apparatus 1142 may be integrated into a third device. The third memory controller 1123, the third interface circuit 1133, and the third memory apparatus 1143 may be integrated into a fourth device. The fourth memory controller 1124, the fourth interface circuit 1134, and the fourth memory apparatus 1144 may be integrated into a fifth device. In an embodiment, the host 1110, the first to fourth memory controllers 1121, 1122, 1123, 1124, the first to fourth interface circuits 1131, 1132, 1133, 1134, and the first to fourth memory apparatuses 1141, 1142, 1143, 1144 may each be manufactured as independent semiconductor apparatuses. The host 1110, the first to fourth memory controllers 1121, 1122, 1123, 1124, the first to fourth interface circuits 1131, 1132, 1133, 1134, and the first to fourth memory apparatuses 1141, 1142, 1143, 1144 may be manufactured as tiles or chiplets and mounted on at least one base tile or base chiplet.

The first memory apparatus 1141 may perform parallel data communication with the first interface circuit 1131 and the first memory controller 1121 through the first memory bus 1171. The second memory apparatus 1142 may perform parallel data communication with the second interface circuit 1132 and the second memory controller 1122 through the second memory bus 1172. The third memory apparatus 1143 may perform parallel data communication with the third interface circuit 1133 and the third memory controller 1123 through the third memory bus 1173. The fourth memory apparatus 1144 may perform parallel data communication with the fourth interface circuit 1134 and the fourth memory controller 1124 through the fourth memory bus 1174. In an embodiment, at least one of the first to fourth memory buses 1171, 1172, 1173, 1174 may have different characteristics than the third bus 170. For example, a width of the fourth memory bus 1174 may be less than a width of the fourth controller bus 1164, and a clock rate of the fourth memory bus 1174 may be higher than a clock rate of the fourth controller bus 1164. When the first to third memory apparatuses 1141, 1142, 1143 perform parallel data communication through the first to third memory buses 1171, 1172, 1173, the fourth memory apparatus 1144 may perform serial data communication through the fourth memory bus 1174. When the fourth memory apparatus 1144 performs serial data communication, the fourth memory apparatus 1144 and the fourth interface circuit 1134 may be equipped with a SerDes for converting parallel data to serial data or converting serial data to parallel data.

Figure 12:
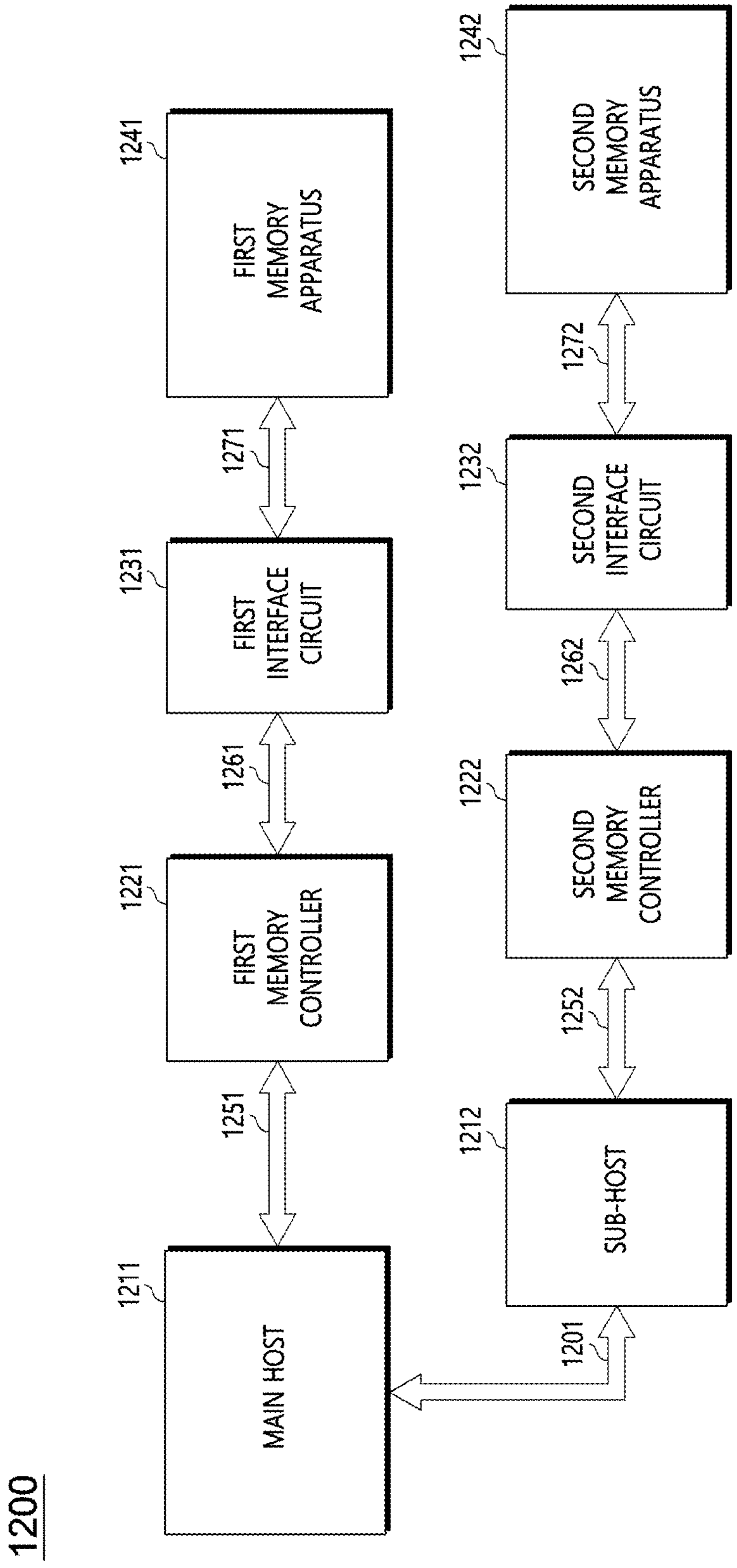
FIG. 12 is a diagram illustrating a configuration of a computing system according to an embodiment of the present disclosure.

FIG. 12 is a diagram illustrating a configuration of a computing system 1200 according to an embodiment of the present disclosure. Referring to FIG. 12, the computing system 1200 may include a main host 1211, a sub-host 1212, a first memory controller 1221, a first interface circuit 1231, a first memory apparatus 1241, a second memory controller 1222, a second interface circuit 1232, and a second memory apparatus 1242. The main host 1211 may generate an access request to access the first memory apparatus 1241, and may provide the access request to the first memory controller 1221. The main host 1211 may be electrically connected to the first memory controller 1221 through a first host bus 1251, and may provide the access request to the first memory controller 1221 through the first host bus 1251. The first host bus 1251 may have substantially the same characteristics as the first bus 150 illustrated in FIG. 1. The main host 1211 may perform various computational operations, and may access the sub-host 1212 to perform all or some of computational operations in parallel. For example, the main host 1211 may perform a portion of total workload, and the sub-host 1212 may be controlled by the main host 1211 to perform remaining workload among the total workload. The sub-host 1212 may have the same kind of processing core as the main host 1211, or may have a different kind of processing core than the main host 1211. In an embodiment, the sub-host 1212 may be controlled by the main host 1211 to perform functions that increase the amount of memory capacity that can be utilized by the main host 1211. The sub-host 1212 may accelerate the computational performance and/or speed of the main host 1211 by providing additional data required for computational operations of the main host 1211. The sub-host 1212 may be, for example, a Compute eXpress Link (CXL) core. The main host 1211 may be electrically connected to the sub-host 1212 through a system bus 1201, and may provide a control signal for controlling the sub-host 1212 to the sub-host 1212 through the system bus 1201. The sub-host 1212 may generate an access request for accessing the second memory apparatus 1242 based on the control signal provided from the main host 1211, and may provide the access request to the second memory controller 1222. The system bus 1201 may include a standard protocol for electrically connecting the main host 1211 and the sub-host 1212.

The sub-host 1212 may generate an access request to access the second memory apparatus 1242, and may provide the access request to the second memory controller 1222. The sub-host 1212 may be electrically connected to the second memory controller 1222 through a second host bus 1252, and may transmit the access request to the second memory controller 1222 through the second host bus 1252. The second host bus 1252 may have substantially the same characteristics as the first host bus 1251. In an embodiment, the second host bus 1252 may have different characteristics than the first host bus 1251, and may utilize a standard protocol having a different specification than the first host bus 1251.

The first memory controller 1221 may be electrically connected to the first interface circuit 1231 through a first controller bus 1261. The first interface circuit 1231 may be electrically connected to the first memory apparatus 1241 through a first memory bus 1271. The first controller bus 1261 may have substantially the same characteristics as the second bus 160 illustrated in FIG. 1, and the first memory bus 1271 may have substantially the same characteristics as the third bus 170 illustrated in FIG. 1. In an embodiment, a width of the data bus included in the first controller bus 1261 may be less than or equal to a width of the data bus included in the first memory bus 1271. The second memory controller 1222 may be electrically connected to the second interface circuit 1232 through a second controller bus 1262. The second interface circuit 1232 may be electrically connected to the second memory apparatus 1242 through a second memory bus 1272. The second controller bus 1262 may have substantially the same characteristics as the first controller bus 1261, and the second memory bus 1272 may have substantially the same characteristics as the first memory bus 1271. In an embodiment, a width of the data bus included in the second controller bus 1262 may be less than or equal to a width of the data bus included in the second memory bus 1272.

In an embodiment, the first controller bus 1261 and the first memory bus 1271 may have substantially the same characteristics as the second bus 160 and the third bus 170, respectively, while the second controller bus 1262 and the second memory bus 1272 may have different characteristics than the first controller bus 1261 and the first memory bus 1271. For example, the first memory apparatus 1241 may perform parallel data communication with the first interface circuit 1231, while the second memory apparatus 1242 may perform serial data communication with the second interface circuit 1232. A width of the data bus included in the second memory bus 1272 may be less than a width of the data bus included in the second controller bus 1262. A clock rate of the second memory bus 1272 may be higher than a clock rate of the second controller bus 1262. In an embodiment, the second controller bus 1262 and the second memory bus 1272 may have substantially the same characteristics as the second bus 160 and third bus 170, respectively, while the first controller bus 1261 and the first memory bus 1271 may have different characteristics than the second controller bus 1262 and the second memory bus 1272. For example, the second memory apparatus 1242 may perform parallel data communication with the second interface circuit 1232, while the first memory apparatus 1241 may perform serial data communication with the first interface circuit 1231. A width of the first memory bus 1271 may be less than a width of the first controller bus 1261, and a clock rate of the first memory bus 1271 may be higher than a clock rate of the first controller bus 1261.

In an embodiment, the sub-host 1212, the second memory controller 1222, the second interface circuit 1232, and the second memory apparatus 1242 may be disposed on a single interposer and/or substrate, and may be manufactured as a single semiconductor apparatus. The sub-host 1212, the second memory controller 1222, and the second interface circuit 1232 may perform functions of a dedicated controller device to allow the second memory apparatus 1242 to perform data communication with an external host device (e.g., the main host 1211). The single semiconductor apparatus may be manufactured as a dual in-line memory module (DIMM) to provide a large amount of data storage space to the main host 1211. For example, the single semiconductor apparatus may be a Managed Dram Solution (MDS). In an embodiment, the sub-host 1212, the second memory controller 1222, the second interface circuit 1232, and the second memory apparatus 1242 may be manufactured as independent dies, tiles, or chiplets.

Figure 13A:
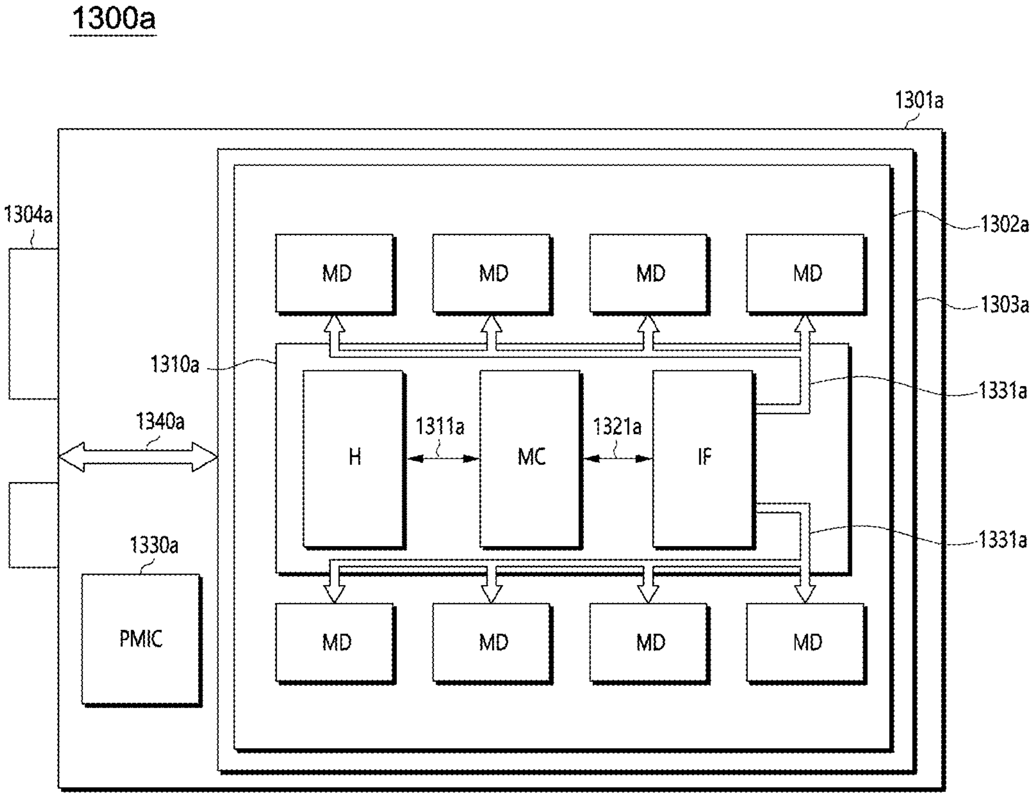
FIGS. 13A to 13C are diagrams illustrating a configuration of a semiconductor apparatus according to an embodiment of the present disclosure.
Figure 13B:
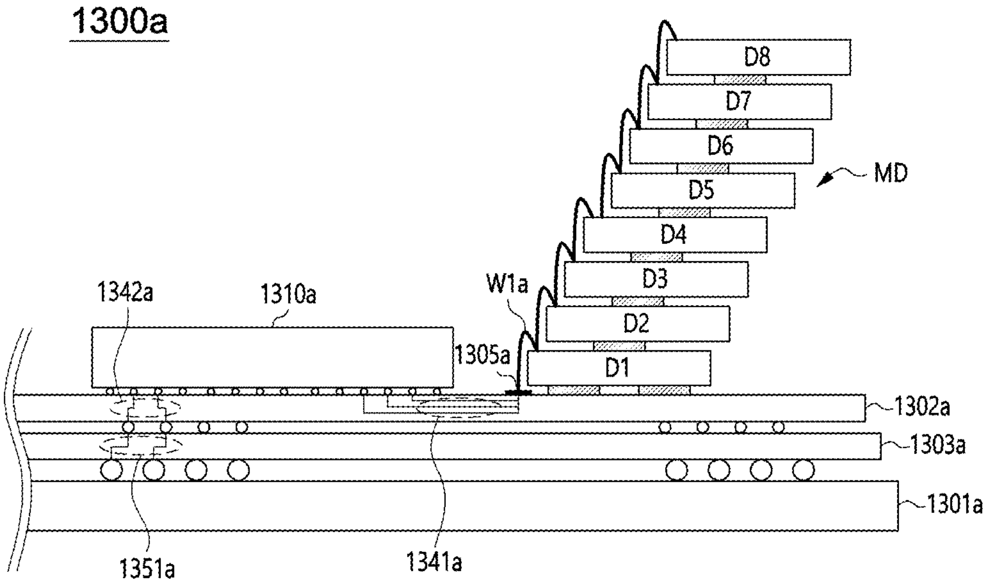
Figure 13C:
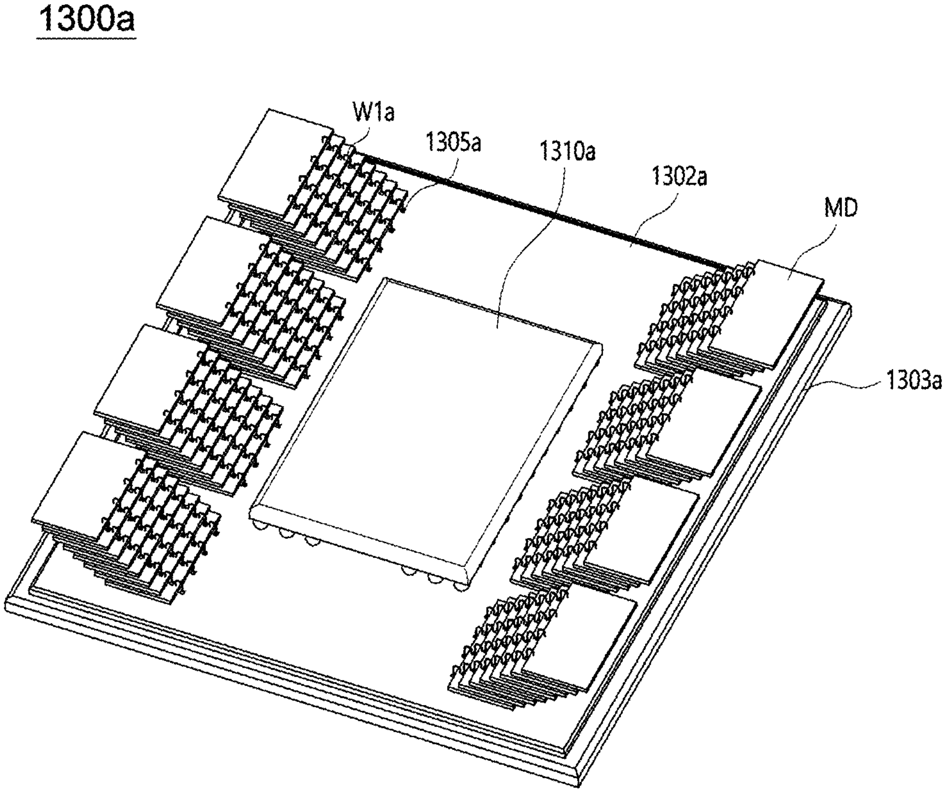

FIGS. 13A to 13C are diagrams illustrating a configuration of a semiconductor apparatus 1300*a* according to an embodiment of the present disclosure. FIG. 13A is a conceptual plan view of the semiconductor apparatus 1300*a*, FIG. 13B is a cross-sectional view of the semiconductor apparatus 1300*a*, and FIG. 13C is a perspective view of the semiconductor apparatus 1300*a*. The semiconductor apparatus 1300*a* may be a memory system, such as a CXL module or a CXL device. The semiconductor apparatus 1300*a* may include a controller device 1310*a* and a plurality of memory media MD. The semiconductor apparatus 1300*a* may include a module substrate 1301*a*. The module substrate 1301*a* may include a module pin 1304*a*, and may communicate with an external device through the module pin 1304*a*. For example, the external device may be the main host 1211 shown in FIG. 12, and the module pin 1304*a* may be electrically connected to the system bus 1201 shown in FIG. 12. The semiconductor apparatus 1300*a* may be electrically connected to the external device through the module pin 1304*a* by inserting the module pin 1304*a* into a slot and/or channel formed in a main board. A package substrate 1303*a* may be mounted on the module substrate 1301*a*, and the package substrate 1303*a* may be electrically connected to the module substrate 1301*a* through package balls and/or solder balls. On the package substrate 1303*a*, an interposer 1302*a* may be stacked. The interposer 1302*a* may be electrically connected to the package substrate 1303*a* using bumps. The controller device 1310*a* and the plurality of memory media MD may be disposed on the interposer 1302*a*. The package substrate 1303*a*, the interposer 1302*a*, the controller device 1310*a*, and the plurality of memory media MD may be packaged in a single package, and the single package may be mounted on the module substrate 1301*a*. The controller device 1310*a* may be disposed on the interposer 1302*a* and electrically connected to the interposer 1302*a* through microbumps. The plurality of memory media MD may be disposed on the interposer 1302*a*. The controller device 1310*a* may be disposed in a first region on the interposer 1302*a*, and the plurality of memory media MD may be disposed in a second region on the interposer 1302*a*. The first and second regions might not overlap each other.

The host H may be electrically connected to the module substrate 1301*a* and the external device through a system bus 1340*a*. The host H may be electrically connected to the memory controller MC through a host bus 1311*a*. The memory controller MC may be electrically connected to the interface circuit IF through a controller bus 1321*a*, and the interface circuit IF may be electrically connected to each of the plurality of memory media MD through a plurality of memory buses 1331*a*. The controller bus 1321*a* may have substantially the same characteristics as the second bus 160 shown in FIG. 1, and each of the plurality of memory buses 1331*a* may have substantially the same characteristics as the third bus 170 shown in FIG. 1. Each of the plurality of memory media MD may perform parallel data communication with the interface circuit IF. The interface circuit IF may perform parallel data communication with the memory controller MC, or may perform partial parallel data communication. A width of each of the plurality of memory buses 1331*a* may be greater than or equal to a width of the controller bus 1321*a*, and a clock rate of each of the plurality of memory buses 1331*a* may be less than or equal to a clock rate of the controller bus 1321*a*.

The controller device 1310*a* may relay data communication between the external device and the plurality of memory media MD. The controller device 1310*a* may include a host H, a memory controller MC, and an interface circuit IF. The host H may correspond to the sub-host 1212 shown in FIG. 12, the memory controller MC may correspond to the second memory controller 1222 shown in FIG. 12, and the interface circuit IF may correspond to the second interface circuit 1232 shown in FIG. 12. A redundant description of the corresponding components will be omitted. The controller device 1310*a* may be electrically connected with a plurality of memory media MD and may perform data communication with the plurality of memory media MD. The controller device 1310*a* may be electrically connected to each of the plurality of memory media MD through the interface circuit IF. Each of the plurality of memory media MD may correspond to the second memory apparatus 1242 shown in FIG. 12. The plurality of memory media MD may form independent channels and may each be electrically connected with the interface circuit IF of the controller device 1310*a* through independent memory buses. In FIGS. 13A to 13C, the semiconductor apparatus 1300*a* is illustrated as having eight memory media, but the number of memory media that the semiconductor apparatus 1300*a* has may be less than eight or more than eight. Each of the plurality of memory media MD may include at least one memory die. When each of the plurality of memory media MD includes two or more memory dies, the two or more memory dies may be stacked to form a single memory media. In FIGS. 13B and 13C, one memory media includes eight memory dies, but the number of memory dies that one memory media includes may be less than or greater than eight.

The controller device 1310*a* may be electrically connected to the module substrate 1301*a* through a signal path 1342*a* formed in the interposer 1302*a* and a signal path 1351*a* formed in the package substrate 1303*a*. The controller device 1310*a* may be electrically connected to the pads 1305*a* formed in the interposer 1302*a* through a signal path 1341*a* formed in the interposer 1302*a*. The host H may be electrically connected to the module substrate 1301*a* through the signal path 1342*a* and the signal path 1351*a*. The interface circuit IF may be electrically connected to the pads 1305*a* through the signal path 1341*a*. The plurality of memory media MD may be electrically connected to the pads 1305*a* through a wire bonding W1*a*, respectively. The plurality of memory media MD may be electrically connected to the controller device 1310*a* through the wire bonding W1*a* and the signal path 1341*a*. The interface circuit IF may be electrically connected to the plurality of memory media MD through the signal path 1341*a* and the wire bonding W1*a*, respectively. The signal path 1341*a* and the wire bonding W1*a* may correspond to the plurality of the memory busses 1331*a*.

A first memory die D1 of the memory media MD may be bonded to the interposer 1302*a* using DAF. The second to eighth memory dies D2, D3, D4, D5, D6, D7, D8 may also be bonded sequentially with the first to seventh memory dies D1, D2, D3, D4, D5, D6, D7, respectively, using DAF. The first to eighth memory dies D1, D2, D3, D4, D5, D6, D7, D8 may be electrically connected using a wire bonding. The first to eighth memory dies D1, D2, D3, D4, D5, D6, D7, D8 may be electrically connected to the interposer 1302*a* by wire bonding with the pads 1305*a*. The pads 1305*a* may be electrically connected to the controller device 1310*a* through the signal path 1341*a*. The interface circuit IF may be electrically connected with the signal path 1341*a* through the microbumps, so that electrical connection may be formed between the interface circuit IF and the memory dies. A frequency of the signals transmitted through the controller bus 1321*a* between the memory controller MC and the interface circuit IF may be greater than or equal to a frequency of the signals transmitted through the signal path 1341*c* and the wire bonding W1*a* between the interface circuit IF and the memory media MD. The controller bus 1321*a* may include a first data bus that electrically connects the memory controller MC and the interface circuit IF, and the signal path 1341*a* may include a second data bus that electrically connects the interface circuit IF and the memory media MD. A width of the first data bus may be less than or equal to a width of the second data bus.

The semiconductor apparatus 1300*a* may further include a power management integrated circuit PMIC 1330*a*. The power management integrated circuit PMIC may be disposed on the module substrate 1301*a*. In an embodiment, the power management integrated circuit PMIC may be disposed on the interposer 1302*a*. The power management integrated circuit PMIC may receive an externally applied power supply voltage through the module pin 1304*a*, and may generate a plurality of internal voltages from the power supply voltage. The power management integrated circuit PMIC may generate the plurality of internal voltages by changing or regulating a voltage level of the externally applied power supply voltage. The plurality of internal voltages may be applied to the host H, the memory controller MC, the interface circuit IF, and the memory media MD, and may be used as operating power voltages for components of the semiconductor apparatus 1300*a*. The power management integrated circuit PMIC may independently generate internal voltages for the host H, the memory controller MC, the interface circuit IF, and the memory media MD, and the internal voltages may have different voltage levels. In an embodiment, at least two of the internal voltages may have the same voltage level and remaining internal voltages may have different voltage levels.

In an embodiment, the first to eighth memory dies D1, D2, D3, D4, D5, D6, D7, D8 may be stacked in a vertical direction using through vias, and may be electrically connected to the interposer 1302*a* and adjacent memory dies through the microbumps. When the first to eighth memory dies D1, D2, D3, D4, D5, D6, D7, D8 are stacked on the interposer 1302*a* using microbumps, the interposer 1302*a* should be implemented as a silicon interposer. However, if the first to eighth memory dies D1, D2, D3, D4, D5, D6, D7, D8 are stacked using wire bonding and the plurality of memory media MD perform parallel data communication with the controller device 1310*a*, the interposer 1302*a* may be an organic interposer instead of the silicon interposer, which is less expensive than the silicon interposer. Thus, if the plurality of memory media MD are stacked using wire bonding, the manufacturing cost of the semiconductor apparatus 1300*a* may be reduced. Furthermore, if the plurality of memory media MD perform parallel data communication with the controller device 1310*a*, the bandwidth of the memory bus 1331*a* can be expanded so that a larger number of data can be received from or transmitted to the controller device 1310*a* in a shorter time.

Figure 14A:
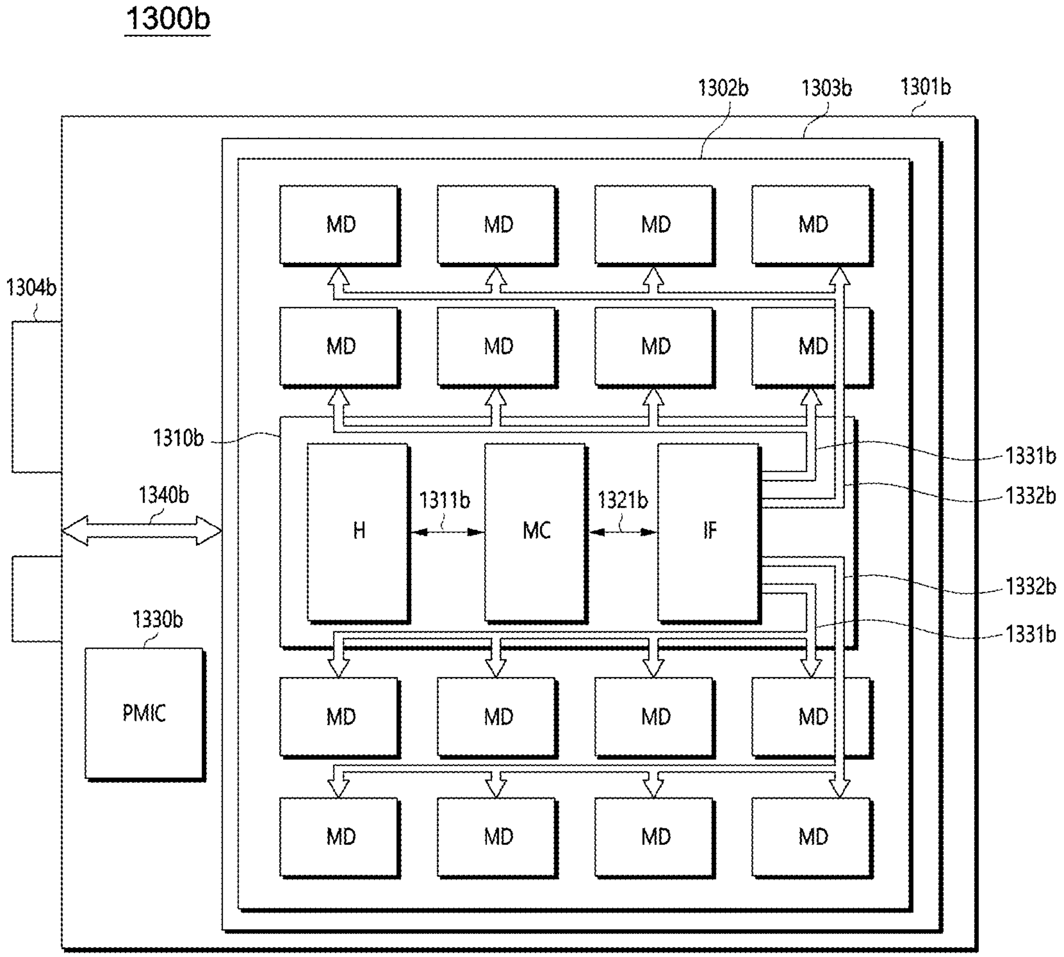
FIGS. 14A to 14C are diagrams illustrating a configuration of a semiconductor apparatus according to an embodiment of the present disclosure.
Figure 14B:
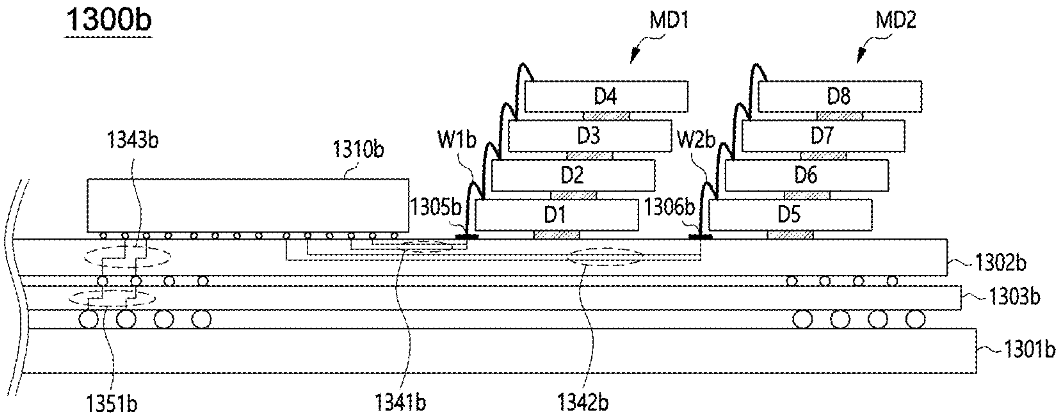
Figure 14C:
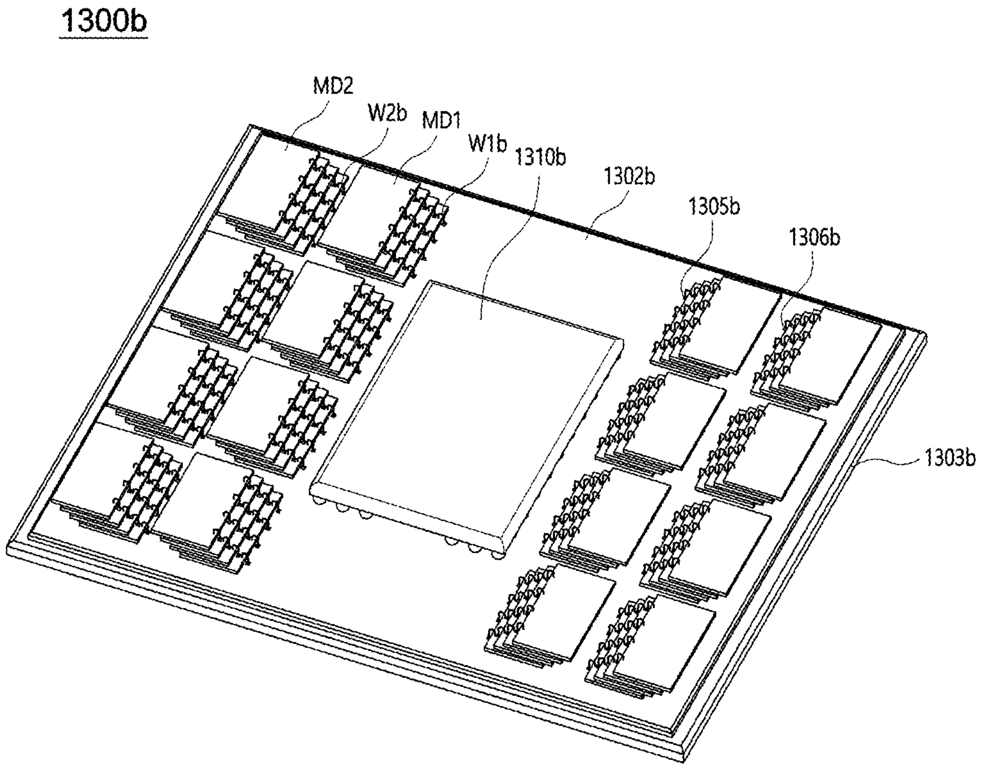

FIGS. 14A to 14C are diagrams illustrating a configuration of a semiconductor apparatus 1300*b* according to an embodiment of the present disclosure. FIG. 14A may be a conceptual plan view of the semiconductor apparatus 1300*b*, FIG. 14B may be a cross-sectional view of the semiconductor apparatus 1300*b*, and FIG. 14C may be a perspective view of the semiconductor apparatus 1300*b*. The semiconductor apparatus 1300*b* may be a memory system, such as a CXL module or a CXL device. The semiconductor apparatus 1300*b* may include a controller device 1310*b* and a plurality of memory media MD. The semiconductor apparatus 1300*b* may include a module substrate 1301*b*. The module substrate 1301*b* may include a module pin 1304*b*, and may communicate with an external device through the module pin 1304*b*. For example, the external device may be the main host 1211 shown in FIG. 12, and the module pin 1304*b* may be electrically connected to the system bus 1201 shown in FIG. 12. The semiconductor apparatus 1300*b* may be electrically connected to the external device through a main board by inserting the module pin 1304*b* into a slot and/or channel formed in the main board. A package substrate 1303*b* may be mounted on the module substrate 1301*b*, and the package substrate 1303*b* may be electrically connected with the module substrate 1301*b* through package balls and/or solder balls. On the package substrate 1303*b*, an interposer 1302*b* may be stacked. The interposer 1302*b* may be electrically connected to the package substrate 1303*b* using bumps. The controller device 1310*b* and the plurality of memory media MD may be disposed on the interposer 1302*b*. The package substrate 1303*b*, the interposer 1302*b*, the controller device 1310*b*, and the plurality of memory media MD may be packaged in a single package, and the single package may be mounted on the module substrate 1301*b*. The controller device 1310*b* may be disposed on the interposer 1302*b* and electrically connected to the interposer 1302*b* through microbumps. The plurality of memory media MD may be disposed on the interposer 1302*b*. The controller device 1310*b* may be disposed in a first region on the interposer 1302*b*, and the plurality of memory media MD may be disposed in a second region and a third region on the interposer 1302*b*. The first, second, and third regions might not overlap each other. For example, some of the plurality of memory media MD may be disposed in the second region, and the remainder of the plurality of memory media MD may be disposed in the third region.

The controller device 1310*b* may relay data communication between the external device and the plurality of memory media MD. The controller device 1310*b* may include a host H, a memory controller MC, and an interface circuit IF. The host H may correspond to the sub-host 1212 shown in FIG. 12, the memory controller MC may correspond to the second memory controller 1222 shown in FIG. 12, and the interface circuit IF may correspond to the second interface circuit 1232 shown in FIG. 12. Redundant descriptions of the corresponding components will be omitted. The controller device 1310*b* may be electrically connected with the plurality of memory media MD, and may perform data communication with the plurality of memory media MD. The controller device 1310*b* may be electrically connected to each of the plurality of memory media MD through the interface circuit IF. Each of the plurality of memory media MD may correspond to the second memory apparatus 1242 shown in FIG. 12. The plurality of memory media MD may form independent channels and may each be electrically connected with the interface circuit IF of the controller device 1310*b* through independent memory buses. In FIGS. 14A to 14C, the semiconductor apparatus 1300*b* is illustrated as having sixteen memory media, but the number of memory media that the semiconductor apparatus 1300*b* has may be less than sixteen or more than sixteen. Each of the plurality of memory media MD may include at least one memory die. When each of the plurality of memory media includes two or more memory dies, the two or more memory dies may be stacked to form a single memory media. In FIGS. 14B and 14C, one memory media is illustrated to include four memory dies, but the number of memory dies that one memory media includes may be less than or greater than four.

The host H may be electrically connected to the module substrate 1301*b* and the external device through a system bus 1340*b*. The host H may be electrically connected to the memory controller MC through a host bus 1311*b*. The memory controller MC is electrically connected to the interface circuit IF through a controller bus 1321*b*, and the interface circuit IF may be electrically connected to the plurality of memory media MD through a plurality of memory buses 1331*b*, 1332*b*, respectively. The controller bus 1321*b* may have substantially the same characteristics as the second bus 160 shown in FIG. 1, and each of the plurality of memory buses 1331*b*, 1332*b* may have substantially the same characteristics as the third bus 170 shown in FIG. 1. Each of the plurality of memory media MD may perform parallel data communication with the interface circuit IF. The interface circuit IF may perform parallel data communication with the memory controller MC, or may perform partial parallel data communication. A width of each of the plurality of memory buses 1331*b*, 1332*b* may be greater than or equal to a width of the controller bus 1321*b*, and a clock rate of each of the plurality of memory buses 1331*b*, 1332*b* may be less than or equal to a clock rate of the controller bus 1321*b*.

The controller device 1310*b* may be electrically connected to the module substrate 1301*b* through a signal path 1343*b* formed in the interposer 1302*b* and a signal path 1351*b* formed in the package substrate 1303*b*. The controller device 1310*b* may be electrically connected to a first pads 1305*b* formed in the interposer 1302*b* through a first signal path 1341*b* formed in the interposer 1302*b*. The controller device 1310*b* may be electrically connected to a second pads 1306*b* formed in the interposer 1302*b* through a second signal path 1342*b* formed in the interposer 1302*b*. The host H may be electrically connected to the module substrate 1301*b* through the signal path 1343*b* and the signal path 1351*b*. The interface circuit IF may be electrically connected to the first pads 1305*b* through the first signal path 1341*b*, and electrically connected to the second pads 1306*b* through the second signal path 1342*b*. The plurality of memory media MD may be electrically connected to the first and second pads 1305*b*, 1306*b* through wire bonding, respectively. The plurality of memory media MD may be electrically connected to the controller device 1310*b* through the wire bonding and the first and second signal paths 1341*b*, 1342*b*. The first memory media MD1 may be electrically connected to the first pads 1305*b* through a wire bonding W1*b*, and be electrically connected to the controller device 1310*b* through the first pads 1305*b* and the first signal path 1341*b*. The second memory media MD2 may be electrically connected to the second pads 1306*b* through a wire bonding W2*b*, and be electrically connected to the controller device 1310*b* through the second pads 1306*b* and the second signal path 1342*b*. The interface circuit IF may be electrically connected to the first memory media MD1 through the first signal path 1341*b* and the wire bonding W1*b*. The interface circuit IF may be electrically connected to the second memory media MD2 through the second signal path 1342*b* and the wire bonding W2*b*. The first signal path 1341*b* and the wire bonding W1*b* may correspond to the first memory bus 1331*b*, and the second signal path 1342*b* and the wire bonding W2*b* may correspond to the second memory bus 1332*b*.

A first memory die D1 of the first memory media MD1 may be bonded with the interposer 1302*b* using DAF. The second to fourth memory dies D2, D3, D4 may also be bonded sequentially with the first to third memory dies D1, D2, D3, respectively, using DAF. The first to fourth memory dies D1, D2, D3, D4 may be electrically connected using a wire bonding. The first to fourth memory dies D1, D2, D3, D4 may be electrically connected to the interposer 1302*b* by wire bonding with first pads 1305*b* formed on the interposer 1302*b*. The first pads 1305*b* may be electrically connected to the controller device 1310*b* through a first signal path 1341*b* formed in the interposer 1302*b*. A first memory die D5 of the second memory media MD2 may be bonded with the interposer 1302*b* using DAF. The second to fourth memory dies D6, D7, D8 may also be bonded sequentially with the first to third memory dies D5, D6, D7, respectively, using DAF. The first to fourth memory dies D5, D6, D7, D8 may be electrically connected using a wire bonding. The first to fourth memory dies D5, D6, D7, D8 may be electrically connected to the interposer 1302*b* by wire bonding with second pads 1306*b* formed on the interposer 1302*b*. The second pads 1306*b* may be electrically connected to the controller device 1310*b* through a second signal path 1342*b* formed in the interposer 1302*b*. The interface circuit IF may be electrically connected to the first and second signal paths 1341*b*, 1342*b* through the microbumps, so that an electrical connection may be formed between the interface circuit IF and the first and second memory media MD1, MD2. A frequency of the signals transmitted through the controller bus 1321*b* between the memory controller MC and the interface circuit IF may be greater than or equal to a frequency of the signals transmitted through the first signal path 1341*b* and the wire bonding W1*b* between the interface circuit IF and the first memory media MD1 and the signals transmitted through the second signal path 1342*b* and the wire bonding W2*b* between the interface circuit IF and the second memory media MD2. The controller bus 1321*b* may include a first data bus that electrically connects the memory controller MC and the interface circuit IF. The first signal path 1341*b* may include a second data bus that electrically connects the interface circuit IF and the first memory media MD1. The second signal path 1342*b* may include a third data bus that electrically connects the interface circuit IF and the second memory media MD2. A width of the first data bus may be less than or equal to a width of the second data bus and a width of the third data bus. The semiconductor apparatus 1300*b* may further include a power management integrated circuit PMIC 1330*b*. The power management integrated circuit PMIC may be disposed on the module substrate 1301*b*. In an embodiment, the power management integrated circuit PMIC may be disposed on the interposer 1302*b*.

In the semiconductor apparatus 1300*a* shown in FIGS. 13A and 13C, four memory media MD may be disposed at a first side of the controller device 1310*a*, and another four memory media MD may be disposed at a second side of the controller device 1310*a*. In the semiconductor apparatus 1300*b*, eight memory media MD may be disposed at a first side of the controller device 1310*b* in two rows of four, and eight memory media MD may be disposed at a second side of the controller device 1310*b* in two rows of four. The data bandwidth of the memory bus of the semiconductor apparatus 1300*a* may be substantially the same as the data bandwidth of the memory bus of the semiconductor apparatus 1300*b*. The structure of the semiconductor apparatus 1300*a* may decrease the area of the interposer 1302*a* and the package substrate 1303*a*, while the structure of the semiconductor apparatus 1300*b* may increase the area of the interposer 1302*b* and the package substrate 1303*b* but decrease the height of the package.

Figure 15A:
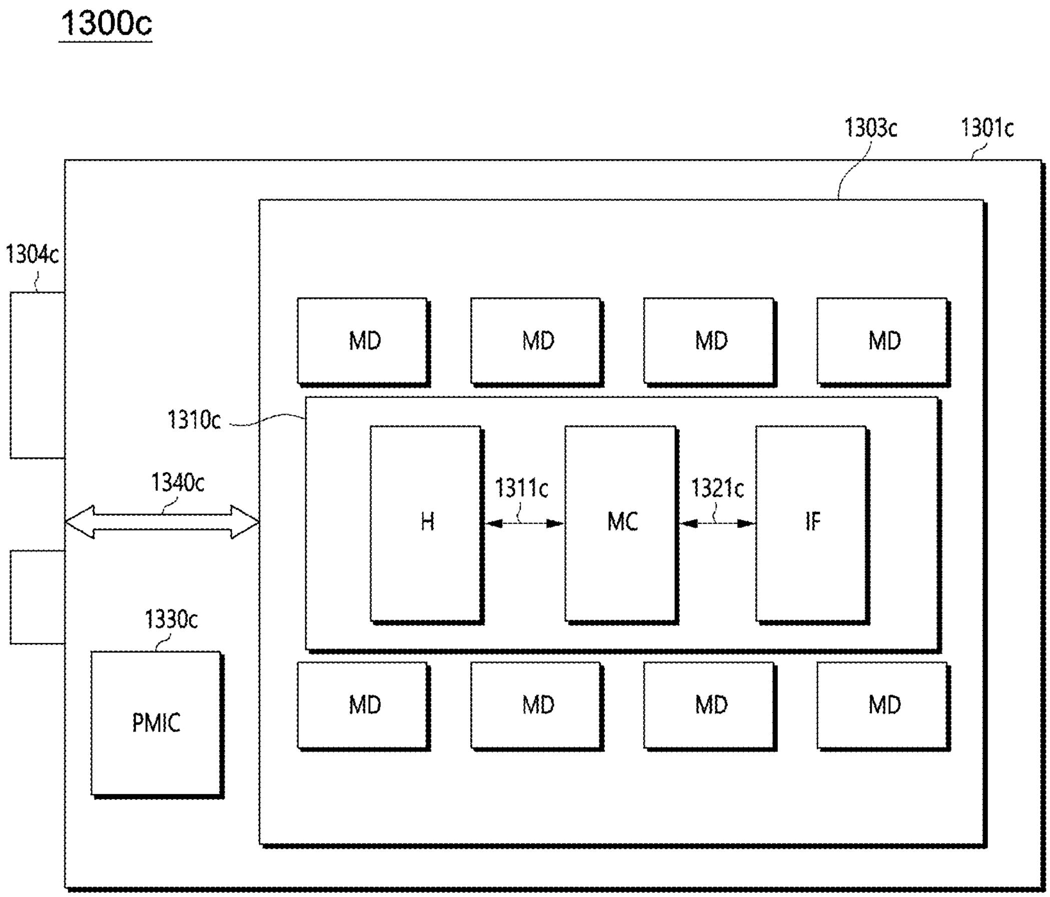
FIGS. 15A to 15C are diagrams illustrating a configuration of a semiconductor apparatus according to an embodiment of the present disclosure.
Figure 15B:
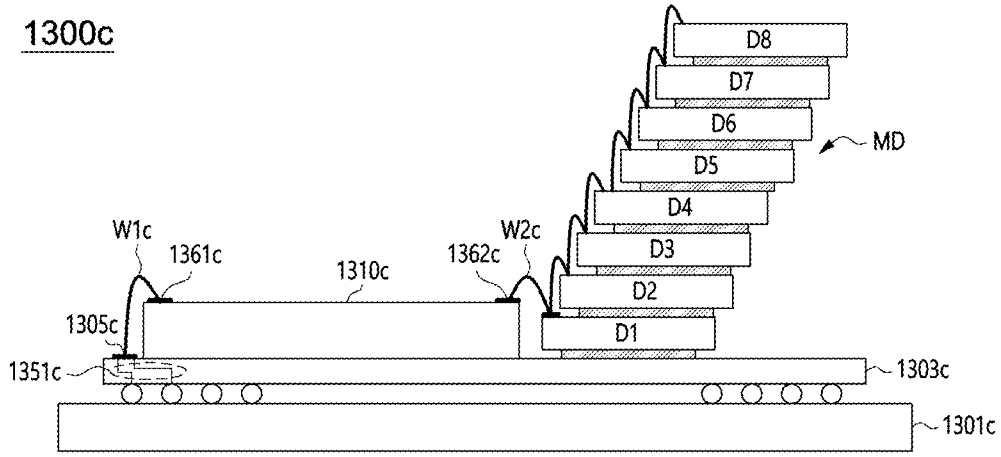
Figure 15C:
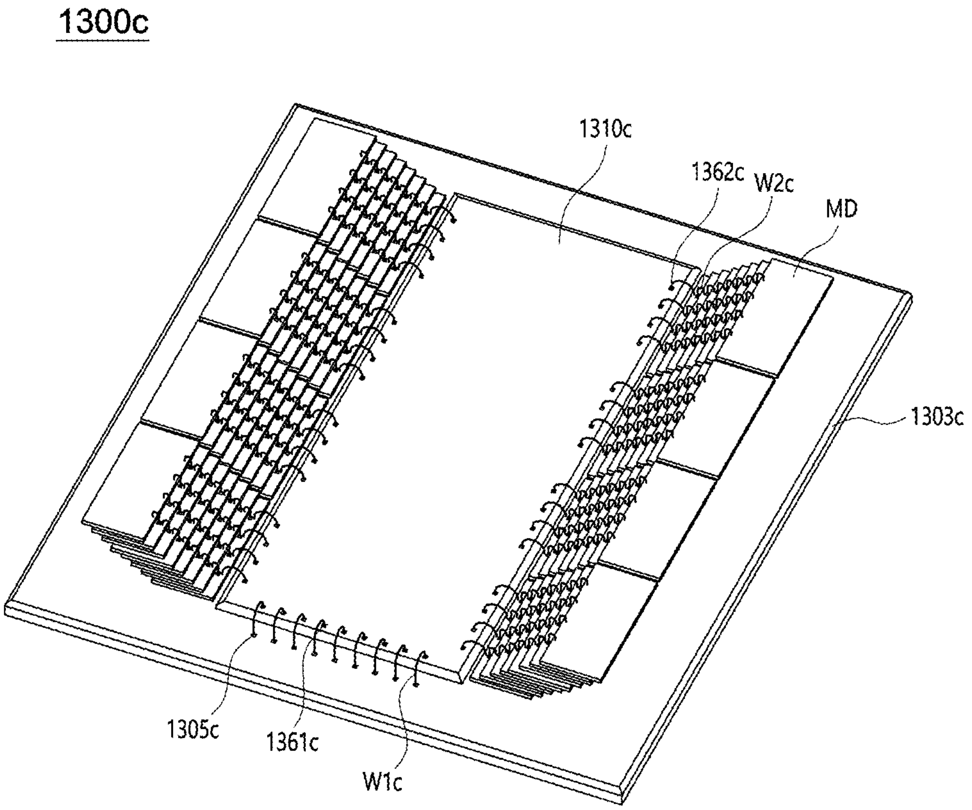

FIGS. 15A to 15C are diagrams illustrating a configuration of a semiconductor apparatus 1300*c* according to an embodiment of the present disclosure. FIG. 15A may be a conceptual plan view of the semiconductor apparatus 1300*c*, FIG. 15B may be a cross-sectional view of the semiconductor apparatus 1300*c*, and FIG. 15C may be a perspective view of the semiconductor apparatus 1300*c*. The semiconductor apparatus 1300*c* may be a memory system, such as a CXL module or a CXL device. The semiconductor apparatus 1300*c* may include a controller device 1310*c* and a plurality of memory media MD. The semiconductor apparatus 1300*c* may include a module substrate 1301*c*. The module substrate 1301*c* may include a module pin 1304*c*, and may communicate with an external device through the module pin 1304*c*. For example, the external device may be the main host 1211 shown in FIG. 12, and the module pin 1304*c* may be electrically connected to the system bus 1201 shown in FIG. 12. The semiconductor apparatus 1300*c* may be electrically connected to the external device through a main board by inserting the module pin 1304*c* into a slot and/or channel formed in the main board. A package substrate 1303*c* may be mounted on the module substrate 1301*c*, and the package substrate 1303*c* may be electrically connected with the module substrate 1301*c* through package balls and/or solder balls. The semiconductor apparatus 1300*c* might not include an interposer. The package substrate 1303*c*, the controller device 1310*c*, and the plurality of memory media MD may be packaged in a single package, and the single package may be mounted on the module substrate 1301*c*. The controller device 1310*c* may be disposed on the package substrate 1303*c*. The first Pads 1361*c* on the controller device 1310*c* may be wire bonded to pads 1305*c* on the package substrate 1303*c*, and the controller device 1310*c* may be electrically connected to the package substrate 1303*c* through the wire bonding. The plurality of memory media MD may be disposed on the package substrate 1303*c*. The controller device 1310*c* may be disposed in a first region on the package substrate 1303*c*, and the plurality of memory media MD may be disposed in a second region on the package substrate 1303*c*. The first and second regions might not overlap each other.

The controller device 1310*c* may relay data communication between the external device and the plurality of memory media MD. The controller device 1310*c* may include a host H, a memory controller MC, and an interface circuit IF. The host H may correspond to the sub-host 1212 shown in FIG. 12, the memory controller MC may correspond to the second memory controller 1222 shown in FIG. 12, and the interface circuit IF may correspond to the second interface circuit 1232 shown in FIG. 12. Redundant descriptions of the corresponding components will be omitted. The controller device 1310*c* may be electrically connected with a plurality of memory media MD and may perform data communication with the plurality of memory media MD. The controller device 1310*c* may be electrically connected to each of the plurality of memory media MD through the interface circuit IF. Each of the plurality of memory media MD may correspond to the second memory apparatus 1242 shown in FIG. 12. The plurality of memory media MD may form independent channels and may be electrically connected with the interface circuit IF of the controller device 1310*c* through independent memory buses. In FIGS. 15A to 15C, the semiconductor apparatus 1300*c* is illustrated as having eight memory media, but the number of memory media that the semiconductor apparatus 1300*c* has may be less than eight or more than eight. Each of the plurality of memory media MD may include at least one memory die. When each of the plurality of memory media includes two or more memory dies, the two or more memory dies may be stacked to form a single memory media. In FIGS. 15B and 15C, one memory media is illustrated to include eight memory dies, but the number of memory dies that one memory media includes may be less than or greater than eight.

The host H may be electrically connected to the external device through a system bus 1340*c*, and may be electrically connected to the memory controller MC through a host bus 1311*c*. The memory controller MC may be electrically connected to the interface circuit IF through a controller bus 1321*c*, and the interface circuit IF may be electrically connected to each of the plurality of memory media MD through a plurality of memory buses. The controller bus 1321*c* may have substantially the same characteristics as the second bus 160 shown in FIG. 1, and each of the plurality of memory buses may have substantially the same characteristics as the third bus 170 shown in FIG. 1. Each of the plurality of memory media MD may perform parallel data communication with the interface circuit IF. The interface circuit IF may perform parallel data communication with the memory controller MC, or may perform partial parallel data communication. A width of each of the plurality of memory buses may be greater than or equal to a width of the controller bus 1321*c*, and a clock rate of each of the plurality of memory buses may be less than or equal to a clock rate of the controller bus 1321*c*.

The controller device 1310*c* may be electrically connected to the module substrate 1301*c* through a wire bonding W1*c* between the first pads 1361*c* and the pads 1305*c* and the signal path 1351*c* formed in the package substrate 1303*c*. The controller device 1310*c* may be electrically connected to the plurality of memory media MD through the second pads 1362*c*. The host H may be electrically connected to the module substrate 1301*a* through the wire bonding W1*c* and the signal path 1351*c*. The interface circuit IF may be electrically connected to the memory media MD through the second pads 1362*c*. The memory media MD may be electrically connected to the second pads 1362*c* through a wire bonding W2*c*. The interface circuit IF may be electrically connected to the memory media MD through the wire bonding W2*c*. The wire bonding W2*c* may correspond to one of the plurality of the memory buses.

A first memory die D1 of the memory media MD may be bonded to the package substrate 1303*c* using DAF. The second to eighth memory dies D2, D3, D4, D5, D6, D7, D8 may also be bonded sequentially with the first to seventh memory dies D1, D2, D3, D4, D5, D6, D7, respectively, using DAF. The first to eighth memory dies D1, D2, D3, D4, D5, D6, D7, D8 may be electrically connected using a wire bonding. The first to eighth memory dies D1, D2, D3, D4, D5, D6, D7, D8 may be electrically connected to the interface circuit IF of the controller device 1310*c* by wire bonding with the second pads 1362*c* formed on the controller device 1310*c*. If the plurality of memory media MD are wire bonded directly to the second pads 1362*c* of the controller device 1310*c*, the manufacturing cost of the semiconductor apparatus 1300*c* may be further reduced because the semiconductor apparatus 1300*c* does not require the use of an interposer.

A frequency of the signals transmitted through the controller bus 1321*c* between the memory controller MC and the interface circuit IF may be greater than or equal to a frequency of the signals transmitted through the wire bonding W2*c* between the interface circuit IF and the memory media MD. The controller bus 1321*a* may include a first data bus which electrically connects the memory controller MC and the interface circuit IF, and the wire bonding W2*c* may include a second data bus which electrically connects the interface circuit IF and the memory media MD. A width of the first data bus may be less than or equal to a width of the second data bus. The semiconductor apparatus 1300*c* may further include a power management integrated circuit PMIC 1330*c*. The power management integrated circuit PMIC may be disposed on the module substrate 1301*c*.

Figure 16A:
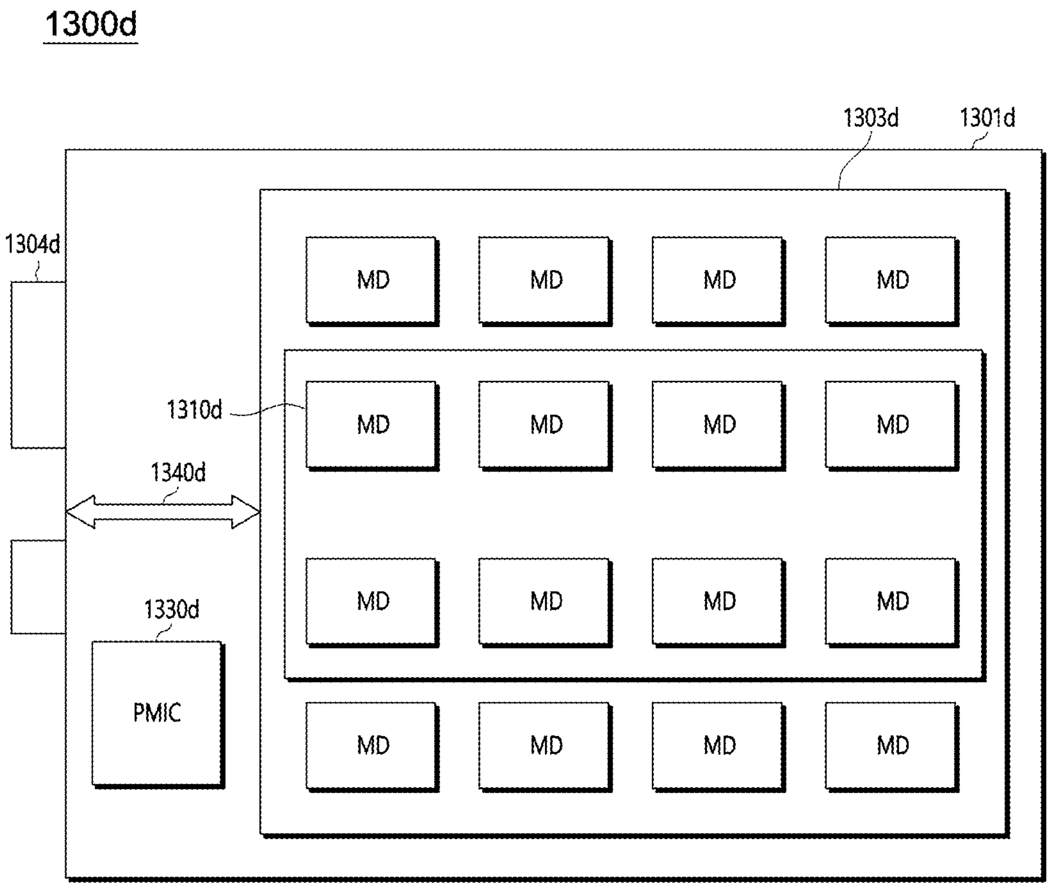
FIGS. 16A to 16C are diagrams illustrating a configuration of a semiconductor apparatus according to an embodiment of the present disclosure.
Figure 16B:
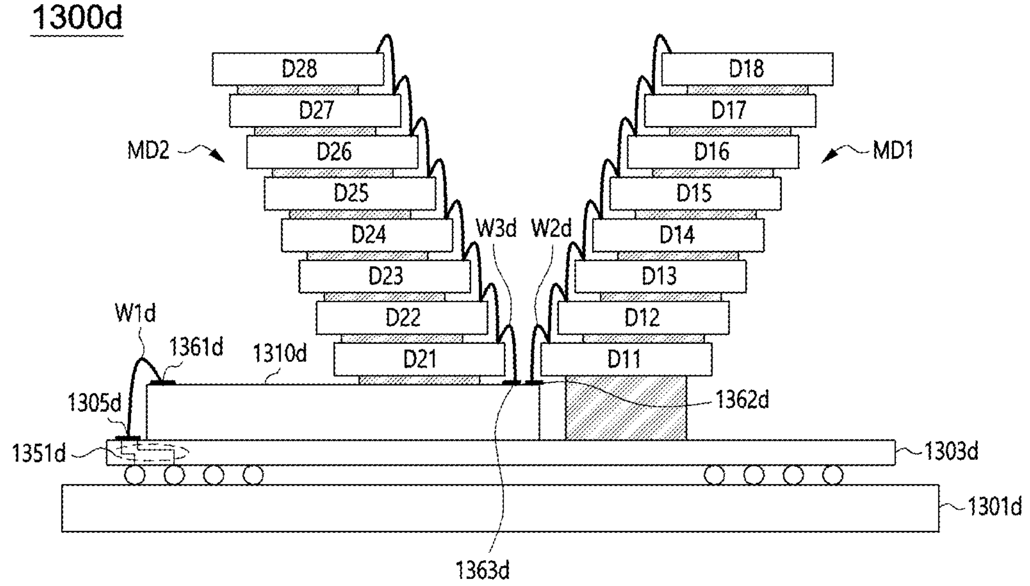
Figure 16C:
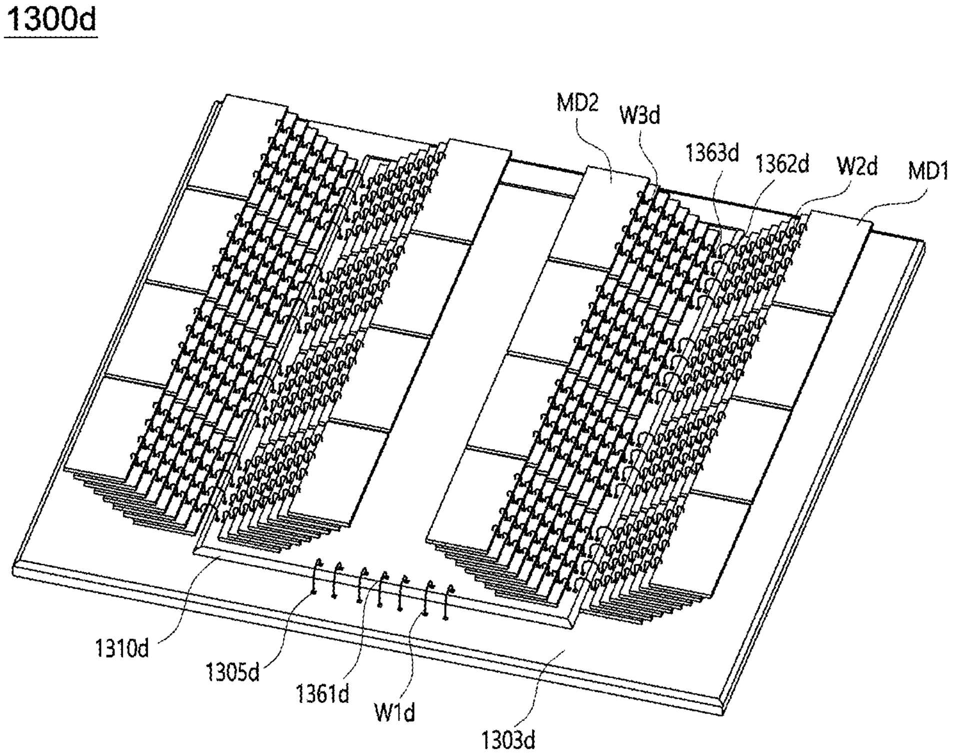

FIGS. 16A to 16C are diagrams illustrating a configuration of a semiconductor apparatus 1300*d* according to an embodiment of the present disclosure. FIG. 16A may be a conceptual plan view of the semiconductor apparatus 1300*d*, FIG. 16B may be a cross-sectional view of the semiconductor apparatus 1300*d*, and FIG. 16C may be a perspective view of the semiconductor apparatus 1300*d*. Redundant descriptions of the corresponding components will be omitted. The semiconductor apparatus 1300*d* may be a memory system, such as a CXL module or a CXL device. The semiconductor apparatus 1300*d* may include a controller device 1310*d* and a plurality of memory media MD. The semiconductor apparatus 1300*d* may include a module substrate 1301*d*. The module substrate 1301*d* may include a module pin 1304*d*, and may communicate with an external device through the module pin 1304*d*. For example, the external device may be the main host 1211 shown in FIG. 12, and the module pin 1304*d* may be electrically connected to the system bus 1201 shown in FIG. 12. The semiconductor apparatus 1300*d* may be electrically connected to the external device through a main board by inserting the module pin 1304*d* into a slot and/or channel formed in the main board. A package substrate 1303*d* may be mounted on the module substrate 1301*d*, and the package substrate 1303*d* may be electrically connected with the module substrate 1301*d* through package balls and/or solder balls. The semiconductor apparatus 1300*d* might not include an interposer. The package substrate 1303*d*, the controller device 1310*d*, and the plurality of memory media MD may be packaged in a single package and the single package may be mounted on the module substrate 1301*d*. The controller device 1310*d* may be disposed on the package substrate 1303*d*. The controller device 1310*d* may be disposed in a first region on the package substrate 1303*d*. The controller device 1310*d* may be electrically connected to the package substrate 1303*d* using a wire bonding. First pads 1361*d* of the controller device 1310*d* may be electrically connected with pads 1305*d* on the package substrate 1303*d* through wire bonding. The pads 1305*d* may be electrically connected to a signal path 1351*d* formed in the package substrate 1303*d*. Some of the plurality of memory media MD may be disposed on the package substrate 1303*d*, and the remainder of the plurality of memory media MD may be disposed on the controller device 1310*d*. The some of the plurality of memory media MD may be disposed in a second region on the package substrate 1303*d*. The first and second regions might not overlap each other. The remainder of the plurality of memory media MD may be disposed in the first region on the controller device 1310*d*. For example, eight memory media may be disposed on the package substrate 1303*d*, and the remaining eight memory media may be disposed on the controller device 1310*d*.

The controller device 1310*d* may relay data communication between the external device and the plurality of memory media MD. Although not shown, the controller device 1310*d* may include a host, a memory controller, and an interface circuit, and have substantially the same configuration as the controller device 1310*c* shown in FIG. 15A. The controller device 1310*d* may be electrically connected with a plurality of memory media MD, and may perform data communication with the plurality of memory media MD. The controller device 1310*d* may be electrically connected with each of the plurality of memory media MD through an interface circuit. Each of the plurality of memory media MD may correspond to the second memory apparatus 1242 shown in FIG. 12. The plurality of memory media MD may form independent channels and may each be electrically connected with the interface circuit of the controller device 1310*d* through independent memory buses. In FIGS. 16A to 16C, the semiconductor apparatus 1300*d* is illustrated as having sixteen memory media, but the number of memory media that the semiconductor apparatus 1300*d* has may be less than sixteen or more than sixteen. Each of the plurality of memory media MD may include at least one memory die. When each of the plurality of memory media MD includes two or more memory dies, the two or more memory dies may be stacked to form a single memory media. In FIGS. 16B and 16C, one memory media includes eight memory dies, but the number of memory dies that one memory media includes may be less than or greater than eight.

The controller device 1310*d* may be electrically connected to the module substrate 1301*d* through a wire bonding W1*d* between the first pads 1361*d* and the pads 1305*d* and the signal path 1351*d* formed in the package substrate 1303*d*. The controller device 1310*d* may be electrically connected to the plurality of memory media MD through the second and third pads 1362*d*, 1363*d*. The host may be electrically connected to the module substrate 1301*d* through the wire bonding W1*d* and the signal path 1351*d*. The interface circuit IF may be electrically connected to the plurality of memory media MD through the second and third pads 1362*d*, 1363*d*. The host may be electrically connected to the memory controller through a host bus. The memory controller may be connected to the interface circuit through a controller bus. The interface circuit may be electrically connected to the plurality of memory media MD through wire bonding between the second and third pads 1362*d*, 1363*d* and the plurality of memory media MD. The wire bonding between the second and third pads 1362*d*, 1363*d* and the plurality of memory media MD may correspond to a plurality of memory buses. For example, the first memory media MD1 may be electrically connected to the interface circuit through a wire bonding W2*d* between the first memory media MD1 and the second pads 1362*d*. The second memory media MD2 may be electrically connected to the interface circuit through a wire bonding W3*d* between the second memory media MD2 and the third pads 1363*d*.

A first memory die D11 of the first memory media MD1 may be bonded to the package substrate 1303*d* using DAF. The second to eighth memory dies D12, D13, D14, D15, D16, D17, D18 may also be bonded sequentially with the first to seventh memory dies D11, D12, D13, D14, D15, D16, D17, respectively, using DAF. The first to eighth memory dies D11, D12, D13, D14, D15, D16, D17, D18 may be electrically connected using a wire bonding. The first to eighth memory dies D11, D12, D13, D14, D15, D16, D17, D18 may be electrically connected to the controller device 1310*d* by wire bonding with the second pads 1362*d*. A first memory die D21 of the second memory media MD2 may be bonded to top surface of the controller device 1310*d* using DAF. The second to eighth memory dies D22, D23, D24, D25, D26, D27, D28 may also be bonded sequentially with the first to seventh memory dies D21, D22, D23, D24, D25, D26, D27, respectively, using DAF. The first to eighth memory dies D21, D22, D23, D24, D25, D26, D27, D28 may be electrically connected using a wire bonding. The first to eighth memory dies D21, D22, D23, D24, D25, D26, D27, D28 may be electrically connected to the controller device 1310*d* by wire bonding with third pads 1363*d*. When the plurality of memory media MD are disposed on the controller device 1310*d*, the capacity of the semiconductor apparatus 1300*d* can be increased without increasing the area of the package. The semiconductor apparatus 1300*d* may further include a power management integrated circuit PMIC 1330*d*. The power management integrated circuit PMIC may be disposed on the module substrate 1301*d*. In an embodiment, the power management integrated circuit PMIC may be disposed on the package substrate 1303*d*.

Figure 17A:
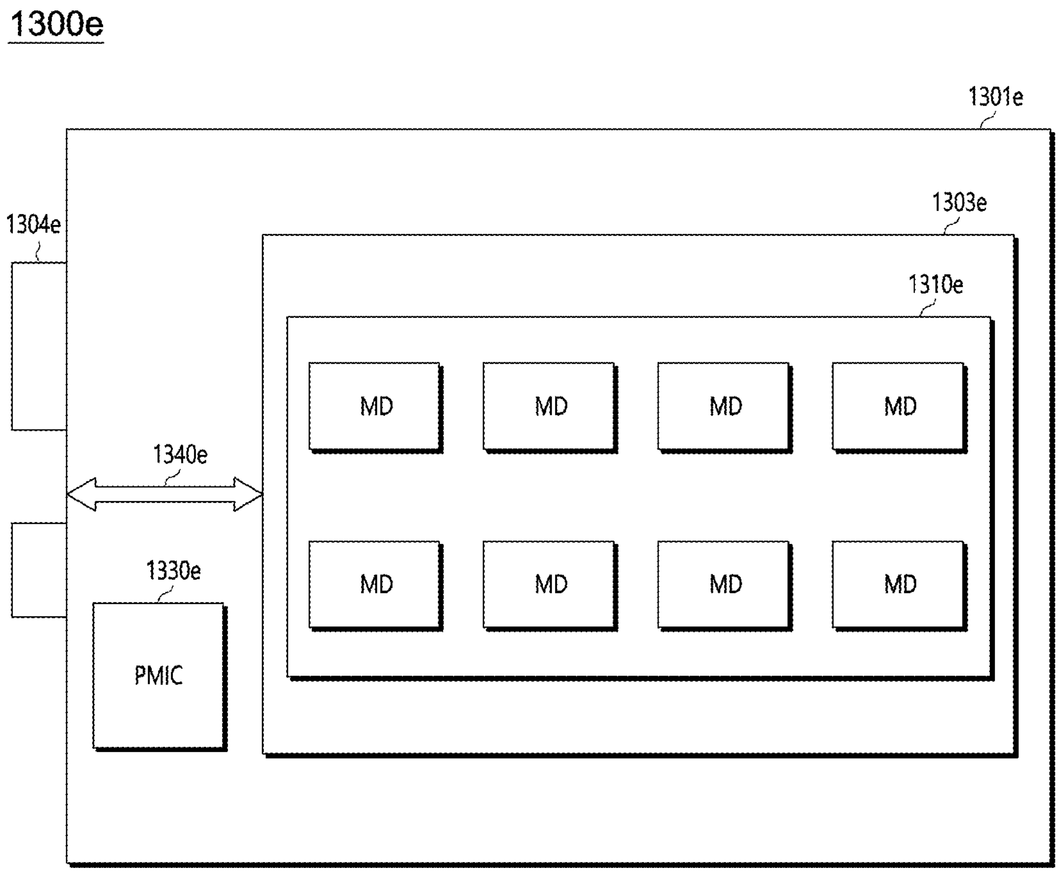
FIGS. 17A to 17C are diagrams illustrating a configuration of a semiconductor apparatus according to an embodiment of the present disclosure.
Figure 17B:
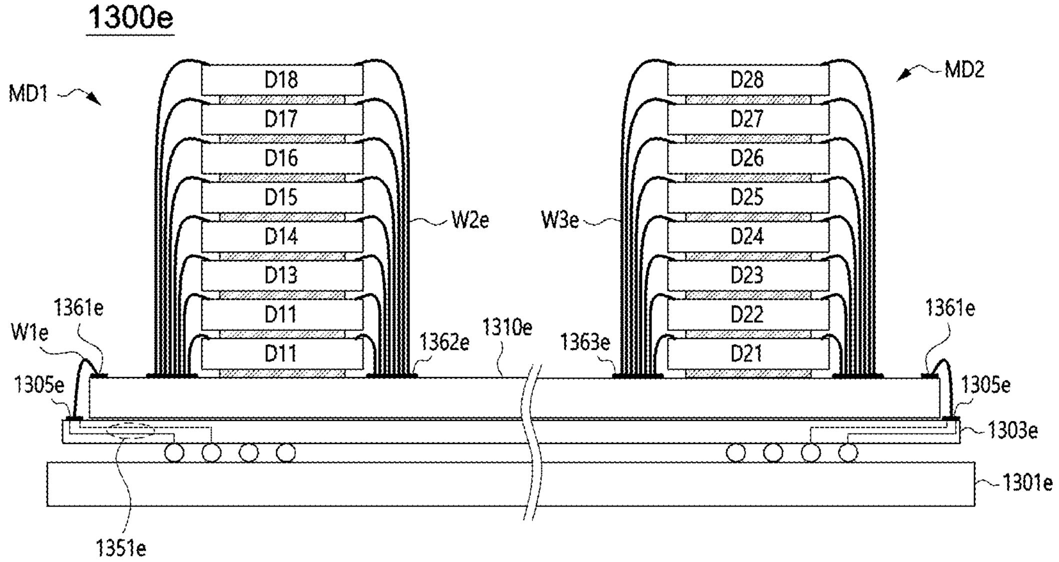
Figure 17C:
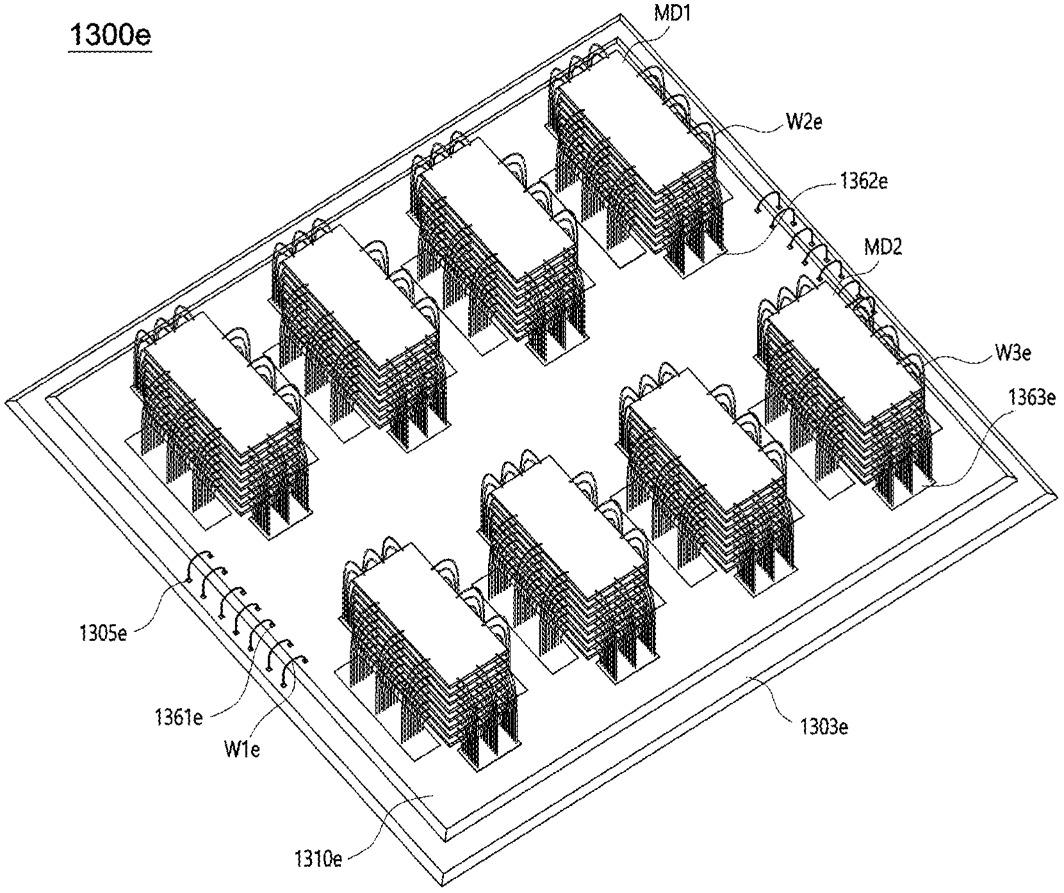

FIGS. 17A to 17C are diagrams illustrating a configuration of a semiconductor apparatus 1300*e* according to an embodiment of the present disclosure. FIG. 17A may be a conceptual plan view of the semiconductor apparatus 1300*e*, FIG. 17B may be a cross-sectional view of the semiconductor apparatus 1300*e*, and FIG. 17C may be a perspective view of the semiconductor apparatus 1300*e*. Redundant descriptions of the corresponding components will be omitted. The semiconductor apparatus 1300*e* may be a memory system, such as a CXL module or a CXL device. The semiconductor apparatus 1300*e* may include a controller device 1310*e* and a plurality of memory media MD. The semiconductor apparatus 1300*e* may include a module substrate 1301*e*. The module substrate 1301*e* may include a module pin 1304*e*, and may communicate with an external device through the module pin 1304*e*. For example, the external device may be the main host 1211 shown in FIG. 12, and the module pin 1304*e* may be electrically connected to the system bus 1201 shown in FIG. 12. The semiconductor apparatus 1300*e* may be electrically connected to the external device through a main board by inserting the module pin 1304*e* into a slot and/or channel formed in the main board. A package substrate 1303*e* may be mounted on the module substrate 1301*e*, and the package substrate 1303*e* may be electrically connected with the module substrate 1301*e* through package balls and/or solder balls. The semiconductor apparatus 1300*e* might not include an interposer. The package substrate 1303*e*, the controller device 1310*e*, and the plurality of memory media MD may be packaged in a single package, and the single package may be mounted on the module substrate 1301*e*. The controller device 1310*e* may be disposed on the package substrate 1303*e*. The controller device 1310*e* may be electrically connected to the package substrate 1303*e* using a wire bonding. First pads 1361*e* formed in the controller device 1310*e* may be electrically connected to the pads 1305*e* formed in the package substrate 1303*e* through wire bonding. The pads 1305*e* may be electrically connected to a signal path 1351*e* formed in the package substrate 1303*e*. All of the plurality of memory media MD may be disposed on the controller device 1310*e*. Some of the plurality of the memory media MD may be disposed in a first region on the controller device 1310*e*, and the remainder of the plurality of memory media MD may be disposed in a second region on the controller device 1310*e*. The first and second regions might not overlap each other. For example, when the semiconductor apparatus 1300*e* includes sixteen memory media, eight memory media may be disposed in the first region of the controller device 1310*e*, and other eight memory media may be disposed in the second region of the controller device 1310*e*.

The controller device 1310*e* may relay data communication between the external device and the plurality of memory media MD. Although not shown, the controller device 1310*e* may include a host, a memory controller, and an interface circuit, and may have substantially the same configuration as the controller device 1310*c* shown in FIG. 15A. The controller device 1310*e* may be electrically connected with a plurality of memory media MD, and may perform data communication with the plurality of memory media MD. The controller device 1310*e* may be electrically connected with each of the plurality of memory media MD through an interface circuit. Each of the plurality of memory media MD may correspond to the second memory apparatus 1242 shown in FIG. 12. The plurality of memory media MD may form independent channels and may each be electrically connected with the interface circuit of the controller device 1310*e* through independent memory buses. In FIGS. 17A to 17C, the semiconductor apparatus 1300*e* is illustrated as having eight memory media, but the number of memory media that the semiconductor apparatus 1300*e* has may be less than eight or more than eight. Each of the plurality of memory media MD may include at least one memory die. When each of the plurality of memory media MD includes two or more memory dies, the two or more memory dies may be stacked to form a single memory media. In FIGS. 17B and 17C, one memory media includes eight memory dies, but the number of memory dies that one memory media includes may be less than or greater than eight.

The controller device 1310*e* may be electrically connected to the module substrate 1301*e* through a wire bonding W1*e* between the first pads 1361*e* and the pads 1305*e* and the signal path 1351*e* formed in the package substrate 1303*d*. The controller device 1310*e* may be electrically connected to the plurality of memory media MD through the second and third pads 1362*e*, 1363*e*. The host may be electrically connected to the module substrate 1301*e* through the wire bonding W1*e* and the signal path 1351*e*. The host may be electrically connected to the memory controller through a host bus. The memory controller may be connected to the interface circuit through a controller bus. The interface circuit may be connected to the plurality of the memory media MD through the second and third pads 1362*e*, 1363*e*. The interface circuit may be electrically connected to the plurality of memory media MD through wire bonding between the second and third pads 1362*e*, 1363*e* and the plurality of memory media MD. The wire bonding between the second and third pads 1362*e*, 1363*e* and the plurality of memory media MD may correspond to a plurality of memory buses. For example, the first memory media MD1 may be electrically connected to the interface circuit through a wire bonding W2*e* between the first memory media MD1 and the second pads 1362*e*. The second memory media MD2 may be electrically connected to the interface circuit through a wire bonding W3*e* between the second memory media MD2 and the third pads 1363*e*.

A first memory die D11 of the first memory media MD1 may be bonded to the controller device 1310*e* using DAF. The second to eighth memory dies D12, D13, D14, D15, D16, D17, D18 may also be bonded sequentially with the first to seventh memory dies D11, D12, D13, D14, D15, D16, D17, respectively, using DAF. The first to eighth memory dies D11, D12, D13, D14, D15, D16, D17, D18 may be electrically connected using a wire bonding. The first to eighth memory dies D11, D12, D13, D14, D15, D16, D17, D18 may be electrically connected to the controller device 1310*e* by wire bonding with second pads 1362*e* formed on the controller device 1310*e*. A first memory die D21 of the second memory media MD2 may be bonded to top surface of the controller device 1310*e* using DAF. The second to eighth memory dies D22, D23, D24, D25, D26, D27, D28 may also be bonded sequentially with the first to seventh memory dies D21, D22, D23, D24, D25, D26, D27 respectively, using DAF. The first to eighth memory dies D21, D22, D23, D24, D25, D26, D27, D28 may be electrically connected using a wire bonding. The first to eighth memory dies D21, D22, D23, D24, D25, D26, D27, D28 may be electrically connected to the controller device 1310*e* by wire bonding with third pads 1363*e* formed on the controller device 1310*e*. When the plurality of memory media MD are disposed on the controller device 1310*e*, the capacity of the semiconductor apparatus 1300*e* can be increased without increasing the area of the package. Further, if the plurality of memory dies is stacked in a vertical alignment rather than in a stepwise manner, then wire bonding may be possible on all four sides of the memory dies as shown in FIG. 17C. Thus, the semiconductor apparatus may have a large capacity, while being manufactured at a much lower cost. The semiconductor apparatus 1300*e* may further include a power management integrated circuit PMIC 1330*e*. The power management integrated circuit PMIC may be disposed on the module substrate 1301*e*. In an embodiment, the power management integrated circuit PMIC may be disposed on the package substrate 1303*e*.

Figure 18:
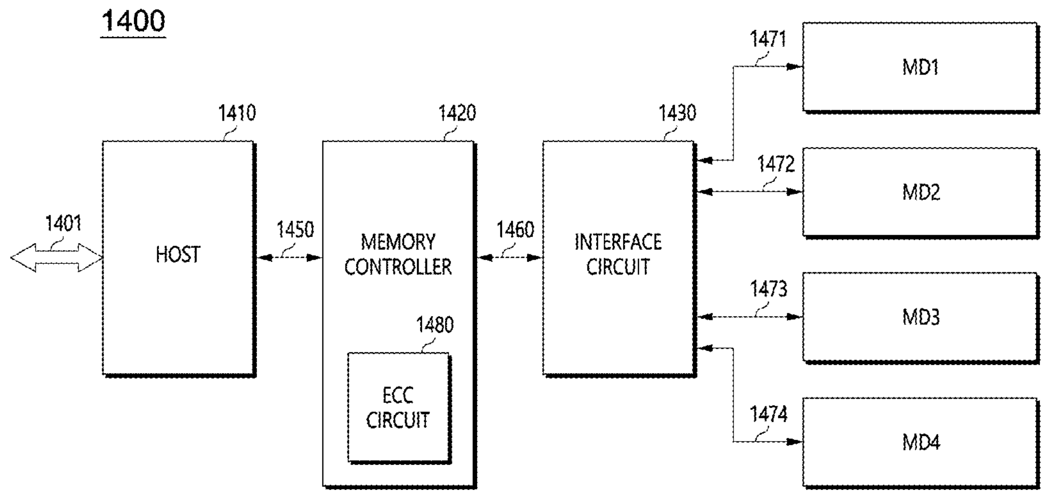
FIG. 18 is a diagram illustrating a configuration of a semiconductor apparatus according to an embodiment of the present disclosure.

FIG. 18 is a diagram illustrating a configuration of a semiconductor apparatus 1400 according to an embodiment of the present disclosure. Referring to FIG. 18, the semiconductor apparatus 1400 may be a memory system, such as a CXL module or a CXL device. The semiconductor apparatus 1400 may include a host 1410, a memory controller 1420, an interface circuit 1430, and a plurality of memory media MD1, MD2, MD3, MD4. The host 1410 may be electrically connected to an external device, such as the main host 1211 shown in FIG. 12, through a system bus 1401. The memory controller 1420 may be electrically connected to the host 1410 through a host bus 1450. The memory controller 1420 may include an enhanced error correction code (ECC) circuit. The memory controller 1420 may correct fail bit errors in data signals provided to the interface circuit 1430, and may correct fail bit errors in data signals received from the interface circuit 1430, through the enhanced ECC circuit 1480. If the memory controller 1420 includes the enhanced ECC circuit 1480, it can detect and correct a greater number of fail bits generated by the memory media MD1, MD2, MD3, MD4. In an embodiment, the enhanced ECC circuit 1480 may correct fail bit errors in command signals, address signals provided from the memory controller 1420 to the interface circuit 1430 along with the data signals. In an embodiment, the enhanced ECC circuit 1480 may be disposed external to the memory controller 1420. For example, the enhanced ECC circuit 1480 may be disposed to electrically connect between the memory controller 1420 and the interface circuit 1430. The interface circuit 1430 may be electrically connected to the memory controller 1420 through a controller bus 1460, and may be electrically connected to the plurality of memory media MD1, MD2, MD3, MD4 through a plurality of memory buses 1471, 1472, 1473, 1474. In FIG. 18, the semiconductor apparatus 1400 is shown as including four memory media, but the number of memory media included by the semiconductor apparatus 1400 may be less or more than four. The interface circuit 1430 may be electrically connected with a first memory media MD1 through a first memory bus 1471, electrically connected with a second memory media MD2 through a second memory bus 1472, electrically connected with a third memory media MD3 through a third memory bus 1473, and electrically connected with a fourth memory media MD4 through a fourth memory bus 1474. The interface circuit 1430 may perform parallel data communication or partial parallel data communication with the memory controller 1420 through the controller bus 1460. The interface circuit 1430 may perform parallel data communication with the first to fourth memory media MD1, MD2, MD3, MD4 through the first to fourth memory buses 1471, 1472, 1473, 1474, respectively. The controller bus 1460 may have substantially the same characteristics as the second bus 160 shown in FIG. 1. Each of the first to fourth memory buses 1471, 1472, 1473, 1474 may have substantially the same characteristics as the third bus 170 shown in FIG. 1.

Each of the first to fourth memory media MD1, MD2, MD3, MD4 may include a plurality of memory dies. The plurality of memory dies may have a simplified structure when compared to a conventional memory die. In the plurality of memory dies, the number of memory cells may be increased, while the number of row address decoders and redundancy cells may be decreased. Thus, the plurality of memory dies may have a smaller size than a conventional memory die. Further, because the plurality of memory dies can be stacked through wire bonding, memory media having a large data storage capacity can be realized at a low manufacturing cost. However, as the number of row address decoders and redundancy cells is reduced, the number of fail bits in the data signals stored in or output from the memory cell regions may be increased. Typically, a memory die and a memory controller has an ECC logic to correct fail bits in the data signals. The memory controller 1420 may further include the enhanced ECC circuit 1480 (i.e., enhanced ECC performance) to further relieve increased fail bits in the memory die through the ECC circuit 1480, thereby improving the reliability of the semiconductor apparatus 1400. The host 1410, the memory controller 1420, and the interface circuit 1430 may be integrated into a controller device. Because the interface circuit 1430 performs parallel data communication with the memory controller 1420 and the plurality of memory media MD1, MD2, MD3, MD4, respectively, the memory controller 1420 may have no SerDes or only minimal-sized SerDes. Thus, utilizing some or all of the area allocated for the SerDes, the controller device may add the enhanced ECC circuit 1480 without increasing the overall area of the controller device. As a result, the semiconductor apparatus 1400 may have a reduced overall area and manufacturing cost compared to a conventional semiconductor apparatus, while still providing a memory system with the same or improved performance as a conventional semiconductor apparatus.

Figure 19:
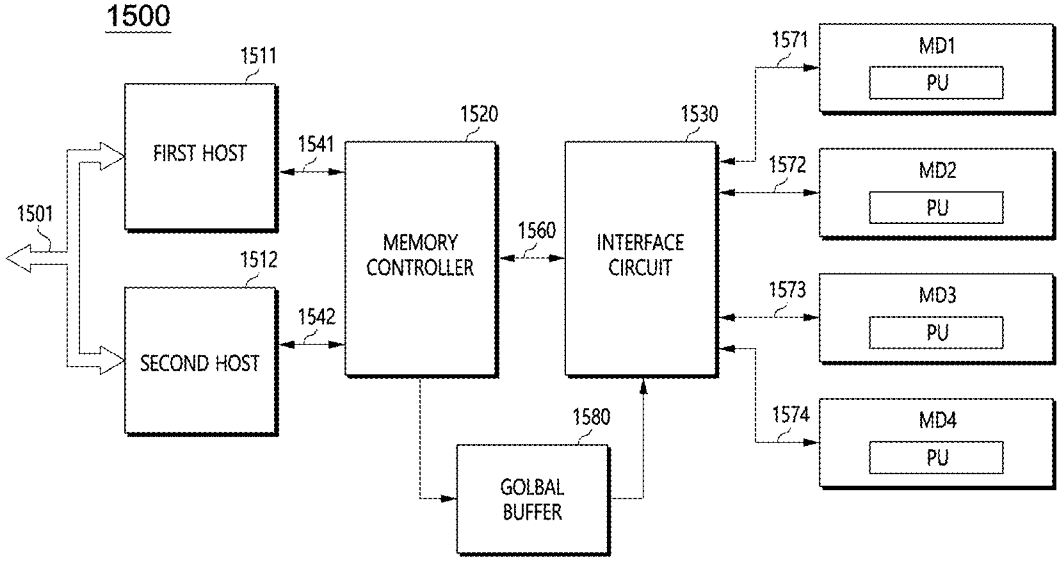
FIG. 19 is a diagram illustrating a configuration of a semiconductor apparatus according to an embodiment of the present disclosure.

FIG. 19 is a diagram illustrating a configuration of a semiconductor apparatus 1500 according to an embodiment of the present disclosure. Referring to FIG. 19, the semiconductor apparatus 1500 may be a memory system, such as a CXL module or a CXL device. The semiconductor apparatus 1500 may include a first host 1511, a second host 1512, a memory controller 1520, an interface circuit 1530, and a plurality of memory media MD1, MD2, MD3, MD4. The first and second hosts 1511, 1512 may each be electrically connected to an external device, such as the main host 1211 shown in FIG. 12, through a system bus 1501. The first and second hosts 1511, 1512 may perform different functions. Basically, the first host 1511 may perform data communication operations between the semiconductor apparatus 1500 and the external device, and the second host 1512 may perform computational operations of the semiconductor apparatus 1500. The first host 1511, based on a first request from the external device, may generate an access request to the plurality of memory media MD1, MD2, MD3, MD4, thereby providing data and/or computational data stored on the plurality of memory media MD1, MD2, MD3, MD4 to the external device through the system bus 1501, and may provide data transmitted through the system bus 1501 to the plurality of memory media MD1, MD2, MD3, MD4 or as data used for computational operations. The second host 1512 may perform computational operations on data output from the plurality of memory media MD1, MD2, MD3, MD4 and/or data provided from the external device through the system bus 1501 by generating a computational request based on a second request from the external device.

The memory controller 1520 may be electrically connected to the first host 1511 through a first host bus 1541, and may be electrically connected to the second host 1512 through a second host bus 1542. The memory controller 1520 may generate command signals and address signals for accessing the plurality of memory media MD1, MD2, MD3, MD4 based on the access request provided by the first host 1511. The memory controller 1520 may generate command signals and address signals to instruct computational operations of the plurality of memory media MD1, MD2, MD3, MD4 based on the computational request provided from the second host 1512. The semiconductor apparatus 1500 may further include a global buffer 1580. The global buffer 1580 may be electrically connected between the memory controller 1520 and the interface circuit 1530. The global buffer 1580 may store and output data corresponding to vectors so that the plurality of memory media MD1, MD2, MD3, MD4 can perform matrix operations. The global buffer 1580 may receive data corresponding to the vectors from the memory controller 1520, and may store data corresponding to the vectors. The global buffer 1580 may output data corresponding to the vectors to the interface circuit 1530, which may provide data corresponding to the vectors to the plurality of memory media MD1, MD2, MD3, MD4. In an embodiment, the global buffer 1580 may be implemented with a register or static random access memory (SRAM). The interface circuit 1530 may be electrically connected to the memory controller 1520 through a controller bus 1560, and may be electrically connected to the plurality of memory media MD1, MD2, MD3, MD4 through a plurality of memory buses 1571, 1572, 1573, 1574. In FIG. 19, the semiconductor apparatus 1500 is shown as including four memory media, but the number of memory media included by the semiconductor apparatus 1500 may be less than or greater than four. The interface circuit 1530 may be electrically connected with a first memory media MD1 through a first memory bus 1571, electrically connected with a second memory media MD2 through a second memory bus 1572, electrically connected with a third memory media MD3 through a third memory bus 1573, and electrically connected with a fourth memory media MD4 through a fourth memory bus 1574. The interface circuit 1530 may perform parallel data communication or partial parallel data communication with the memory controller 1520 through the controller bus 1560. The interface circuit 1530 may perform parallel data communication with the first to fourth memory media MD1, MD2, MD3, MD4, respectively, through the first to fourth memory buses 1571, 1572, 1573, 1574. The controller bus 1560 may have substantially the same characteristics as the second bus 160 shown in FIG. 1. Each of the first to fourth memory buses 1571, 1572, 1573, 1574 may have substantially the same characteristics as the third bus 170 shown in FIG. 1.

Each of the first to fourth memory media MD1, MD2, MD3, MD4 may include a plurality of memory dies. Because each of the plurality of memory dies performs parallel data communication with the interface circuit 1530, they might not include an additional circuit such as SerDes. The area from which the SerDes is removed may be provided with a processing unit PU. The processing unit PU may include a MAC (Multiply and Accumulation) unit. Each of the plurality of memory dies may include a memory cell array and the processing unit PU to perform a computational operation requested from the second host 1512. The first host 1511, the second host 1512, the memory controller 1520, the global buffer 1580, and the interface circuit 1530 may be integrated into a controller device. Because the interface circuit 1530 performs parallel data communication with the memory controller 1520 and the plurality of memory media MD1, MD2, MD3, MD4, respectively, the memory controller 1520 may have no SerDes or only a minimal-sized SerDes. Thus, utilizing some or all of the area allocated for the SerDes, the controller device may add the second host 1512 and the global buffer 1580 without increasing the overall area of the controller device. As a result, the semiconductor apparatus 1500 can realize a memory system that performs the function of PIM (Processing In Memory) in substantially the same area as a conventional semiconductor apparatus.

Figure 20A:
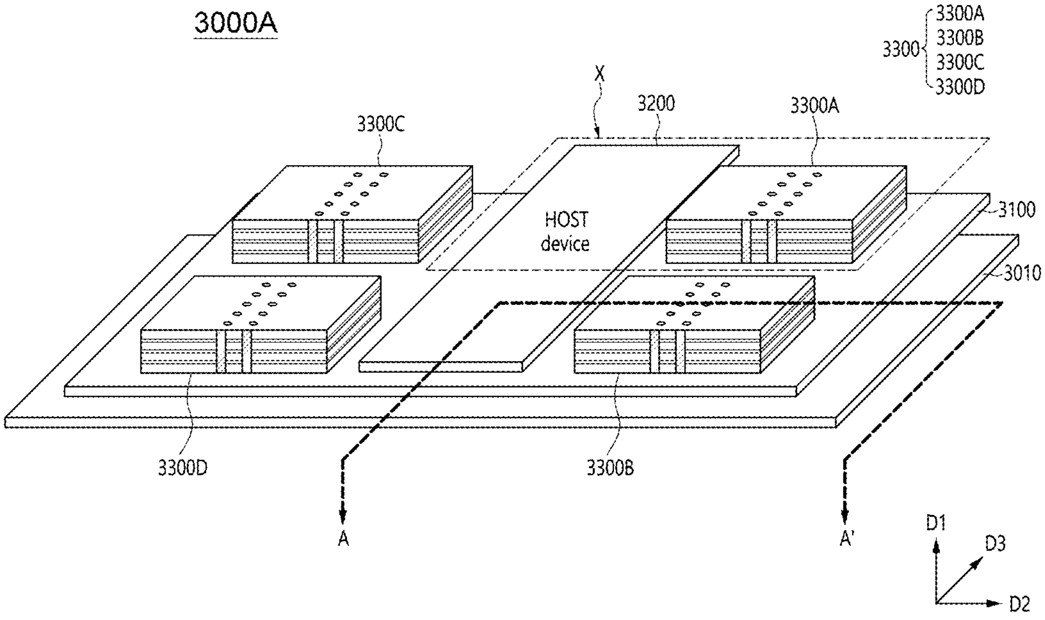
FIG. 20A is a diagram illustrating a perspective view of a computing system according to an embodiment of the present disclosure.
Figure 20B:
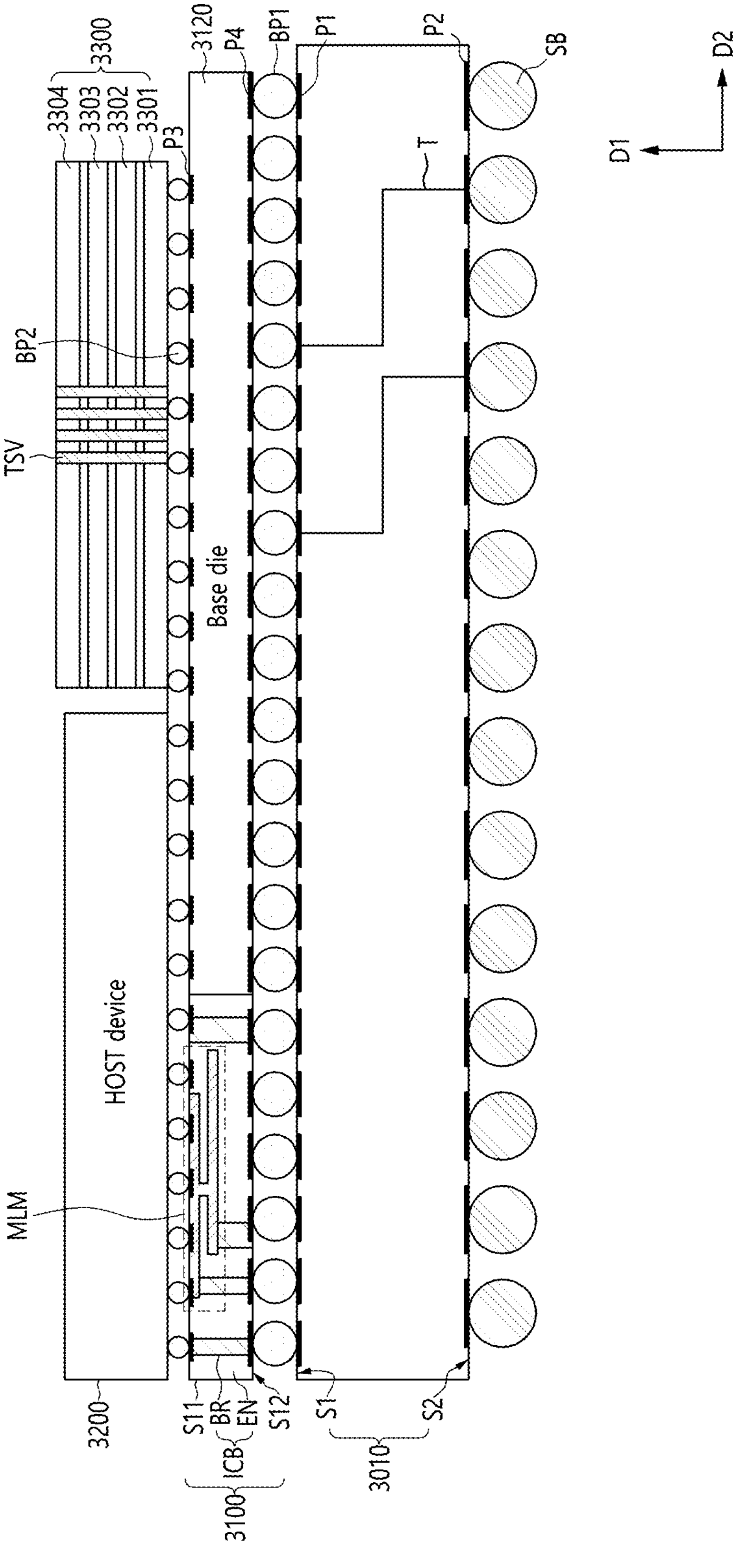
FIG. 20B is a diagram illustrating a cross-sectional view of the computing system taken along line A-A' of FIG. 20A according to an embodiment of the present disclosure.
Figure 20C:
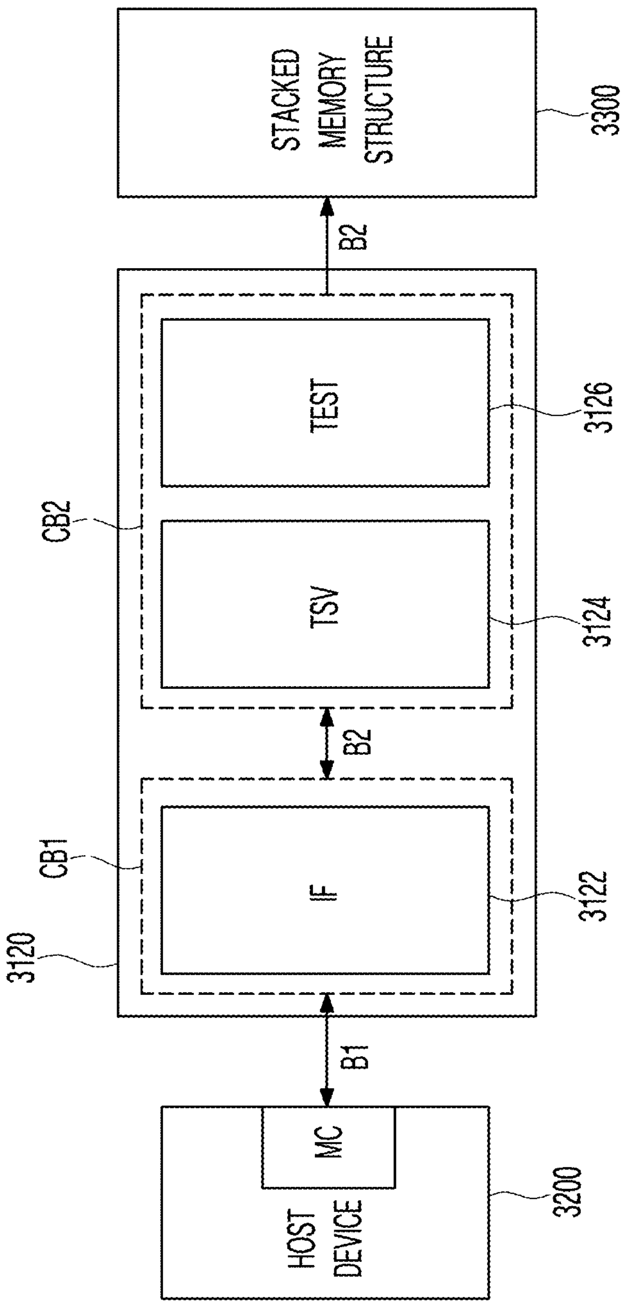
FIG. 20C is a schematic block diagram illustrating the computing system according to an embodiment of the present disclosure.
Figure 20D:
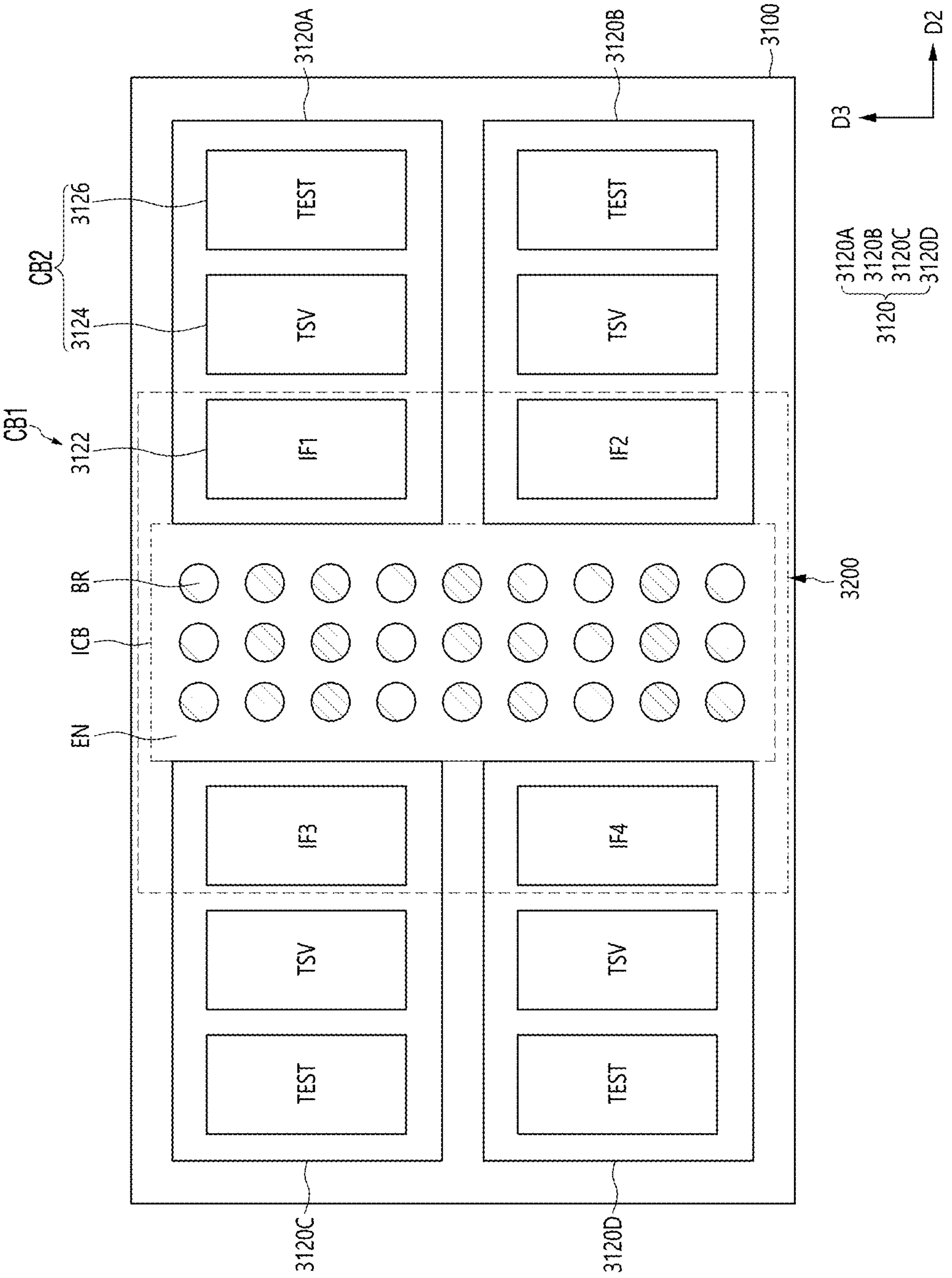
FIG. 20D is a diagram illustrating a schematic plan view of a base die structure of FIG. 20A according to an embodiment of the present disclosure.
Figure 20E:
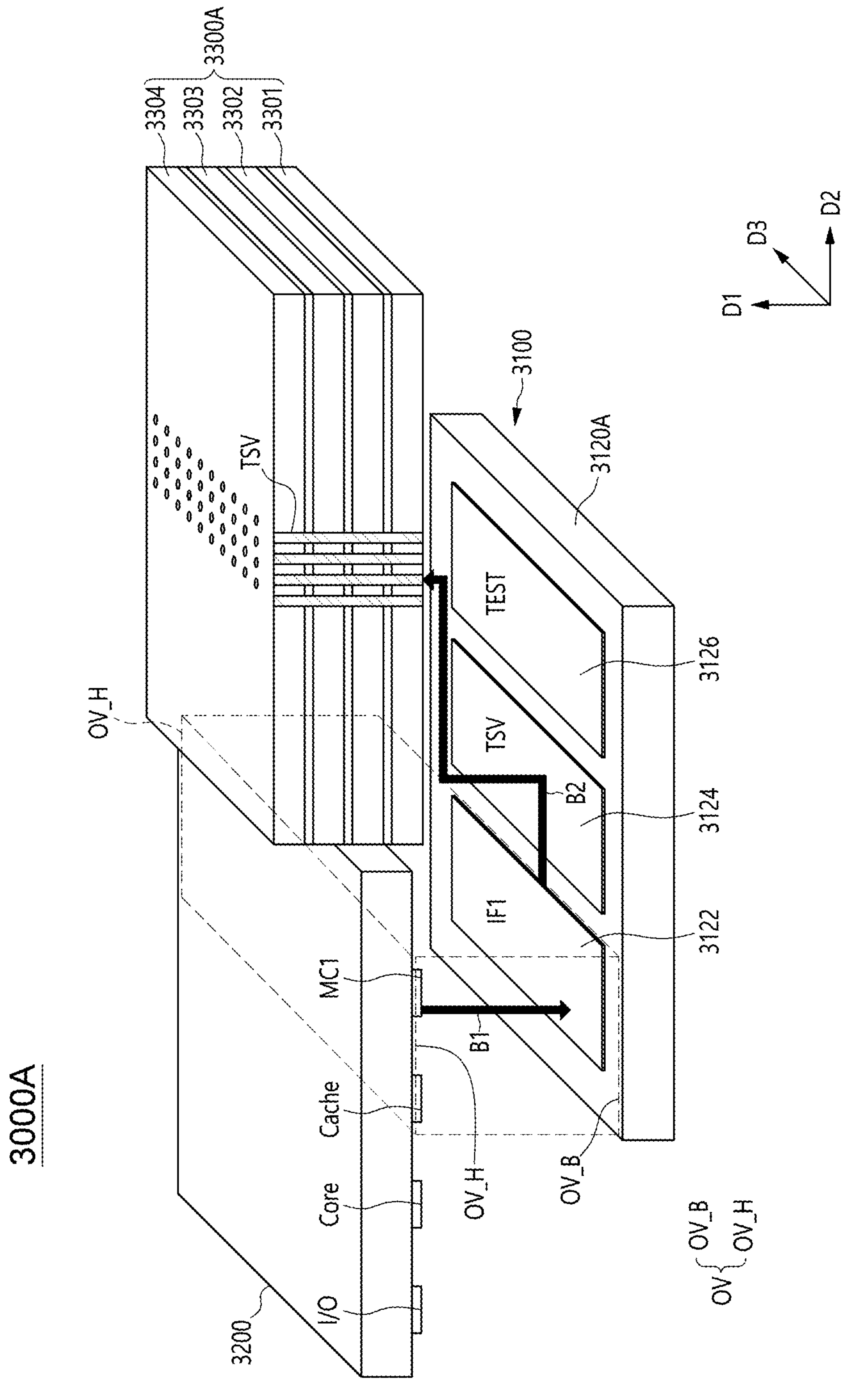
FIG. 20E is a diagram illustrating perspective views of main parts of a signal transmission path of the computing system of FIG. 20A according to an embodiment of the present disclosure.

FIG. 20A is a diagram illustrating a perspective view of a computing system according to an embodiment of the present disclosure. FIG. 20B is a diagram illustrating a cross-sectional view of the computing system taken along line A-A' of FIG. 20A according to an embodiment of the present disclosure. FIG. 20C is a schematic block diagram illustrating the computing system according to an embodiment of the present disclosure. FIG. 20D is a diagram illustrating a schematic plan view of a base die structure of FIG. 20A according to an embodiment of the present disclosure. FIG. 20E is a diagram illustrating perspective views of main parts of a signal transmission path of the computing system of FIG. 20A according to an embodiment of the present disclosure. For reference, FIG. 20E illustrates a signal transmission path among components in an "X" portion of FIG. 20A.

Referring to FIGS. 20A to 20E, a computing system 3000A may include a substrate 3010, a base die structure 3100, a host device 3200, and at least one stacked memory structure 3300. The substrate 3010, the base die structure 3100, and the host device 3200 may be sequentially stacked along a first direction D1. In addition, the substrate 3010, the base die structure 3100, and the stacked memory structure 3300 may also be stacked along the first direction D1. In the following embodiments, "stacked" or "disposed along the first direction D1" will be understood to mean, for example, being formed in a vertical direction to the substrate 3010 or being disposed in three dimensions.

The substrate 3010 may support the base die structure 3100, the host device 3200, and the stacked memory structure 3300. The substrate 3010 may be a substrate for a semiconductor package including, for example, a printed circuit board (PCB), a ceramic substrate, a glass substrate, or a tape wiring substrate. Referring to FIG. 20B, the substrate 3010 may include a first surface S1 and a second surface S2 facing each other. The first surface S1 may be referred to as a top surface or a front side, and the second surface S2 may be referred to as a bottom surface, a rear surface or a back side. The substrate 3010 may include a plurality of first pads P1 arranged on the first surface S1, and a plurality of second pads P2 arranged on the second surface S2. The plurality of first pads P1 may be coupled to first connection terminals BP1 for example, bumps) of the base die structure 3100. The plurality of second pads P2 may be coupled to external connection terminals SB (for example, solder balls). A size of the plurality of first pads P1 and a size of the plurality of second pads P2 may be different from each other. The substrate 3010 may include a plurality of traces T. The plurality of first pads P1 and the plurality of second pads P2 may be respectively coupled by the plurality of traces T to communicate a plurality of electrical signals through the substrate 3010 between the first pads P1 and the second pads P2.

The base die structure 3100 may be mounted on the first surface S1 of the substrate 3010 and may include at least one base die 3120. In an embodiment, the base die structure 3100 may include as many base dies 3120 as the number corresponding to the number of the stacked memory structures 3300. For example, when the computing system 3000A includes four stacked memory structures 3300A to 3300D, the base die structure 3100 may include four base dies 3120A to 3120D. As will be described in detail later, each of the base dies 3120A to 3120D may be configured to overlap with (or be bonded to) a portion of the host device 3200 and a portion of the corresponding stacked memory structures 3300A to 3300D, respectively. The base dies 3120A to 3120D may also be referred to by various terms such as a logic die (logic chip), a logic base, a control die (control chip), a master die (master chip), a buffer die (buffer chip), or an interface die (interface chip).

The base die structure 3100 may include a first surface S11 and a second surface S12 facing each other. The first surface S11 may correspond to a top surface or a front surface of the base die structure 3100, and the second surface S12 may correspond to a bottom surface or a rear surface of the base die structure 3100. For example, the second surface S12 may face the first surface S1 of the substrate 3010. A plurality of third pads P3 may be arranged on the first surface S11 of the base die structure 3100, and a plurality of fourth pads P4 may be arranged on the second surface S12 to be coupled to the first connection terminals BP1.

Referring to FIGS. 20C and 20D, each of the base dies 3120 (i.e., 3120A to 3120D) may include at least one first circuit block CB1 and at least one second circuit block CB2. For example, the first circuit block CB1 may be electrically coupled to the host device 3200. The first circuit block CB1 may include, for example, an interface circuit block 3122. The second circuit block CB2 may be electrically coupled to one of the stacked memory structures 3300 (i.e., 3300A to 3300D). For example, the second circuit block CB2 may include a TSV circuit block 3124 and a test circuit block 3126.

The interface circuit block 3122 and the host device 3200 may be coupled through the first bus B1. The interface circuit block 3122 may convert various signals received from the host device 3200 into signals having a form suitable to be provided to the stacked memory structure 3300. For example, the interface circuit block 3122 may include an interface circuit configuration described above with reference to FIGS. 1 to 6.

Referring to FIG. 20E, in order to shorten the physical length of the first bus B1, at least a portion of the interface circuit block 3122 may be located in an overlap region OV_B, where the base dies 3120A to 3120D overlap the host device 3200 in first direction D1.

The TSV circuit block 3124 may receive signals output from the interface circuit block 3122, or may provide signals output from the stacked memory structure 3300 to the interface circuit block 3122. The TSV circuit block 3124 may be coupled to a plurality of TSVs disposed inside the stacked memory structure 3300.

The test circuit block 3126 may include a plurality of test circuits for testing the stacked memory structure 3300. In some embodiments, the test circuit block 3126 is omitted.

The first circuit block CB1 and the second circuit block CB2 may be connected by the second bus B2. In addition, the first circuit block CB1 may be coupled to the second circuit block CB2, and the second circuit block CB2 coupled to the stacked memory structure 3300, through the second bus B2, respectively. The second bus B2 may be substantially the same as the configuration of a third bus 170 of described above with reference to FIG. 1. The second bus B2 may be a signal transmission path capable of transmitting and receiving input/output signals of the stacked memory structure 3300. For example, a global input/output signal (GIO) may be transmitted through the second bus B2. However, the present invention is not limited thereto.

Referring again to FIG. 20B, the base die structure 3100 may further include a connection block ICB. The connection block ICB may be located adjacent to the base dies 3120A to 3120D and may insulate and support the base dies 3120A to 3120D. The connection block ICB may couple electrical elements of the substrate 3010 and electrical components of the host device 3200. The connection block ICB may be located adjacent to the base dies 3120A to 3120D, such as for example, adjacent to at least one side of the base dies 3120A to 3120D. The connection block ICB may include a plurality of bridges BR and a molding layer EN. The plurality of bridges BR may electrically connect the third pads P3 located on the first surface S11 of the base die structure 3100 and the fourth pads P4 located on the second surface S12 of the base die structure 3100. For example, the plurality of bridges BR may extend through part or all of the base die structure 3100 along the first direction D1. The plurality of bridges BR may include at least one of a conductive pillar, a conductive post, a conductive wire, or a conductive stud. In some embodiments, the molding layer EN may be disposed between the plurality of bridges BR, and may surround side surfaces of the base dies 3120A to 3120D while insulating the plurality of bridges BR. The molding layer EN may include an epoxy resin having a filler, an epoxy acrylate having a filler, PBO (Polybenzoxazole), or polyimide. The connection block ICB may further include at least one buildup interconnection layer MLM. For example, the buildup interconnection layer MLM may be located between the plurality of bridges BR and the third pads P3, or between the plurality of bridges BR and the fourth pads P4. The buildup interconnection layer MLM may include at least one of a vertical conductive line or a horizontal conductive line, or a redistribution layer. Signals directly transmitted from the substrate 3010 to the host device 3200 may be directly transmitted through the plurality of bridges BR and the buildup interconnection layer MLM. In an embodiment, the connection block ICB may be located between the host device 3200 and the substrate 3010. The thickness of the connection block ICB may be the same as that of the base dies 3120A to 3120D, respectively.

The host device 3200 may be stacked on the first surface S11 of the base die structure 3100. In order to shorten the length of the first bus B1, the host device 3200 may be disposed on the first surface S11 of the base die structure 3100 so that at least a portion of the host device 3200 overlaps the base dies 3120A to 3120D of the base die structure 3100 in the first direction D1.

The host device 3200 may have one configuration selected from among the host, the main host, and/or the sub-host described above with reference to FIGS. 1 to 19. For example, the host device 3200 may include at least one core, a cache, an input/output device I/O, and at least one memory controller MC1, as an electric component. The core, the cache, the input/output device I/O, and the memory controller MC1 may be substantially the same as the process core, the cache, and the memory controller MC1 described above with reference to FIGS. 1 to 19.

At least one of the components of the host device 3200 may be arranged to face the base die structure 3100, in particular, the base die 3120. For example, the memory controller MC1 of the host device 3200 may be arranged to overlap with an interface circuit block 3122 of the base die 3120A. As described above, the memory controller MC1 may support data transfer between various components inside the host device 3200 and the stacked memory structure 3300. The memory controller MC of the host device 3200 and the interface circuit block 3122 of the base die 3120, which are arranged to face each other, may be coupled by the first bus B1. For example, the first bus B1 may include a DDR PHY interface (DFI), although the present disclosure is not limited thereto. The first bus B1 may correspond to a second bus 160 described above with reference to FIG. 1. More specifically, the first bus B1 may transmit data in substantially the same manner as the first data bus 161 of FIG. 1.

In an example, a data transmission format of a signal transmitted through the first bus B1 may be the same as a data transmission format transmitted through the second bus B2 within a set range. The "data transmission format" may include a data transmission rate, a number of data transmitted at one time, and a clock frequency, and the set range may be a margin determined by a user.

The first bus B1 is configured to directly couple the host device 3200 and the base die structure 3100 without passing through an interposer. Therefore, the physical length of the first bus B1 may be reduced by at least the thickness of a general interposer, compared to the physical length of a general bus connecting a host device (or a host) and the base die. As the physical length of the first bus B1 is reduced, lower-power communication between the host device 3200 and the base dies 3120A to 3120D becomes possible.

In addition, data transmitted from the memory controller MC of the host device 3200 to the interface circuit block 3122 through the first bus B1 has a data transmission format similar to data to be transferred to the stacked memory structure 3300. Accordingly, data communication between a memory controller MC of the host device 3200 and the interface circuit block 3122 of the base die 3120 may be possible without separate SerDes processing.

In an embodiment, when the computing system 3000A includes the plurality of stacked memory structures 3300A to 3300D, the host device 3200 may include a number of memory controllers MC1 to MC4 corresponding to the respective plurality of stacked memory structures 3300A to 3300D. The first bus B1 may couple the memory controllers MC1 to MC4 and the interface circuit blocks 3122 of the base dies 3120A to 3120D, respectively. In order to reduce the physical length of the first buses B1, the memory controllers MC1 to MC4 of the host device 3200 may be disposed in an overlap region OV_H of the host device 3200, which overlaps the base dies 3120A to 3120D in the first direction D1.

The stacked memory structure 3300, similar to the host device 3200, may be disposed on the first surface S11 of the base die structure 3100. For example, when the stacked memory structure 3300 includes first to fourth stacked memory structures 3300A to 3300D, the stacked memory structures 3300A to 3300D may be symmetrically disposed on both sides with respect to the host device 3200 in the second direction D2 or the third direction D3. Furthermore, each of the stacked memory structures 3300A to 3300D may overlap at least a portion of the first to fourth base dies 3120A to 3120D of the base die structure 3100 in the first direction D1. As described above, the term "overlap" may mean that two different components face each other and overlap. The two overlapped components may be directly contacted or bonded. Further, the two overlapped components may face each other with a thin film layer or the like interposed therebetween. For example, the stacked memory structures 3300A to 3300D and the base dies 3120A to 3120D, which are stacked side by side, may constitute HBM memory apparatuses. In an embodiment, the overlap may be understood as being bonded directly without insertion of an additional medium.

Each of the stacked memory structures 3300A to 3300D may include a plurality of memory dies 3301 to 3304 stacked along a first direction D1, and a plurality of TSVs extending in the first direction D1 that couple the plurality of memory dies 3301 to 3304. In FIG. 20E, the stacked memory structures 3300A to 3300D are illustrating four stacked memory dies 3301 to 3304, but each of the stacked memory structures 3300A to 3300D may include four or fewer memory dies or four or more memory dies. Although not illustrated in the figures, the plurality of TSVs penetrating the plurality of memory dies 3301 to 3304 may be electrically connected through a plurality of connection terminals (not shown). The plurality of TSVs and the plurality of TSV connection terminals may provide a plurality of channels in the plurality of memory dies 3301 to 3304. Through the plurality of channels, the data received in the parallel signal scheme may be written to the plurality of memory dies and the written data may be read in the parallel signal scheme. A connection scheme of the TSVs of the stacked memory structure 3300 is described in detail in U.S. Ser. No. 19/070,088 entitled "COMPUTING SYSTEM ARCHITECTURE HAVING EFFICIENT BUS CONNECTIONS" filed by the present applicant, which is incorporated into the present disclosure in its entirety.

The stacked memory structures 3300A to 3300D may be electrically connected to the base dies 3120A to 3120D using second connection terminals BP2, but other embodiments are not limited thereto. The TSVs of the stacked memory structures 3300A to 3300D may be electrically connected to the TSV circuit blocks 3124 of the base dies 3120A to 3120D, respectively. On at least one portion of a surface of the base die 3120 adjacent to the stacked memory structure 3300 and a surface of the stacked memory structure 3300 facing the base die 3120, at least one of an interconnection wiring (not shown) or a redistribution layer (not shown) may be provided. Using the second connection terminals BP2 and at least one of the interconnection wiring and the redistribution layer, the TSVs of the stacked memory structure 3300 and the TSV circuit blocks 3124 of the base dies 3120A to 3120D may be coupled.

As an example, a surface of the base die 3120 adjacent to the stacked memory structure 3300 may be located on the same plane as the first surface S11 of the base die structure 3120. A surface of the stacked memory structure 3300 adjacent to the base die 3120 may correspond to the bottom surface of the stacked memory structure 3300. Also, the term "surface of the base die 3120" may indicate a resulting surface of the base die 3120 on which the first and second circuit blocks CB1 and CB2 are integrated.

In an embodiment, a vertical shortest distance between the base die structure 3100 and the host device 3200 may be substantially identical to a vertical shortest distance between the base die structure 3100 and the stacked memory structure 3300.

By way of example, the first bus B1 and the second bus B2 may refer to a first and a second signal transmission path. The first bus B1 may include a bonding member, for example, a second connection terminal BP2, for bonding the host device 3200 and the base die structure 3100 (or the base die 3120). The second connection terminal BP2 bonding the host device 3200 and the base die 3120 may correspond to a bonding surface or a bonding interface between the host device 3200 and the base die 3120. Similarly, the second bus B2 may include a bonding member, for example, the second connection terminal BP2, for bonding the base die structure 3100 (or the base die 3120). The second connection terminal BP2 bonding the base die 3120 and the stacked memory structure 3300 may correspond to a bonding surface or a bonding interface between the base die 3120 and the stacked memory structure 3300.

In addition, the base die structure 3100 mounted on the substrate 3010 of the present embodiment, the host device 3200, and the stacked memory structure 3300 may be encapsulated or surrounded by a molding layer (not shown) to configure a single integrated circuit package.

Figure 21A:
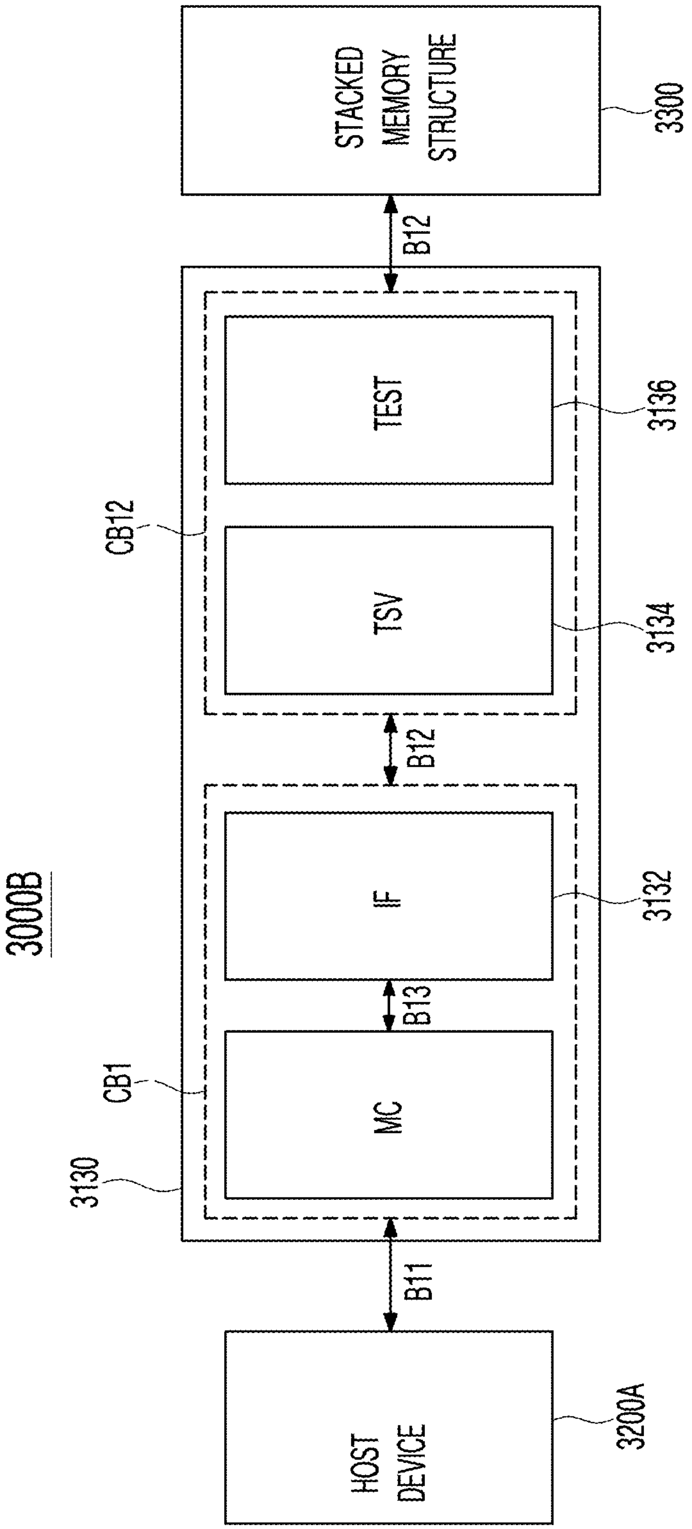
FIG. 21A is a schematic block diagram illustrating a computing system according to an embodiment of the present disclosure.
Figure 21B:
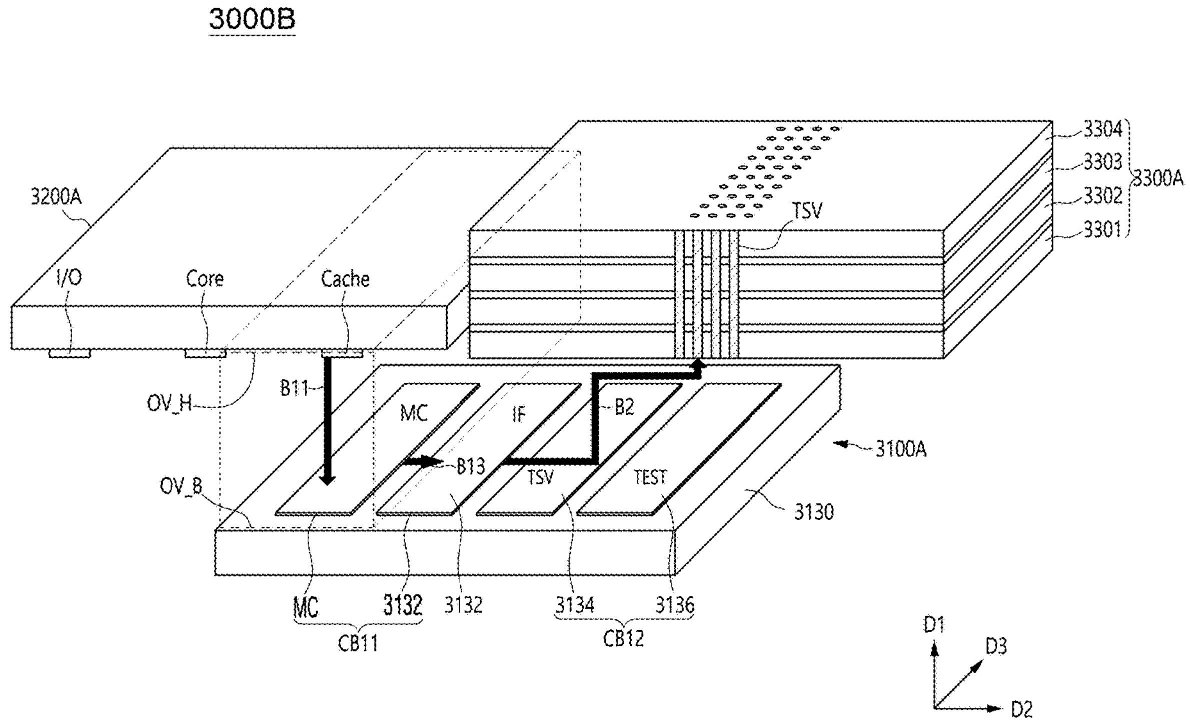
FIG. 21B is a diagram illustrating a perspective partial view of a computing system according to an embodiment of the present disclosure.

FIG. 21A is a schematic block diagram illustrating a computing system according to an embodiment of the present disclosure. FIG. 21B is a diagram illustrating a perspective partial view of a computing system according to an embodiment of the present disclosure Referring to FIGS. 21A and 21B, a computing system 3000B may include a host device 3200A, a base die structure 3100A including at least one base die 3130, and at least one stacked memory structure 3300. The host device 3200A may be arranged to overlap with a portion of the base die 3130 in the first direction D1, and the stacked memory structure 3300 may also be arranged to overlap with a portion of the base die 3130 in the first direction D1.

The base die 3130 may include a first circuit block CB11 and a second circuit block CB12. For example, at least a portion of the first circuit block CB11 may be located in an overlap region OV_B of the base die 3130 facing the host device 3200A. The first circuit block CB11 may include a memory controller MC and an interface circuit block 3132. In one example, the memory controller MC of the first circuit block CB11 may be located in the overlap region OV_B. In an example, the memory controller MC of the first circuit block CB11 and at least a portion of the interface circuit block 3132 may be located in the overlap region OV_B. The second circuit block CB12 may include a TSV circuit block 3134 and a test circuit block 3136, as described above with reference to FIGS. 20A-20E.

The configurations of the memory controller MC, the interface circuit block 3132, the TSV circuit block 3134, and the test circuit block 3136 may be substantially the same as the configurations of the interface circuits 230, the interface circuit block 3122, the TSV circuit block 3124, and the test circuit block 3126 described in foregoing embodiments.

Because the memory controller MC is integrated in the base die 3130, the host device 3200A may secure internal arear (or space) with a margin corresponding to an integrated area of the memory controller MC. In the secured internal area of the host device 3200A, various components (not shown) related to performance of the host device 3200A may be integrated.

The host device 3200A and the first circuit block CB11 may be coupled through the first bus B11. For example, a selected component of the host device 3200A may be coupled to the memory controller MC of the base die 3130 through the first bus B11. For example, the selected component of the host device 3200A may include a cache, but embodiments are not limited thereto. The first bus B11 may be based on an interface matching a protocol of the memory controller MC. For example, the first bus B11 may include at least one of AXI (Advanced extensible Interface), UCIe (Universal Chiplet Interconnect express), AMBA (Advanced Microcontroller Bus Architecture), UPI (Ultra Path Interconnect), Infinite Fabric, and NVLINK. A signal transmission scheme of the first bus B11 may be substantially the same as that of a first bus 150 described above with reference to FIG. 1. Since the host device 3200A and the base die 3130A are directly stacked (or bonded) along the first direction D1 without insertion of an interposer, a physical length of the first bus B11 may be shorter than a physical length of a typical first bus that couples the host device and the base die through an interposer. Furthermore, because the selected component of the host device 3200A, for example, the cache, and the memory controller MC of the base die 3130 are arranged to face each other and overlap in the first direction D1 while exchanging signals, the length of the first bus B11 may be further shortened. The first circuit block CB11 and the second circuit block CB12 may be coupled through the second bus B12. Further, the first circuit block CB11 and the second circuit block CB12, and the second circuit block CB12 and the stacked memory structure 3300, may be coupled through the second bus B12, respectively. The second bus B12 may be substantially the same as a second bus B2 described above with reference to FIG. 20C and a third bus 170 described above with reference to FIG. 1. The second bus B12 may be configured to transmit data and signals suitable for operation of the stacked memory structure 3300. For example, the second bus B12 may transmit a GIO signal, although the present disclosure is not limited thereto.

The first circuit block CB11 may include a third bus B13 connecting the memory controller MC and the interface circuit block 3132 of the first circuit block CB11. The third bus B13 may be substantially the same as a second bus 160 described above with reference to FIG. 1 or a first bus B1 described above with reference to FIG. 20. For example, a signal transmission scheme using the third bus B13 may be similar to a signal transmission scheme through the second bus 160 of FIG. 1 or the first bus B1 of FIG. 20. For example, the third bus B13 may include a DFI, although the present disclosure is not limited thereto. The third bus B13 may be an internal bus or a wiring structure that couples the memory controller MC and the interface circuit block 3132, which are adjacently arranged within the same base die 3130A. Thus, the third bus B13 may have a relatively short physical length compared to the lengths of the first bus B11 and the second bus B12. A physical length of the third bus B13 may vary according to integrated positions of the memory controller MC11 and the interface circuit block 3132. Accordingly, a user may modify an architecture of the memory controller MC and the interface circuit block 3132 in consideration of a data transmission rate of the stacked memory structure 3300.

In an example, each of the first to third buses B11, B12, and B13 may correspond to various signal transmission paths for transmitting signals suitable for a specific protocol. That is, in the present embodiment, the first to third buses B11, B12, and B13 may correspond to first to third signal transmission paths. Accordingly, a designer may modify an architecture of the memory controller MC and the interface circuit block 3132 in consideration of a data transmission rate of the stacked memory structure 3300.

Because the memory controller is disposed in the base die, other components that perform different functions may be further formed in the host device in areas of integration with the memory controller.

The memory controller may also be fabricated using a BEOL process because the memory controller is configured to process signals having a relatively low data transmission rate and is integrated in the base die together with circuit blocks, such as the interface circuit block, the TSV circuit block, and the test circuit block fabricated by a back end of line (BEOL) process. Accordingly, the manufacturing cost of the computing system can be reduced.

Figure 22A:
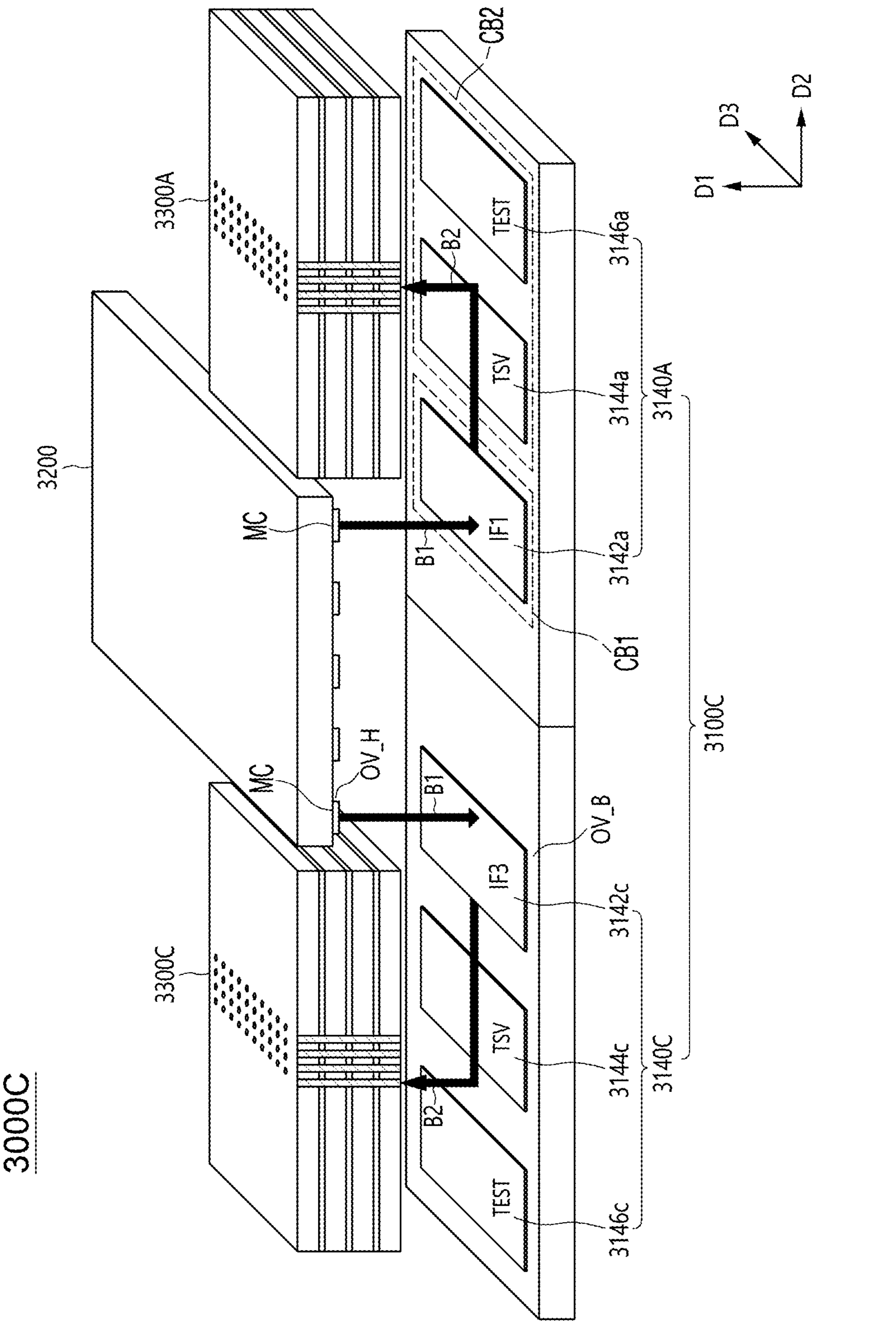
FIG. 22A is a diagram illustrating a perspective view of a portion of a computing system according to an embodiment of the present disclosure.
Figure 22B:
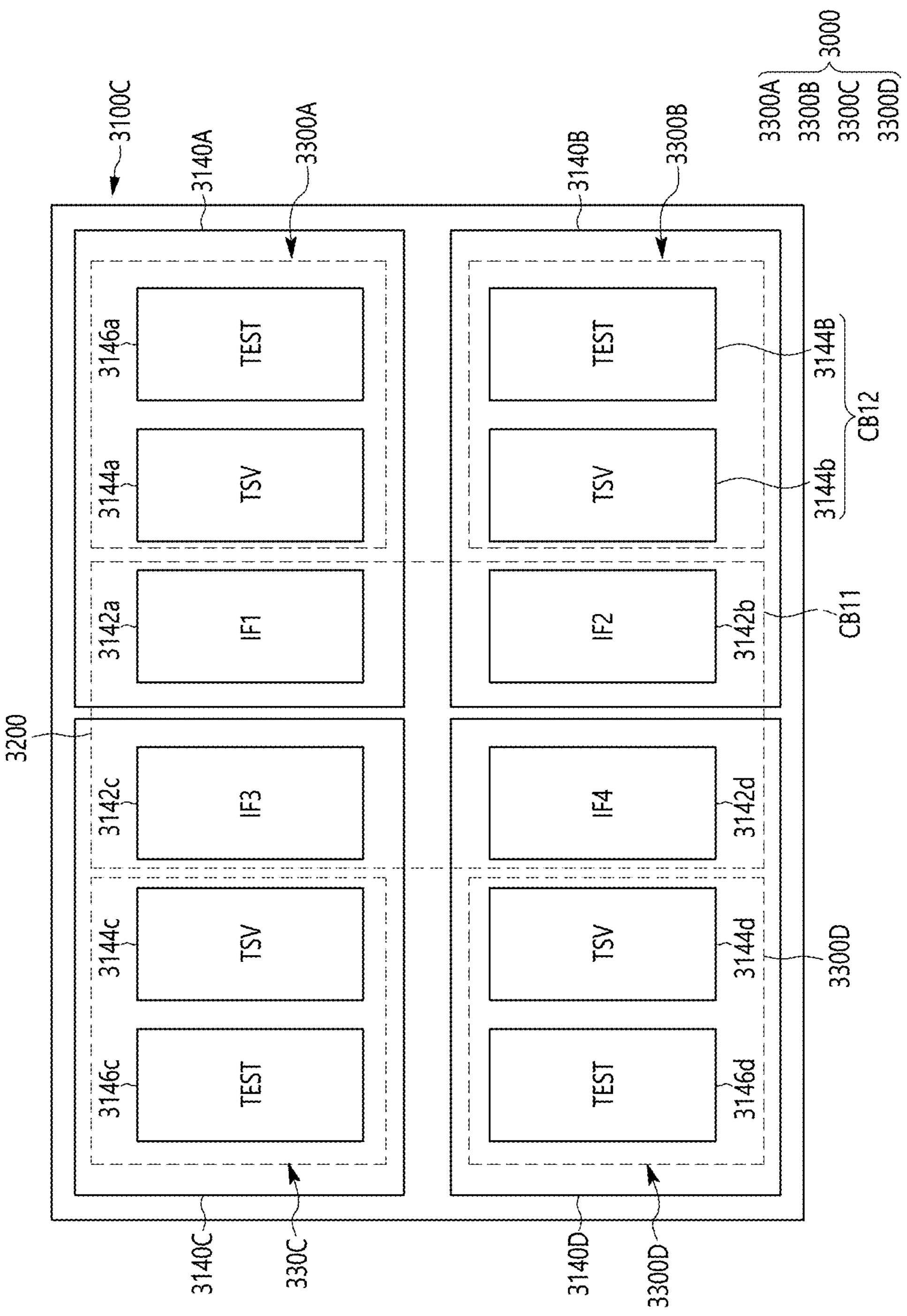
FIG. 22B is a diagram illustrating a schematic plan view of a base die structure including extension base dies of FIG. 22A according to an embodiment of the present disclosure.
Figure 22C:
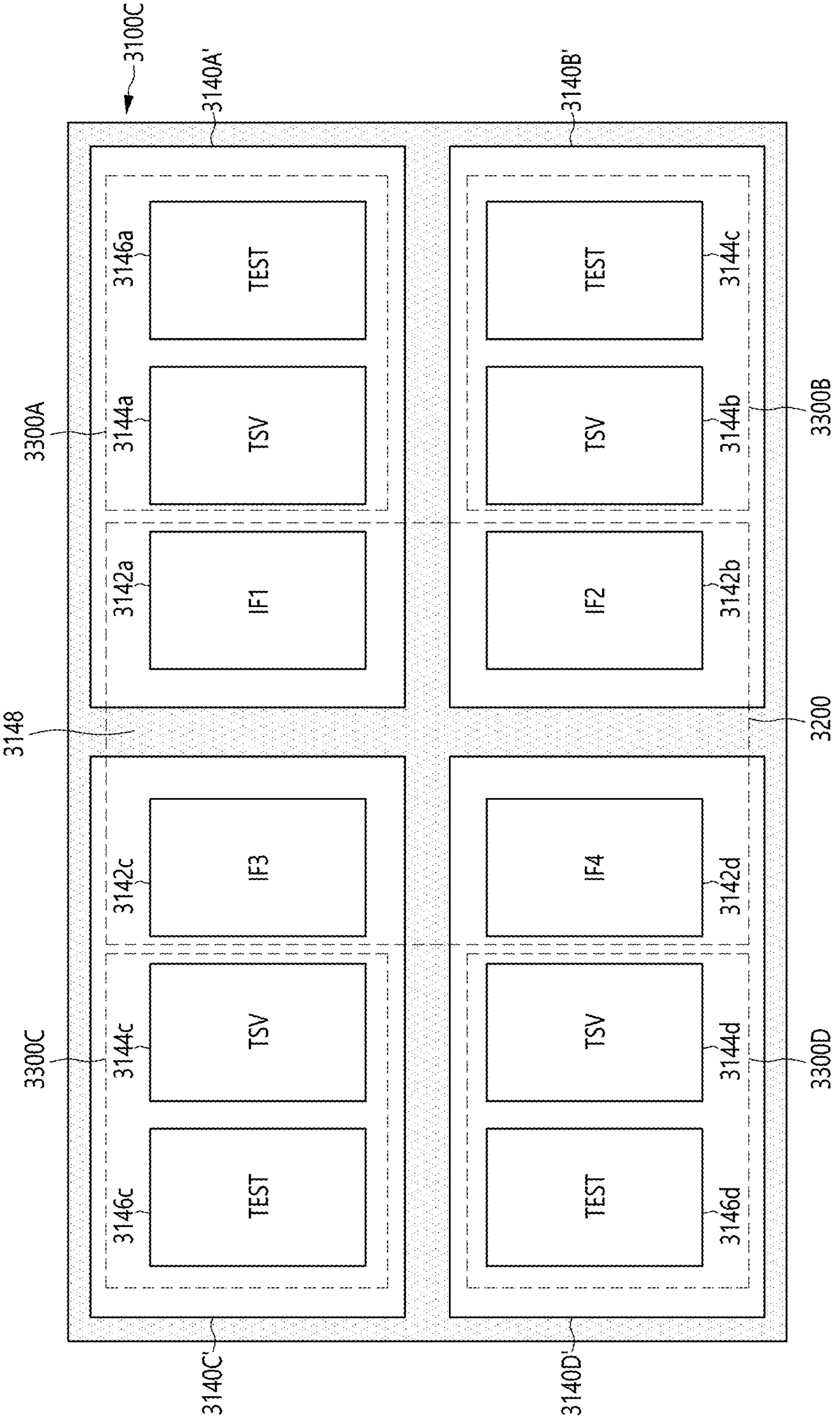
FIG. 22C is a diagram illustrating a plan view of a base die structure including extension base dies according to an embodiment of the present disclosure.

FIG. 22A is a diagram illustrating a perspective view of a portion of a computing system according to an embodiment of the present disclosure. FIG. 22B is a diagram illustrating a schematic plan view of a base die structure including extension base dies of FIG. 22A according to an embodiment of the present disclosure. FIG. 22C is a diagram illustrating a plan view of a base die structure including extension base dies according to an embodiment of the present disclosure.

Referring to FIGS. 22A and 22B, a computing system 3000C may include a base die structure 3100C including a plurality of extension base dies 3140A to 3140D, a host device 3200 and a plurality of stacked memory structures 3300. The computing system 3000C may further include a substrate supporting the base die structure 3100C, the host device 3200, and the stacked memory structure 3300. The substrate may be substantially the same as the substrate 3010 illustrated in FIGS. 20A and 20B. For example, the substrate may include a package substrate. The base die structure 3100C may be located between the substrate and the host device 3200, and between the substrate and the stacked memory structure 3300, respectively.

In an embodiment, when the computing system 3000C includes the host device 3200 and first to fourth stacked memory structures 3300A to 3300D arranged on both sides of the host device 3200, the base die structure 3100C may include the first to fourth extension base dies 3140A to 3140D respectively coupled to first to fourth stacked memory structures 3300A to 3300D.

The first extension base die 3140A may overlap an entire bottom surface of the first stacked memory structure 3300A and a portion of the host device 3200. Accordingly, the first extension base die 3140A may have a size (or an area) relatively larger than a size of a general base die, for example, a base die size of a JEDEC standard specification. For example, the base die structure 3300C might not include one or more connection blocks ICB including a molding layer.

In exemplary embodiments, the host device 3200 may include first to fourth memory controllers MC1 to MC4 corresponding to the first to fourth stacked memory structures 3300A to 3300D, respectively. For example, the first to fourth memory controllers MC1 to MC4 may be disposed in a first overlap region OV_H of the host device 3200.

Each of the first to fourth extension base dies 3140A to 3140D may include a first circuit block CB1 and a second circuit block CB2. For example, the first circuit blocks CB1 may include interface circuit blocks 3142*a* to 3142*d*, respectively. The second circuit blocks CB2 may include TSV circuit blocks 3144*a* to 3144*d* and test circuit blocks 3146*a* to 3146*d*, respectively. The first circuit blocks CB1 may be coupled respectively to each of the memory controllers MC1 to MC4 of the host device through the first bus B1. The first circuit block CB1 and the second circuit block CB2, and the second circuit block CB2 and the stacked memory structures 3300A to 3300D, may be coupled through the second bus B2, respectively.

The first circuit blocks CB1 may be disposed on second overlap regions OV_B of the first to fourth extension base dies 3140A to 3140D, respectively. The configurations of the interface circuit blocks 3142*a* to 3142*d*, the TSV circuit blocks 3144*a* to 3144*d*, the test circuit blocks 3146*a* to 3146*d*, and first and second buses B1 and B2 may be substantially the same as the configurations described above and illustrated in FIGS. 20A to 20E.

In an embodiment, sidewalls of the first to fourth extension base dies 3140A to 3140D may be directly bonded. In an embodiment, the base die structure 3100C may include the four extension base dies 3140A to 3140D, which are not diced.

In exemplary embodiments, as illustrated in FIG. 22C, the base die structure 3100C may further include first to fourth extension base dies 3140A' to 3140D' and a support layer 3148 located among the first to fourth extension base dies 3140A' to 3140D'. For example, the support layer 3148 may include an insulating layer or a molding layer. The support layer 3148 may be configured to surround at least one sidewall of the first to fourth extension base dies 3140A to 3140D. Although not illustrated in the drawings, a plurality of bridges directly connecting the host device 3200 and the substrate 3010 (see, for examples, FIG. 20A to FIG. 20B) may be further provided in the support layer 3148. The first to fourth extension base dies 3140A' to 3140D' may have a larger size than the base dies 3120 and 3130 of the JEDEC standard, as described above and illustrated in FIGS. 20A to 21B, and may have a size equal to or smaller than the extension base dies 3140A to 3140D of FIGS. 22A to 22B.

As described above, the base die structure is configured to include the extension base dies so that the integration density of circuits in the base dies can be improved. In addition, because an area of the base die itself is increased, additional space provides better margins for forming the first bus that couples the host device and the extension base dies.

Figure 23A:
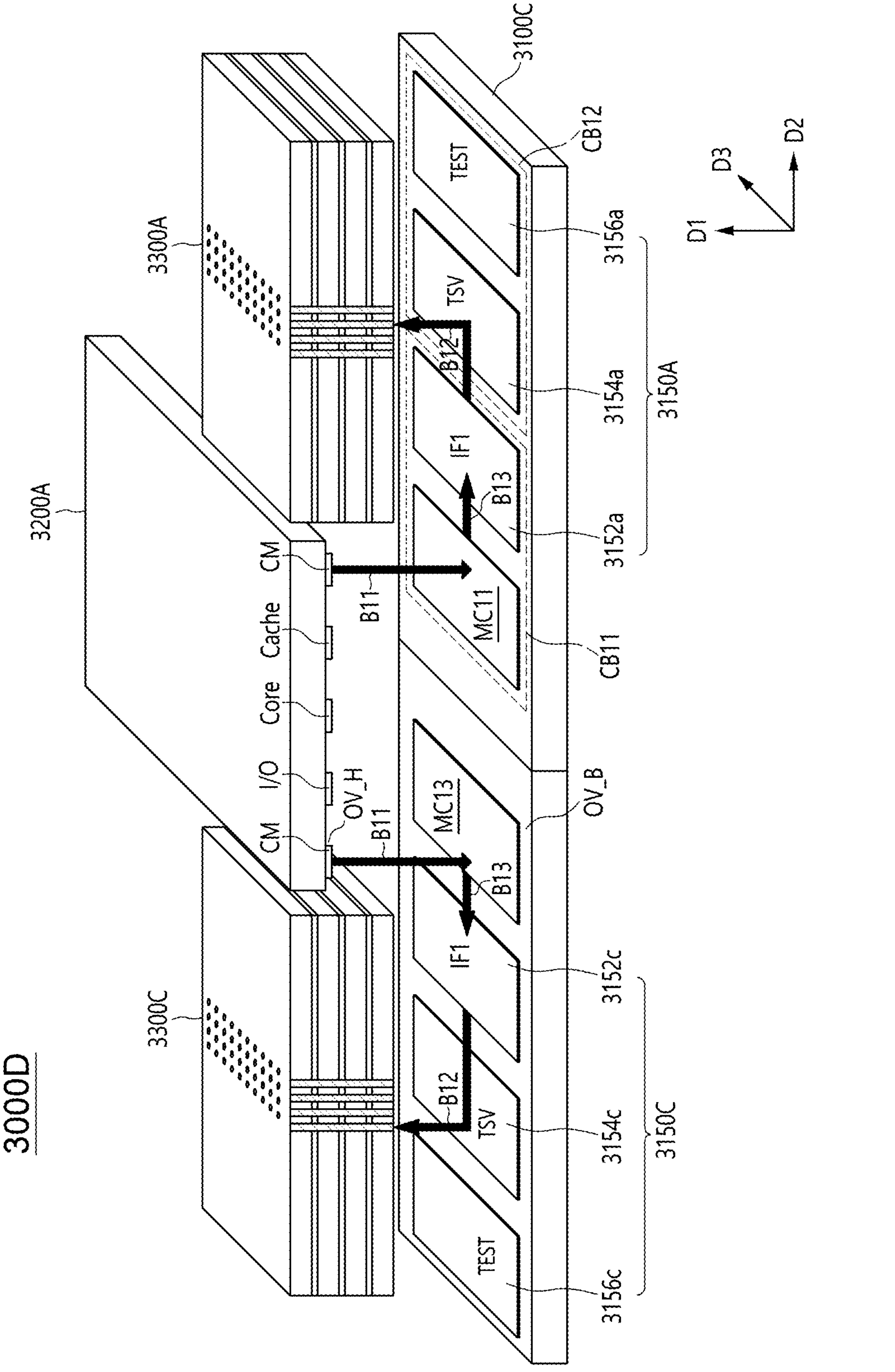
FIG. 23A is a diagram illustrating a perspective view of a main part of a computing system according to an embodiment of the present disclosure.
Figure 23B:
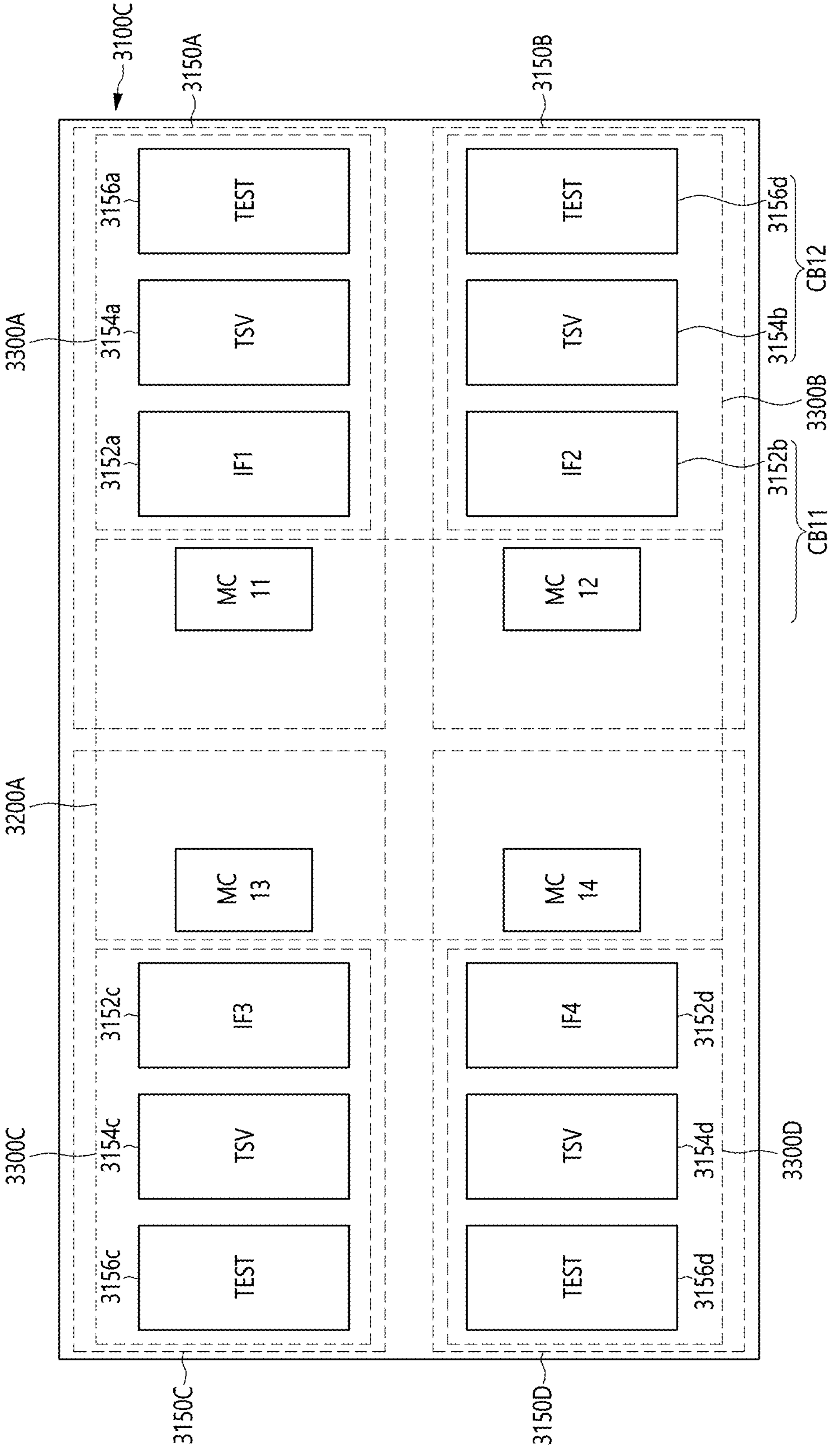
FIG. 23B is a diagram illustrating a schematic plan view of a base die structure including extension base dies of FIG. 23A according to an embodiment of the present disclosure.

FIG. 23A is a diagram illustrating a perspective view of a main part of a computing system according to an embodiment of the present disclosure, and FIG. 23B is a diagram illustrating a schematic plan view of a base die structure including extension base dies of FIG. 23A.

Referring to FIGS. 23A and 23B, a computing system 3000D may include a base die structure 3100C, a host device 3200A, and a plurality of stacked memory structures 3300A to 3300D.

Each of the extension base dies 3150A to 3150D may include a first circuit block CB11 and a second circuit block CB12. The first circuit block CB11 may be directly coupled to the host device 3200A through a first bus B11. The second circuit block CB12 may be coupled to the first circuit block CB11 and each of the plurality of stacked memory structures 3300A to 3300D through second buses B12.

The first circuit block CB11, similar to the first circuit block CB11 described in FIGS. 21A and 21B, may include memory controllers MC11 to MC14 and interface circuit blocks 3152*a* to 3152*d*, respectively.

For example, the first circuit blocks CB11 of the extended base dies 3150A to 3150D may be arranged to overlap with the host device 3200A. The host device 3200A and the first circuit blocks CB11 of the extension base dies 3150A to 3150D may be coupled by the first bus B11. For example, the first bus B11 may be substantially the same as the first bus B11 of FIGS. 21A and 21B. In addition, the first bus B11 may be located between a first overlap region OV_H of the host device 3200A and a second overlap region OV_B of the extension base dies 3150A to 3150D.

In embodiments of the disclosure, a selected component CM of the host device 3200A may be located in the first overlap region OV_H. For example, the selected component CM may include a cache, although the present disclosure is not limited thereto. By way of example, the selected components CM of the host device 3200A and each of the memory controllers MC11 to MC14 may be coupled through the first bus B11. The memory controllers MC11 to MC14 may be respectively disposed in the second overlap regions OV_B of the extension base dies 3150A to 3150D, respectively.

The first circuit block CB11 may include a third bus 13 connecting one of the memory controllers MC11 to MC14 and one of the interface circuit blocks 3152*a* to 3152*d*. The third bus B13 may be substantially the same as the third bus B13 of FIGS. 21A and 21B. The third bus B13 may include a DFI.

For example, the second circuit blocks CB12 may include TSV circuit blocks 3154*a* to 3154*d* and test circuit blocks 3156*a* to 3156*d*, respectively. The configurations of the TSV circuit blocks 3154*a* to 3154*d*, the test circuit blocks 3156*a* to 3156*d*, and the second bus B12 may be substantially the same as those illustrated in FIGS. 21A and 21B.

Figure 24:
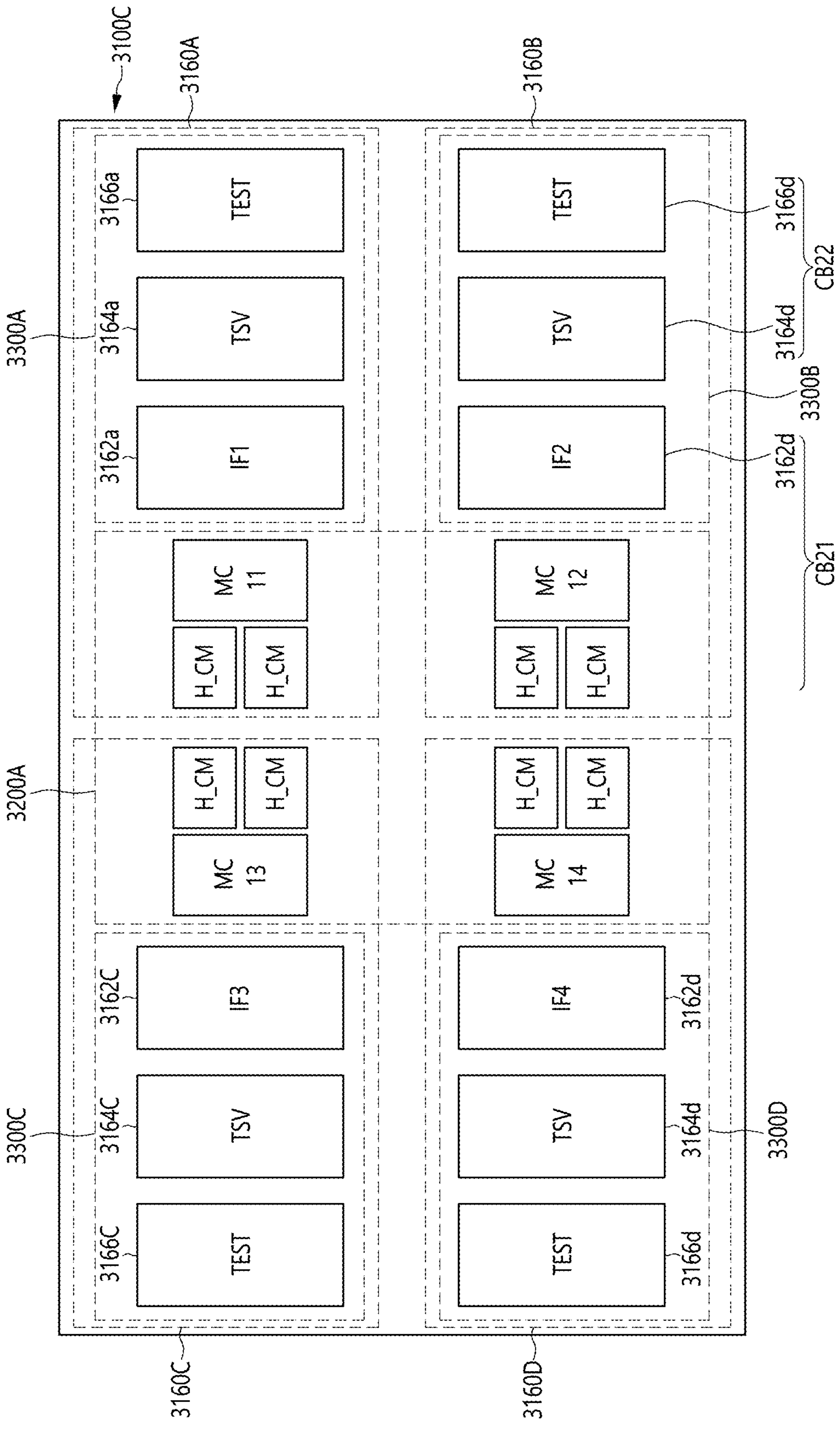
FIG. 24 is a diagram illustrating a schematic plan view of a base die structure including extension base dies according to an embodiment of the present disclosure.

FIG. 24 is a diagram illustrating a schematic plan view of a base die structure including extension base dies according to an embodiment of the present disclosure.

Referring to FIGS. 23 and 24, each of first to fourth extension base dies 3160A to 3160D may include a first circuit block CB21 and a second circuit block CB22. For example, each of the first circuit block CB21 may include at least one memory controllers MC11 to MC14 as well as components H_CM (hereinafter, additional components. For example, additional components H_CM having the same function may be integrated into each of the first blocks CB21 of the extension base dies 3160A to 3160D.

In an embodiment, the additional components H_CM respectively disposed in the first circuit blocks CB11 of the first to fourth extension base dies 3160A to 3160D may have different functions. The additional components H_CM having different functions may be disposed in different extension base dies 3160A to 3160D may be interconnected within respective extension base dies 3160A to 3160D.

The second circuit block CB22 may include TSV circuit blocks 3164*a* to 3164*d* and first to fourth test circuit blocks 3166*a* to 3166*d*. The first circuit block CB21 of the extension base dies 3160A to 3160D and the host device 3200A may be coupled by the first bus B11. The first circuit block CB21 and the second circuit block CB22, and the second circuit block CB22 and the plurality of stacked memory structures 3300A to 3300D, may be coupled by the second bus B12. The memory controllers MC11 to MC14 and the interface circuit blocks 3162*a* to 3162*d* may be coupled by the third bus B13.

The additional components H_CM may include circuits that can be fabricated by a BEOL process, together with the interface circuit blocks 3162*a* to 3162*d*, the TSV circuit blocks 3164*a* to 3164*d*, the test circuit blocks 3166*a* to 3166*d*, and the memory controllers MC11 to MC14.

The configurations of the memory controllers MC11 to MC14, the interface circuit blocks 3162*a* to 3162*d*, the TSV circuit blocks 3164*a* to 3164*d*, the test circuit blocks 3166*a* to 3166*d*, the first bus B11, the second bus B12, and the third bus B13 may be substantially the same as the configurations of the memory controllers MC11 to MC14, the interface circuit block 3132, the TSV circuit block 3134, and the test circuit block 3136 described above with reference to FIGS. 21A and 21B.

In addition, at least one portion of the first circuit block CB21 may be arranged to overlap with the host device 3200A, while another portion of the first circuit block CB21 may be arranged to overlap with the stacked memory structures 3300A to 3300D, respectively. By way of example, the additional components H_CM and the memory controllers MC11 to MC14 of the first circuit blocks CB21 may overlap with the host device 3200A, respectively, in the first direction D1. The interface circuit blocks 3162*a* to 3162*d* of the first circuit blocks CB21 may be arranged to overlap with the stacked memory structures 3300A to 3300D, respectively, in the first direction D1.

The above-described base die structures 3100, 3100A, and 3100C may be configured as an assembly including a plurality of base dies 3120A to 3120D and 3130A to 3130D, or a plurality of extension base dies 3140A to 3140D, 3150A to 3150D, and 3160A to 3160D. However, the present disclosure is not limited thereto, and in other embodiments the base die structure may be configured as an extension single base die. The extended single base die may have, for example, a total area disposed on a substrate that is greater than that of the plurality of base dies 3120A to 3120D and 3130A to 3130D. An extension base die may also have, for example, a total area disposed on a substrate of any of the plurality of extension base dies 3140A to 3140D, 3150A to 3150D, and 3160A to 3160D.

Figure 25:
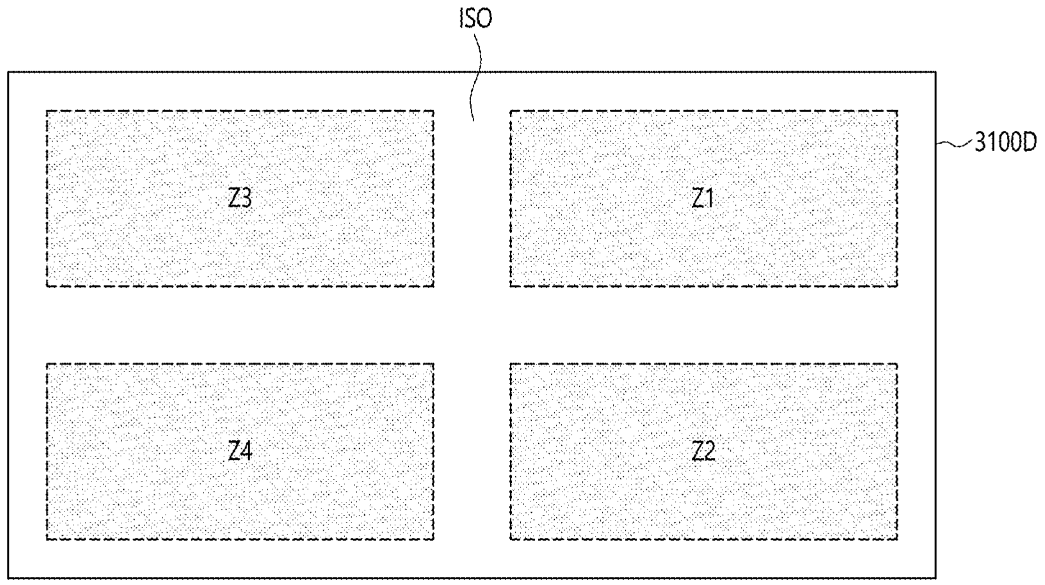
FIG. 25 is a diagram illustrating a schematic plan view of an extension single base die according to an embodiment of the present disclosure.

FIG. 25 is a diagram illustrating a schematic plan view of an extension single base die according to an embodiment of the present disclosure.

Referring to FIG. 25, an extension single base die 3100D may include a plurality of circuit zones Z1 to Z4. The plurality of circuit zones Z1 to Z4 may correspond to positions of a plurality of base dies or positions of a plurality of extension base dies, respectively. Each of the plurality of circuit zones Z1 to Z4 may include at least one circuit element. For example, the circuit element may include at least one of an interface circuit block, a TSV circuit block, a test circuit block, a memory controller, cache, and an additional component. Further, the extension single base die 3100D may include an isolation region ISO for isolating the plurality of circuit zones Z1 to Z4.

Figure 26:
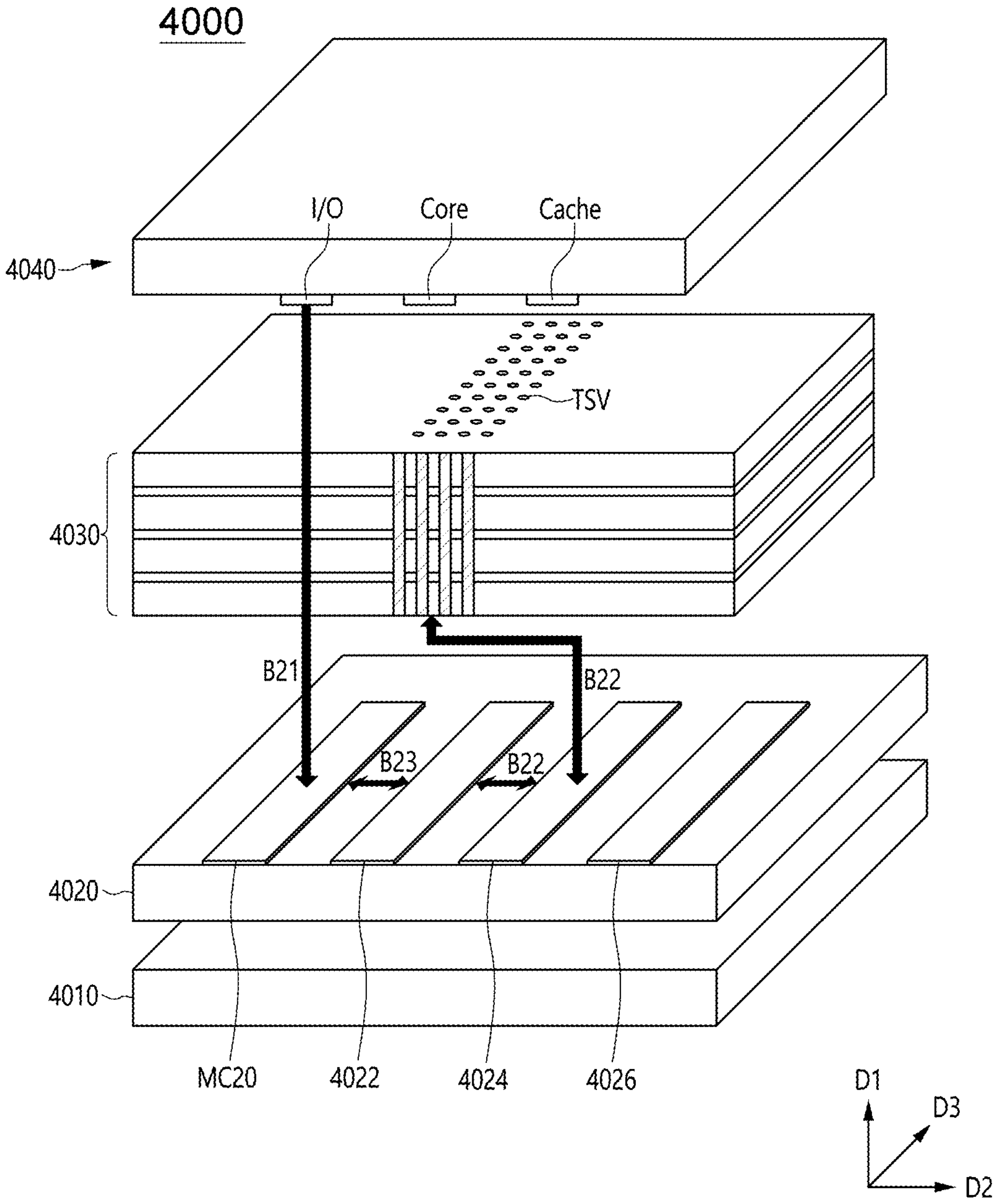
FIGS. 26 to 28 are diagrams illustrating schematic perspective views of a computing system according to embodiments of the present disclosure.
Figure 27:
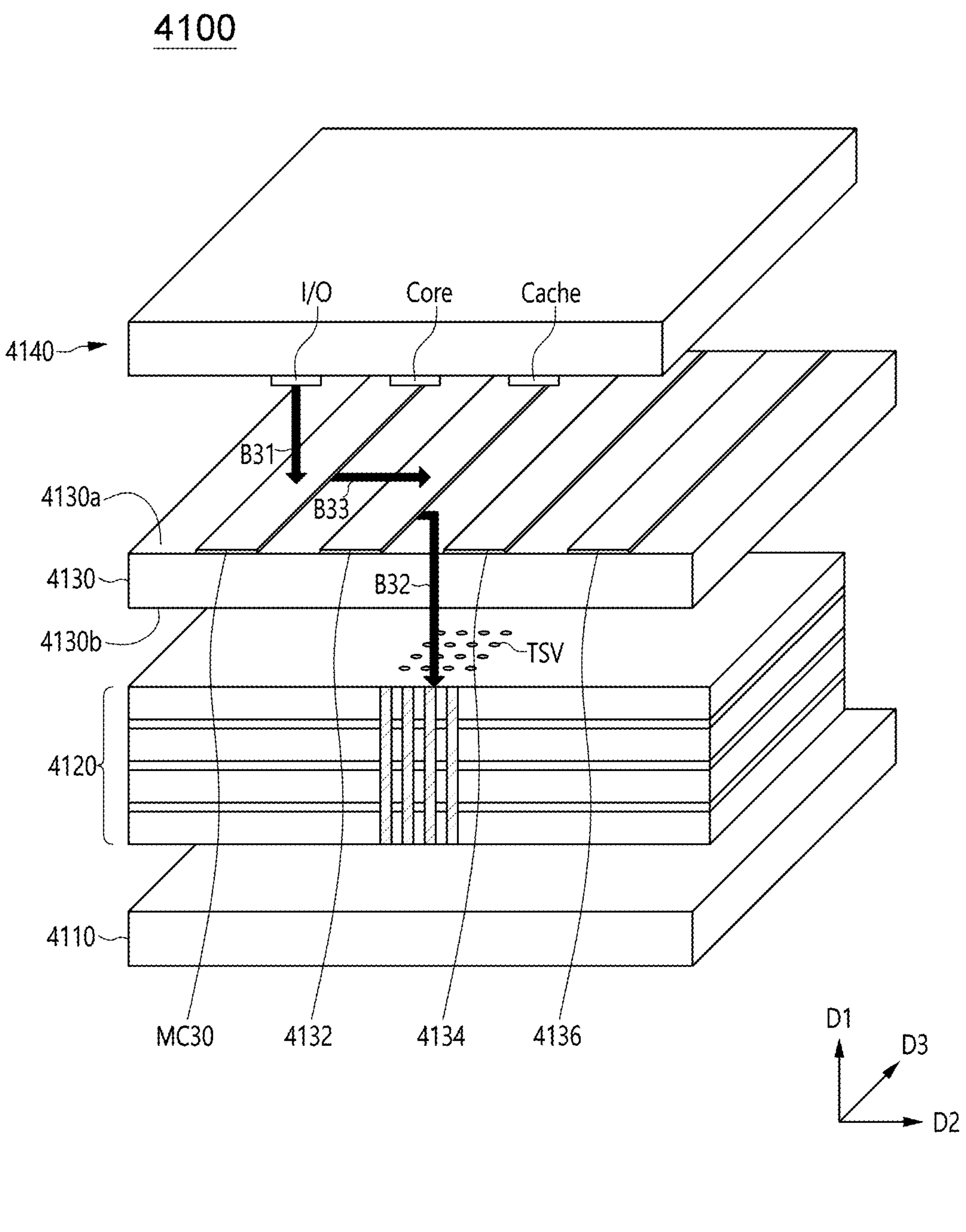
Figure 28:
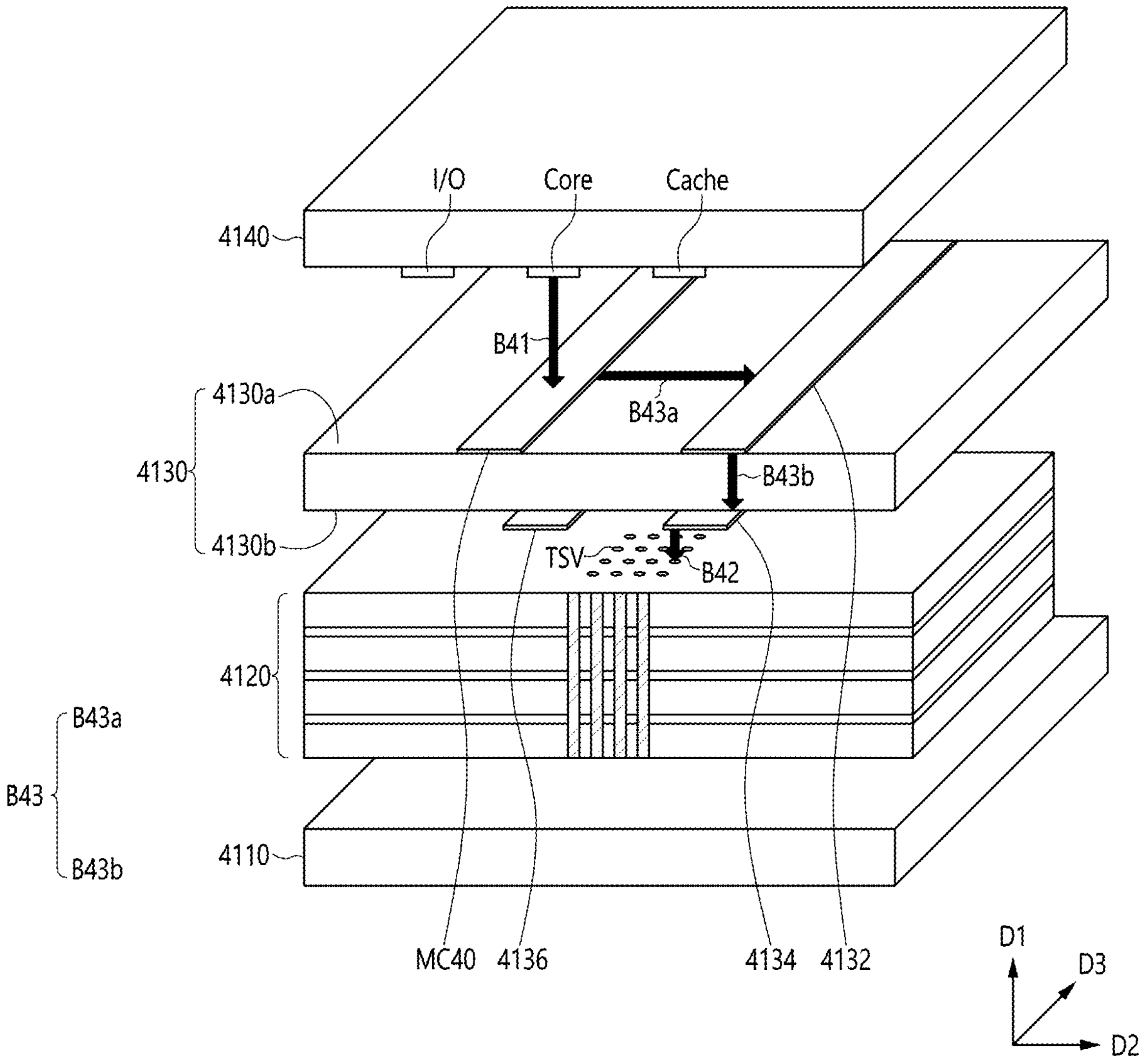

FIGS. 26 to 28 are diagrams illustrating schematic perspective views of a computing system according to embodiments of the present disclosure.

Referring first to FIG. 26, a computing system 4000 may include a substrate 4010, a base die 4020, a stacked memory structure 4030, and a host device 4040. The substrate 4010, the base die 4020, the stacked memory structure 4030, and the host device 4040 may be sequentially stacked along a first direction D1. The substrate 4010 and the stacked memory structure 4030 may include any one of the substrates and any one of the stacked memory structures described in FIGS. 1 to 25. The base die 4020 may include one of the base die, the extension base die, the extension base die (or extension single die), and the base die structure illustrated in FIGS. 21A to 25. For example, the base die 4020 may include at least one memory controller MC20, at least one interface circuit block 4022, at least one TSV circuit block 4024, and at least one test circuit block 4026.

The memory controller MC20 of the base die 4020 may be coupled to the host device 4040 through a first bus B21. Although not explicitly illustrated in the drawings, the first bus B21 may pass through TSVs of the stacked memory structure 4030. For example, a signal transmission scheme through the first bus B21 may be substantially the same as a signal transmission scheme through a first bus 150 of FIG. 1. The memory controller MC20 and the interface circuit block 4022 may be coupled by third bus B23. For example, a signal transmission scheme through the third bus B23 may be substantially the same as a signal transmission scheme through a second bus 160 of FIG. 1. The interface circuit block 4022 may be coupled to the TSV circuit block 4024 and the stacked memory structure 4030 through second buses B22, respectively. A configuration and operation of the memory controller MC20 may be substantially the same as configurations and operations of the memory controllers of FIG. 21A, FIG. 21B, FIG. 23A, FIG. 23B, and FIG. 24. However, the present disclosure is not limited thereto, and as illustrated in FIGS. 22A to 22C, the memory controller MC20 may be integrated in the host device 4040, and the host device 4040 and the base die 4020 may be coupled by a first bus B1. For example, the first bus B1 may be substantially the same as a first bus B1 of FIG. 20B.

The host device 4040 may also include any one of the host devices described in FIG. 21A, FIG. 21B, FIG. 23A, FIG. 23B, and FIG. 24. The host device 4040 disposed on an upper portion of the stacked memory structure 4030 may electrically communicate signals with the base die 4020 or the substrate 4010 through TSVs of the stacked memory structure 4030. Among the components in the host device 4040, components that may be manufactured through a BEOL process, for example, the memory controller MC20 and other components, may be integrated in the base die 4020. Accordingly, an integration degree of the host device 4040 may be improved, and various performance components may be further integrated in the host device 4040. In addition, because the substrate 4010, the base die 4020, the stacked memory structure 4030, and the host device 4040 are stacked three-dimensionally, the computing system 4000 may be miniaturized.

Referring to FIG. 27, a computing system 4100 may include a substrate 4110, a stacked memory structure 4120, a base die 4130, and a host device 4140. The substrate 4110, the stacked memory structure 4120, the base die 4130, and the host device 4140 may be sequentially stacked along a first direction D1. The substrate 4110 and the stacked memory structure 4120 may include any one of the substrates and the stacked memory structures described in FIGS. 1 to 26. The base die 4130 may include any of the base die, the extension base die, the extension base die, or the base die structure described in FIGS. 20A to 26. For example, the base die 4130 may include at least one memory controller MC30, at least one interface circuit block 4132, at least one TSV circuit block 4134, and at least one test circuit block 4136. The memory controller MC30, the interface circuit block 4132, the TSV circuit block 4134, and the test circuit block 4136 may be disposed on one of a first surface 4130*a* of the base die 4130 and a second surface 4130*b* of the base die 4130. For example, the first surface 4130*a* may face the host device 4140, and the second surface 4130*b* may face the stacked memory structure 4120.

The base die 4130 and the host device 4140 may be coupled by a first bus B31. The base die 4130 and the stacked memory structure 4120 may be coupled by a second bus B32. The memory controller MC30 and the interface circuit block 4132, which are disposed on the base die 4130, may be coupled by a third bus B33.

The base die 4130 may be located between the host device 4140 and the stacked memory structure 4120. Accordingly, lengths of the first bus B31 between the base die 4130 and the host device 4140 and the second bus B32 between the base die 4130 and the stacked memory structure 4120 are both shortened. Since the memory controller MC30 is disposed on the base die 4130, a signal transmission scheme through the first bus B31 may be substantially the same as a signal transmission scheme through a first bus 150 of FIG. 1. A signal transmission scheme of the first bus B32 that couples the interface circuit block 4134 of the base die 4130 and the stacked memory structure 4120 may be substantially the same as a signal transmission scheme through a third bus 170 of FIG. 1. A signal transmission scheme through the third bus B33 that couples the memory controller MC30 and the interface circuit block 4134 may be substantially the same as a signal transmission scheme through a second bus 160 of FIG. 1. The signal transmission paths of the first bus B31 and the second bus B32 may be parallel to a first direction D1 (a vertical direction), and the signal transmission path of the third bus B33 may be parallel to a second direction D2 (a horizontal direction).

When the stacked memory structure 4120, the base die 4130, and the host device 4140 are sequentially stacked, a size of the computing system 4100 can be reduced. A physical length of the buses B31, B32, and B33 coupling the stacked memory structure 4120, the base die 4130, and the host device 4140 may be reduced, thereby enabling data and signal transmission without performing high-speed SerDes processing. Although FIG. 27 illustrates an example in which the memory controller MC30 is integrated in the base die 4130, it is apparent from other disclosed embodiments that the memory controller MC30 may be disposed in the host device 4140.

Referring to FIG. 28, at least one of circuit blocks integrated in a base die 4130 (hereinafter, base circuit blocks) may be located on a first surface 4130*a* of the base die 4130, and the other circuit blocks of base circuit blocks 4132, 4134, and 4136 may be located on a second surface 4130*b* of the base die 4130. For example, at least one base circuit block directly communicating with the host device 4140, for example, at least one a memory controller MC40 and the interface circuit block 4132, may be located on a first surface 4130*a* adjacent to the host device 4140. At least one of the base circuit blocks directly or indirectly communicating with the stacked memory structure 4120, for example, at least one the TSV circuit block 4134 and the test circuit block 4136, may be located on the second surface 4130*b* adjacent to the stacked memory structure 4120.

The base die 4130 and the host device 4140 may be coupled by a first bus B41. The first bus B41 may be positioned between the base die 4130 and the host device 4140. The base die 4130 and the stack memory structure 4120 may be coupled by a second bus B42. Further, the base circuit blocks 4132, 4134, and 4136 may be coupled by a third bus B43. For example, the third bus B43 may include a horizontal third bus B43*a* and a vertical third bus B43*b*. The horizontal third bus B43*a* may couple the base circuit blocks (such as, the memory controller MC40 and the interface circuit block 4132) arranged on the same plane. The vertical third bus B43*b* may couple the base circuit blocks (such as, the interface circuit block 4132 and the TSV circuit block 4134) arranged on different planes, for example, the first surface 4130*a* and the second surface 4130*b* of the base die 4130.

As the base circuit blocks 4132, 4134, and 4136 are distributed on both surfaces 4130*a* and 4130*b* of the base die 4130, a physical length of the first bus B41 and a physical length of the second bus B42 may be further shortened. Integration margins of the first surface 4130*a* and the second surface 4130*b* of the base die 4130 are increased.

Furthermore, as the base circuit blocks MC40, 4132, 4134, and 4136 of the base die 4130 are distributed on both surfaces of the base die 4130, auxiliary blocks (not shown) for improving signal transmission characteristics between the host device 4140 and the base die 4130, and between the base die 4130 and the stacked memory structure 4120, may also be integrated in available space of the base die 4130.

According to the computing systems of the disclosed embodiments, a computing system includes a base die of which at least a portion overlaps with the host device and the stacked memory structure. The host device and the stacked memory structure are configured to directly communicate through the base die. Accordingly, a signal transmission path coupling the host device and the base die may be shortened, so that communication between the host device and the base die can be achieved without passing through a high-speed SerDes and an interposer.

In an embodiment, the host device, the base die structure, the base die, and the extension base die may be integrated in the substrate in the form of chiplets or tiles.

In addition, when the base die structure (or the base die), the host device, and memory dies of the stacked memory structure are all at a chip level, it is apparent that the base die structure, the host device, and the stacked memory structure may be stacked in a hybrid bonding manner without external terminals such as bumps or microbumps.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that the meaning and scope of the claims and all changes or modified forms derived from the equivalent concept thereof are included in the scope of the present disclosure.

What is claimed is:

1. An integrated circuit package comprising:

a base die including a first surface and a second surface;

a host device disposed on the first surface of the base die;

a first hybrid bonding surface located between the first surface of the base die and the host device;

a stacked memory structure disposed on the first surface of the base die; and a second hybrid bonding surface located between the first surface of the base die and the stacked memory structure, wherein the base die includes at least one circuit block to transmit data between the host device and the stacked memory structure.

2. The integrated circuit package of claim 1, further comprising:

a package substrate attached to the second surface of the base die, and a mold layer disposed over the package substrate to encapsulate the base die, the host device and the stacked memory structure.

3. The integrated circuit package of claim 1, wherein the circuit block of the base die comprises a first circuit block directly or indirectly connected to the host device, and a second circuit block directly or indirectly connected to the stacked memory structure.

4. The integrated circuit package of claim 3, wherein the host device comprises a plurality of electrical components, and a selected electrical component of the plurality of electrical components is electrically connected to the first circuit block of the base die.

5. The integrated circuit package of claim 4, wherein the first circuit block is disposed on the base die to face the selected electrical component, and the selected electrical component is disposed in the host device to face the first circuit block.

6. The integrated circuit package of claim 3, wherein a selected electrical component and the first circuit block are electrically connected through the first hybrid bonding surface.

7. The integrated circuit package of claim 3, wherein the first circuit block comprises a memory controller and an interface circuit block electrically connected to the memory controller.

8. An integrated circuit package comprising:

a package substrate;

a base die structure mounted on the package substrate;

at least one host device disposed on the base die structure, the base die structure comprising a plurality of base dies, and each of the plurality of base dies including a first circuit block;

a plurality of stacked memory structures disposed on the base die structure;

at least one first hybrid bonding surface located between the base die structure and the host device; and a plurality of second hybrid bonding surfaces located between the base die structure and the plurality of stacked memory structures, respectively.

9. The integrated circuit package of claim 8, wherein the first hybrid bonding surface and the second hybrid bonding surfaces are located on a same plane.

10. The integrated circuit package of claim 8, wherein the host device is arranged to face the first circuit blocks of the plurality of base dies.

11. The integrated circuit package of claim 8, wherein the host device comprises a plurality of selected electrical components, each of which is directly or indirectly connected to a corresponding one of the plurality of base dies, and wherein the first circuit blocks are directly or indirectly connected to a corresponding one of the plurality of selected electrical components.

12. The integrated circuit package of claim 11, wherein the plurality of selected electrical components of the host device are arranged to face the first circuit block of the plurality of base dies, respectively.

13. The integrated circuit package of claim 11, wherein the plurality of selected electrical components and the first circuit blocks are electrically connected through the at least one first hybrid bonding surface.

14. The integrated circuit package of claim 11, wherein each of the first circuit blocks comprises a memory controller and an interface circuit block electrically connected to the memory controller.

15. The integrated circuit package of claim 8, wherein at least one stacked memory structure is disposed over each of the plurality of base dies.

16. The integrated circuit package of claim 8, wherein the base die structure comprises:

a connection block located between the plurality of base dies and including a plurality of bridges connecting the host device to the package substrate, wherein the base dies in the plurality of base dies are arranged in a horizontal direction and separated from each other.

17. The integrated circuit package of claim 16, wherein the connection block further comprises a molding layer insulating the plurality of bridges.

18. The integrated circuit package of claim 8, wherein the base dies in the plurality of base dies are continuously arranged in a horizontal direction.

19. The integrated circuit package of claim 8, wherein the base die structure comprises a single extended base die including a plurality of circuit zones and an isolation region isolating the plurality of circuit zones, and the plurality of circuit zones face the host device and at least one stacked memory structure.

20. The integrated circuit package of claim 19, wherein the host device comprises a plurality of selected electrical components respectively arranged to face the plurality of circuit zones.

21. The integrated circuit package of claim 20, wherein the plurality of selected electrical components and the plurality of circuit zones are electrically connected through the at least one first hybrid bonding surface, respectively.

22. The integrated circuit package of claim 8, a mold layer disposed over the package substrate and configured to encapsulate the base die structure, the at least one host device and the plurality of stacked memory structures.

23. A method of manufacturing an integrated circuit package, comprising:

hybrid bonding at least one stacked memory structure onto an upper surface of a base die; and hybrid bonding a host device onto the upper surface of the base die, wherein the base die comprises at least one circuit block, and the host device and the stacked memory structure transmit data to each other through the base die.

24. The method of claim 23, further comprising mounting the base die on a package substrate, and encapsulating the base die, the at least one stacked memory structure and the host device, through a mold layer, wherein a lower surface of the base die is attached to the package substrate.

25. A method of manufacturing an integrated circuit package, comprising:

providing a base die structure comprising a plurality of base dies, each of the base dies including at least one circuit block;

hybrid bonding a plurality of stacked memory structures and a host device onto an upper surface of the base die structure; and mounting the base die structure on a package substrate, wherein the host device and the plurality of stacked memory structures transmit data to each other through the at least one circuit block of the base dies.

26. The method of claim 25, wherein the hybrid bonding comprises:

stacking the plurality of stacked memory structures on the base die structure to respectively face the plurality of base dies; and hybrid bonding the plurality of base dies to the plurality of stacked memory structures.

27. The method of claim 25, wherein the hybrid bonding comprises:

stacking the host device on the base die structure to respectively face the plurality of base dies; and hybrid bonding the plurality of base dies to the host device.

28. The method of claim 25, further comprising:

encapsulating the package substrate, the base die structure, at least one stacked memory structure and the host device, through a mold layer.

* * * * *